United States Patent
Koike et al.

(10) Patent No.: US 9,263,649 B2
(45) Date of Patent: Feb. 16, 2016

(54) LAYERED PRODUCT FOR FINE PATTERN FORMATION AND METHOD OF MANUFACTURING LAYERED PRODUCT FOR FINE PATTERN FORMATION

(75) Inventors: Jun Koike, Tokyo (JP); Fujito Yamaguchi, Tokyo (JP); Masatoshi Maeda, Tokyo (JP); Shinji Arihisa, Tokyo (JP); Masayoshi Arihisa, legal representative, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 170 days.

(21) Appl. No.: 14/004,305

(22) PCT Filed: Jun. 18, 2012

(86) PCT No.: PCT/JP2012/065494
§ 371 (c)(1),
(2), (4) Date: Feb. 20, 2014

(87) PCT Pub. No.: WO2012/176728
PCT Pub. Date: Dec. 27, 2012

(65) Prior Publication Data
US 2014/0151733 A1 Jun. 5, 2014

(30) Foreign Application Priority Data

| Jun. 23, 2011 | (JP) | ................................ | 2011-139692 |
| Aug. 29, 2011 | (JP) | ................................ | 2011-185504 |
| Aug. 29, 2011 | (JP) | ................................ | 2011-185505 |
| Dec. 27, 2011 | (JP) | ................................ | 2011-285597 |
| Dec. 27, 2011 | (JP) | ................................ | 2011-286453 |
| Jan. 25, 2012 | (JP) | ................................ | 2012-013466 |
| Feb. 3, 2012 | (JP) | ................................ | 2012-022267 |
| Feb. 23, 2012 | (JP) | ................................ | 2012-037957 |
| Feb. 24, 2012 | (JP) | ................................ | 2012-038273 |

(51) Int. Cl.
*H01L 33/20* (2010.01)
*H01L 33/58* (2010.01)
(Continued)

(52) U.S. Cl.
CPC ............ *H01L 33/58* (2013.01); *B29C 33/3842* (2013.01); *B29C 33/40* (2013.01);
(Continued)

(58) Field of Classification Search
CPC .............................. H01L 21/469; H01L 33/20
See application file for complete search history.

(56) References Cited

U.S. PATENT DOCUMENTS 7,520,742 B2 * 4/2009 Motowaki ............... B29C 33/58
106/38.27
8,419,995 B2 * 4/2013 Yoneda ............... B29C 37/0003
264/293

(Continued)

FOREIGN PATENT DOCUMENTS

JP 2011-66273 A 3/2011

OTHER PUBLICATIONS nternational Search Report for PCT/JP2012/065494 mailed on Sep. 11, 2012.

*Primary Examiner* — Evan Pert
(74) *Attorney, Agent, or Firm* — Birch, Stewart, Kolasch & Birch, LLP

(57) ABSTRACT

Disclosed is a layered product for fine pattern formation and a method of manufacturing the layered product for fine pattern formation, capable of easily forming a fine pattern having a thin or no remaining film in order to form a fine pattern having a high aspect ratio on a processing object. The layered product for fine pattern formation (1) of the present invention used to form a fine pattern (220) in a processing object (200) using a first mask layer (103) includes: a mold (101) having a concavo-convex structure (101a) on a surface; and a second mask layer (102) provided on the concavo-convex structure (101a), wherein in the second mask layer (102), a distance (lcc) and a height (h) of the concavo-convex structure (101a) satisfy Formula (1) 0<lcc<1.0 h, and a distance (lcv) and the height (h) satisfy Formula (2) 0≤lcv≤0.05 h.

53 Claims, 86 Drawing Sheets

(51) Int. Cl.
*H01L 21/469* (2006.01)
*G03F 7/00* (2006.01)
*B29C 33/38* (2006.01)
*B29C 33/42* (2006.01)
*H01L 33/00* (2010.01)
*B29C 33/40* (2006.01)
*B82Y 10/00* (2011.01)
*B82Y 40/00* (2011.01)

(52) U.S. Cl.
CPC ............ *B29C 33/424* (2013.01); *B82Y 10/00* (2013.01); *B82Y 40/00* (2013.01); *G03F 7/0002* (2013.01); *H01L 21/469* (2013.01); *H01L 33/005* (2013.01); *H01L 33/20* (2013.01); *H01L 2924/0002* (2013.01); *H01L 2933/0083* (2013.01)

(56) References Cited

U.S. PATENT DOCUMENTS

| | | | | |
|---|---|---|---|---|
| 8,632,714 | B2* | 1/2014 | Ogino | B81C 1/0046 264/293 |
| 8,692,237 | B2* | 4/2014 | Kim | H01L 51/5203 257/40 |
| 8,703,837 | B2* | 4/2014 | Kawaguchi | B82Y 10/00 264/293 |
| 8,802,570 | B2* | 8/2014 | Iida | B05D 5/00 427/277 |
| 9,005,502 | B2* | 4/2015 | Chiba | B29C 33/40 264/220 |
| 9,073,102 | B2* | 7/2015 | Yoshida | B29C 33/62 |

* cited by examiner

LAYERED PRODUCT FOR FINE PATTERN FORMATION AND METHOD OF MANUFACTURING LAYERED PRODUCT FOR FINE PATTERN FORMATION

TECHNICAL FIELD

The present invention relates to a layered product for fine pattern formation used to form a fine pattern on an object to be processed, and more particularly, to a layered product for fine pattern formation capable of forming a fine pattern having a high aspect ratio on an object to be processed and a method of manufacturing the same.

BACKGROUND ART

In the related art, a photolithography technology has been widely used to fabricate a fine pattern to manufacture a large-scale integration (LSI) circuit. However, the photolithography technology has a problem in that it is difficult to fabricate a pattern having a size smaller than a wavelength of the light used in exposure. In addition, as another fine pattern fabrication technology, there is known a mask pattern lithography technology (EB method) using an electron beam lithography system. However, in the EB method, a lithograph time increases as the number of lithograph patterns increases because of directly forming a mask pattern by lithography using electron beams, and a throughput until pattern formation significantly decreases. In addition, a problem also occurs in that costs of apparatuses increase in such methods due to high-precision control for a mask position in a photolithography exposure apparatus or a large size of the electron beam lithography system in the EB exposure apparatus.

As a fine pattern fabrication technology capable of addressing such problems, there is known a nanoimprint lithography technology. In the nanoimprint lithography technology, a fine pattern formed on a mold is transferred onto a surface of a transfer target substrate by pressing the mold having a fine pattern of nanoscale to a resist film formed on a surface of the transfer target substrate.

FIGS. 1A and 1B are explanatory diagrams illustrating an exemplary nanoimprint lithography method. Referring to FIG. 1A, in order to form a concavo-convex structure on a surface of a desired substrate (object to be processed) 1001, a fine pattern 1003 formed on a mold 1002 is pressed to the object 1001 to be processed by applying a nanoimprint lithography method.

In a case where a fine pattern 1003 is used as a mask for fabricating the object 1001 to be processed, the fine pattern 1003 is made of a transfer material serving as a mask when the object 1001 to be processed is fabricated. When the transfer is performed, it is necessary to reduce a remaining film thickness T. In order to reduce the remaining film thickness T, it is necessary to reduce a thickness of the coating of the transfer material and press it with a high pressure for a long time and the likes. However, as the thickness of the coating is reduced, the object 1001 to be processed becomes susceptible to roughness or particles existing on a surface of the object 1001 to be processed, and moreover a transfer material may be unsatisfactorily filled in the concavo-convex structure of the mold 1002, or vapors may be incorporated. If pressing is made for a long time, throughput reliability is degraded. In addition, in order to uniformly form the thin remaining film, it is also necessary to use a special apparatus having a minute pressure distribution. Particularly, it is known that it is very difficult to form a homogeneous thin remaining film in a large scale. For these problems, it is difficult to take overall advantages such as transferability in a large scale, convenience, or throughput reliability of the nanoimprint lithography considered to be industrially superior.

Meanwhile, in a case where a fine pattern having a high aspect ratio is formed on the object 1001 to be processed, it is necessary to increase an aspect ratio of the fine pattern formed on a surface of the mold 1002. However, as the aspect ratio of the fine pattern formed on a surface of the mold 1002 increases, a filling error may be easily generated, and a demolding error such as a breakdown of the fine pattern 1003 may be easily generated when the mold 1002 is removed. As illustrated in FIG. 1B, in order to form the fine pattern 1003 having a high aspect ratio on the object 1001 to be processed, a method has been proposed, in which an organic layer 1004 (mask layer) is provided on the object 1001 to be processed, a fine pattern 1003 is formed on the organic layer 1004, and the organic layer 1004 is fabricated by using the fine pattern 1003 as a mask. However, even when the fine pattern 1003 is used as a mask for fabricating the organic layer 1004, the aforementioned problems still exist.

Among them, a method of forming a fine mask pattern having a thin or no remaining film T has been proposed (refer to Japanese Unexamined Patent Application No. 2011-66273). In Japanese Unexamined Patent Application No. 2011-66273, first, a mask material film is directly formed on a concavo-convex structure having unevenness on a surface. Subsequently, the remaining film T is thinned or has a zero thickness by performing etch-back for the mask material film (a thickness of the mask material film arranged on the concavo-convex structure of the mold is thinned). Then, a substrate is laminated to the mask material, and, finally, ashing is performed for the mold side, so that a fine mask pattern having no remaining film T excluding a fine structure in the mold is obtained.

CITATION LIST

Patent Literatures

[Patent Literature 1] Japanese Unexamined Patent Application No. 2011-66273

SUMMARY OF INVENTION

Technical Problem

However, in the fine mask formation method disclosed in Japanese Unexamined Patent Application No. 2011-66273, a total number of the processes performed until the fine mask pattern having a thin or no remaining film is obtained is large, and the method is complicated. In addition, it can be easily imagined that throughput reliability is not satisfactory until a mask layer having a thin or no remaining film is formed on a surface of the inorganic substrate as an object to be processed, and it is difficult to form a mask in a large scale since it is necessary to etch back the entire mask material film.

The present invention has been made in view of the aforementioned problems, and an aim thereof is to provide a layered product for fine pattern formation and a method of manufacturing a layered product for fine pattern formation, capable of easily forming a fine pattern with a thin or no remaining film in order to form a fine pattern having a high aspect ratio on an object to be processed.

Solution to the Problem

According to the present invention, there is provided a layered product for fine pattern formation used to form a fine pattern in an object to be processed using a first mask layer, including: a mold having a concavo-convex structure on a surface; and a second mask layer serving as a mask when the first mask layer is fabricated, wherein a distance lcc between a top position S of a convex portion of the concavo-convex structure and an interfacial position Scc of the second mask layer formed in the concave portion of the concavo-convex structure and a height h of the concavo-convex structure satisfy Formula (1) 0<lcc<1.0 h, and a distance lcv between the top position S of the convex portion and a top position Scv of the second mask layer formed on the convex portion and the height h satisfy Formula (2) 0≤lcv≤0.05 h.

In the layered product for fine pattern formation according to the present invention, the first mask layer may be provided to cover the concavo-convex structure of the mold, and a distance lor between the top position Scv and a surface of the first mask layer and a pitch P of the concavo-convex structure satisfy Formula (6) 0.05≤lor/P≤5.

According to the present invention, there is provided a method of manufacturing a layered product for fine pattern formation including a process of coating a solution of a second mask layer material on a concavo-convex structure of a mold to form a second mask layer, wherein a unit area Sc in a plane parallel to a principal surface of the mold in a coating area of the coating process, a coat film thickness hc of the solution in the coating process, a volumetric concentration C of the solution of the second mask layer material, and a volume Vc of the concave portion of the concavo-convex structure existing under the unit area Sc satisfy Formula (11) Sc·hc·C<Vc.

According to the present invention, there is provided a layered product for fine pattern formation including: an object to be processed; a first mask layer that is provided on a principal surface of the object to be processed and has a concavo-convex structure on a surface; and a second mask layer provided on the concavo-convex structure of the first mask layer, wherein the second mask layer is arranged in at least a part of a convex portion and side face portion of the concavo-convex structure, a ratio hmv/h0 between a thickness hmv of the second mask layer arranged on the convex portion of the concavo-convex structure and a height h0 of the concavo-convex structure represented by a distance between a bottom of the concave portion and a top of the convex portion of the concavo-convex structure satisfy Formula (16) 0<hmv/h0≤20, and a ratio hml/hmv between a thickness hml of the second mask layer arranged on a side face portion of the concavo-convex structure and a thickness hmv of the second mask layer arranged on the convex portion of the concavo-convex structure satisfies Formula (17) 0≤hml/hmv<1.

According to the present invention, there is provided a layered product for fine pattern formation including: an object to be processed; a first mask layer that is provided on a principal surface of the object to be processed and has a concavo-convex structure on a surface; and a second mask layer provided on the concavo-convex structure of the first mask layer, wherein a distance lcc between a top position S of a convex portion of the concavo-convex structure and an interfacial position Scc of the second mask layer formed in the concave portion of the concavo-convex structure and a height h of the concavo-convex structure satisfy Formula (1) 0<lcc<1.0 h, a distance lcv between the top position (S) of the convex portion and a top position Scv of the second mask layer formed on the convex portion of the concavo-convex structure satisfies Formula (21) 0≤lcv≤h−lcc, and a thickness of the first mask layer represented by a distance between an interface between the first mask layer and the object to be processed and a top position S of the convex portion is 50 nm or larger and 1500 nm or smaller.

Technical Advantages of the Invention

According to the present invention, it is possible to implement a layered product for fine pattern formation and a method of manufacturing a layered product for fine pattern formation, capable of easily forming a fine pattern with a thin or no remaining film in order to form a fine pattern having a high aspect ratio on an object to be processed.

DESCRIPTION OF EMBODIMENTS

Figure 1A:
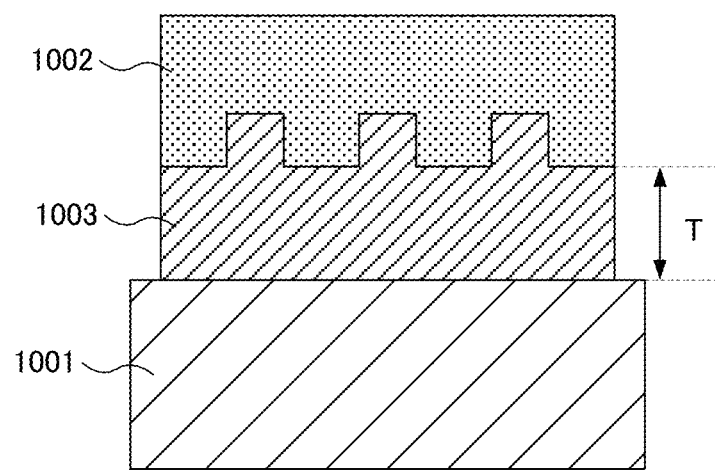
FIGS. 1A and 1B are explanatory diagrams illustrating an exemplary nanoimprint lithography method.
Figure 1B:
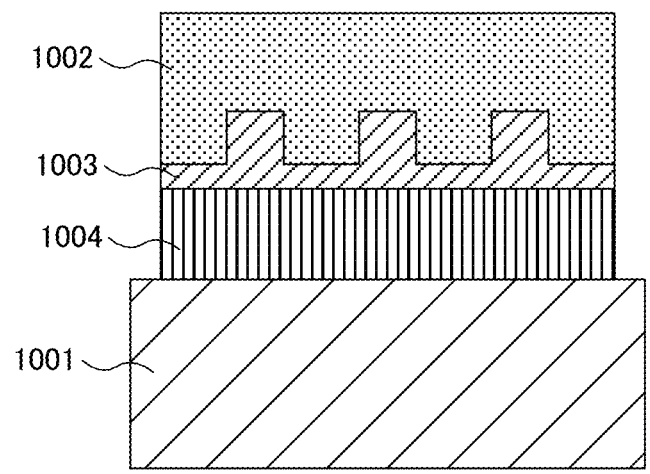
Figure 2A:
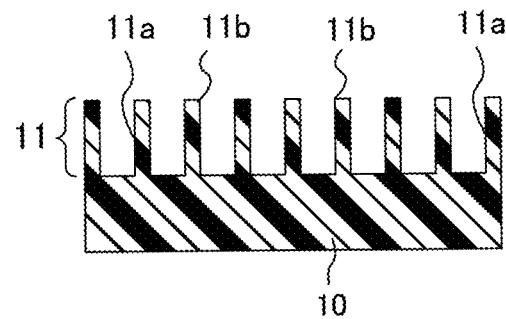
FIGS. 2A to 2C are process diagrams illustrating a method of forming a fine pattern on an object to be processed.

FIGS. 2A to 2C and 3A to 3F are process diagrams illustrating a method of forming a fine pattern of an object to be processed according to the present embodiment. As shown in FIG. 2A, a concavo-convex structure 11 is formed in a principal surface of the mold 10. The concavo-convex structure 11 includes a plurality of concave portions 11a and a plurality of convex portions 11b. The mold 10 is, for example, a film-like or plate resin mold.

Figure 2B:
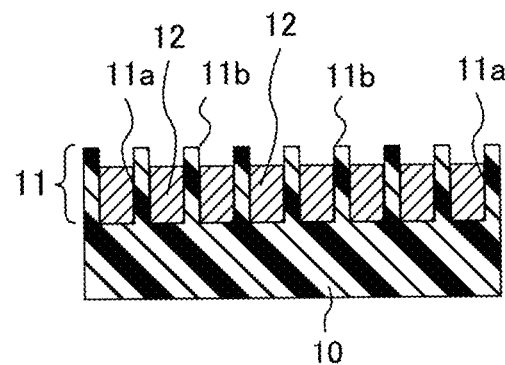

First, as illustrated in FIG. 2B, a second mask layer 12 for patterning a first mask layer described below is filled in the concave portions 11a of the concavo-convex structure 11 of the mold 10. The second mask layer 12 comprises, for example, a sol-gel material. Here, a layered product including the mold 10 and the second mask layer 12 will be referred to as a layered product for fine pattern formation 1 or simply a first layered product 1. This layered product for fine pattern formation 1 may be used in patterning of an object 20 to be processed via the first mask layer as a mask.

Figure 2C:
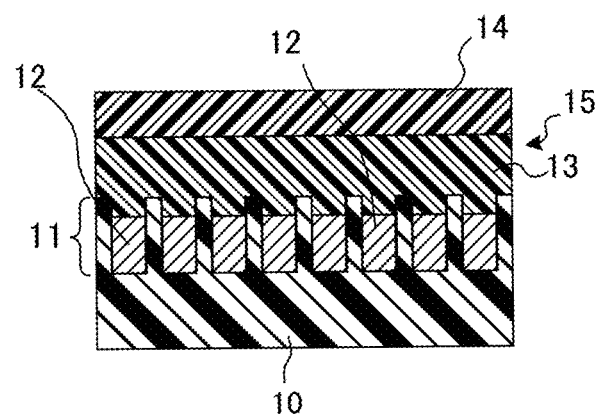

Next, as illustrated in FIG. 2C, the first mask layer 13 is formed on the concavo-convex structure 11 including the second mask layer 12 of the layered product 1. This first mask layer 13 is used in the patterning of the object to be processed described below. The first mask layer 13 comprises, for example, photosetting resin or thermosetting resin.

In addition, as illustrated in FIG. 2C, a protection layer 14 may be provided over the first mask layer 13. The protection layer 14 is used to protect the first mask layer 13 and is non-essential. Here, a layered product 15 including the mold 10, the second mask layer 12, and the first mask layer 13 will be referred to as a layered product for fine pattern formation 2 or simply a second layered product 2. The layered product 2 can be used to pattern the object 20 to be processed by laminating the first mask layer 13 to the object 20 to be processed.

Figure 3A:
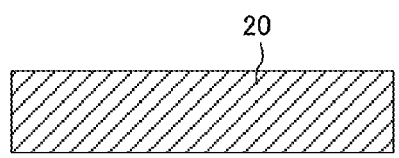
FIGS. 3A to 3F are process diagrams illustrating a method of forming a fine pattern on an object to be processed.

Then, an object 20 to be processed as illustrated in FIG. 3A is prepared. The object 20 to be processed is, for example, a sapphire substrate. First, as illustrated in FIG. 3B, an exposed surface of the first mask layer 13 of the layered product 15 (second layered product 2) obtained after removing the protection layer 14 faces the principal surface of the object 20 to be processed and then lamination (thermocompressive bonding) of them. In this state, the first mask layer 13 is set by irradiating energy rays against the layered product 15 to bond the layered product 15 to the object 20 to be processed.

Figure 3D:
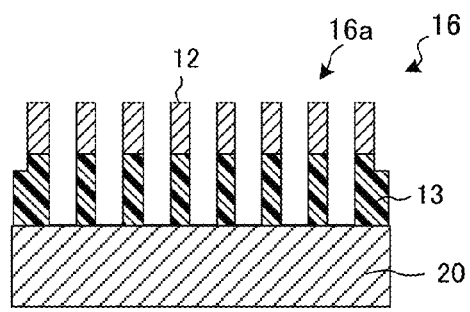
Figure 3B:
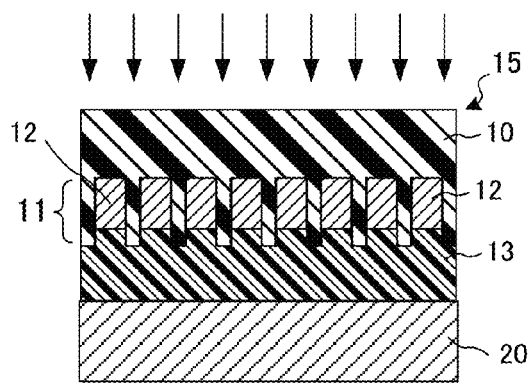
Figure 3E:
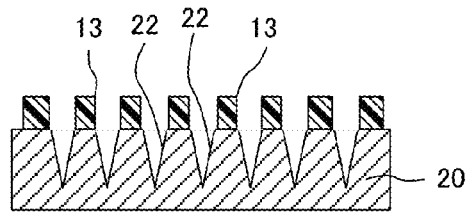
Figure 3C:
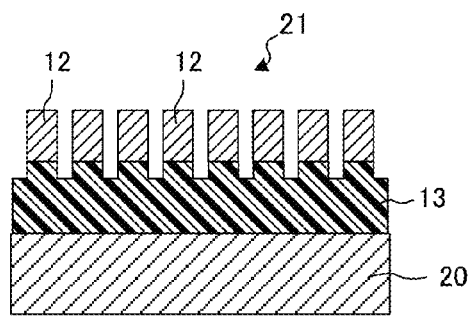

Then, as illustrated in FIG. 3C, the mold 10 is removed from the first and second mask layers 13 and 12. As a result, it is possible to obtain an intermediate product 21 including the object 20 to be processed, the first mask layer 13, and the second mask layer 12.

Figure 3F:
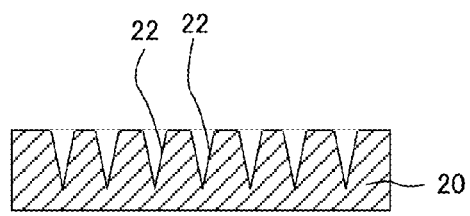

Then, the first mask layer 13 is patterned, for example, through oxygen ashing by using the second mask layer 12 as an etching mask as illustrated in FIG. 3D. As a result, a fine pattern structure 16 provided with a fine mask pattern 16a having a high aspect ratio and including the first and second mask layers 13 and 12 is obtained. In addition, for example, reactive ion etching is performed for the object 20 to be processed by using the patterned first mask layer 13 as an etching mask to form a fine pattern in a principal surface of the object 20 to be processed as illustrated in FIG. 3E. Finally, as illustrated in FIG. 3F, the first mask layer 13 remaining on the principal surface of the object 20 to be processed is eliminated to obtain the object 20 to be processed having a fine pattern 22.

In the present embodiment, the processes until the layered product 15 (second layered product 2) is obtained from the mold 10 illustrated in FIGS. 2A to 2C are performed using a single line (hereinafter, referred to as a first line). The subsequent processes in FIGS. 3A to 3F are performed using another line (hereinafter, referred to as a second line). In a preferable embodiment, the first and second lines are processed in different facilities. For this reason, in the layered product 15, for example, in a case where the mold 10 has a film shape and flexibility, the layered product 15 is stored or delivered in a roll shape. In addition, if the mold 10 has a sheet shape, a plurality of layered products 15 are stacked and then stored or delivered.

In a more preferable embodiment, the first line is a supplier line of the layered product 15, and the second line is a user line of the layered product 15. In this manner, if a supplier mass-produces the layered product 15 in advance and provides the layered product 15 to a user, the following advantages can be obtained.

(1) It is possible to fine pattern the object 20 to be processed by reflecting an accuracy of the fine pattern of the mold 10 included in the layered product 15. Specifically, the second mask layer 12 ensures an accuracy of the fine pattern of the mold 10 included in the layered product 15. Furthermore, since a precision of the thickness of the first mask layer 13 can be ensured using the layered product 15, it is possible to provide a high precision for the thickness of the first mask layer 13 transferred onto the object 20 to be processed. That is, by using the layered product 15, it is possible to transfer the second mask layer 12 and the first mask layer 13 onto a plane of the object 20 to be processed with a high precision of the thickness of the first mask layer 13 and a high transfer accuracy of the fine pattern. For this reason, by fine-patterning the first mask layer 13 using the second mask layer 12, it is possible to reflect a pattern accuracy (pattern arrangement accuracy) of the mold 10 in a plane of the object 20 to be processed and form a fine pattern structure 16 provided with the fine mask pattern 16*a* including the second and first mask layers 12 and 13 with a high precision of the thickness and a high aspect ratio. By using the fine mask pattern structure 16 having a high precision, it is possible to fabricate the object 20 to be processed with a high precision and manufacture a fine pattern by reflecting a fine pattern accuracy (pattern arrangement accuracy) of the mold 10 in a plane of the object 20 to be processed.

(2) Since an accuracy of the fine pattern can be ensured using the layered product 15, it is possible to fine-pattern the object 20 to be processed in utilities suitable for fabricating the object 20 to be processed without using a complicated process or apparatus.

(3) Since an accuracy of the fine pattern can be ensured using the layered product 15, it is possible to use the layered product 15 in a place optimal to manufacture a device using the fabricated object 20 to be processed. That is, it is possible to manufacture a device having a stable functionality.

As described above, by using the first line as a supplier line of the layered product 15 and using the second line as a user line of the layered product 15, it is possible to use the layered product 15 in an environment optimal to manufacture the object 20 to be processed and optimal to manufacture a device using the fabricated object 20 to be processed. For this reason, it is possible to improve a throughput of fabricating the object 20 to be processed and assembling a device. Furthermore, the layered product 15 is a layered product including a mold 10 and a functional layer (including the second mask layer 12 and the first mask layer 13) provided on a concavo-convex structure 11 of the mold 10. That is, an arrangement accuracy of the first and second mask layers 13 and 12 that rules a fabrication accuracy of the object 20 to be processed can be ensured by an accuracy of the concavo-convex structure 11 of the mold 10 of the layered product 15, and a thickness precision of the first mask layer 13 can be ensured by the layered product 15. As described above, by using the first line as a supplier line of the layered product 15 and using the second line as a user line of the layered product 15, it is possible to fabricate the object 20 to be processed with a high accuracy using the layered product 15 in an environment optimal to manufacture a device using the fabricated object 20 to be processed.

By the way, in the method of forming the aforementioned fine pattern, the second mask layer 12 may be formed also on the convex portion 11*b* when the second mask layer 12 is filled in the concave portion 11*a* of the concavo-convex structure 11 of the mold 10 in the first line. In a case where a fine pattern is formed on the object 20 to be processed using the layered product 1 having such a thin film, it is difficult to perform ashing of the first mask layer 13. Therefore, it is necessary to provide a separate process of eliminating the second mask layer 12 on the convex portion 11*b*. By providing the process of eliminating the second mask layer 12 on the convex portion 11*b*, a volume of the second mask layer 12 in the concave portion 11*a* is reduced, and a volume distribution increases. For this reason, a manufacturing process becomes complicated. Therefore, there is a problem in that manufacturing efficiency of the object 20 to be processed having the fine pattern 22 is degraded, and a fabrication accuracy of the object 20 to be processed is lowered.

The inventors found a fact that it is possible to address a problem in the ashing of the first mask layer 13 described above if a distance between a top position of the convex portion 11*b* of the concavo-convex structure 11 provided on the mold 10 and a surface position of the second mask layer 12 filled in the concave portion 11*a* satisfies a predetermined relationship for a height of the convex portion 11*b*, and a distance between a top position of the convex portion 11*b* of the concavo-convex structure 11 provided on the mold 10 and a surface position of the second mask layer 12 formed on the convex portion 11*b* satisfies a predetermined relationship.

That is, according to a first aspect of the present invention, there is provided a layered product for fine pattern formation used to form a fine pattern on an object to be processed using a first mask layer, the layered product including a mold having a concavo-convex structure on a surface and a second mask layer serving as a mask when the first mask layer is fabricated, wherein a distance lcc between a top position S of a convex portion of the concavo-convex structure and an interfacial position Scc of the second mask layer provided in the concave portion satisfies a predetermined range, and a distance lcv between the top position S of the convex portion and a top position Scv of the second mask layer formed on the convex portion satisfies a predetermined range.

In this layered product for fine pattern formation, the second mask layer is arranged to bury the concave portion of the concavo-convex structure, and the second mask layer having a very thin thickness is arranged on the convex portion of the concavo-convex structure, or the second mask layer is not provided. Therefore, when the layered product for fine pattern formation is deposited on the object to be processed to transfer the first and second mask layers to the object to be processed, it is possible to provide a thin thickness or substantially no thickness in the second mask layer arranged in the bottom of the fine pattern concave portion of the first mask layer provided over the object to be processed, and omit the remaining film processing in the subsequent process. As a result, it is possible to obtain a layered product consisting of [the second mask layer/the first mask layer/the object to be processed] with a thin or no remaining film and improve a fabrication accuracy of the first mask layer. For this reason, it is possible to easily form the fine mask pattern having a high aspect ratio on an object to be processed.

In the method of forming the fine pattern described above, in some cases, a fine mask pattern 16*a* having a sufficiently high aspect ratio may not be obtained when the fine pattern structure 16 having the first and second mask layers 13 and 12 obtained by ashing the first mask layer 13 is fabricated by using the second mask layer 12 as a mask in the second line.

The inventors found a fact that, by providing a predetermined second mask layer in an upper face and a side face of the first mask layer 13 provided on the object 20 to be processed, a dry etching rate in a depth direction is sufficiently larger than a dry etching rate in a plane direction, so that it is possible to form a fine mask pattern having a high aspect ratio on the object 20 to be processed.

That is, according to a second aspect of the present invention, there is provided a layered product for fine pattern formation including an object to be processed, a first mask layer that is provided on a principal surface of the object to be processed and has a concavo-convex structure on its surface, and a second mask layer provided over a concavo-convex structure of the first mask layer.

In this layered product for fine pattern formation, the first mask layer provided over the object to be processed can be protected by the second mask layer. Therefore, it is possible to perform dry etching of the first mask layer with a high anisotropic aspect ratio (vertical dry etching rate/horizontal dry etching rate) and easily perform dry etching to make a deep feature in the first mask layer. As a result, it is possible to easily transfer the fine mask pattern having a high aspect ratio (height/diameter) on a surface of the object to be processed. Therefore, it is possible to easily fabricate the object to be processed (for example, an inorganic substrate) by using the fine mask pattern having a high aspect ratio.

Hereinafter, embodiments of the present invention will be described in detail with reference to the accompanying drawings. In the following description, a layered product for fine pattern formation according to the first aspect described above and a layered product for fine pattern formation according to the second aspect described above will be described in detail.

<First Aspect>

First, a first aspect of the present invention will be described in detail. In the first aspect, a configuration of the layered product for fine pattern formation fabricated using the first line described above will be described in detail. The layered product for fine pattern formation according to the first aspect includes a mold and a second mask layer provided on the mold.

Embodiment 1

Figure 4A:
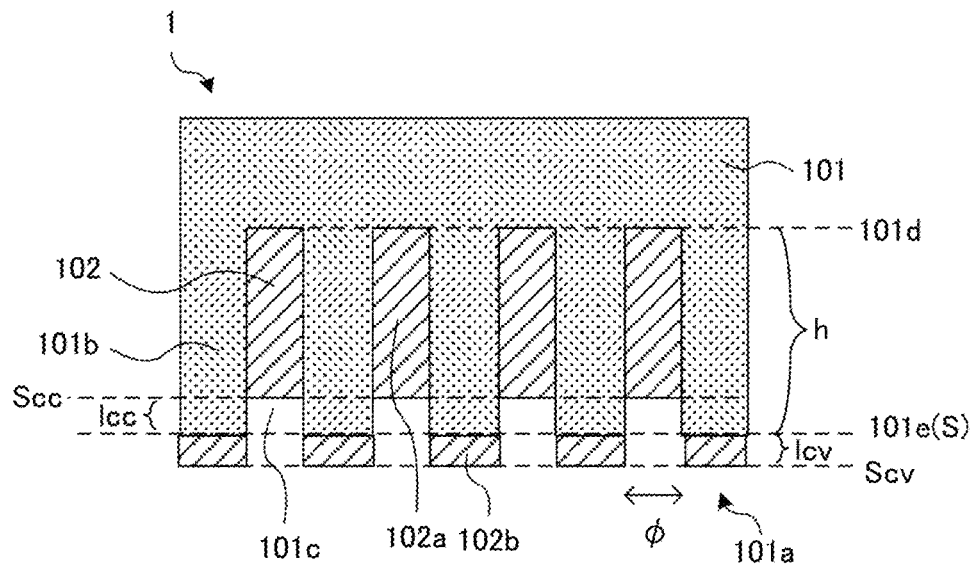
FIGS. 4A and 4B are schematic cross-sectional views illustrating an exemplary layered product for fine pattern formation according to a first aspect.

FIG. 4A is a schematic cross-sectional view illustrating a layered product for fine pattern formation (hereinafter, referred to as a first layered product 1) according to Embodiment 1 of the first aspect of the present invention. As illustrated in FIG. 4A, the first layered product 1 includes a mold 101 having a concavo-convex structure 101a (hereinafter, referred to as a "fine pattern") and a second mask layer 102 provided over the concavo-convex structure 101a of the mold 101 to form a fine pattern in the first mask layer 103.

The mold 101 is provided with a single (for example, a line shape) or a plurality of (for example, a dot shape) convex portions 101b extending in a certain direction, and a concave portions 101c are formed between the convex portions 101b. The convex portions 101b are provided to have a predetermined interval from each other along a direction perpendicular to the certain direction. That is, a plurality of convex portions 101b are formed across the entire surface of the mold 101 as seen in a plan view. In addition, the convex portions 101b protrude in a direction perpendicular to the surface of the mold from the surface of the mold 101 as seen in a cross-sectional view taken along a thickness direction approximately perpendicular to the principal surface of the first layered product 1 (as seen in a cross section perpendicular to the perpendicular direction). The convex portions 101b and the concave portions 101c constitute a concavo-convex structure (fine pattern) 101a.

The second mask layer 102 is provided to fill the concave portions 101c of the concavo-convex structure 101a and a part thereof is also provided on the convex portion 101b of the concavo-convex structure. The second mask layer 102 has a functionality of masking at least the first mask layer 103 in fabrication of the first mask layer 103 or the object 200 to be processed. The second mask layer 102 has a second mask layer 102a (hereinafter, referred to as a "mask layer 102a in the concave portion") formed in the concave portion 101c of the concavo-convex structure 101a and a second mask layer 102b (hereinafter, referred to as a "mask layer 102b on the convex portion") formed on the convex portion 101b. Here, in the present specification, a height h of the concavo-convex structure 101a refers to a height of the convex portion 101b or a depth of the concave portion 101c. In addition, the height h of the concavo-convex structure 101a is a shortest distance between a position of the bottom portion 101d of the concave portion and a position of the top portion 101e of the convex portion (top position S of the convex portion described below).

The concavo-convex structure 101a preferably has an aspect ratio of 0.1 to 5.0 as expressed as a ratio h/ϕ between the opening width ϕ and the height h. The aspect ratio is preferably set to 0.1 or higher, and more preferably 0.5 or higher from the viewpoint of a dry etching property when a fine mask pattern having a high aspect ratio is formed on the object 200 to be processed. Meanwhile, the aspect ratio is preferably set to 3.0 or lower, more preferably 2.5 or lower and further preferably 1.5 or lower from the viewpoint of a transfer accuracy of the mask layer (including the second mask layer 102 and the first mask layer 103).

Embodiment 2

Figure 4B:
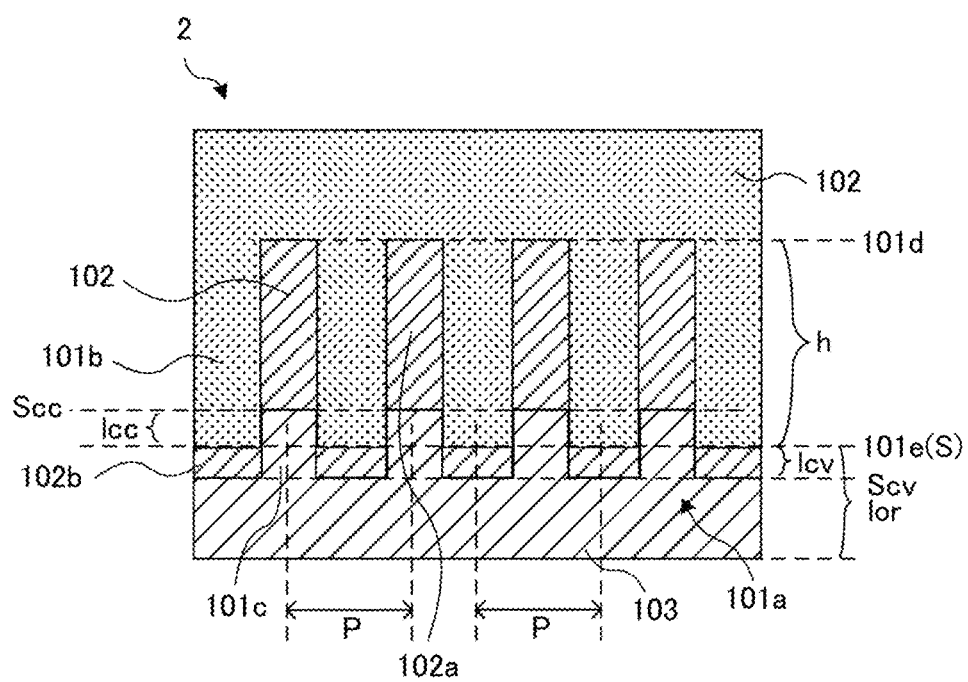

FIG. 4B is a schematic cross-sectional view illustrating a second layered product 2 of the layered product for fine pattern formation (hereinafter, referred to as a "second layered product 2") according to Embodiment 2 of the first aspect of the present invention. As illustrated in FIG. 4B, the second layered product 2 includes a first mask layer 103 provided to cover the concavo-convex structure 101a of the mold 101 and the second mask layer 102 in addition to the configuration of the first layered product 1 according to Embodiment 1 described above. The first mask layer 103 comprises, for example, an organic material and serves as a laminating layer for laminating the object 200 to be processed to the concavo-convex structure 101a of the mold 101 and the second mask layer 102. That is, the second layered product 2 has a configuration in which the first mask layer 103 for providing the first layered product 1 on the object 200 to be processed is provided in advance on the concavo-convex structure 101a of the first layered product 1 described above. The first mask layer 103 may contain a reactive diluent and a polymerization initiator. The second mask layer 102 has a functionality of masking at least the first mask layer 103 when the first mask layer 103 or the object 200 to be processed is fabricated.

In the second layered product 2, a shape of the interface between the second mask layer 102 and the first mask layer 103 may be either flat or curved. As the curved shape, the second mask layer 102 may be swollen in a convex shape toward the first mask layer 103 side, or the first mask layer 103 may be swollen in a convex shape toward the second mask layer 102 side. In addition, a structure including a single swollen portion having a convex shape from the first mask layer 103 to the second mask layer 102 and two swollen portions having a convex shape from the second mask layer 102 to the first mask layer 103, and the like may be possible.

In the second layered product 2, the phrase "to cover the concavo-convex structure 101a and the second mask layer 102" means that, in a case where the mask layer 102b is not provided on the convex portion, the first mask layer 103 is provided on the mask layer 102a in the concave portion and on the convex portion 101b of the concavo-convex structure 101a. In addition, it means that, in a case where the mask layer 102b is provided on the convex portion, the first mask layer 103 is provided on the mask layer 102a in the concave portion and the mask layer 102b on the convex portion.

Next, configurations of the first and second layered products 1 and 2 described above will be described in detail. In the following description, although the first layered product 1 is exemplarily described, it is assumed that the second layered product 2 has the same configuration unless specified otherwise.

<Top Position S of Convex Portion>

The top position S of the convex portion in FIGS. 4A and 4B refers to a top position of the convex portion 101b of the concavo-convex structure 101a. In a case where a height h of the concavo-convex structure 101a has variability, the top position S of the convex portion refers to an in-plane average position of the top positions of each convex portion 101b. An average number for obtaining the top position S of the convex portion is preferably set to 10 or higher. In addition, the top position S of the convex portion may be obtained by observing a cross-sectional image using a scanning electron microscope or a transmission electron microscope.

<Interfacial Position Scc>

The interfacial position Scc illustrated in FIGS. 4A and 4B refers to an average position of the interfaces of the second mask layers 102 (mask layers 102a in the concave portion) formed in the concave portion 101c of the concavo-convex structure 101a. In the case of the first layered product 1, this interfacial position Scc refers to a position of the interface between a surface of the mask layer 102a in the concave portion of the concavo-convex structure 101a and an air layer as illustrated in FIG. 4A. In a case where a surface position of the mask layer 102a in the concave portion has variability, the interfacial position Scc refers to an in-plane average position of the interfacial position of the second mask layer 102a of the concave portion 101c. An average number used to obtain the interfacial position Scc is preferably set to 10 or higher. In addition, the interfacial position Scc may be obtained from a cross-sectional image of the first layered product 1 using a scanning electron microscope or a transmission electron microscope. Furthermore, the interfacial position Scc may be obtained by observing a cross section in combination of a transmission electron microscope and an energy dispersive X-ray spectroscopy method.

In a case where a surface of the mask layer 102a in the concave portion forms a curved face, and this curved faces is convex downward, i.e., toward the bottom 101d of the concave portion of the concavo-convex structure 101a, a portion where the thickness of the second mask layer 102 is smallest is set to the interfacial position Scc. That is, even when the mask layer 102a in the concave portion is partially attached to the inner wall of the concave portion of the concavo-convex structure of the mold 101, a portion where the mask layer 102a in the concave portion is lowest is set to the interfacial position Scc. Meanwhile, in a case where this curved face is convex upward, i.e., toward the apex 101e of the convex portion of the concavo-convex structure 101a, a portion where the thickness of the mask layer 102a in the concave portion is largest is set to the interfacial position Scc.

In the case of the second layered product 2, the interfacial position Scc refers to an interfacial position with the first mask layer 103 of the mask layer 102a in the concave portion of the concavo-convex structure 101a as illustrated in FIG. 4B. If the interfacial position with the first mask layer 103 of the mask layer 102a in the concave portion has variability, the interfacial position Sec refers to an in-plane average position of the interfacial position with the first mask layer 103 of the mask layer 102a in the concave portion. The average number used to obtain the interfacial position Sec is preferably set to 10 or higher. In addition, the interfacial position Scc may be obtained by observing a cross-sectional image of the second layered product 2 using a scanning electron microscope or a transmission electron microscope. In addition, the interfacial position Scc may be obtained by observing a cross section in combination of a transmission electron microscope and an energy dispersive X-ray spectroscopy method.

In a case where an interface with the first mask layer 103 of the mask layer 102a in the concave portion forms a curved surface, and this curved surface is convex downward i.e., the bottom 101d of the concave portion of the concavo-convex structure 101a, a portion where the thickness of the mask layer 102a in the concave portion is smallest is set to the interfacial position Scc. That is, even when the mask layer 102a in the concave portion is partially attached to the inner wall of the concave portion of the concavo-convex structure 101a, a portion where the mask layer 102a in the concave portion is lowest is set to the interfacial position Scc. Meanwhile, in a case where this curved surface is convex upward e.g., in the apex 101e of the concave portion of the concavo-convex structure 101a, a portion where the thickness of the mask layer 102a in the concave portion is largest is set to the interfacial position Scc.

<Top Position Scv>

The top position Scv of FIGS. 4A and 4B refers to a top face position of the second mask layer 102 (mask layer 102b over the concave portion) formed on the convex portion 101b of the concavo-convex structure 101a. When the top face position of the mask layer 102b on the convex portion has variability, the top position Scv refers to an in-plane average position of the top face position of the mask layer 102b on the convex portion. An average number used to obtain the top position Scv is preferably set to 10 or higher. In addition, the top position Scv may be obtained by observing a cross-sectional image using a scanning electron microscope or a transmission electron microscope. In addition, the top position Scv may be obtained by observing a cross section in combination of a transmission electron microscope and an energy dispersive X-ray spectroscopy method.

The distance lcc of FIGS. 4A and 4B refers to a distance between the top position S of the convex portion and the interfacial position Scc. That is, the distance lcc refers to a value obtained by subtracting a thickness of the mask layer 102a in the concave portion within a surface of the concavo-convex structure 101a of the mold 101 from a height h of the concavo-convex structure 101a of a plurality of convex portions 101b within a surface of the concavo-convex structure of the mold 101. Therefore, in a case where the top position S of the convex portion or the interfacial position Scc within a surface of the concavo-convex structure 101a has variability, the distance lcc refers to an average height h of the concavo-convex structure 101a and/or an average thickness of the mask layer 102a in the concave portion. In addition, an average height h of the concavo-convex structure 101a may be obtained by observing a cross-sectional image using a scanning electron microscope or a transmission electron microscope.

Figure 5:
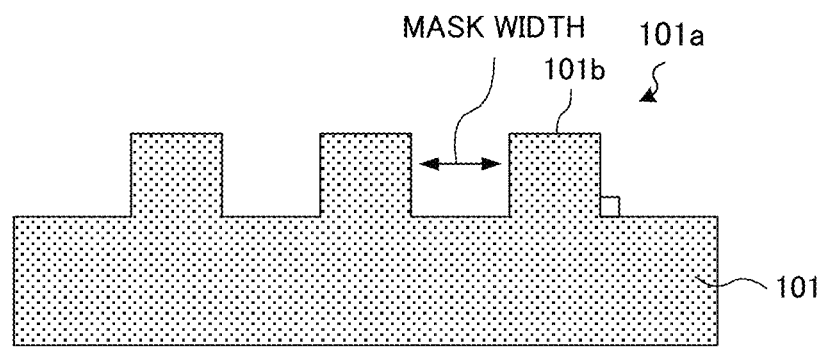
FIG. 5 is a schematic cross-sectional view illustrating a mold according to a first aspect.

As illustrated in FIG. 5, in a case where side faces of the convex portions 101b of the concavo-convex structure 101a extend in a direction perpendicular to the principal surface of the mold 101, the width of the second mask layer 102 is constant and does not have a distribution at all times regardless of variability of the distance lcc. For this reason, it is necessary that the second mask layer 102 has dry etching resistance in order to form a fine mask pattern having a high aspect ratio on the object 200 to be processed. The distance lcc is preferably set to $lcc<1.0\,h$, more preferably $lcc \leq 0.9\,h$, further preferably $lcc \leq 0.7\,h$, and particularly preferably $lcc \leq 0.6\,h$ from the viewpoint of dry etching resistance and facility of transfer of the second mask layer 102.

Figure 6:
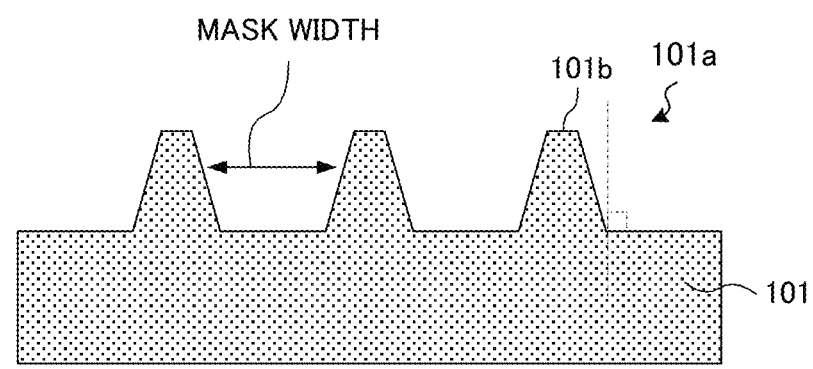
FIG. 6 is a schematic cross-sectional view illustrating a mold according to a first aspect.

Meanwhile, as illustrated in FIG. 6, in a case where side faces of the convex portions 101b of the concavo-convex structure 101a are inclined with respect to the principal surface of the mold 101, variability of the distance lcc in the second mask layer 102 affects variability of the width of the formed second mask layer 102. Variability of the width of the second mask layer 102 is associated with variability of the fine mask pattern that includes the first and second mask layers 103 and 102 formed on the object 200 to be processed and has a high aspect ratio. In addition, in a case where the object 200 to be processed is fine-patterned using the first mask layer 103, the variability of the width of the second mask layer 102 is associated with variability of the fine pattern 220 formed in the object 200 to be processed after the fabrication.

In a case where the distance lcc is set to lcc<0, the concave portion 101c of the concavo-convex structure 101a of the mold 101 is fully filled with the mask layer 102a in the concave portion. This means that a thin film of the second mask layer 102 is formed on the concavo-convex structure 101a of the mold 101. In this case, an etching accuracy is degraded when the first mask layer 103 is etched by using the second mask layer 102 as a mask in the layered product consisting of [the second mask layer 102/the first mask layer 103] transferred onto the object 200 to be processed. That is, a fabrication accuracy of the fine mask pattern provided on the object 200 to be processed with a high aspect ratio is degraded. From the aforementioned viewpoint, the distance lcc is preferably set to 0<lcc and more preferably 0.02 h≤lcc. Further preferably, the distance lcc is set to 0.05 h≤lcc, and particularly preferably 0.1 h≤lcc.

<Distance lcv>

The distance lcv of FIGS. 4A and 4B refers to a distance between the top position S of the convex portion and the top position Scv. That is, the distance lcv refers to a thickness of the mask layer 102b on the convex portion. Therefore, in a case where the top position S of the convex portion or the top position Scv has variability, the distance lcv refers to an average thickness of the mask layer 102b on the convex portion.

In addition, the distance lcv is preferably set to lcv≤0.05 h, more preferably lcv≤0.02 h, and further preferably lcv≤0.01 h in order to more easily eliminate the second mask layer 102 (mask layer 102b on the convex portion) through dry etching and improve a fabrication accuracy of the fine mask pattern provided on the object 200 to be processed with a high aspect ratio. Particularly, in a case where there is no mask layer 102b on the convex portion, that is, in the case of lcv=0, an etching accuracy or etching facility is significantly improved when the first mask layer 103 is etched by using the second mask layer 102 as a mask in the layered product consisting of [the second mask layer 102/the first mask layer 103] transferred onto the object 200 to be processed.

From the aforementioned viewpoint, in the first and second layered products 1 and 2 according to the aforementioned embodiment, a relationship between the distance lcc and the height h of the concavo-convex structure 101a satisfies Formula (1) 0<lcc<1.0 h, and a relationship between the distance lcc and the height h of the convex portion satisfies Formula (2) 0≤lcv≤0.05 h. As a result, by performing dry etching for the second mask layer 102 and the first mask layer 103 transferred onto the object 200 to be processed, it is possible to easily fabricate the first mask layer 103. As a result, it is possible to form the fine mask pattern on the object 200 to be processed with a high aspect ratio. In addition, since a precision for filling the mask layer 102a in the concave portion is improved, it is possible to improve a precision of the diameter and the height of the fine mask pattern structure formed on the object 200 to be processed through dry etching. Furthermore, since it is possible to reduce a width of the second mask layer 102 through dry etching, it is possible to obtain a physically stable fine mask pattern. If the object 200 to be processed is physically stably fabricated using the fine mask pattern with a high accuracy, it is possible to easily obtain the fine pattern 220 (refer to FIG. 10G) fabricated or transferred onto the object to be processed 220 with a high accuracy.

In the first and second layered products 1 and 2 according to the aforementioned embodiment, the distance lcc and the height h of the convex portion preferably satisfy Formula (3) 0.02 h≤lcc≤0.9 h. In this case, a transfer accuracy is more improved when the second mask layer 102 and the first mask layer 103 are transferred onto the object to be processed using the first and second layered products 1 and 2. That is, it is possible to transfer the second mask layer 102 and the first mask layer 103 onto the object 200 to be processed by reflecting an accuracy of the concavo-convex structure 101a of the mold 101. In addition, since a precision for filling the mask layer 102a in the concave portion is more improved, it is possible to more improve a precision of the height and the diameter of the fine mask pattern formed on the object 200 to be processed with a high aspect ratio through dry etching. Furthermore, it is possible to increase a diameter of the fine mask pattern provided on the object 200 to be processed through dry etching and improve a physical stability of the fine mask pattern. As described above, since it is possible to form the fine mask pattern on the object 200 to be processed with a higher accuracy in a physically stable state through dry etching, it is possible to easily obtain the fine pattern 220 transferred onto the object 200 to be processed with a high accuracy.

Furthermore, in the first and second layered products 1 and 2 according to the aforementioned embodiment, a relationship between the distance lcv and the height h of the convex portion preferably satisfies Formula (4) 0≤lcv≤0.01 h, and the distance lcv preferably satisfies Formula (5) lcv=0. In this case, since the thickness of the mask layer 102b on the convex portion can be remarkably reduced, it is possible to easily fabricate the first mask layer 103 with a high precision when dry etching is performed for the second mask layer 102 and the first mask layer 103 transferred onto the object 200 to be processed. Particularly, it is possible to more improve a precision of the height and the diameter of the fine mask pattern formed on the object 200 to be processed with a high aspect ratio through dry etching. Particularly, in a case where there is no mask layer 102b on the convex portion, that is, in the case of lcv=0, it is possible to form a fine pattern 220 through dry etching on the object 200 to be processed by reflecting an arrangement accuracy of the concavo-convex structure 101a of the mold 101.

In the second layered product 2, the distance lor of FIG. 4B refers to a distance between the top position Scv of the mask layer 102b on the convex portion and the surface position of the first mask layer 103. Therefore, in a case where the top position Scv or the surface position of the first mask layer 103 has variability in a plane, an average value of the distances lor is used as the distance lor. The average value used to obtain the distance lor is preferably set to 10 or higher. In addition, in a case where there is no mask layer 102b on the convex portion, that is, in the case of lcv=0, the distance lor becomes a distance between the top position S of the convex portion and the surface position of the first mask layer 103.

Figure 7:
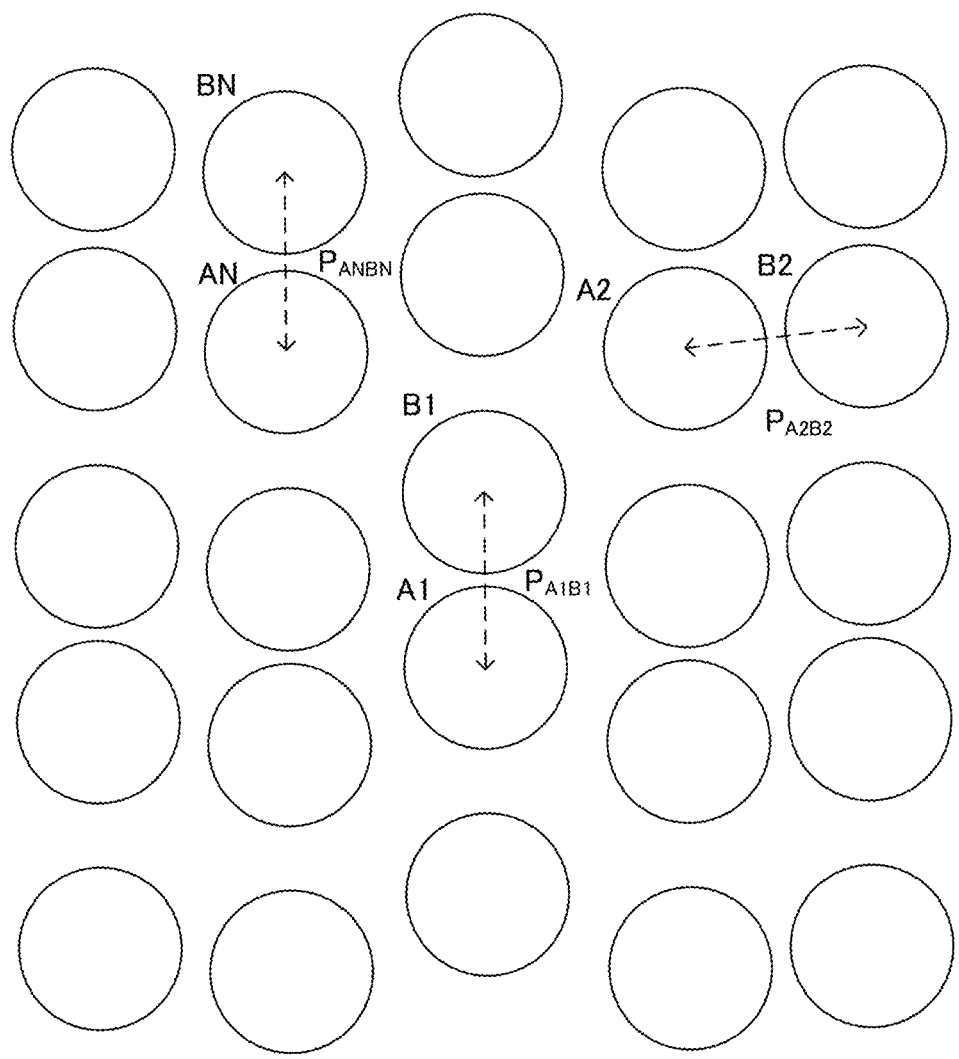
FIG. 7 is an explanatory diagram illustrating a pitch of a fine pattern in a layered product for fine pattern formation according to a first aspect.

In the second layered product 2, the distance P of FIG. 4B refers to a distance between centers of the neighboring convex portions 101b of the concavo-convex structure 101a or a distance between centers of the neighboring concave portions 101c. In a case where the concavo-convex structure 101a has a dot structure (or hole structure, similarly applied hereinafter), as illustrated in FIG. 7, a dot B1 nearest to a certain dot (or hole, similarly applied hereinafter) A1 is selected, and a distance $P_{A1B1}$ between the center of the dot A1 and the center of the dot B1 is defined as a pitch P. As illustrated in FIG. 7, in a case where the pitch P is different depending on the selected dot, a plurality of arbitrary dots are selected, and pitches P are obtained for each selected dot, so that an arithmetic average value of the pitches P is defined as a pitch P of the concavo-convex structure 101a. That is, it is defined that $(P_{A1B1}+P_{A2B2}+ \ldots +P_{ANBN})/N=P$. The arithmetic average number N is preferably set to 10 or higher. In addition, the pitch P may be obtained by observing a cross-sectional image using a scanning electron microscope or a transmission electron microscope. In a case where the pitch P is obtained from the cross-sectional image, the center of the dot described above is set to the center position of the apex of the convex portion.

Figure 8:
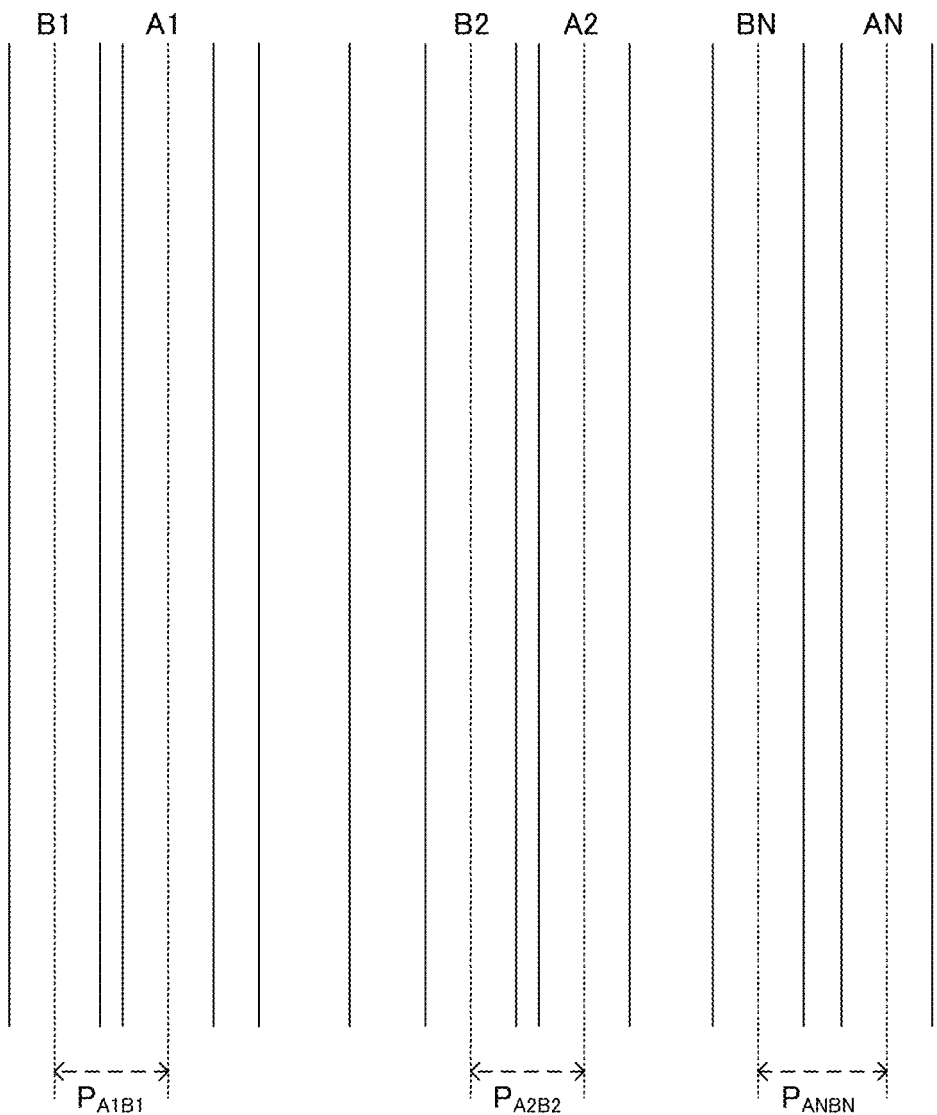
FIG. 8 is an explanatory diagram illustrating a pitch of a fine pattern in a layered product for fine pattern formation according to a first aspect.

Meanwhile, in a case where the concavo-convex structure 101a has a line-and-space structure, a convex line B1 nearest to a certain convex line (or concave line, similarly applied hereinafter) A1 is selected as illustrated in FIG. 8, and the shortest distance $P_{A1B1}$ between the center line of the convex line A1 and the center line of the convex line B1 is defined as the pitch P. As illustrated in FIG. 8, in a case where the pitch P is different depending on the selected convex line, a plurality of arbitrary convex lines are selected, and pitches P of each selected convex line are obtained, so that an arithmetic average value of the obtained pitches is defined as the pitch P of the concavo-convex structure 101a. That is, it is defined that $(P_{A1B1}+P_{A2B2}+ \ldots +P_{ANBN})/N=P$. The arithmetic average number N is preferably set to 10 or higher. In addition, the pitch P may be obtained by observing a cross-sectional image using a scanning electron microscope or a transmission electron microscope. In a case where the pitch P is obtained from the cross-sectional image, the center line of the convex line described above is set to the center position of the apex of the convex portion.

A ratio lor/P between the distance lor and the pitch P is preferably set to lor/P≤5 (Formula (15)), and more preferably lor/P≤4 from the viewpoint of a dry etching characteristic of the first mask layer 103 and the second mask layer 102 transferred onto the object 200 to be processed. The ratio lor/P is preferably set to lor/P≤2.5 in order to suppress a collapse of the pillar (fine mask pattern) including the second mask layer 102 and the first mask layer 103 in the dry etching. Meanwhile, the ratio lor/P is preferably set to lor/P≥0.05 from the viewpoint of the laminating and transfer accuracy. The distance lor is preferably set to 0 nm or longer from the viewpoint of a transfer accuracy. The distance lor is preferably set to 1500 nm or shorter from the viewpoint of a dry etching accuracy. An distribution of the distance lor is preferably set to approximately ±30%, more preferably ±25%, and most preferably ±10% from the viewpoint of variability of the width of the first mask layer 103 on the object 200 to be processed after the etching of the first mask layer 103, depending on the pitch P of the concavo-convex structure 101a.

From the aforementioned viewpoint, in the second layered product 2 according to the embodiment described above, a relationship between the distance lor and the pitch P of the concavo-convex structure 101a preferably satisfies Formula (6) 0.05≤lor/P≤5. In this case, since a laminating and transfer accuracy of the second layered product 2 to the object 200 to be processed is satisfactory, a precision of the layered product 201 consisting of [the object 200 to be processed/the first mask layer 103/the second mask layer 102] is improved. In addition, a dry etching characteristic after the transfer becomes satisfactory, so that it is possible to transfer the fine mask pattern having a high aspect ratio to the object 200 to be processed with a high precision. A distribution of the distance lor of the first mask layer 103 may be set to the pitch of the fine pattern of the mold 101. The distribution of the distance lor is preferably set to approximately ±30%, more preferably ±25%, and most preferably ±10% from the viewpoint of variability of the width of the first mask layer 103 on the object 200 to be processed, depending on the pitch of the fine pattern of the mold 101.

Figure 9A:
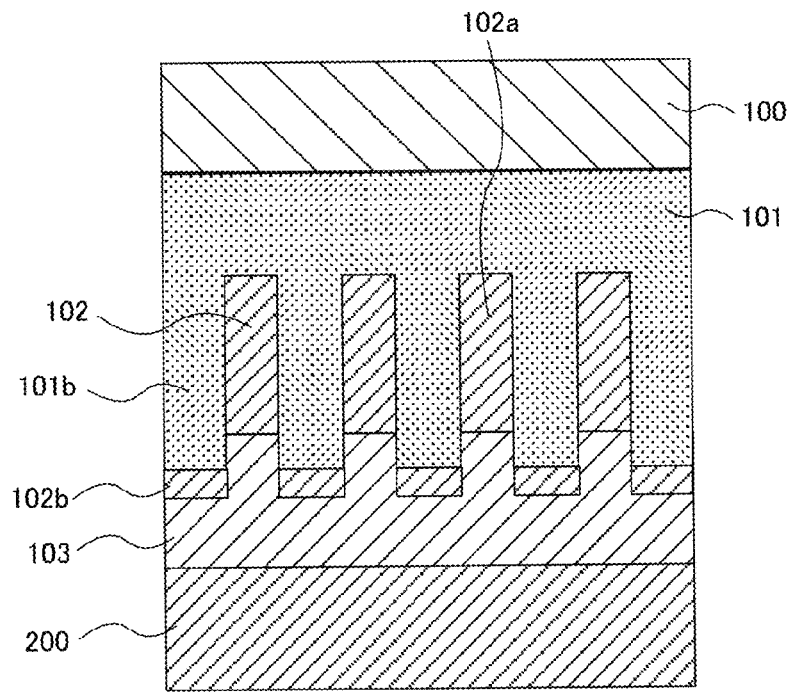
FIGS. 9A and 9B are schematic cross-sectional views illustrating another example of the layered product for fine pattern formation according to a first aspect.
Figure 9B:
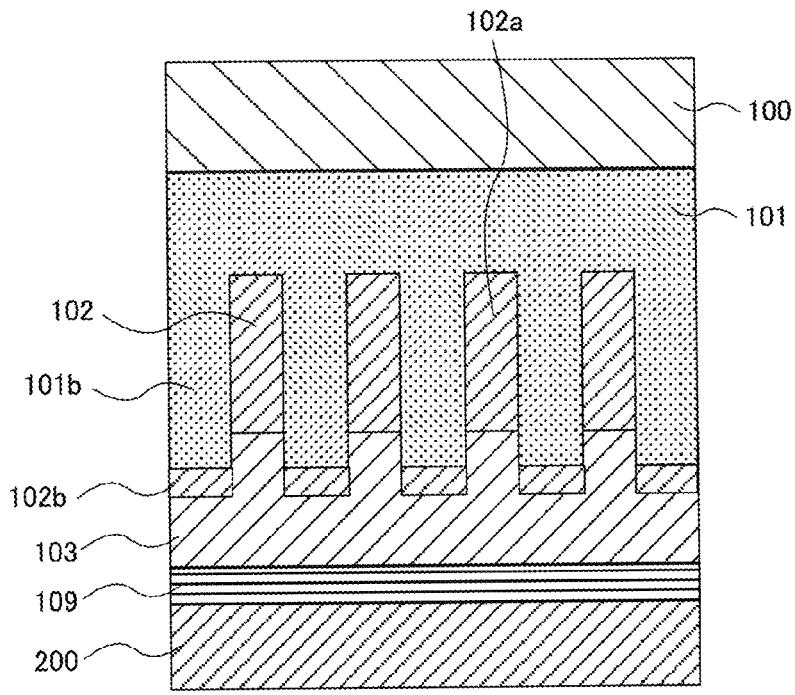

As illustrated in FIG. 9, in the second layered product 2, the object 200 to be processed may be provided in the side opposite to the concavo-convex structure 101a of the first mask layer 103. In this case, as illustrated in FIG. 9A, the object 200 to be processed may be provided on a surface of the first mask layer 103. Alternatively, as illustrated in FIG. 9B, a hard mask layer 109 may be provided on a principal surface of the object 200 to be processed, and a surface of the first mask layer 103 may be provided on the hard mask layer 109. In addition, although not illustrated in FIG. 9, similar to the second layered product 2, the first layered product 1 may also has a configuration in which a surface of the hard mask 109 of the object 200 to be processed having the hard mask layer 109 in advance may be laminated to a surface of the concavo-convex structure 101a of the first layered product 1 by interposing the first mask layer 103.

If the hard mask layer 109 is provided, it is possible to form a fine mask pattern including the first and second mask layers 103 and 102 on the hard mask layer 109 with a high aspect ratio by performing dry etching for the first and second mask layers 103 and 102 transferred onto the hard mask layer 109. It is possible to easily fine-pattern the hard mask layer 109 by using the fine mask pattern as a mask. If the hard mask pattern which is obtained by fine-patterning of the hard mask layer 109 is used as a mask, it is possible to easily etch the object 200 to be processed. Particularly, by applying the hard mask layer 109, applicability of wet etching as well as dry etching is also improved when the object 200 to be processed is fabricated to obtain the fine pattern 220 on the object 200 to be processed.

A material of the hard mask layer 109 is not particularly limited if it is determined based on a etching selectivity between the hard mask layer 109 and the object 200 to be processed {(etching rate of object 200 to be processed)/(etching rate of hard mask layer 109)}. The etching selectivity {(etching rate of object 200 to be processed)/(etching rate of hard mask layer 109)} is preferably set to 1 or higher, and more preferably 3 or higher from the viewpoint of workability. The etching selectivity is preferably set to 5 or higher, and more preferably 10 or higher in order to increase the aspect ratio of the fabricated object 200 to be processed. The etching selectivity is further preferably set to 15 or higher in order to thin the hard mask layer 109. A material of the hard mask layer 109 may include, for example, but not particularly limited to, silica, titania, spin-on glass (SOG), spin-on carbon (SOC), chromium, aluminum, oxides thereof, and the like. From the viewpoint of workability in etching, a thickness of the hard mask layer 109 is preferably set to 5 nm or greater and 500 nm or smaller, more preferably 5 nm or greater and 300 nm or smaller, and most preferably 5 nm or greater and 150 nm or smaller.

In addition, the hard mask layer 109 may have a multilayer structure. Here, a multilayer structure refers to a lamination in a thickness direction of the hard mask layer 109. For example, a first hard mask layer 109(1) may be provided on a principal surface of the object 200 to be processed, and a second hard mask layer 109(2) may be provided on the first hard mask layer 109(1). Similarly, the (N+1)th hard mask layer 109(N+1) may be provided on the (N)th hard mask N. The number of layers of the hard mask layer 109 is preferably set to 10 or smaller, more preferably 5 or smaller, and most preferably 3 or smaller from the viewpoint of workability of the hard mask layer 109 and a fabrication accuracy of the object 200 to be processed.

In a case where the hard mask layer 109 has a multilayered structure, a thickness of each layer is preferably set to 5 nm or greater and 150 nm or smaller. In addition, a total thickness of all layers, including the case of a single layer, is preferably set to 500 nm or smaller. Particularly, the total thickness is preferably set to 300 nm or smaller, and more preferably 150 nm or smaller.

As a configuration of the two-layered hard mask layer 109, for example, a film of $SiO_2$ may be formed on a principal surface of the object 200 to be processed, and a film of Cr may be formed on the film of $SiO_2$. Alternatively, as a configuration of the three-layered hard mask layer 109, for example, a film of $SiO_2$ is formed on a principal surface of the object 200 to be processed, a film of Cr is formed on the film of $SiO_2$, and a film of $SiO_2$ is formed on the film of Cr. Alternatively, a film of $SiO_2$ is formed on a principal surface of the object 200 to be processed, a film of SOG is formed on the film of $SiO_2$, and a film of SOC is formed on the film of SOG. Alternatively, a film of $SiO_2$ is formed on a principal surface of the object 200 to be processed, a film of SOC is formed on the film of $SiO_2$, and a film of SOG is formed on the film of SOC, and the like.

Figure 10A:
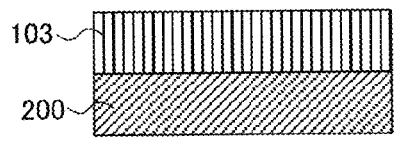
FIGS. 10A to 10G are explanatory diagrams illustrating a method of forming a fine pattern using the layered product for fine pattern formation according to a first aspect.

Here, a method of forming a fine pattern using the first layered product 1 will be shortly described. As illustrated in FIG. 10A, first, the first mask layer 103 is laminated on the object 200 to be processed. Then, as illustrated in FIG. 10B, a surface having the concavo-convex structure 101a of the first layered product 1 and a principal surface of the object 200 to be processed are laminated by interposing the first mask layer 103. Then, as illustrated in FIG. 10C, the first mask layer 103 is set by irradiating ultraviolet rays and the like, and adhesiveness between the first mask layer 103 and the object 20 to be processed and adhesiveness between the first and second mask layers 103 and 102 are fixed.

Figure 10D:
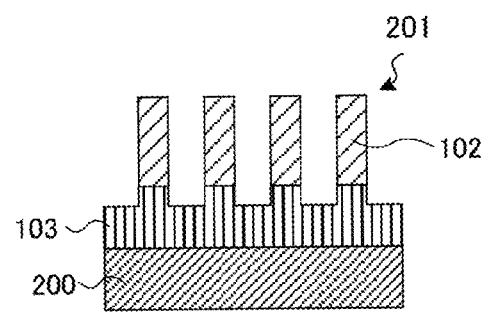
Figure 10B:
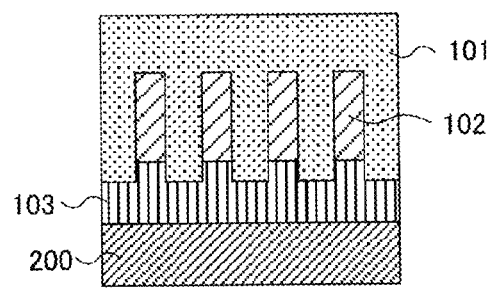
Figure 10E:
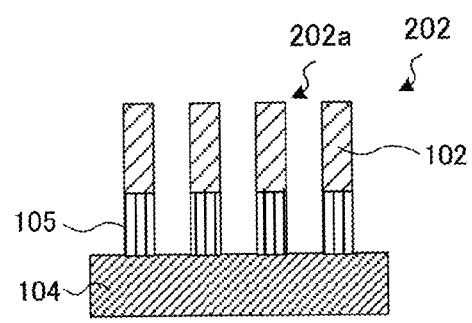
Figure 10C:
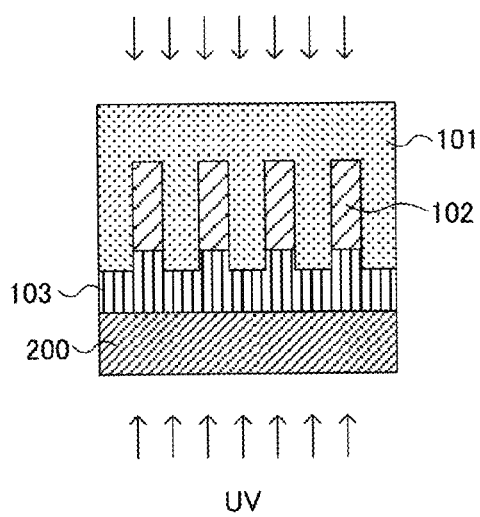

Then, as illustrated in FIG. 10D, the concavo-convex structure 101a of the mold 101 is transferred onto the object 200 to be processed by using the first and second mask layers 103 and 102 by removing the mold 101, so that a layered product 201 consisting of [the second mask layer 102/the first mask layer 103/the object 200 to be processed] can be obtained. Then, as illustrated in FIG. 10E, the first mask layer 103 is etched by using the second mask layer 102 of the obtained layered product 201 as a mask, so that a fine pattern structure 202 having a fine pattern (hereinafter, referred to as a "fine mask pattern 202a") with a high aspect ratio is obtained on the object 200 to be processed. This fine mask pattern 202a comprises [the fine-patterned second mask layer 102/the fine-patterned first mask layer 103].

Figure 10F:
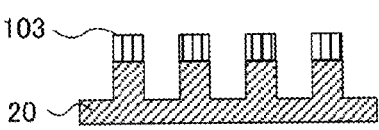
Figure 10G:
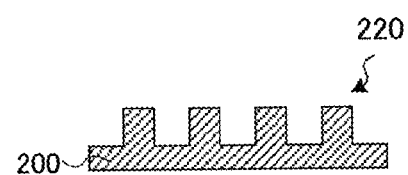

The obtained fine mask pattern 202a forms a nanostructure corresponding to the concavo-convex structure 101a of the mold 101 and has a high aspect ratio. For this reason, a water-repellent property is exhibited by modifying a surface of the obtained fine mask pattern 202a to have hydrophobicity, and a hydrophilic property is exhibited by modifying the surface of the fine mask pattern 202a to have hydrophilicity. If a metal is selected as the second mask layer 102, for example, it is possible to build a sensor capable of detecting a minor substance using a surface plasmon (surface plasmon-polariton). In addition, if the pattern is minute and has a high aspect ratio, structural adherence is exhibited, so that it is possible to use the pattern surface having a high aspect ratio as an adhesive layer. Furthermore, if the fine mask pattern 202a is used as a etching mask, it is possible to easily perform fabrication even when the object 200 to be processed is a difficult processing material as illustrated in FIG. 10F. Finally, it is possible to obtain an object 200 to be processed having the fine pattern 220 by eliminating remnants (first mask layer 103) on the object 200 to be processed as illustrated in FIG. 10G.

Figure 11A:
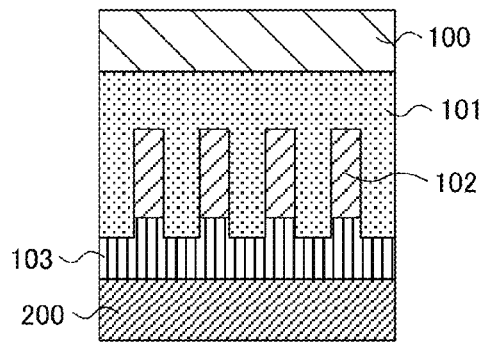
FIGS. 11A to 11F are explanatory diagrams illustrating a method of forming a fine pattern using the layered product for fine pattern formation according to a first aspect.
Figure 11B:
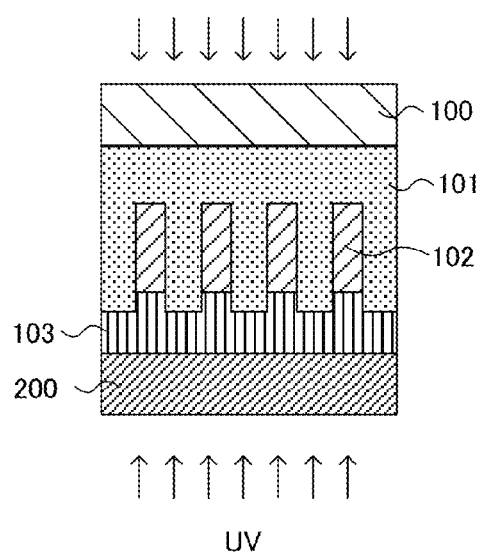

Next, a method of forming a fine pattern using the second layered product 2 will be shortly described. As illustrated in FIG. 11A, the first mask layer 103 of the second layered product 2 and the object 200 to be processed are laminated. Then, as illustrated in FIG. 11B, by irradiating ultraviolet rays and the like, adhesiveness between the first mask layer 103 and the object 200 to be processed and adhesiveness between the first and second mask layers 103 and 102 are set.

Figure 11C:
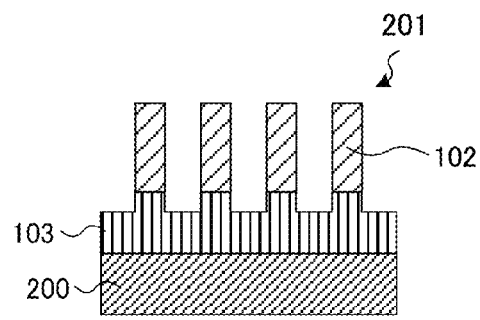
Figure 11D:
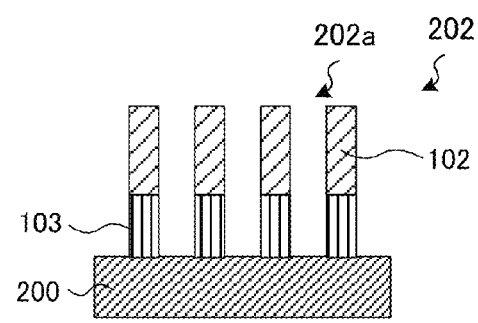
Figure 11E:
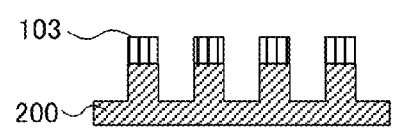
Figure 11F:
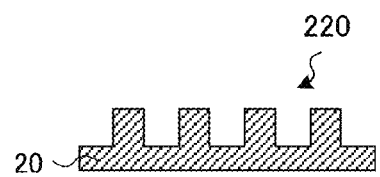

Then, by removing the mold 101 from the first and second mask layers 103 and 102 as illustrated in FIG. 11C, it is possible to obtain a layered product 201 consisting of [the second mask layer 102/the first mask layer 103/the object 200 to be processed]. Then, as illustrated in FIG. 11D, if the first mask layer 103 is etched by using the second mask layer 102 of the obtained layered product 201 as a mask, a fine pattern structure 202 provided with the fine mask pattern 202a having a high aspect ratio on the object 200 to be processed is obtained. That is, it is possible to form the fine mask pattern 202a consisting of [the fine-patterned second mask layer 102/the fine-patterned first mask layer 103] on the object 200 to be processed. This fine mask pattern 202a may be used similarly to the fine mask pattern 202a obtained using the first layered product 1. In addition, as illustrated in FIG. 11E, even when the object 200 to be processed is a difficult processing materilal, it is possible to easily perform fabrication. Finally, it is possible to obtain an object 200 to be processed having the fine pattern 220 by eliminating remnants (first mask layer 103) on the object 200 to be processed as illustrated in FIG. 11F.

In this manner, if the second mask layer 102 is transferred onto the object 200 to be processed by interposing the first mask layer 103 using the first layered product 1 to obtain the layered product 201, and fine-patterning (etching) is then performed for the first mask layer 103 by using the second mask layer 102 as a mask, it is possible to easily transfer the fine mask pattern 202a onto the object 200 to be processed with a high aspect ratio by reflecting an arrangement accuracy of the concavo-convex structure 101a of the mold 101 and obtain the fine pattern structure 202.

Similar to the second layered product 2, if the first mask layer 103 is prepared in advance, it is possible to transfer the layered product 201 consisting of [the second mask layer 102/the first mask layer 103/the object 200 to be processed] onto the object 200 to be processed using the second layered product 2 by directly laminating the second layered product 2 to the object 200 to be processed without separately forming the first mask layer 103 on the object 200 to be processed. As a result, it is possible to exclude an especial technique such as filling or uniform pressing of the first mask layer 103 in the nanoimprint lithography (transfer) and perform transfer using a general method such as lamination. Therefore, it is possible to more conveniently obtain the layered product 201. Furthermore, by using the second layered product 2, it is possible to ensure a thickness distribution of the first mask layer 103 based on a coating accuracy of the first layered product 1 on the concavo-convex structure 101a. That is, it is possible to more reduce a thickness distribution of the first mask layer 103 through laminating and transfer onto the object 200 to be processed. Therefore, in the layered product 201, it is possible to improve a thickness accuracy precision of the first mask layer 103 within a plane of the object 200 to be processed and improve a distribution precision of the fine mask pattern 202a formed through etching on the object 200 to be processed. For this reason, by using the second layered product 2, it is possible to improve a distribution precision of the fine mask pattern 202a within a plane of the object 200 to be processed and reduce an in-plane distribution of the exhibited functionalities. In a case where the object 200 to be processed is fabricated by using the fine mask pattern 202a as a mask, the fine pattern 220 of the fabricated object 200 to be processed has a high distribution precision within a plane of the object 200 to be processed.

In the method of forming a fine pattern 220 on a surface of the object 200 to be processed using the first and second layered products 1 and 2 described above, the fabrication of the first mask layer 103 performed by using the second mask layer 102 as a mask is preferably performed by dry etching in order to form the fine mask pattern 202a on the object 200 to be processed. A ratio Vo1/Vm1 between the etching rate Vm1 of the second mask layer 102 and the etching rate Vo1 of the first mask layer 103 in this dry etching affects a fabrication accuracy when the first mask layer 103 is etched by using the second mask layer 102 as a mask. If Vo1/Vm1>1, that means the second mask layer 102 is more difficultly etched in comparison with the first mask layer 103. Therefore, it is preferable that the ratio Vo1/Vm1 be higher. The ratio Vo1/Vm1 is preferably set to Vo1/Vm1≤1000, more preferably Vo1/Vm1≤150, and most preferably Vo1/Vm1≤100 from the viewpoint of arrangement of the second mask layer 102 in the concave portion 101c of the concavo-convex structure 101a of the mold 101.

From the aforementioned viewpoint, in the second layered product 2, a ratio Vo1/Vm1 between the etching rate Vm1 of the second mask layer 102 and the etching rate Vo1 of the first mask layer 103 preferably satisfies Formula (7) 3≤Vo1/Vm1. As a result, etching resistance of the second mask layer 102 is improved, and the etching amount of the second mask layer 102 is reduced, so that it is possible to form the fine pattern structure 202.

The ratio Vo1/Vm1 is more preferably set to 10≤Vo1/Vm1, and further preferably 15≤Vo1/Vm1. If the ratio Vo1/Vm1 satisfies the aforementioned range, it is possible to easily fine-pattern the first mask layer 103 through dry etching by using the second mask layer 102 as a mask even when the first mask layer 103 having a thickness is used. As a result, it is possible to form the fine-patterned fine mask pattern 202a on the object 200 to be processed. If such a fine mask pattern 202a is used, it is possible to easily perform dry etching for the object 200 to be processed and allow the object 200 to be processed to have a super water-repellent property, a super hydrophilicity, adhesiveness, and a sensor functionality. For example, in the case of a sensor, a sensor can be manufactured by selecting gold or silver as a metal in the second mask layer 102. In a case where a minor substance (such as a molecule serving as an indicator for measuring a progress or invasiveness of a certain disease) is attached to such a metal surface, even a minute concentration such as ppm or ppb, which is difficult to measure, can be detected using a surface plasmon (surface plasmon-polariton) of the metal surface by increasing a sensitivity by an optical system.

Meanwhile, etching anisotropy in the etching of the first mask layer 103 (ratio $Vo_\perp/Vo_{//}$ between horizontal etching rate $Vo_{//}$ and vertical etching rate $Vo_\perp$ is preferably set to $Vo_\perp/Vo_{//}>1$. Higher etching anisotropy is more preferable. The vertical direction refers to a thickness direction of the first mask layer 103, and the horizontal direction refers to an in-plane direction of the first mask layer 103. The ratio $Vo_\perp/Vo_{//}$ is, in general, preferably set to $Vo_\perp/Vo_{//}\geq 2$, more preferably $Vo_\perp/Vo_{//}\geq 3.5$, and further preferably $Vo_\perp/Vo_{//}\geq 10$, from the viewpoint of forming the fine mask pattern 202a on the object 200 to be processed, depending on a field of use. In a case where the object 200 to be processed is fabricated using the obtained fine mask pattern 202a, it is necessary to maintain a large width (diameter) of the first mask layer 103 in order to stably form the first mask layer 103, which is high, and easily perform dry etching for the object 200 to be processed in a submicron or smaller range of the pitch. If the aforementioned range is satisfied, it is possible to maintain a large width (an interval of lines) of the first mask layer 103 after dry etching, which is desirable.

The object 200 to be processed may be appropriately selected without a particular limitation depending on a field of use (such as a water-repellent property, hydrophilicity, adhesiveness, a sensor, or a mask for fabricating a substrate) of the fine pattern structure 202. For this reason, the object 200 to be processed may include a resin film, a resin plate, a resin lens, an inorganic substrate, an inorganic film, an inorganic lens, and the like.

Particularly, in a case where the object 200 to be processed is fabricated by using the fine mask pattern 202a as a mask, the object 200 to be processed may include, for example, an inorganic substrate such as composite quartz, quartz such as fused quartz, non-alkali glass, low-alkali glass, glass such as soda-lime glass, a silicon wafer, a nickel plate, sapphire, diamond, SiC, mica, ZnO, a semiconductor substrate (such as a nitride semiconductor substrate), or indium tin oxide (ITO). In addition, in a case where the first and second layered products 1 and 2 have flexibility, the object 200 to be processed may include an inorganic substrate having an external shape having a curvature (such as a lens shape, a cylindrical/pillar shape, or a spherical shape). Particularly, in a case where the first and second layered products 1 and 2 have a film shape (such as a reel shape), widths of the first and second layered products 1 and 2 can be easily changed by cutting out the film. As a result, the fine mask pattern 202a can be arbitrarily formed on a surface of the object 200 to be processed with a predetermined width. For this reason, for example, in a case where the object 200 to be processed has a cylindrical shape, the fine mask pattern 202a may be formed on a part of or the entire lateral side of the cylinder.

In the second layered product 2, it is preferable that a ratio Vo2/Vi2 between the etching rate Vi2 of the object 200 to be processed and the etching rate Vo2 of the first mask layer 103 in the dry etching be smaller. If Vo2/Vi2<1, the etching rate of the first mask layer 103 is smaller than the etching rate of the object 200 to be processed, so that it is possible to easily fabricate the object 200 to be processed.

In the second layered product 2, the ratio Vo2/Vi2 of the etching rate preferably satisfies Formula (8) Vo2/Vi2≤3. As a result, a coating property and an etching accuracy of the first mask layer 103 are improved, so that it is possible to form the fine pattern structure 202. In addition, the ratio Vo2/Vi2 of the etching rate is more preferably set to Vo2/Vi2≤2.5. Further preferably, the ratio Vo2/Vi2 is set to Vo2/Vi2≤2 in order to reduce a thickness of the first mask layer 103. Most preferably, the ratio Vo2/Vi2 satisfies Formula (9) Vo2/Vi2≤1. If the Formula (9) is satisfied, a fabrication accuracy is more improved when the object 200 to be processed is fabricated by using the fine mask pattern 202a formed on the object 200 to be processed as a mask. Furthermore, a configuration controllability of the fine pattern 220 provided on the object 200 to be processed is improved.

In this manner, the first layered product 1 according to the aforementioned embodiment has a configuration in which the mask layer 102a is arranged in the concave portion to bury the concave portion 101c of the concavo-convex structure 101a, and the very thin mask layer 102b on the convex portion is arranged or is not arranged on the convex portion 101a of the concavo-convex structure 101a. As a result, when the layered product 201 consisting of [the second mask layer 102/the first mask layer 103/the object 200 to be processed] is manufactured by laminating the first layered product 1 onto the object 200 to be processed by interposing the first mask layer 103, the second mask layer 102 (the mask layer 102b on the convex portion) arranged in the bottom of the concave portion of the first mask layer 103 on the object 200 to be processed may have a thin thickness or substantially no thickness. As a result, in the dry etching process for forming the fine mask pattern 202a on the object 200 to be processed, it is possible to omit a process of eliminating the second mask layer 102 (the mask layer 102b on the convex portion) corresponding to a remaining film arranged in the bottom of the concave portion of the first mask layer 103 of the layered product 201. Therefore, it is possible to improve a fabrication accuracy of the fine mask pattern 202a formed on the object 200 to be processed and improve an accuracy of the fine pattern 220 provided by further performing fabrication on the object 200 to be processed.

In the case of the second layered product 2, when the layered product 201 including the first and second mask layers 103 and 102 is manufactured on the object 200 to be processed by laminating the first mask layer 103 onto the object 200 to be processed, the second mask layer 102 (the mask layer 102 b on the convex portion) arranged in the concave portion of the first mask layer 103 may have a thin thickness or substantially no thickness. Therefore, similar to the advantages of the first layered product 1, it is possible to maintain a high accuracy of the fine pattern 220 provided in the object 200 to be processed and the fine mask pattern 202a provided on the object 200 to be processed. Furthermore, it is possible to easily fine-pattern the first mask layer 103 if a ratio of the etching rate between the first and second mask layers 103 and 102 satisfies a predetermined condition. Therefore, it is possible to stably form the fine mask pattern 202a on the object 200 to be processed.

Particularly, in a state the aforementioned distance satisfies a condition lcv=0, that is, no second mask layer 102b is arranged on the convex portion 101b of the concavo-convex structure 101a of the mold 101, the remaining film described above does not exist. That is, in the layered product 201 consisting of [the second mask layer 102/the first mask layer 103/the object 200 to be processed], the second mask layer 102 is not arranged in the bottom of the concave portion of the concavo-convex structure of the first mask layer 103. Therefore, easiness for forming the fine mask pattern 202a on the object 200 to be processed is further improved, and a local and in-plane precision of the fine mask pattern 202a in the fine pattern structure 202 is improved, which is desirable.

Hereinafter, materials of each element of the first and second layered products 1 and 2 and the like will be described in detail.

[Mold]

Figure 13A:
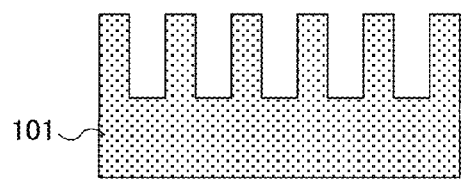
FIGS. 13A and 13B are schematic cross-sectional views illustrating an exemplary mold according to a first aspect.
Figure 13B:
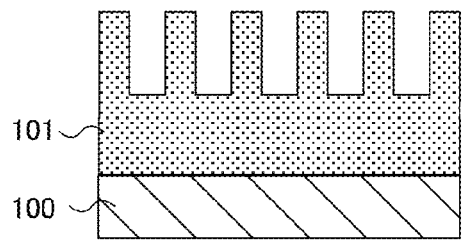

The shape of the mold 101 is not particularly limited if a concavo-convex structure 101a is formed on its surface, and preferably includes a flat plate shape, a film shape, or a reel shape. The mold 101 may be formed without using a support member 100 as illustrated in FIG. 13A or may be formed over the support member 100 as illustrated in FIG. 13B.

The mold 101 that does not include the support member 100 may be soft and include a soft film-like mold comprising polydimethylsiloxane (PDMS), COP, polyimide, polyethylene, PET, and fluororesin, or thermoplastic resin. In addition, a plate mold consisting of an inorganic material may be used as the mold 101. The inorganic material may include, for example, quartz, glass, silicon, nickel, diamond-like carbon, fluorine-containing diamond-like carbon, SiC, diamond, chromium, sapphire, or the like.

By using a hard and plate mold 101, it is possible to maintain a high surface accuracy of the mold 101. Here, the surface accuracy refers to a parallelism between the top position S of the convex portion of the concavo-convex structure 101a of the mold 101 and the surface opposite to the concavo-convex structure 101a. It is possible to maintain a high surface accuracy of the fabricated layered product 201 (a parallelism between a principal surface of the object 200 to be processed and a surface including an apex of the second mask layer 102) by using a layered product for fine pattern formation with a mold 101 having a high parallelism (surface accuracy). As a result, it is possible to improve a surface accuracy of the fine mask pattern 202a of the fine pattern layered product 201 fabricated through dry etching (a parallelism between a principal surface of the object 200 to be processed and a surface including an apex of the second mask layer 102). Therefore, it is possible to maintain a high surface accuracy (a parallelism between the surface including the apex of the fine pattern 220 of the object 200 to be processed and the surface including the bottom of the concave portion of the fine pattern 220) of the fine pattern 220 of the fabricated object 200 to be processed.

For example, in a case where a sapphire substrate is fine-patterned as the object 200 to be processed, in order to improve both internal quantum efficiency and light-emission efficiency of an LED, a size and a distribution of the fine pattern 220 fabricated on the sapphire substrate are important. A height accuracy of the fine pattern 220 on the sapphire substrate can be ensured by the surface accuracy of the mold 101, which is directly associated with the ensure of an accuracy of a radius of the fine mask patterns 202a formed through dry etching. The accuracy of the trunk is directly associated with an accuracy of the size of the fine pattern 220 formed on the sapphire substrate. In addition, it is possible to perform transfer in a step-and-repeat manner and maintain high productivity.

Meanwhile, if a soft mold 101 is used, it is possible to suppress, for example, intrusion of large voids that may be generated and intrusion of micro-sized voids into the inside of the concavo-convex structure 101a when the layered product for fine pattern formation is laminated to the object 200 to be processed. Furthermore, since protrusions or particles on a surface of the object 200 to be processed can be absorbed, a transfer accuracy is improved. Such an effect improves a transfer accuracy of the layered product 201 and improves a fabrication accuracy when the object 200 to be processed is fabricated by using the fine mask pattern 202a as a mask.

The mold 101 including the support member 100 may include a combination of the hard support member 100 and the soft mold 101, a combination of the soft support member 100 and the hard mold 101, or a combination of the soft support member 100 and the soft mold 101. Particularly, a combination of the soft support member 100 and the soft mold 101 is suitable to continuously manufacture the layered product for fine pattern formation in a roll-to-roll process. In addition, by using the obtained soft and reel-like (film-like) layered product for fine pattern formation, the first and second mask layers 103 and 102 are continuously transferred to the object 200 to be processed with a high transfer accuracy and a high transfer speed. That is, it is possible to continuously obtain the layered product 201 with a high accuracy. In addition, by using the layered product for fine pattern formation with a soft and reel-like (film-like) mold, it is possible to transfer the first and second mask layers 103 and 102 to an arbitrary portion of the object to be processed. This is similarly applied to a curved surface.

A combination of the hard support member 100 and the soft mold 101 may include a combination of the support member 100 consisting of an inorganic material such as glass, quartz, silicon, SUS, or an aluminum plate and the mold 101 consisting of PDMS, polyimide, polyethylene, PET, COP, fluororesin, photosetting resin, and the like.

In this manner, if the soft mold 101 is provided on the hard support member 100, it is possible to easily change a surface material property of the mold 101 while a surface accuracy of the hard support member 100 is ensured. For this reason, it is possible to easily fill the first mask layer 103 on the second mask layer 102 to transfer the first layered product 1 onto the object 200 to be processed. In addition, a coating property of the first mask layer 103 is improved when the second layered product 2 is manufactured. In addition, it is possible to maintain a high surface accuracy (a parallelism between a principal surface of the object 200 to be processed and a surface including an apex of the second mask layer 102) of the layered product 201 formed through transfer and improve a height precision of the fine mask pattern 202a after etching is performed from the second mask layer 102 of the layered product 201. As a result, it is possible to ensure a fabrication accuracy when the object 200 to be processed is fabricated by using the fine mask pattern 202a as a mask.

A combination of the soft support member 100 and the hard mold 101 may include a combination of the support member 100 consisting of a soft elastic body as typified by sponge or rubber (such as silicone rubber) and a mold 101 consisting of an inorganic material such as silicon, quartz, nickel, chromium, sapphire, SiC, diamond, diamond-like carbon, or fluorine-containing diamond-like carbon. In a case where the support member 100 is a soft elastic body, it is preferred that a Young's modulus (longitudinal elastic modulus) of the support member 10 is set to approximately 1 MPa or higher and 100 MPa or lower, since it is possible to maintain a high surface accuracy. From the viewpoint of similar advantages, it is more preferred that the Young's modulus of the support member 10 is set to 4 MPa or higher and 50 MPa or lower. In addition, from the viewpoint of a transfer accuracy when the layered product 201 consisting of [the first mask layer 103/the second mask layer 102/the object 200 to be processed] is formed, the thickness of the support member 10 is preferably set to 0.5 mm of larger and 20 cm or smaller, more preferably 1 mm or larger and 10 cm or smaller, and most preferably 5 mm or larger and 8 cm or smaller.

By using such combinations, it is possible to further improve a surface accuracy of the hard mold 101 due to a stress relaxation and stress concentration absorption effect caused by the soft support member 100, when the layered product for fine pattern formation is laminated and pressed onto the object 200 to be processed. As a result, it is possible to improve a height precision of the fine pattern structure 202. Accordingly, it is possible to also ensure a fabrication accuracy when the object 200 to be processed is fabricated by using the fine mask pattern 202a as a mask.

The combination of the soft support member 100 and the soft mold 101 may include a combination of the support member 100 consisting of a resin film such as a PET film, a TAC film, a COP film, a PE film, and a PP film and a mold 101 consisting of photosetting resin and the like.

Through such a combination, it is possible to continuously manufacture the layered product for fine pattern formation through a roll-to-roll method and facilitate laminating to the object 200 to be processed when the layered product for fine pattern formation is applied. By using a roll-to-roll method to manufacture the layered product for fine pattern formation, it is possible to improve an arrangement accuracy for filling the inside of the concavo-convex structure 101a of the second mask layer 102. Furthermore, since a coating property of the first mask layer 103 is improved, it is possible to improve a thickness precision of the first mask layer 103. For this reason, in the case of the second layered product 2, it is possible to highly set a thickness and a pattern accuracy of the first and second mask layers 103 and 102 transferred onto the object 200 to be processed by reflecting the accuracy of the second layered product 2, so that the accuracy of the layered product is significantly improved. Particularly, it is possible to suppress defects such as air voids (macro voids) or nano air voids (voids generated inside the concavo-convex structure 101a) that may be generated when the layered product consisting of [the support member 100, /the mold 101/the second mask layer 102/the first mask layer 103/the object 200 to be processed] is obtained by laminating the layered product for fine pattern formation to the object 200 to be processed using a cylindrical (circular columnar) lamination roll, and improve a laminating speed. In addition, by applying a roll-to-roll method, a peel stress is applied as a line when the support member 100 and the mold 101 are removed from the layered product consisting of [the support member 100/the mold 101/the second mask layer 102/the first mask layer 103/the object 200 to be processed], so that a transfer accuracy is improved.

By arranging a combination of the soft support member 100 and the soft mold 101 on the hard support member 100, it is possible to obtain advantages similar to those of the combination of the hard support member 100 and the soft mold 101 as described above.

A material of the support member 100 may include, but not particularly limited to, any inorganic material such as glass, ceramic, a silicon wafer, and metal, or any organic material such as plastic, rubber, and sponge. Depending on a field of use of the layered product for fine pattern formation, a material of the support member 100 may include a plate, a sheet, a film, a reel, a thin film, woven fabrics, non-woven fabrics, any other shape, and a combination thereof. However, it is preferable that the support member 100 include only a hard inorganic material such as glass, quartz, silicon, and SUS, only a soft elastic body such as rubber (such as silicone rubber) or sponge, a multilayer structure including a hard inorganic material such as glass, quartz, silicon, and SUS, and rubber (such as silicone rubber) or sponge, or a resin film such as a PET film, a TAC film, a COP film, a PE film, and a PP film.

In order to improve adhesiveness between the support member 100 and the mold 101, an easy adhesive coating, a primer treatment, a corona treatment, a plasma treatment, a UV/ozone treatment, an excimer treatment, a high-energy ray treatment, a surface roughening treatment, a porosity treatment, and the like may be performed on a principal surface of the support member 100 on which the mold 101 to form a chemical bond with the mold 101 or a physical bond such as penetration.

The support member 100 of the mold 101 may include the support member 100 described above. However, by using the support member 100 obtained by considering a refractive index, a haze, and a resin layer containing fine particles as described below, it is possible to further improve a transfer accuracy of the first and second mask layers 103 and 102.

In a case where energy rays are irradiated against the support member 100 surface after forming the layered product consisting of [the support member 100/the mold 101/the second mask layer 102/the first mask layer 103/the object 200 to be processed by using the layered product for fine pattern formation, it is possible to improve a transfer accuracy and reduce power of the used energy ray source as reflection of energy rays at an interface between the support member 100 and the mold 101 is reduced. For this reason, a difference |n1−n2| between the refractive index n1 of the support member 100 and the refractive index n2 of the mold 101 with respect to a main wavelength λ necessary in reaction of the first mask layer 103 is preferably set to 0.3 or smaller, more preferably 0.2 or smaller, and most preferably 0.15 or smaller. In addition, it is preferred that the difference |n1−n2| of the refractive index is equal to or smaller than 0.1 since the energy rays do not approximately recognize an interface between the support member 100 and the mold 101.

A haze of the support member 100 is preferably set to 30% or lower. If the haze is set to 30% or lower, it is possible to ensure close adherence of the mold 101. Particularly, from the viewpoint of a transfer accuracy and adherence of the mold 101, the haze is preferably set to 10% or lower, more preferably 6% or lower, and most preferably 1.5% or lower. In addition, in a case where patterned energy rays are irradiated onto the layered product for fine pattern formation to form the layered product 201 consisting of [the patterned second mask layer 102/the first mask layer 103/the object 200 to be processed], the haze is preferably set to 1.5% or lower from the viewpoint of a resolution thereof. The haze is a value representing turbidity and is obtained based on total transmittance T of the light that is irradiated from a light source and transmits through a sample and transmittance D of the light dispersed and scattered in the sample. According to Japanese Industrial Standards JIS-K-7105, the haze value is defined as H=D/T×100. The haze value may be easily measured using a commercially available turbidity meter (for example, NDH-1001DP produced by NIPPON DENSHOKU INDUSTRIES CO., LTD.) and the like. A support member 100 having the haze value equal to or lower than 1.5% described above may include, for example, a polyethylene terephthalate film such as high-transparent film GS series produced by TEIJIN LIMITED., M-310 series produced by Hoechst Diafoil Company, and Mylar-D series produced by DuPont Co., Ltd.

In a case where a film-like support member 100 is selected as the support member 100, a support member 100 obtained by laminating a resin layer containing fine particles on one surface of a biaxial orientation polyester film may be used. An average diameter of fine particles is preferably set to 0.01 μm or larger in order to improve workability for continuously manufacturing the mold 101 through a roll-to-roll process and workability for continuously laminating the layered product for fine pattern formation to the object 200 to be processed and suppress generation of a defect of the fine pattern or macro defects in a millimeter scale or a centimeter scale. An average diameter of fine particles is preferably set to 5.0 μm or smaller in order to improve a resolution for forming the layered product 201 consisting of [the patterned second mask layer 102/the first mask layer 103/the object 200 to be processed] by irradiating the patterned energy rays onto the layered product for fine pattern formation. In order to further exert this advantage, the average diameter of fine particles is more preferably set to 0.02 to 4.0 μm, especially preferably 0.03 to 3.0 μm.

A content of the fine particles may be appropriately controlled depending on, for example, base resin included in a resin layer, a types and an average diameter of the fine particles, a desired physical property, and the like. The fine particles may include, for example, inorganic particles such as silica, kaolin, talc, alumina, calcium phosphate, titanium dioxide, calcium carbonate, barium sulfate, calcium fluoride, lithium fluoride, zeolite, and molybdenum sulphide, organic particles such as crosslinking polymer particles or calcium oxalate, and the like. Particularly, from the viewpoint of transparency, silica particles are preferably used. In addition, the fine particles include filler. Such fine particles may be used solely or in combination of two or more.

A base resin included in the resin layer containing the fine particles may include, for example, a polyester-based resin, a polyurethane-based resin, an acryl-based resin, a mixture thereof, or copolymer thereof, or the like. A thickness of the resin layer is preferably set to 0.01 μm or larger in order to improve workability for continuously manufacturing the mold 101 through a roll-to-roll process or workability for continuously laminating the layered product for fine pattern formation to the object 200 to be processed and suppress defects of the fine pattern and macro defects in a millimeter scale or a centimeter scale. The thickness of the resin layer is more preferably set to 0.05 to 3.0 μm, especially preferably 0.1 to 2.0 μm, and significantly preferably 0.1 to 1.0 μm in order to improve a resolution for forming the layered product 201 consisting of [the patterned second mask layer 102/the first mask layer 103/the object 200 to be processed] by irradiating the patterned energy rays onto the layered product for fine pattern formation.

A method of laminating the resin layer on one surface of the biaxial orientation polyester film may include, for example, coating and the like without a particular limitation. Polyester-based resins of the biaxial orientation polyester film may include, for example, polyester-based resins mainly containing polyester such as aromatic linear polyesters containing aromatic dicarboxylic acids such as polyethylene terephthalate, polybutylene terephthalate, and polyethylene naphthalate and diols, aliphatic linear polyesters containing aliphatic zircarbon acids and diols, copolymers thereof, and the like. These polyesters may be used solely or in combination of two or more. In addition, a biaxial orientation polyester film where the resin layer is laminated may contain the fine particles. Such fine particles may include, for example, fine particles similar to those contained in the resin layer, and the like. A content of the fine particles contained in the biaxial orientation polyester film is preferably set to 0 to 80 ppm, more preferably 0 to 60 ppm, and especially preferably 0 to 40 ppm in order to maintain transparency of the support member 100. A method of manufacturing the biaxial orientation polyester film may include, for example, but not particularly limited to, a biaxial stretching method, and the like. In addition, the support member 100 may be manufactured by forming a resin layer on one surface of a non-stretching film or a uniaxial stretching film and then further stretching it. A thickness of the biaxial orientation polyester film is preferably set to 1 to 100 μm, and more preferably 1 to 50 μm. Such a support film may include, for example, A2100-16 and A4100-25, produced by TOYOBO CO., LTD., and the like. In addition, in a case where a support member 100 obtained by laminating a resin layer containing fine particles on one surface of the biaxial orientation polyester film is used, the mold 101 is preferably formed on the surface of the resin layer containing the fine particles from the viewpoint of adhesiveness or transfer integrity.

Figure 12A:
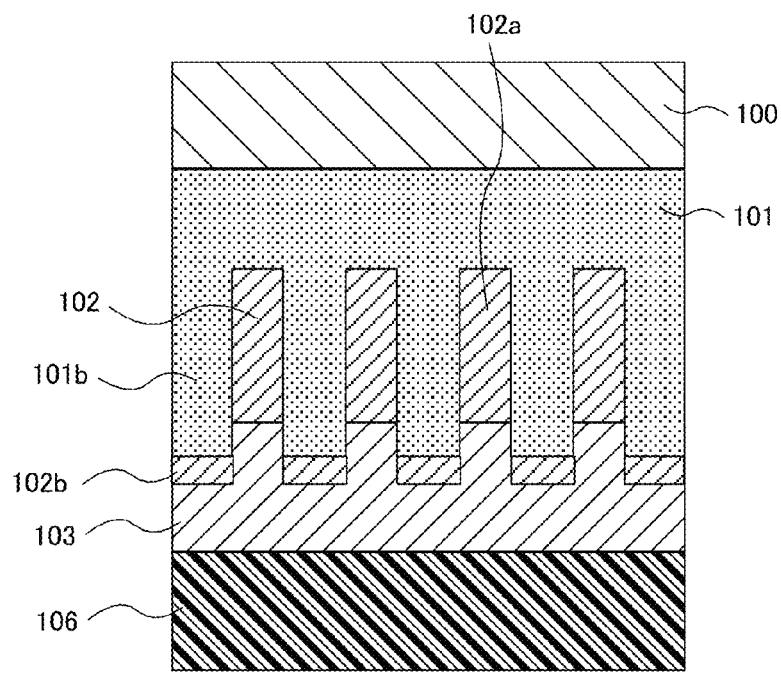
FIGS. 12A and 12B are schematic cross-sectional views illustrating another example of the layered product for fine pattern formation according to a first aspect.
Figure 12B:
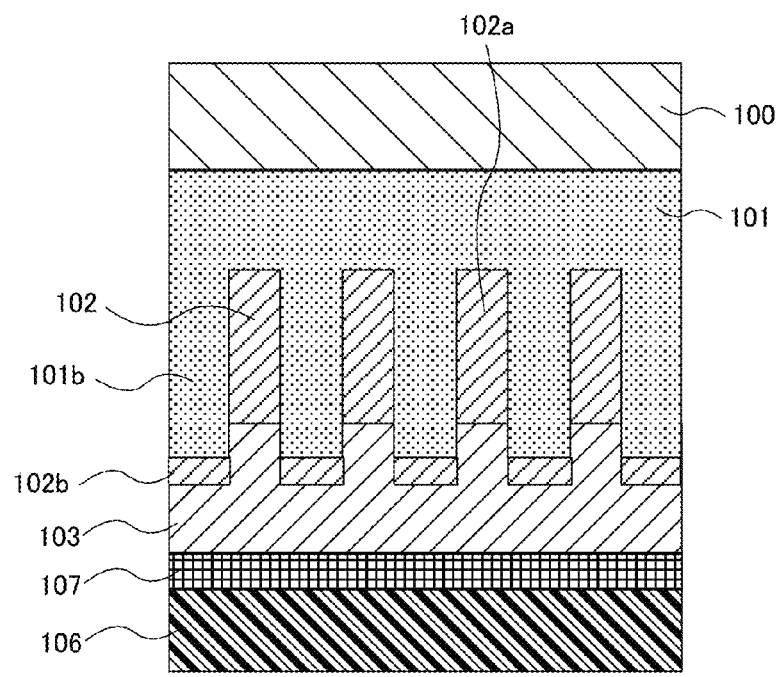

As illustrated in FIGS. 12A and 12B, in the second layered product 2, a protection layer 106 may be provided on the surface opposite to the concavo-convex structure 101a of the first mask layer 103. In this case, the protection layer 106 may be provided on a surface of the first mask layer 103 as illustrated in FIG. 12A, or a surface of an adhesive layer 107 provided in the protection layer 106 may be provided on a surface of the first mask layer 103 as illustrated in FIG. 12B.

If the protection layer 106 is provided, it is possible to easily perform a winding when the second layered product 2 is continuously manufactured, and it is possible to protect the first mask layer 103 of the second layered product 2. For this reason, storage stability of the second layered product 2 is improved, and it is possible to suppress attachment of particles or generation of a scratch on the surface of the first mask layer 103 that may be caused in delivery. Therefore, a laminating property to the object 200 to be processed is improved. If such a protection layer 106 is provided, it is possible to maintain a functionality of the first mask layer 103 of the second layered product 2 manufactured in the first line and suppress attachment of particles or a scratch on a surface of the first mask layer. For this reason, in the second line as a user line, it is possible to laminate the first mask layer 103 of the second layered product 2 to the object 200 to be processed by removing the protection layer 106 while a defect such as air voids is suppressed. As a result, it is possible to suppress a defect on a surface of the object 200 to be processed in a micrometer scale or a millimeter scale and transfer the first and second mask layers 103 and 102 onto the object 200 to be processed with a high precision.

The protection layer 106 is not particularly limited if adhesion strength between the protection layer 106 and the first mask layer 103 is smaller than adhesion strength between the first and second mask layers 103 and 102 and adhesion strength between the second mask layer 102 and the concavo-convex structure 101a. For example, even when the number of fish eyes included in the protection layer (protection film) 106 is large (for example, when the protection layer 106 includes 500/m$^2$ or more fish eyes having a diameter of 80 μm or larger), and voids are generated when the protection layer 106 is laminated, the thickness of the first mask layer 103 is thin within a range satisfying the ratio lor/P between the distance lor and the pitch P described above. Therefore, it is conceived that it is possible to suppress deterioration of the first mask layer 103 using oxygen hindrance. In a case where a thickness of the first mask layer 103 is thin within a range satisfying the ratio lor/P between the distance lor and the pitch P, the Young's modulus of the first mask layer 103 increases in comparison with the first mask layer 103 which is thick in a several micrometers to several tens of micrometers scale. Therefore, a concavo-convex transfer effect of the fish eyes of the protection layer 106 to the first mask layer 103 is insignificant. Accordingly, it is possible to easily suppress generation of air voids caused by the fish eyes when laminating to the object 200 to be processed. The number of fish eyes having a diameter of 80 μm or larger included in the protection layer 106 is preferably set to 5/m$^2$ or smaller in order to further suppress air voids when the first mask layer 103 of the second layered product 2 is laminated to the object 200 to be processed using the second layered product 2 having the protection layer 106. Here, the fish eye is generated by an unmolten or deteriorated material intruding into a film when the film is manufactured through mixing, extrusion, or casting by thermofusion of the material. Although a diameter of the fish eye may be different depending on a material, the diameter of the fish eye may be set to approximately 10 μm to 1 mm, and the height from the film surface is set to approximately 1 to 50 μm. Here, a method of measuring the size of the fish eye can be performed, for example, using an optical microscope, a contact type surface roughness meter, or a scanning electron microscope. The diameter of the fish eye means the maximum diameter.

It is preferable that the surface roughness of the protection layer 106 be smaller. For example, a centerline average roughness Ra is preferably set to 0.003 to 0.05 μm, and more preferably 0.005 to 0.03 μm in order to suppress transfer of roughness to a surface of the first mask layer 103 adjoining the protection layer 106. If the surface of the protection layer 106 that does not make contact with the first mask layer 103 has a centerline average roughness Ra of 0.1 to 0.8 μm and a maximum height roughness Rmax of 1 to 5 μm, a handling characteristic is significantly improved when the protection layer 106 is windingly recovered after the protection layer 106 is removed. In order to further exert the aforementioned advantage, the surface of the protection layer 106 that does not make contact with the first mask layer 103 more preferably has a centerline average roughness Ra of 0.15 to 0.4 μm and a maximum height roughness Rmax of 1.5 to 3.0 μm. In addition, the surface roughness refers to a surface roughness described in the standard JIS B0601, in which Ra denotes a centerline average roughness, and Rmax denotes a maximum height. The surface roughness may be measured using a contact type surface roughness meter.

Such a protection layer 106 may be manufactured, for example, by modifying a film manufacturing method such as filtering after thermofusion of resin as a source material when the film is manufactured. If the protection layer 106 preferably has a thickness of 1 to 100 μm from the viewpoint of laminating property of the protection layer 106, protection layer handing convenience in the roll-to-roll method, and reduction of an environmental load. The protection layer 106 more preferably has a thickness of 5 to 50 μm, and most preferably 15 to 50 μm. Commercially available protection layers may include, for example, but not limited to, a polypropylene film such as PP-type PT produced by Shin-Etsu Film Co., Ltd., TORAYFAN BO-2400, YR12-type, produced by TORAY INDUSTRIES, INC, ALPHAN MA-410, E-200C, produced by Oji Holdings Corporation, and ALPHAN E200 series produced by Oji Holdings Corporation, a polyethylene terephthalate film such as PS series such as PS-25 produced by TEIJIN LIMITED., and the like. In addition, by performing a sand blast for a commercially available film, it is possible to simplify the manufacturing.

In the plate mold 101 made of the materials described above, a support member 100 may be arranged on a surface opposite to the surface of the concavo-convex structure 101a. For example, an inorganic support member 100 such as a glass or silicon wafer, an elastic support member 100 having rubber elasticity, or the like may be arranged on a surface opposite to the surface of the concavo-convex structure 101a of the mold 101 made of PDMS or a thermoplastic resin (such as PI, PET, COP, PP, and PE). For example, an support member 100 such as an elastic body having rubber elasticity may be arranged on a surface opposite to the surface of the concavo-convex structure 101a of the mold 101 made of silicon, diamond, nickel, sapphire, quartz, or the like. For example, a mold 101 made of a photosetting resin or a thermosetting resin may be formed over a support member 100 made of an inorganic material such as glass or a silicon wafer or a support member 100 made of an organic material such as a PET film, a COP film, or a TAC film. For example, a mold 101 made of a photosetting resin or a thermosetting resin may be formed over the support member 100 made of an inorganic material such as glass or a silicon wafer or a support member 100 made of an organic material such as a PET film, a COP film, or a TAC film, and a support member 100 such as an elastic body may be further provided on a surface opposite to the support member 100.

A reel-like mold 101 may include, a mold 101 made of only a thermoplastic resin without using the support member 100 (refer to FIG. 13A), a mold 101 made of a hardened material of a thermosetting resin, a photosetting resin, a sol-gel material, and the like formed over the support member 100 (refer to FIG. 13B), and the like. As illustrated in FIG. 13B, when the support member 100 is used, the mold 101 is made of a hardened material of a thermosetting resin, a photosetting resin, a sol-gel material, and the like having a fine pattern on a surface, provided on a principal surface of the support member 100.

Figure 14A:
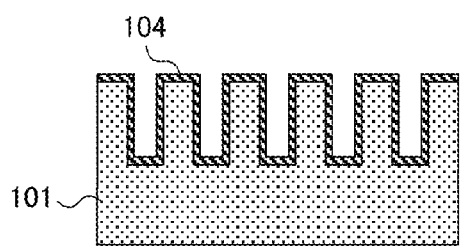
FIGS. 14A and 14B are schematic cross-sectional views illustrating another exemplary mold according to a first aspect.
Figure 14B:
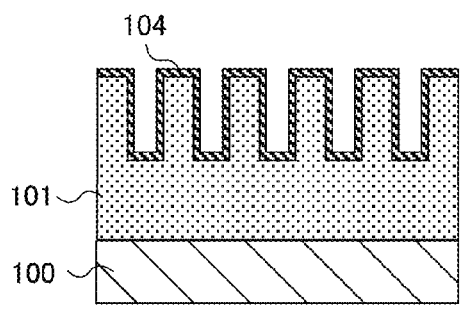

As illustrated in FIGS. 14A and 14B, a metal layer 104 made of a metal, a metal oxide, or a combination of a metal and a metal oxide may be provided on a surface of the fine pattern of the mold 101. If the metal layer 104 is provided, a mechanical strength of the mold 101 is improved. Metals of the metal layer 104 may include, but not particularly limited to, chromium, aluminum, tungsten, molybdenum, nickel, gold, platinum, silicon, and the like. Metal oxides of the metal layer 104 may include $SiO_2$, ZnO, $Al_2O_3$, $ZrO_2$, CaO, $SnO_2$ and the like in addition to the metal oxides described above. In addition, a material of the metal layer 104 may include silicon carbide, diamond-like carbon, and the like. Furthermore, the diamond-like carbon may include fluorine-containing diamond-like carbon. Moreover, a material of the metal layer 104 may include a mixture of those materials.

The metal layer 104 may have a single layer or multiple layers. For example, in a case where adherence between the mold 101 and the metal layer 104 formed in the outermost surface is not satisfactory, the first metal layer 104 may be formed on a surface of the fine pattern of the mold 101, and the second metal layer 104 may be further formed on a surface of the first metal layer 104. In this manner, the (N+1)th metal layer 104 may be formed on a surface of the (N)th metal layer 104 in order to improve an electrification characteristic or adherence of the metal layer 104. The number N of layers in the metal layer 104 is preferably set to $N \leq 4$, more preferably $N \leq 2$, and most preferably, $N \leq 1$, from the viewpoint of a transfer accuracy. For example, in the case of N=2, a first metal layer 104 made of $SiO_2$ may be provided on a surface of the fine pattern of the mold 101, and a second metal layer made of Cr may be provided on the first metal layer 104. In addition, as a metal of the metal layer 104, chromium (Cr) is preferably used from the viewpoint of a transfer accuracy, and the metal oxides preferably include $SiO_2$, $Al_2O_3$, $ZrO_2$, or ZnO.

Figure 15A:
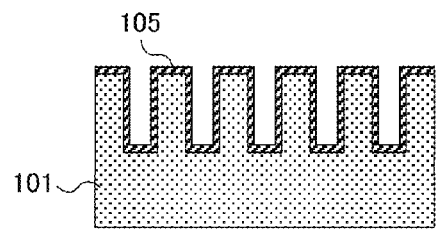
FIGS. 15A to 15D are schematic cross-sectional views illustrating another exemplary mold according to a first aspect.
Figure 15B:
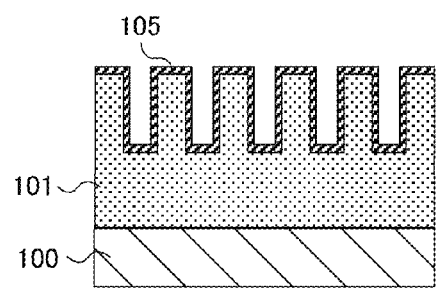
Figure 15C:
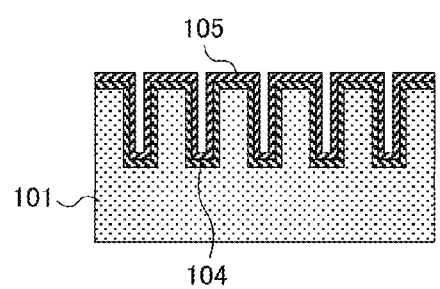
Figure 15D:
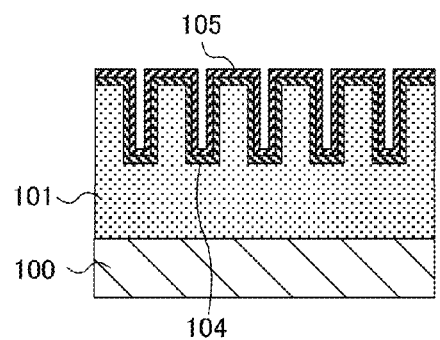

In addition, as illustrated in FIGS. 15A to 15D, a demolding layer 105 may be formed on a surface of the fine pattern of the mold 101 (refer to FIGS. 15A and 15B) or a surface of the metal layer 104 (refer to FIGS. 15C and 15D). If the demolding layer 105 is provided, transfer accuracy of the first and second mask layers 103 and 102 are improved. If the demolding layer 105 is further provided on a surface of the metal layer 104, adhesiveness of a demolding agent (demolding layer) is improved, so that transfer accuracy and transfer integrity of the first and second mask layers 103 and 102 are improved. A thickness of the demolding layer 105 is preferably set to 30 nm or smaller from the viewpoint of a transfer accuracy, and is preferably equal to or larger than a thickness of the monomolecular layer. The demolding layer 105 more preferably has a thickness of 2 nm or larger from the viewpoint of the mold releasability, and further preferably 20 nm or smaller from the viewpoint of a transfer accuracy.

Materials of the demolding layer 105 may be appropriately selected from a combination of the first and second mask layers 103 and 102 without a particular limitation. Materials of the demolding layer 105 commercially available in the art may include, for example, Zonyl TC Coat (produced by DuPont Co., Ltd), Cytop CTL-107M (produced by ASAHI GLASS CO., LTD.), Cytop CTL-107A (produced by ASAHI GLASS CO., LTD.), Novec EGC-1720 (produced by 3M Corporation), OPTOOL DSX (produced by DAIKIN INDUSTRIES, Ltd.), OPTOOL DACHP (produced by DAIKIN INDUSTRIES, Ltd.), Durasurf HD-2101Z (produced by DAIKIN INDUSTRIES, Ltd.), Durasurf HD2100 (produced by DAIKIN INDUSTRIES, Ltd.), Durasurf HD-1101Z (produced by DAIKIN INDUSTRIES, Ltd.), "FTERGENT" produced by NEOS COMPANY LIMITED. (including, for example, M-series such as FTERGENT 251, FTERGENT 215M, FTERGENT 250, FTX-245 M, and FTX-290M; S-series such as FTX-207S, FTX-211S, FTX-220S, and FTX-230S; F-series such as FTX-209F, FTX-213F, FTERGENT 222F, FTX-233F, and FTERGENT 245F; G-series such as FTERGENT 208G, FTX-218G, FTX-230G, and FTS-240G; oligomer series such as FTERGENT 730FM and FTERGENT 730LM; and FTERGENT P-series such as FTERGENT 710FL and FTX-710HL; and the like), "MEGAFACE" produced by DIC Corporation (including, for example, F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, and the like), products such as "OPTOOL™" (for example, DSX, DAC, AES), "FTONE™" (for example, AT-100), "ZEFFLE™" (for example, GH-701), "UNIDYNE™", "DAIFREE™", and "OPTACE™" produced by DAIKIN INDUSTRIES, ltd., "Novec EGC-1720" produced by SUMITOMO 3M Corporation, "Fluorosurf" produced by Fluoro Technology Co., Ltd., and the like, a silicone-based resin such as dimethyl silicone-based oil KF96 (produced by Shin-Etsu Silicone Co., Ltd.), and a commercially available denatured silicone including, specifically, TSF4421 (produced by GE Toshiba Silicones Co., Ltd.), XF42-334 (produced by GE Toshiba Silicones Co., Ltd.), XF42-B3629 (produced by GE Toshiba Silicones Co., Ltd.), XF42-A3161 (produced by GE Toshiba Silicones Co., Ltd.), FZ-3720 (produced by Dow Corning Toray Corporation), BY16-839 (produced by Dow Corning Toray Corporation), SF8411 (produced by Dow Corning Toray Corporation), FZ-3736 (produced by Dow Corning Toray Corporation), BY16-876 (produced by Dow Corning Toray Corporation), SF8421 (produced by Dow Corning Toray Corporation), SF8416 (produced by Dow Corning Toray Corporation), SH203 (produced by Dow Corning Toray Corporation), SH230 (produced by Dow Corning Toray Corporation), SH510 (produced by Dow Corning Toray Corporation), SH550 (produced by Dow Corning Toray Corporation), SH710 (produced by Dow Corning Toray Corporation), SF8419 (produced by Dow Corning Toray Corporation), SF8422 (produced by Dow Corning Toray Corporation), BY16 series (produced by Dow Corning Toray Corporation), FZ3785 (produced by Dow Corning Toray Corporation), KF-410 (produced by Shin-Etsu Chemical Co., Ltd.), KF-412 (produced by Shin-Etsu Chemical Co., Ltd.), KF-413 (produced by Shin-Etsu Chemical Co., Ltd.), KF-414 (produced by Shin-Etsu Chemical Co., Ltd.), KF-415 (produced by Shin-Etsu Chemical Co., Ltd.), KF-351A (produced by Shin-Etsu Chemical Co., Ltd.), KF-4003 (produced by Shin-Etsu Chemical Co., Ltd.), KF-4701 (produced by Shin-Etsu Chemical Co., Ltd.), KF-4917 (produced by Shin-Etsu Chemical Co., Ltd.), KF-7235B (produced by Shin-Etsu Chemical Co., Ltd.), KR213 (produced by Shin-Etsu Chemical Co., Ltd.), KR500 (produced by Shin-Etsu Chemical Co., Ltd.), KF-9701 (produced by Shin-Etsu Chemical Co., Ltd.), X21-5841 (produced by Shin-Etsu Chemical Co., Ltd.), X-22-2000 (produced by Shin-Etsu Chemical Co., Ltd.), X-22-3710 (produced by Shin-Etsu Chemical Co., Ltd.), X-22-7322 (produced by Shin-Etsu Chemical Co., Ltd.), X-22-1877 (produced by Shin-Etsu Chemical Co., Ltd.), X-22-2516 (produced by Shin-Etsu Chemical Co., Ltd.), PAM-E (produced by Shin-Etsu Chemical Co., Ltd.)), alkane-based resins (SAMLAY and the like for forming an alkyl-based monomolecular film), and the like.

Particularly, materials of the demolding layer 105 preferably include a material containing a compound having a methyl group, a material containing silicone, or a material containing fluorine from the viewpoint of mold releasability. Particularly, if materials of the demolding layer 105 include a silane coupling agent or a silicone-based resin such as polydimethylsiloxane (PDMS), it is possible to easily reduce a thickness of the demolding layer 105 and improve adhesiveness between the concavo-convex structure 101a of the mold 101 and the demolding layer 105 while a transfer accuracy is maintained, which is desirable. In addition, if a fluorine-containing demolding material such as a fluorine-based silane coupling agent is used, it is possible to reduce a thickness of the demolding layer 105 in a molecular scale, so that a transfer accuracy can be improved. As a material of the demolding layer 105, a single material or a plurality of materials may be used. A material of the demolding layer 105 preferably has a water contact angle of 90° or larger. Here, the contact angle is a contact angle when a solid film (a film that does not have a fine pattern) is fabricated using materials of the demolding layer 105.

Thermoplastic resins of the mold 101 may include polypropylene, polyethylene, polyethylene terephthalate, polymethyl methacrylate, cyclo olefin polymer, cyclo olefin copolymer, transparent fluororesin, polyethylene, polypropylene, polystyrene, acrylonitrile/styrene-based polymer, acrylonitrile/butadiene/styrene-based polymer, polyvinyl chloride, polyvinylidene chloride, poly(meth)acrylate, polyarylate, polyethylene terephthalate, polybutylene terephthalate, polyamide, polyimide, polyacetal, polycarbonate, polyphenylene ether, polyether ether ketone, polysulfone, polyether sulfone, polyphenylene sulfide, polyvinylidene fluoride, tetrafluoroethylene/perfluoro(alkyl vinyl ether)-based copolymer, tetrafluoroethylene/ethylene-based copolymer, vinylidene fluoride/tetrafluoroethylene/hexafluoropropylene-based copolymer, tetrafluoroethylene/propylene-based copolymer, polyfluoro(meth)acrylate-based polymer, a fluorinated polymer having a fluorinated aliphatic ring structure in a main chain, polyvinyl fluoride, polytetrafluoroethylene, polychlorotrifluoroethylene, chlorotrifluoroethylene/ethylene-based copolymer, chlorotrifluoroethylene/hydrocarbon-based alkenylether-based copolymer, tetrafluoroethylene/hexafluoropropylene-based copolymer, vinylidene fluoride/hexafluoro propylene-based copolymer, and the like.

Thermosetting resins of the mold 101 may include polyimid, epoxy resin, urethane resin, and the like.

In a case where the mold 101 is made of a resin, materials of the mold 101 are not particularly limited if adhesiveness with the first and second mask layers 103 and 102 is lowered by combining the resins described above, the metal layer 104, or the demolding layer 105. Particularly, from the viewpoint of a transfer accuracy, the mold 101 is preferably made of a resin containing polydimethylsiloxane (PDMS) represented as silicone or a fluorine-containing resin. However, in a case where the demolding layer 105 is provided on the concavo-convex structure 101a of the mold 101, a material of the concavo-convex structure 101a is not particularly limited. In a case where the demolding layer 105 is not provided on the concavo-convex structure 101a, the mold 101 is preferably made of a fluorine-containing resin, a polydimethylsiloxane-based resin represented as silicone, COP, polyimide, and the like. Particularly, the mold 101 is preferably made of a polydimethylsiloxane-based resin or a fluorine-containing resin. The fluorine-containing resin is not particularly limited if it contains fluorine and has a water contact angle larger than 90°. Here, the water contact angle refers to a water contact angle of the mold 101 with respect to a surface of the concavo-convex structure 101a. The water contact angle is preferably set to 95° or larger, and more preferably 100° or larger from the viewpoint of a transfer accuracy when the second mask layer 102 is transferred onto the object 200 to be processed.

Particularly, the mold 101 is preferably made of a photosetting resin. If a photosetting resin is selected as a material of the mold 101, throughput reliability and a transfer accuracy is improved when the mold 101 is fabricated, which is desirable.

If a fluorine concentration Es of the resin surface layer (in the vicinity of the concavo-convex structure 101a) in the mold 101 is higher than an average fluorine concentration Eb in the resin layer of the mold 101, free energy on the surface of the mold 101 is lowered, so that it is possible to improve mold releasability from the resin of the transfer material or the first and second mask layers 103 and 102 and obtain a mold 101 capable of transferring an concave-convex shape of a nanometer size in a resin-to-resin manner with excellent mold releasability. In addition, since free energy is highly maintained in the vicinity of the support member 100, it is possible to improve adhesiveness.

If a ratio between the average fluorine concentration Eb in the resin layer of the mold 101 and the fluorine concentration Es in the surface layer portion of the fine pattern of the resin layer of the mold 101 satisfies 1<Es/Eb≤30000 (Formula (10)), the aforementioned advantages are further exerted, which is desirable. Particularly, as the ratio has a narrower range such as 3≤Es/Eb≤1500, 10≤Es/Eb≤100, and so on, mold releasability is further improved, which is desirable.

In the widest range (1<Es/Eb≤30000), if the ratio is set to 20<Es/Eb≤200, the fluorine concentration Es in the surface layer portion of the resin layer of the mold 101 is sufficiently higher than the average fluorine concentration Eb in the resin layer, and free energy in the surface of the mold 101 is effectively reduced, so that mold releasability from the transfer resin or the first and second mask layers 103 and 102 is improved. If the average fluorine concentration Eb in the resin layer of the mold 101 is relatively lower than the fluorine concentration Es of the surface layer portion of the resin layer of the mold 101, a strength of the resin of itself is improved, and free energy can be highly maintained in the vicinity of the support member 100 in the mold 101, so that adherence with the support member 100 is improved. Accordingly, it is possible to obtain a mold 101 capable of repeatedly transferring unevenness from resin to resin in a nanometer size with excellent adherence to the support member 100 and excellent mold releasability from the second mask layer 102, which is particularly desirable. If the ratio satisfies a range of 26≤Es/Eb≤189, free energy on the surface of the resin layer of the mold 101 can be more lowered, so that repetitive transferability is improved, which is desirable. Furthermore, if the ratio satisfies a range of 30≤Es/Eb≤160 (Formula (22)), it is possible to reduce free energy on a surface of the resin layer of the mold 101 and maintain a strength of the resin, so that repetitive transferability is more improved, which is preferable. More preferably, the range is set to 31≤Es/Eb≤155. If the range is set to 46≤Es/Eb≤155, the aforementioned advantages can be further exerted, which is desirable.

The repetitive transferability described above means that how easily a mold 101 can be replicated from another mold. That is, a mold G2 having a concave fine pattern can be formed through transfer by using a mold G1 having a convex fine pattern in the mold 101 as a template. By using the mold G2 as a template, a mold G3 having a convex fine pattern can be formed through transfer. Similarly, a mold GN+1 having a concave fine pattern can be formed through transfer by using a mold GN having a convex fine pattern. In addition, it is possible to obtain a plurality of molds G2 by using a single mold G1 as a template or obtain a plurality of molds G3 by using a single mold G2 as a template. Similarly, it is possible to obtain a plurality of molds GM+1 by using a single mold GM as a template. In addition, a used mold 101 of a layered product for fine pattern formation may be reused. In this manner, if the mold 101 satisfying the aforementioned condition of Es/Eb is used, environmental manageability is improved.

Here, the surface layer of the resin layer of the mold 101 (the area in the second mask layer 102 surface side) refers to, for example, a portion intruding by 1 to 10% in a thickness direction toward the support member 100 side from the surface of the second mask layer 102 side of the resin layer of the mold 101 or a portion intruding by 2 to 20 nm in a thickness direction. In addition, the fluorine concentration Es in the second mask layer 102 side area of the resin layer of the mold 101 can be measured through X-ray photoelectron spectroscopy (XPS) method. In the XPS method, a penetration length of X-rays reaches several nanometers, which is shallow and suitable for measuring the value Es. As another analysis method, the ratio Es/Eb may be computed based on energy dispersive X-ray spectroscopy (TEM-EDX) method using a transmission electron microscope. The average fluorine concentration Eb in the resin of the resin layer of the mold 101 may be computed based on a dose. Alternatively, fragments obtained by physically slicing the resin layer of the mold 101 may be decomposed using a flask combustion method, and then, an ion chromatography analysis may be performed to measure the average fluorine concentration Eb.

In the resins of the resin layer of the mold 101, photopolymerizable radical polymerization resins preferably include a hardening resin composition (1) as a mixture of non-fluorine-containing (meth)acrylate, fluorine-containing (meth)acrylate, and a photopolymerization initiator, a hardening resin composition (2) as a mixture of non-fluorine-containing (meth)acrylate and a photopolymerization initiator, a hardening resin composition (3) as a mixture of non-fluorine-containing (meth)acrylate, silicone, and a photopolymerization initiator, and the like. In addition, a hardening resin composition (4) containing a sol-gel material represented as metal alkoxides may be used. Particularly, if the composition (1) is hardened while the composition (1) makes contact with a hydrophobic interface having lower surface free energy by using the hardening resin composition (1), control can be made such that the fluorine concentration Es of the surface layer portion of the resin layer of the mold 101 increases more than the average fluorine concentration Eb in the resin of the resin layer of the mold 101, and the average fluorine concentration Eb in the resin decreases more.

(A) (Meth)acrylates

The (meth)acrylates contained in the hardening resin composition (1) may include, but not limited to, polymerizable monomers other than (B) fluorine-containing (meth)acrylate described below. Monomers having an acryloyl group or a methacryloyl group, monomers having a vinyl group, or monomers having an allyl group may be preferably used. More preferably, monomers having an acryloyl group or a methacryloyl group is used. In addition, it is preferable that these materials be non-fluorine-containing monomers. The (meth)acrylates include acrylates or methacrylates.

The polymerizable monomers preferably include multifunctional monomers having a plurality of polymerizable groups. The number of polymerizable groups is preferably set to an integer of 1 to 6 from the viewpoint of excellent polymerizability. In a case where two or more types of polymerizable monomers are mixedly used, the average number of the polymerizable groups is preferably set to 1.5 to 4. In a case where a single monomer is used, the number of polymerizable groups of the monomer is preferably set to 3 or greater in order to obtain physical stability (such as a strength and heat resistance) of the hardened material by increasing the crosslinking points after the polymerization reaction. In a case where the number of polymerizable groups of the monomer is set to 1 or 2, a monomer having a different number of polymerizable groups is preferably used in combination.

As a specific example, (meth)acrylate monomers may include the following compounds. Monomers having an acryloyl group or a methacryloyl group may include a (meth)acrylic acid, aromatic (meth)acrylates [such as phenoxyethyl acrylate, and benzyl acrylate], hydrocarbon-based (meth)acrylates [such as stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, and dipentaerythritol hexaacrylate], hydrocarbon-based (meth)acrylates containing an ether-like oxygen atom [such as ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, and tripropylene glycol diacrylate], hydrocarbon-based (meth)acrylates having a functional group [such as 2-hydroxyethyl acrylate, 2-hydroxypropyl acrylate, 4-hydroxybutylvinyl ether, N,N-diethylaminoethyl acrylate, N,N-dimethylaminoethyl acrylate, N-vinylpyrrolidone, and dimethylaminoethyl methacrylate], silicone-based acrylates, and the like. In addition, (meth)acrylate monomers may include EO-modified glycerol tri(meth)acrylate, ECH-modified glycerol tri(meth)acrylate, PO-modified glycerol tri(meth)acrylate, pentaerythritol triacrylate, EO-modified phosphoric acid triacrylate, trimethylolpropane tri(meth)acrylate, caprolactone-modified trimethylolpropane tri(meth)acrylate, PO-modified trimethylolpropane tri(meth)acrylate, tris(acryloxyethyl) isocyanurate, EO-modified trimethylolpropane tri(meth)acrylate, dipentaerythritol hexa(meth)acrylate, caprolactone-modified dipentaerythritol hexa(meth)acrylate, dipentaerythritolhydroxypenta(meth)acrylate, alkyl-modified dipentaerythritol penta(meth)acrylate, dipentaerythritol poly(meth)acrylate, ditrimethylolpropane tetra(meth)acrylate, alkyl-modified dipentaerythritol tri(meth)acrylate, pentaerythritolethoxy tetra(meth)acrylate, pentaerythritol tetra(meth)acrylate, diethylene glycol monomethyl ether(meth)acrylate, dimethylol dicyclopentane di(meth)acrylate, di(meth)acrylic isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, allyloxy plyethylene glycol acrylate, 1,9-nonanediol di(meth)acrylate, EO-modified bisphenol-A di(meth)acrylate, PO-modified bisphenol Adi(meth)acrylate, modified bisphenol-A di(meth)acrylate, EO-modified bisphenol-F di(meth)acrylate, ECH-modified hexahydrophthalic acid diacrylate, neopenthyl glycol di(meth)acrylate, hydroxypivalic acid neopenthyl glycol di(meth)acrylate, EO-modified neopentyl glycol diacrylate, PO-modified neopentyl glycol diacrylate, caprolactone-modified hydroxypivalic acid neopentyl glycol ester, stearic acid-modified pentaerythritol di(meth)acrylate, ECH-modified propylene glycol di(meth)acrylate, ECH-modified phthalic acid di(meth)acrylate, poly(ethylene glycol tetramethylene glycol) di(meth)acrylate, poly(propylene glycol tetramethylene glycol) di(meth)acrylate, polypropylene glycol di(meth)acrylate, silicon di(meth)acrylate, tetraethylene glycol di(meth)acrylate, triethylene glycol di(meth)acrylate, polyester (di)acrylate, polyethylene glycol di(meth)acrylate, dimethylol triscyclo decane di(meth)acrylate, neopentyl glycol-modified trimethylolpropane di(meth)acrylate, dipropylene glycol di(meth)acrylate, tripropylene glycol di(meth)acrylate, triglycerol di(meth)acrylate, EO-modified tripropylene glycol di(meth)acrylate, divinylethylen urea, divinylpropylene urea, 2-ethyl-2-butyl propanediol acrylate, 2-ethylhexyl(meth) acrylate, 2-ethylhexyl carbitol(meth)acrylate, 2-hydroxyethyl(meth)acrylate, 2-hydroxypropyl(meth)acrylate, 2-hydroxybutyl(meth)acrylate, 2-methoxyethyl(meth)acrylate, 3-methoxybutyl(meth)acrylate, 4-hydroxybutyl(meth)acrylate, acrylic acid dimer, benzyl(meth)acrylate, butanediol mono(meth)acrylate, buthoxyethyl(meth)acrylate, butyl (meth)acrylate, cetyl(meth)acrylate, EO-modified cresol (meth)acrylate, ethoxylated phenyl(meth)acrylate, ethyl (meth)acrylate, dipropylene glycol(meth)acrylate, isoamyl (meth)acrylate, isobutyl(meth)acrylate, isooctyl(meth) acrylate, cyclohexyl(meth)acrylate, dicyclopentanyl(meth) acrylate, isobonyl(meth)acrylate, dicyclopentanyloxyethyl (meth)acrylate, isomyristyl(meth)acrylate, lauryl(meth) acrylate, methoxy dipropylene glycol(meth)acrylate, methoxy polyethylene glycol(meth)acrylate, methoxy triethylene glycol(meth)acrylate, methyl(meth)acrylate, methoxy tripropylene glycol(meth)acrylate, neopenthyl glycol benzoate(meth)acrylate, nonylphenoxy polyethylene glycol (meth)acrylate, nonylphenoxy polypropylene glycol(meth) acrylate, octyl(meth)acrylate, paracumylphenoxyethylene glycol(meth)acrylate, ECH-modified phenoxy acrylate, phenoxy diethylene glycol(meth)acrylate, phenoxy hexaethylene glycol(meth)acrylate, phenoxy tetraethylene glycol (meth)acrylate, phenoxyethyl(meth)acrylate, polyethylene glycol(meth)acrylate, polyethylene glycol-polypropylene glycol(meth)acrylate, polypropylene glycol(meth)acrylate, stearyl(meth)acrylate, EO-modified succinic acid (meth) acrylate, tert-butyl(meth)acrylate, tribromophenyl(meth) acrylate, EO-modified tribromophenyl(meth)acrylate, tridodecyl(meth)acrylate, isocyanuric acid EO-modified di- and triacrylate, ε-caprolactone-modified tris(acryloxyethyl) isocyanurate, ditrimethylol propane tetraacrylate, ethoxylated bisphenol-A diacrylate, propoxylated neopentyl glycol diacrylate, tricyclodecane dimethanol diacrylate, and the like. (meth)acrylate monomers may include monomers having an allyl group such as p-isoprophenyl phenol, monomers having a vinyl group such as styrene, α-methyl styrene, acrylonitrile, and vinylcarbazole, and the like. The EO-modification means ethylene oxide modification, the ECH-modification means epichlorohydrin modification, and the PO-modification means propylene oxide modification.

(B) Fluorine-Containing (Meth)acrylate

The fluorine-containing (meth)acrylate of the hardening resin composition (1) preferably includes a polyfluoro alkylene chain and/or a perfluoro(polyoxyalkylene) chain, and a polymerizable group. More preferably, a linear perfluoro alkylene group or a perfluoro oxyalkylene group having an ether-like oxygen atom inserted between carbon atoms and having a trifluoromethyl group in a side chain may be used. A linear polyfluoro alkylene chain and/or a linear perfluoro (polyoxyalkylene) chain having a trifluoromethyl group in a molecular side chain or an end of a molecular structure may be especially preferably used.

As the polyfluoro alkylene chain, a polyfluoro alkylene group having a carbon number of 2 to 24 is preferably used. In addition, the polyfluoro alkylene group may have a functional group.

The perfluoro(polyoxyalkylene) chain preferably includes one or more perfluoro(oxyalkylene) units selected from a group consisting of a $CF_2CF_2O$ unit, a $(CF_2CF(CF_3)O)$ unit, a $(CF_2CF_2CF_2O)$ unit, and a $(CF_2O)$ unit. More preferably, the perfluoro(polyoxyalkylene) chain includes a $(CF_2CF_2O)$ unit, a $(CF_2CF(CF_3)O)$ unit, or a $(CF_2CF_2CF_2O)$ unit. The perfluoro(polyoxyalkylene) chain preferably includes a $(CF_2CF_2O)$ unit because it provides an excellent material property of the fluorinated polymer (such as heat resistance and acid resistance). The number of perfluoro(oxyalkylene) units is preferably set to an integer of 2 to 200, and more preferably an integer of 2 to 50 because the fluorinated polymer has high hardness and excellent mold releasability.

The polymerizable group preferably includes a vinyl group, an allyl group, an acryloyl group, a methacryloyl group, an epoxy group, a dioxetane group, a cyano group, an isocyanate group, or a hydrolyzable silyl group represented as $[-(CH2)_aSi(M1)_{3-b}(M2)_b]$. More preferably, an acryloyl group or a methacryloyl group is used. Here, M1 denotes a substituent group substitutable with a hydroxyl group through a hydrolysis reaction. Such a substituent group may include a halogen atom, an alkoxy group, an acryloxy group, and the like. As a halogen atom, a chlorine atom is preferably used. As the alkoxy group, a methoxy group or an ethoxy group may be preferably used, and a methoxy group is more preferably used. M1 preferably includes an alkoxy group and more preferably a methoxy group. M2 denotes a monovalent hydrocarbon. M2 may include an alkyl group, an alkyl group substituted with one or more aryl groups, an alkenyl group, an alkynyl group, a cycloalkyl group, an aryl group, and the like. Preferably, an alkyl group or an alkenyl group is used. In a case where an alkyl group is used in M2, an alkyl group having a carbon number of 1 to 4 is preferably used, and a methyl group or an ethyl group is more preferably used. In a case where an alkeny group is used in M2, an alkenyl group having a carbon number of 2 to 4 is preferably used, and a vinyl group or an allyl group is more preferably used. The value "a" is set to an integer of 1 to 3 and is preferably set to 3. The value "b" is set to zero or an integer of 1 to 3, and is preferably set to zero. The hydrolyzable silyl group preferably includes $[(CH_3O)_3SiCH_2-]$, $[(CH_3CH2O)_3SiCH_2-]$, $[(CH_3O)_3Si(CH_2)_3-]$, or $[(CH_3CH_2O)_3Si(CH_2)_3-]$.

The number of polymerizable groups is preferably set to an integer of 1 to 4, and more preferably an integer of 1 to 3 from the viewpoint of excellent polymerizability. In a case where two or more types of compounds are used, an average number of the polymerizable groups is preferably set to 1 to 3.

If the fluorine-containing (meth)acrylate has a functional group, adherence with the support member 100 is improved. The functional group may include a carboxyl group, a sulfonic acid group, a functional group having an ester bond, a functional group having an amid bond, a hydroxyl group, an amino group, a cyano group, a urethane group, an isocyanate group, a functional group having an isocyanuric acid derivative, and the like. Particularly, the fluorine-containing (methyl)acrlyate preferably contains at least one of a carboxyl group, an urethane group, and a functional group having an isocyanuric acid derivative. In addition, the isocyanuric acid derivative may have a structure of the isocyanuric acid, in which at least one hydrogen atom bound to a nitrogen atom is substituted with another group. The fluorine-containing (meth)acrylates may include fluoro(meth)acrylates, fluorodienes, and the like. Specifically, the fluorine-containing (meth)acrylates may include the following compounds.

The fluoro(meth)acrylates may include $CH_2=CHCOO(CH_2)_2(CF_2)_{10}F$, $CH_2+CHCOO(CH_2)_2(CF_2)_8F$, $CH_2=CHCOO(CH_2)_2(CF_2)_6F$, $CH_2=C(CH_3)COO(CH_2)_2(CF_2)_{10}F$, $CH_2=C(CH_3)COO(CH_2)_2(CF_2)_8F$, $CH_2=C(CH_3)COO(CH_2)_2(CF_2)_6F$, $CH_2=CHCOOCH_2(CF_2)_6F$, $CH_2=C(CH_3)COOCH_2(CF_2)_6F$, $CH_2=CHCOOCH_2(CF_2)_7F$, $CH_2=C(CH_3)COOCH_2(CF_2)_7F$, $CH_2=CHCOOCH_2CF_2CF_2H$, $CH_2=CHCOOCH_2(CF_2CF_2)_2H$, $CH_2=CHCOOCH_2(CF_2CF_2)_4H$, $CH_2=C(CH_3)COOCH_2(CF_2CF_2)H$, $CH_2=C(CH_3)COOCH_2(CF_2CF_2)_2H$, $CH_2=C(CH_3)COOCH_2(CF_2CF_2)_4H$, $CH_2=CHCOOCH_2CF_2OCF_2CF_2OCF_3$, $CH_2=CHCOOCH_2CF_2O(CF_2CF_2O)_3CF_3$, $CH_2=C(CH_3)COOCH_2CF_2OCF_2CF_2OCF_3$, $CH_2=C(CH_3)COOCH_2CF_2O(CF_2CF_2O)_3CF_3$, $CH_2=CHCOOCH_2CF(CF_3)OCF_2CF(CF_3)O(CF_2)_3F$, $CH_2=CHCOOCH_2CF(CF_3)O(CF_2CF(CF_3)O)_2(CF_2)_3F$, $CH_2=C(CH_3)COOCH_2CF$ $(CF_3)OCF_2CF(CF_3)O(CF_2)_3F$, $CH_2$=$C(CH_3)COOCH_2CF(CF_3)O(CF_2CF(CF_3)O)_2(CF_2)_3F$, $CH_2$=$CFCOOCH_2CH(OH)CH_2(CF_2)_6CF(CF_3)_2$, $CH_2$=$CFCOOCH_2CH(CH_2OH)CH_2(CF_2)_6CF(CF_3)_2$, $CH_2$=$CFCOOCH_2CH(OH)CH_2(CF_2)_{10}F$, $CH_2$=$CFCOOCH_2CH(OH)CH_2(CF_2)_{10}F$, $CH_2$—$CHCOOCH_2CH_2(CF_2CF_2)_3CH_2CH_2OCOCH$=$CH_2$, $CH_2$=$C(CH_3)COOCH_2CH_2(CF_2CF_2)_3CH_2CH_2OCOC(CH_3)$=$CH_2$, $CH_2$=$CHCOOCH_2CyFCH_2OCOCH$=$CH_2$, $CH_2$=$C(CH_3)COOCH_2CyFCH_2OCOC(CH_3)$=$CH_2$, and the like (where CyF denotes perfluoro(1,4-cyclohexylene group)).

The fluorodienes may include $CF_2$=$CFCF_2CF$=$CF_2$, $CF_2$=$CFOCF_2CF$=$CF_2$, $CF_2$=$CFOCF_2CF_2CF$=$CF_2$, $CF_2$=$CFOCF(CF_3)CF_2CF$=$CF_2$, $CF_2$=$CFOCF_2CF(CF_3)CF$=$CF_2$, $CF_2$=$CFOCF_2OCF$=$CF_2$, $CF_2$=$CFOCF_2CF(CF_3)OCF_2CF$=$CF_2$, $CF_2$=$CFCF_2C(OH)(CF_3)CH_2CH$=$CH_2$, $CF_2$=$CFCF_2C(OH)(CF_3)CH$=$CH_2$, $CF_2$=$CFCF_2C(CF_3)(OCH_2OCH_3)CH_2CH$=$CH_2$, $CF_2$=$CFCH_2C(C(CF_3)_2OH)(CF_3)CH_2CH$=$CH_2$, and the like.

More preferably, if the fluorine-containing (meth)acrylate used in the present invention is a fluorine-containing urethane (meth)acrylate expressed in chemical formula 1 described below, it is possible to effectively increase the fluorine concentration Es in the surface layer portion of the fine pattern of the mold 101 while the average fluorine concentration Eb in the resin is lowered, so that adhesiveness to the support member 100 and mold releasability can be more effectively exhibited. Such a urethane(meth)acrylate may include, for example, "OPTOOL DAC" produced by DAIKIN INDUSTRIES, Ltd.

[Chemical Expression 1]

Chemical Formula 1

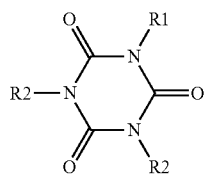

where R1 denotes chemical formula 2, and R2 denotes chemical formula 3.

[Chemical Expression 2]

Chemical Formula 2

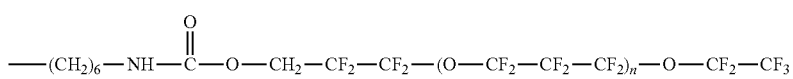

where n denotes an integer of 1 or greater and 6 or smaller.

[Chemical Expression 3]

Chemical Formula 3

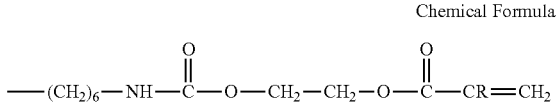

where R denotes H or $CH_3$.

The fluorine-containing (meth)acrylates may be used solely or in combination of two or more. Surface modifying agents for abrasion resistance, defect resistance, fingerprint cohesion prevention, an antifouling property, a leveling effect, a water/oil-repellent property, and the like may be used together. For example, fluorine-containing (meth)acrylates may include "FTERGENT" produced by NEOS COMPANY LIMITED. (including, for example, M-series such as FTERGENT 251, FTERGENT 215M, FTERGENT 250, FTX-245M, and FTX-290M; S-series such as FTX-207S, FTX-211S, FTX-220S, and FTX-230S; F-series such as FTX-209F, FTX-213F, FTERGENT 222F, FTX-233F, FTERGENT 245F; G-series such as FTERGENT 208G, FTX-218G, FTX-230G, and FTS-240G; oligomer series such as FTERGENT 730FM and FTERGENT 730LM; FTERGENT P-series such as FTERGENT 710FL and FTX-710HL, and the like), "MEGAFACE" produced by DIC Corporation (including, for example, F-114, F-410, F-493, F-494, F-443, F-444, F-445, F-470, F-471, F-474, F-475, F-477, F-479, F-480SF, F-482, F-483, F-489, F-172D, F-178K, F-178RM, MCF-350SF, and the like), products produced by DAIKIN INDUSTRIES, ltd. such as "OPTOOL™" (for example, DSX, DAC, and AES), "FTONE™" (for example, AT-100), "ZEFFLE™" (for example, GH-701), "UNIDYNE™", "DAIFREE™", and "OPTACE™", "Novec EGC-1720" produced by Sumitomo 3M Corporation, "FLRUOROSURF" produced by Fluoro Technology Corporation, and the like.

The fluorine-containing (meth)acrylate preferably has a molecular weight Mw of 50 to 50000. From the viewpoint of mutual solubility, the molecular weight Mw is preferably set to 50 to 5000, and more preferably 100 to 5000. When a high molecular weight body having low mutual solubility is used, a diluent solvent may be used. As the diluent solvent, a single solvent preferably has a boiling point of 40 to 180° C., more preferably 60 to 180° C., and further preferably 60 to 140° C. Two or more types of diluents may be used.

A content of the solvent may be set to an amount dispersible in the hardening resin composition (1). Preferably, the content of the solvent is greater than 0 parts by weight and equal to or smaller than 50 parts by weight with respect to the hardening resin composition (1) of 100 parts by weight. In consideration of removal of the surplus solvent amount after drying without limitation, the content of the solvent is more preferably greater than 0 parts by weight and equal to or smaller than 10 parts by weight.

Particularly, in a case where the solvent is contained in order to improve a leveling effect, the content of the solvent is preferably 0.1 or greater parts by weight and 40 or smaller parts by weight with respect to (meth)acrylate of 100 parts by weight. If the content of the solvent is 0.5 or greater parts by weight and 20 or smaller parts by weight, hardening of the hardening resin composition (1) can be maintained, which is desirable. More preferably, the content of the solvent is 1 or greater parts by weight and 15 or smaller parts by weight. In a case where a solvent is contained in order to reduce a thickness of the hardening resin composition (1), if the content of the solvent is 300 or greater parts by weight and 10000 or smaller parts by weight with respect to the (meth)acrylate of 100 parts by weight, a solution stability in the drying process after the coating can be maintained, which is desirable. More preferably, the content of the solvent is 300 or greater parts by weight and 1000 or smaller parts by weight.

(C) Photopolymerization Initiator

The photopolymerization initiator of the hardenable resin composition (1) generates a radical reaction or an ionic reaction by receiving light. A photopolymerization initiator capable of generating a radical reaction is preferably used. The following photopolymerization initiators may be used.

The following photopolymerization initiators known in the art may be used solely or in combination of: an acetophenone-based photopolymerization initiator such as acetophenone, p-tert-butyltrichloroacetophenone, chloroacetophenone, 2,2-diethoxyacetophenone, hydroxyacetophenone, 2,2-dimethoxy-2'-phenylacetophenone, 2-aminoacetophenone, and dialkylamino acetophenone; a benzoin-based photopolymerization initiator such as benzyl, benzoin, benzoinmethyl ether, benzoin ethyl ether, benzoin isopropyl ether, benzoin isobutyl ether, 1-hydroxy cyclohexyl phenyl ketone, 2-hydroxy-2-methyl-1-phenyl-2-methyl propane-1-one, 1-(4-isopropylphenyl)-2-hydroxy-2-methyl propane-1-one, and benzyl dimethyl ketal; a benzophenone-based photopolymerization initiator such as benzophenone, benzoyl benzoic acid, benzoyl benzoic acidmethyl, methyl-o-benzoylbenzoate, 4-phenylbenzophenone, hydroxybenzophenone, hydroxypropylbenzophenone, acrylbenzophenone, 4,4'-bis(dimethylamino)benzophenone, and perfluorobenzophenone; a thioxanthone-based photopolymerization initiator such as thioxanthone, 2-chlorothioxanthone, 2-methylthioxanthone, diethylthioxanthone, and dimethylthioxanthone; an anthraquinone-based photopolymerization initiator such as 2-methylanthraquinone, 2-ethylanthraquinone, 2-tert-butylanthraquinone, 1-chloroanthraquinone, and 2-amylanthraquinone; a ketal-based photopolymerization initiator such as acetophenone dimethyl ketal and benzyl dimethyl ketal; other photopolymerization initiators such as α-acyloxime ester, benzyl-(o-ethoxycarbonyl)-α-monooxime, acyl phosphine oxide, glyoxy ester, 3-ketocoumarine, 2-ethylanthraquinone, camphorquinone, tetramethylthiuram disulfide, azobisisobutyronitrile, benzoyl peroxide, dialkylperoxide, and tert-butyl peroxy pivalate; a fluorine-contained photopolymerization initiator such as perfluoro-tert-butyl peroxide, perfluorobenzoyl peroxide; and the like.

The hardening resin composition (1) may contain a photosensitizer. As a specific example of the photosensitizer, a single photosensitizer or a combination of two or more photosensitizers known in the art may be used. Photosensitizers known in the art include n-butylamine, di-n-butylamine, tri-n-butylphosphine, allylthiourea, s-benzylisothiouronium-p-toluensulfonate, triethylamine, diethylaminoethyl methacrylate, triethylenetetramine, 4,4'-bis(dialkylamino) benzophenone, N,N-dimethylaminobenzoic acid ethyl ester, N,N-dimethylaminobenzoic acid isoamyl ester, pentyl-4-(dimethylamino)benzoate, triethylamine, triethanolamine, and the like.

Commercially available initiators include, for example, an "Irgacure™" (such as Irgacure 651, 184, 500, 2959, 127, 754, 907, 369, 379, 379 EG, 819, 1800, 784, OXE01, and OXE02), a "Darocur™" (such as Darocur 1173, MBF, TPO, and 4265) produced by BASF Corporation, and the like.

The photopolymerization initiators may be used solely or in combination of two or more. When two or more types of photopolymerization initiators are used together, the photopolymerization initiators may be selected in consideration of dispersability of the fluorine-containing (meth)acrylate, hardenability in an inner side and a surface layer portion of the fine pattern of the hardening resin composition (1). For example, an α-hydroxy ketone-based photopolymerization initiator and an α-amino ketone-based photopolymerization initiator may be used together. For example, the combination of two or more types of photopolymerization initiators may include a combination of "Irgacure" series or a combination of "Irgacure" and "Darocure" series. Specifically, a combination of two or more types of photopolymerization initiators may include, for example, a combination of Darocure 1173 and Irgacure 819, a combination of Irgacure 379 and Irgacure 127, a combination of Irgacure 819 and Irgacure 127, a combination of Irgacure 250 and Irgacure 127, a combination of Irgacure 184 and Irgacure 369, a combination of Irgacure 184 and Irgacure 379EG, a combination of Irgacure 184 and Irgacure 907, a combination of Irgacure 127 and Irgacure 379EG, a combination of Irgacure 819 and Irgacure 184, a combination of Darocure TPO and Irgacure 184, and the like.

As a hardening resin composition (2), the hardening resin composition (1) described above may be used excluding (B) fluorine-containing (meth)acrylates. In a case where the resin of the mold 101 is a hardened material of the hardening resin composition (2), both the metal layer 104 and the demolding layer 105, or any one of them is preferably provided from the viewpoint of a transfer accuracy of the second mask layer 102.

A hardening resin composition (3) may be obtained by adding silicone to the hardening resin composition (1) described above or by adding silicone to the hardening resin composition (2).

If silicone is added, the transfer accuracys of the first and second mask layers 103 and 102 are improved due to mold releasability or slidability unique to silicone. Silicone used in the hardening resin composition (3) may include: for example, low-polymerization linear silicone oil exhibiting liquidity at a room temperature, such as polydimethylsiloxane (PDMS) which is a polymer of dimethyl chlorosilane; such denatured silicone oil, high-polymerization linear PDMS, silicone rubber exhibiting a rubber-like elasticity by moderately cross-linking PDMS, silicone resin (or DQ resin) having a 3D mesh structure including such denatured silicone rubber, resin-like silicone, PDMS, and quadrofunctional siloxane; and the like. The crosslinking agent may include an organic molecule or quadrofunctional siloxane (Q-unit).

The denatured silicone oil and the denatured silicone resin is obtained by denaturing a side chain and/or a terminated end of polysiloxane and may be classified into reactive silicone and unreactive silicone. The reactive silicone preferably includes silicone having a hydroxyl group (—OH), silicone having an alkoxy group, silicone having a trialkoxy group, or silicone having an epoxy group. The unreactive silicone preferably includes silicone having a phenyl group, silicone having both a methyl group and a phenyl group, and the like. A combination of a single polysiloxane molecule and two or more denatured elements described above may also be used.

Specifically, commercially available denatured silicone may include, for example, TSF4421 (produced by GE TOSHIBA SILICONES Co., Ltd.), XF42-334 (produced by GE TOSHIBA SILICONES Co., Ltd.), XF42-B3629 (produced by GE TOSHIBA SILICONES Co., Ltd.), XF42-A3161 (produced by GE TOSHIBA SILICONES Co., Ltd.), FZ-3720 (produced by Dow Corning Toray Corporation), BY16-839 (produced by Dow Corning Toray Corporation), SF8411 (produced by Dow Corning Toray Corporation), FZ-3736 (produced by Dow Corning Toray Corporation), BY16-876 (produced by Dow Corning Toray Corporation), SF8421 (produced by Dow Corning Toray Corporation), SF8416 (produced by Dow Corning Toray Corporation), SH203 (produced by Dow Corning Toray Corporation), SH230 (produced by Dow Corning Toray. Corporation), SH510 (produced by Dow Corning Toray Corporation), SH550 (produced by Dow Corning Toray Corporation), SH710 (produced by Dow Corning Toray Corporation), SF8419 (produced by Dow Corning Toray Corporation), SF8422 (produced by Dow Corning Toray Corporation), BY16 series (produced by Dow Corning Toray Corporation), FZ3785 (produced by Dow Corning Toray Corporation), KF-410 (produced by Shin-Etsu Chemical Co., Ltd.), KF-412 (produced by Shin-Etsu Chemical Co., Ltd.), KF-413 (produced by Shin-Etsu Chemical Co., Ltd.), KF-414 (produced by Shin-Etsu Chemical Co., Ltd.), KF-415 (produced by Shin-Etsu Chemical Co., Ltd.), KF-351A (produced by Shin-Etsu Chemical Co., Ltd.), KF-4003 (produced by Shin-Etsu Chemical Co., Ltd.), KF-4701 (produced by Shin-Etsu Chemical Co., Ltd.), KF-4917 (produced by Shin-Etsu Chemical Co., Ltd.), KF-7235B (produced by Shin-Etsu Chemical Co., Ltd.), KR213 (produced by Shin-Etsu Chemical Co., Ltd.), KR500 (produced by Shin-Etsu Chemical Co., Ltd.), KF-9701 (produced by Shin-Etsu Chemical Co., Ltd.), X21-5841 (produced by Shin-Etsu Chemical Co., Ltd.), X-22-2000 (produced by Shin-Etsu Chemical Co., Ltd.), X-22-3710 (produced by Shin-Etsu Chemical Co., Ltd.), X-22-7322 (produced by Shin-Etsu Chemical Co., Ltd.), X-22-1877 (produced by Shin-Etsu Chemical Co., Ltd.), X-22-2516 (produced by Shin-Etsu Chemical Co., Ltd.), PAM-E (produced by Shin-Etsu Chemical Co., Ltd.), and the like.

Reactive silicone may include, for example, amino-modified silicone, epoxy-modified silicone, carboxyl-modified silicone, carbinol-modified silicone, methacryl-modified silicone, vinyl-modified silicone, mercapto-modified silicone, phenol-modified silicone, monofunctionally terminated reactive silicone, heterofunctional group-modified silicone, and the like.

If a silicone compound having any one of a vinyl group, a methacrylic group, an amino group, an epoxy group, or an alicyclic epoxy group is contained, silicone can be composed into the mold 101 by using a chemical bond. Therefore, transfer accuracy of the first and second mask layers 103 and 102 are improved. Particularly, if a silicone compound having any one of a vinyl group, a methacrylic group, an epoxy group, or an alicyclic epoxy group is contained, the aforementioned advantages are further exerted, which is desirable. From the viewpoint of hardening of the resin layer of the mold 101, a silicone compound having any one of a vinyl group or a methacrylic group is preferably used. From the viewpoint of adhesiveness to the support member 100, a silicone compound having any one of an epoxy group or an alicyclic epoxy group is preferably used. The silicone compounds having any one of a vinyl group, a methacrylic group, an amino group, an epoxy group, or an alicyclic epoxy group may be used solely or in combination of two or more. The silicone having a photopolymerizable group and the silicone that does not have a photopolymerizable group may be used solely or in combination of two or more.

The silicone compound having a vinyl group may include, for example, KR-2020 (produced by Shin-Etsu Silicone Co., Ltd.), X-40-2667 (produced by Shin-Etsu Silicone Co., Ltd.), CY52-162 (produced by Dow Corning Toray Corporation), CY52-190 (produced by Dow Corning Toray Corporation), CY52-276 (produced by Dow Corning Toray Corporation), CY52-205 (produced by Dow Corning Toray Corporation), SE1885 (produced by Dow Corning Toray Corporation), SE1886 (produced by Dow Corning Toray Corporation), SR-7010 (produced by Dow Corning Toray Corporation), XE5844 (produced by GE TOSHIBA SILICONES Co., Ltd.), and the like.

The silicone compound having a methacrylic group may include, for example, X-22-164 (produced by Shin-Etsu Silicone Co., Ltd.), X-22-164AS (produced by Shin-Etsu Silicone Co., Ltd.), X-22-164A (produced by Shin-Etsu Silicone Co., Ltd.), X-22-164B (produced by Shin-Etsu Silicone Co., Ltd.), X-22-164C (produced by Shin-Etsu Silicone Co., Ltd.), X-22-164E (produced by Shin-Etsu Silicone Co., Ltd.), and the like.

The silicone compound having an amino group may include, for example, PAM-E (produced by Shin-Etsu Silicone Co., Ltd.), KF-8010 (produced by Shin-Etsu Silicone Co., Ltd.), X-22-161A (produced by Shin-Etsu Silicone Co., Ltd.), X-22-161B (produced by Shin-Etsu Silicone Co., Ltd.), KF-8012 (produced by Shin-Etsu Silicone Co., Ltd.), KF-8008 (produced by Shin-Etsu Silicone Co., Ltd.), X-22-166B-3 (produced by Shin-Etsu Silicone Co., Ltd.), TSF4700 (produced by Momentive Performance Materials Inc.), TSF4701 (produced by Momentive Performance Materials Inc.), TSF4702 (produced by Momentive Performance Materials Inc.), TSF4703 (produced by Momentive Performance Materials Inc.), TSF4704 (produced by Momentive Performance Materials Inc.), TSF4705 (produced by Momentive Performance Materials Inc.), TSF4706 (produced by Momentive Performance Materials Inc.), TSF4707 (produced by Momentive Performance Materials Inc.), TSF4708 (produced by Momentive Performance Materials Inc.), TSF4709 (produced by Momentive Performance Materials Inc.), and the like.

The silicone compound having an epoxy group may include, for example, X-22-163 (produced by Shin-Etsu Silicone Co., Ltd.), KF-105 (produced by Shin-Etsu Silicone Co., Ltd.), X-22-163A (produced by Shin-Etsu Silicone Co., Ltd.), X-22-163B (produced by Shin-Etsu Silicone Co., Ltd.), X-22-163C (produced by Shin-Etsu Silicone Co., Ltd.), TSF-4730 (produced by Momentive Performance Materials Inc.), YF3965 (produced by Momentive Performance Materials Inc.), and the like.

The silicone compound having an alicyclic epoxy group may include, for example, X-22-169AS (produced by Shin-Etsu Silicone Co., Ltd.), X-22-169B (produced by Shin-Etsu Silicone Co., Ltd.), and the like.

A hardening resin composition (4) may include a composition obtained by adding a sol-gel material described below to the hardening resin compositions (1) to (3) or a composition containing only a sol-gel material. If the sol-gel material is added to the hardening resin compositions (1) to (3), it is possible to improve repetitive transferability of the mold by a shrinkage effect unique to the sol-gel material or exert an inorganic property unique to the sol-gel material. Therefore, a penetration suppression effect of the first or second mask layer 103 or 102 against the mold 101 is improved, so that transfer accuracy of the first and second mask layers 103 and 102 are improved.

The sol-gel material of the mold 101 may include a group of compounds hardened as hydrolysis/polycondensation progresses based on heat or catalysis. Such a group of compounds may include, but not particularly limited to, a metal alkoxide, a metal alcoholate, a metal chelate compound, a halogenated silane, liquid glass, spin-on glass, and a reactant thereof. These materials are collectively referred to as a metal alkoxide.

Metal alkoxides are a group of compounds obtained by combining a metal species such as Si, Ti, Zr, Zn, Sn, B, In, or Al and a functional group such as a hydroxy group, a methoxy group, an ethoxy group, a propyl group, or an isopropyl group. Such a functional group generates a metalloxane bond -Me1-O-Me2- (where Me1 and Me2 denote metal species, that may be identical or different) by performing a hydrolysis/polycondensation reaction using water, an organic solvent, hydrolysis catalyst, and the like. If a metal species is silicon (Si), a metalloxane bond (siloxane bond) —Si—O—Si— is generated. When metal alkoxides of metal species M1 and Si are used, for example, a bond -M1-O—Si—may be generated.

The metal alkoxide having a metal species Si may include, for example, dimethyldiethoxysilane, diphenylldiethoxysilane, phenyltriethoxysilane, methyltriethoxysilane, vinyltriethoxysilane, p-styryltriethoxysilane, methylphenyldiethoxysilane, tetraethoxysilane, p-styryltriethoxysilane, a compound obtained by substituting an ethoxy group of these compounds with a methoxy group, a propyl group, or a isopropyl group, and the like. In addition, a compound having a hydroxy group such as diphenylsilanediol or dimethylsilanediol may also be selected.

At least one of the aforementioned functional groups may be directly substituted with a phenyl group and the like without using an oxygen atom from the metal species. For example, such compounds may include diphenylsilanediol, dimethylsilanediol, or the like. By using such compounds, it is possible to increase a density obtained after condensation and a penetration suppression effect of the first and second mask layers 103 and 102 against the mold 101, so that transfer accuracys of the first and second mask layers 103 and 102 are improved.

Halogenated silanes are a group of compounds in which the metal species of the aforementioned metal alkoxides is silicon, and obtained by substituting a functional group causing hydrolysis/polycondensation with a halogen atom.

The liquid glass may include a TGA series produced by Apallo Ring Corporation, and the like. In addition, a sol-gel compound may be added depending on a desired material property.

A silsesquioxane compound may be used as the metal alkoxide. Silsesquioxanes are a group of compounds obtained by binding a single organic group and three oxygen atoms to a single silicon atom. The silsesquioxane may include, but not particularly limited to, polysiloxane having a compositional formula $[(RSiO_{3/2})_n]$. The silsesquioxane may include a polysiloxane having any structure such as a cage type, a ladder type, or a random type. In addition, in the compositional formula $[(RSiO_{3/2})_n]$, the symbol R may denote a substituent or non-substituent siloxy group or any other substituent group, and the number n is preferably set to 8 to 12. In order to obtain an excellent hardenability of the hardening resin composition (4), n is more preferably set to 8 to 10, and further preferably, 8. The n groups R may be identical or different.

The silsesquioxane compound may include, for example, polyhdrogen silsesquioxane, polymethylsilsesquioxane, polyethylsilsesquioxane, polypropylsilsesquioxane, polyisopropylsilsesquioxane, polybutylsilsesquioxane, poly(-sec-butyl)silsesquioxane, poly(-tert-butyl)silsesquioxane, polyphenylsilsesquioxane, and the like. In addition, at least one of the n groups R in the silsesquioxane may be substituted with the substituent groups described below. The substituent groups may include, for example, trifluoromethyl, 2,2,2-trifluoro ethyl, 3,3,3-trifluoropropyl, 2,2,3,3-tetrafluoropropyl, 2,2,3,3,3-pentafluoropropyl, 2,2,2-trifluoro-1-trifluoromethylethyl, 2,2,3,4,4,4-hexafluorobutyl, 2,2,3,3,4,4,5,5-octafluoropentyl, 2,2,2-trifluoroethyl, 2,2,3,3-tetrafluoropropyl, 2,2,3,3,3-pentafluoropropyl, 2,2,3,3,4,4,5,5-octafluoropentyl, 3,3,3-trifluoropropyl, nonafluoro 1,1,2,2-tetrahydrohexyl, tridecafluoro-1,1,2,2-tetrahydrooctyl, heptadecafluoro 1,1,2,2-tetrahydrodecyl, perfluoro-1H,1H,2H,2H-dodecyl, perfluoro-1H,1H,2H,2H-tetradecyl, 3,3,4,4,5,5,6,6,6-nonafluorohexyl, an alkoxysiryl group, and the like. In addition, commercially available silsesquioxanes may be used. For example, the commercially available silsesquioxanes may include various cage-type silsesquioxane derivatives produced by Hybrid Plastics, Inc. or silsesquioxane derivatives produced by Sigma-Aldrich Co., LLC., and the like.

The metal alkoxide may have a prepolymer state in which a polymerization reaction is partially generated, and unreacted functional groups remain. If the metal alkoxide is partially condensed, it is possible to obtain a prepolymer having metal species chained by interposing an oxygen element. That is, by performing the partial condensation, it is possible to produce a prepolymer having a large molecular weight. By partially condensing the metal alkoxide, flexibility is provided to the mold 101. As a result, it is possible to suppress a breakdown of the fine pattern or a crack generated when the mold 101 is manufactured by transfer using the metal alkoxide.

The partial condensation degree can be controlled by a reaction atmosphere, a composition of the metal alkoxide, and the like. What the partial condensation degree is used for a prepolymer state can be appropriately selected depending on a field of use or how to use, and is not particularly limited therefore. For example, a partially condensed material preferably has a viscosity of 50 cP or higher in order to more improve a transfer accuracy and anti-moisture stability. The partially condensed material more preferably has a viscosity of 100 cP or higher in order to further exert such an advantage.

A prepolymer for promoting the partial condensation may be obtained by dehydration-based polycondensation and/or dealcoholization reaction-based polycondensation. For example, it is possible to obtain the prepolymer by heating a solution including a metal alkoxide, water, and a solvent (such as alcohol, ketone, or ether) within a temperature range of 20 to 150° C. and performing hydrolysis and polycondensation. The polycondensation degree can be controlled and appropriately selected based on a temperature, a reaction time, and a pressure (decompression). If the hydrolysis/polycondensation is slowly performed by using moisture in the environmental atmosphere (water vapor based on humidity) without adding water, it is possible to reduce a molecular weight distribution of the prepolymer. Furthermore, in order to promote polycondensation, energy rays may be irradiated. Here, a light source of energy rays may be appropriately selected depending on a type of the metal alkoxide. The light source of energy rays may include, but not particularly limited to, a UV-LED light source, a metal halide light source, a high-pressure mercury lamp light source, and the like. Particularly, if a photoacid generator is added to the metal alkoxide, and energy rays are irradiated onto the corresponding composition, photoacid is generated from the photoacid generator, and polycondensation of the metal alkoxide can be promoted by using the photoacid as a catalyst so as to obtain the prepolymer. Moreover, the prepolymer may be obtained by performing the aforementioned operation while the metal alkoxide is chelated in order to control a condensation degree and a steric arrangement of the prepolymer.

It is defined that the aforementioned prepolymer has a state in which at least four or more metal elements are chained by interposing oxygen atoms. That is, it is defined that the prepolymer has a state in which metal elements are condensed in a chain of —O-M1-O-M2-O-M3-O-M4-O— and so on.

Here, M1, M2, M3, and M4 denote metal elements that may be identical or different. For example, in a case where a metalloxane bond having a chain of —O—Ti—O— is generated by preliminarily condensing a metal alkoxide having titanium as a metal species, it is denoted that the prepolymer is expressed as a general formula [—O—Ti—]$_n$ (where n≥4). Similarly, for example, in a case where a metalloxane bond having a chain of —O—Ti—O—Si—O— is generated by preliminarily condensing a metal alkoxide having titanium as a metal species and a metal alkoxide having silicon as a metal species, it is denoted that the prepolymer is expressed as a general formula [—O—Ti—O—Si—]$_n$ (where n≥2). However, in a case where different types of metal elements are contained, it is not always to form an alternate arrangement such as —O—Ti—O—Si—. For this reason, the prepolymer is expressed as a general formula [—O-M-]$_n$ (where M=Ti or Si, and n≥4).

The metal alkoxide may include a fluorine-containing silane coupling agent. If the fluorine-containing silane coupling agent is included, it is possible to lower surface energy on a fine pattern surface of the mold 101 including the hardened material of the metal alkoxide. Therefore, even when the demolding layer 105 and the like is not formed, transfer accuracy of the first and second mask layers 103 and 102 are improved. This means that the demolding layer 105 can be integrated into the mold in advance.

The fluorine-containing silane coupling agent may include, for example, a compound having a general formula [F$_3$C—(CF$_2$)$_n$—(CH$_2$)$_m$—Si(O—R)$_3$] (where n denotes an integer of 1 to 11, m denotes an integer of 1 to 4, and R denotes an alkyl group having a carbon number of 1 to 3). The fluorine-containing silane coupling agent may include a polyfluoroalkylene chain and/or a perfluoro(polyoxyalkylene) chain. More preferably, the fluorine-containing silane coupling agent has a linear perfluoroalkylene group or a perfluoro oxyalkylene group in which an ether-like oxygen atom is inserted between a carbon atom and a carbon atom, and a trifluoromethyl group exists in a side chain. Particularly, it is preferable that the fluorine-containing silane coupling agent has a linear perfluoro(polyoxyalkylene) chain and/or a linear polyfluoroalkylene chain in which a trifluoromethyl group exists in a side chain or a terminal end of a molecular structure. The polyfluoroalkylene chain preferably includes a polyfluoroalkylene group having a carbon number of 2 to 24. The perfluoro(polyoxyalkylene) chain preferably includes at least one or more perfluoro(oxyalkylene) units selected from a group consisting of a (CF$_2$CF$_2$O) unit, a (CF$_2$CF(CF$_3$)O) unit, a (CF$_2$CF$_2$CF$_2$O) unit, and a (CF$_2$O) unit. More preferably, the perfluoro(polyoxyalkylene) chain preferably includes a (CF$_2$CF$_2$O) unit, a (CF$_2$CF(CF$_3$)O) unit, or a (CF$_2$CF$_2$CF$_2$O) unit. Particularly, it is preferable that the perfluoro(polyoxyalkylene) chain include a (CF$_2$CF$_2$O) unit because of an excellent surface segregation characteristic.

The metal alkoxide according to the present invention may contain a polysilane. Polysilanes are a group of compounds having a silicon element in a main chain, in which a bond [—Si—Si—] is replicated. By irradiating energy rays (such as ultraviolet rays) onto the polysilane, the bond [—Si—Si—] is broken, and a siloxane bond is generated. For this reason, a siloxane bond can be effectively generated by providing a polysilane and irradiating ultraviolet rays, so that it is possible to improve a transfer accuracy when a mold is transferred by using the metal alkoxide as a source material.

The mold 101 may be a hybrid type including an inorganic segment and an organic segment. If the mold 101 is a hybrid type, a transfer accuracy for manufacturing the mold 101 through transfer is improved, and a physical integrity of the fine pattern is improved. Furthermore, depending on the compositions of the first and second mask layers 103 and 102, it is possible to more effectively suppress the first and second mask layers 103 and 102 from penetrating into the inside of the concavo-convex structure 101a of the mold 101. As a result, it is possible to improve a transfer accuracy. The hybrid type mold may be formed of, for example, photopolymerizable (or thermopolymerizable) resins with an inorganic precursor, molecules having a covalent bond between an organic polymer and an inorganic segment, and the like. In a case where a sol-gel material is used as an inorganic precursor, a photopolymerizable resin is included in addition to the sol-gel material including a silane coupling agent. In the case of the hybrid type, for example, a metal alkoxide and a silane coupling agent having a photopolymerizable group may be mixed. Alternatively, for example, a metal alkoxide, a silane coupling agent having a photopolymerizable group, a radical polymerizable resin, and the like may be mixed. In order to further increase a transfer accuracy, silicone may be added to these materials. A mixing ratio between the metal alkoxide having a silane coupling agent and the photopolymerizable resin is preferably set to 3:7 to 7:3 in parts by weight from the viewpoint of a transfer accuracy.

[Second Mask Layer]

Materials of the second mask layer 102 are not particularly limited if it satisfies the etching selectivity described below. The materials of the second mask layer 102 may include various well-known resins (organic materials), an inorganic precursor, an inorganic condensation material, a plating solution (such as a chromium plating solution), a metal oxide filler, metal oxide fine particles, silsesquioxanes such as HSQ, spin-on glass, metal fine particles, and the like, that can be diluted with a solvent. The second mask layer 102 and the first mask layer 103 described below are preferably chemically bound to each other or form a hydrogen bond from the viewpoint of a transfer accuracy for forming the layered product 201 through transfer using a layered product for fine pattern formation. In order to improve a transfer speed and a transfer accuracy, photopolymerization or thermopolymerization, and combined polymerization thereof is useful. For this reason, the second mask layer is especially preferably formed using both of a photopolymerizable group and a thermopolymerizable group or any one of them. In addition, the second mask layer 102 preferably contains a metal element from the viewpoint of dry etching resistance. Furthermore, if the second mask layer 102 contains fine particles of metal oxides, dry etching can be more easily performed for the object 200 to be processed, which is desirable.

Metal elements of the second mask layer 102 preferably include at least one element selected from a group consisting of titanium (Ti), zirconium (Zr), chromium (Cr), zinc (Zn), tin (Sn), boron (B), indium (In), aluminum (Al), silicon (Si), molybdenum, tungsten, and germanium. Particularly, the second mask layer 102 preferably contains titanium (Ti), zirconium (Zr), chromium (Cr), or silicon (Si). In addition, the second mask layer 102 preferably includes a metalloxane bond [—O-Me1-O-Me2-O—] in order to allow metal elements of the second mask layer 102 to stably exist, satisfy dry etching resistance described below, and improve a fabrication accuracy when the first mask layer 103 is etched by using the second mask layer 102 as a mask in the layered product consisting of [the second mask layer 102/the first mask layer 103/the object 200 to be processed]. Here, both of Me1 and Me2 denote metal elements that may be identical or different. The metal elements described above may be used as M1 and M2. For example, in the case of a single metal element, the metalloxane bond may include [—O—Ti—O—Ti—O—],

[—O—Zr—O—Zr—O—], [—O—Si—O—Si—O—], and the like. In the case of including different types of metal elements, the metalloxane bond may include [—O—Ti—O—Si—O—], [—O—Zr—O—Si—O—], [—O—Zn—O—Si—O—], and the like. The metal elements of the metalloxane bond may include three or more types. Particularly, when two or more types of metal elements are included, at least silicon (Si) is preferably included from the viewpoint of a transfer accuracy of the mask layer.

In a case where the second mask layer 102 has a metalloxane bond, a ratio $C_{pM1}/C_{pSi}$ between a concentration $C_{pSi}$ of silicon (Si) in the entire composition of the second mask layer 102 and a total concentration $C_{pM1}$ of metal elements other than silicon (Si) is preferably set to 0.02 or higher and 24 or lower because a fabrication accuracy is improved when the first mask layer 103 is etched by using the second mask layer 102 as a etching mask. Particularly, the ratio $C_{pM1}/C_{pSi}$ is more preferably set to 0.05 or higher and 20 or lower, and most preferably 0.1 or higher and 15 or lower.

If a radius of inertia is set to 5 nm or smaller in a case where a source material of the second mask layer 102 is dissolved into a solvent having a concentration of 3 weight %, a filling and arrangement accuracy of the second mask layer 102 in the concave portion 101c of the concavo-convex structure 101a of the mold 101 is improved, and a fabrication accuracy is improved when the first mask layer 103 is etched by using the second mask layer 102 as an etching mask, which is desirable. The radius of inertia is preferably set to 3 nm or smaller, more preferably 1.5 nm or smaller, and most preferably 1 nm or smaller. Here, the radius of inertia is a radius computed by applying a Gunier plot to the measurement result obtained through a small-angle X-ray scattering measurement using X-rays having a wavelength of 0.154 nm.

As a method of incorporating the metalloxane bond into the second mask layer, metal oxide nanoparticles may be used, or an inorganic precursor may be condensed. As a method of condensing the inorganic precursor, for example, a reaction caused by hydrolysis and polycondensation of the metal alkoxides described above may be used.

A source material of the second mask layer 102 preferably has a viscosity of 50 cP or higher at a temperature of 25° C. because a fabrication accuracy is improved when the first mask layer 103 is etched by using the second mask layer 102 as a mask. From the similar advantage, the viscosity of the source material of the second mask layer 102 is more preferably set to 100 cP or higher, and most preferably 150 cP or higher. In order to improve a filling and dearrangement accuracy of the second mask layer 102 in the concave portion 101c of the concavo-convex structure 101a of the mold 101, the viscosity of the source material of the second mask layer 102 is preferably set to 10000 cP or lower, more preferably 8000 cP or lower, and most preferably 5000 cP or lower. As described below, a source material of the second mask layer is diluted with a solvent for use.

As a method of incorporating the metal element into the second mask layer 102, for example, metal oxide fine particles (filler), metal fine particles, or a sol-gel material such as metal alkoxides may be incorporated into a source material of the second mask layer 102. As the sol-gel material used in the second mask layer 102, for example, the metal alkoxides used to form the mold 101 described above may be used.

From the viewpoint of dry etching resistance of the second mask layer 102, the metal alkoxide preferably contains a metal element selected from a group consisting of Ti, Ta, Zr, Zn, and Si as a metal species. Particularly, from the viewpoint of improvement of a transfer accuracy and a transfer speed, the sol-gel material preferably contains at least two types of metal alkoxides having different metal species. A combination of the metal species in the metal alkoxides having two different types of metal species may include, for example, a combination of Si and Ti, a combination of Si and Zr, a combination of Si and Ta, a combination of Si and Zn, and the like. From the viewpoint of dry etching resistance, a ratio $C_{M1}/C_{Si}$ between a molarity $C_{Si}$ of the metal alkoxide having the metal species Si and a molarity $C_{M1}$ of the metal alkoxide having the metal species M1 other than Si is preferably set to 0.2 to 15. From the viewpoint of stability for drying and coating when a material of the second mask layer 102 is coated on a surface of the fine pattern of the mold 101 to arrange the second mask layer, the ratio $C_{M1}/C_{Si}$ is preferably set to 0.5 to 15. From the viewpoint of a physical strength, the ratio $C_{M1}/C_{Si}$ is more preferably set to 5 to 8.

In the widest range of 0.2 to 15 of the ratio $C_{M1}/C_{Si}$, the ratio $C_{M1}/C_{Si}$ is preferably set to 0.2 to 10 in order to improve a configuration stability of the second mask layer 102 when the first mask layer 103 is etched by using the second mask layer 102 as a mask. Particularly, the ratio $C_{M1}/C_{Si}$ is preferably set to 0.2 to 5, and more preferably 0.2 to 3.5 in order to improve a physical stability in the etching of the second mask layer 102. The ratio $C_{M1}/C_{Si}$ is preferably set to 0.23 to 3.5 in order to improve a contour shape stability of the second mask layer 102 when the first mask layer 103 is etched by using the second mask layer 102 as a mask. From the same viewpoint, the ratio $C_{M1}/C_{Si}$ is preferably set to 0.25 to 2.5.

Preferably, the second mask layer 102 is a hybrid type including an inorganic segment and an organic segment from the viewpoint of dry etching resistance and a transfer accuracy of the second mask layer 102. The hybrid type second mask layer may be formed of, for example, a combination of inorganic fine particles and a photopolymerizable (or thermopolymerizable) resin, a combination of an inorganic precursor and a photopolymerizable (or thermopolymerizable) resin, or molecules in which an organic polymer and an inorganic segment are bound in a covalent bond, an inorganic precursor and an inorganic precursor having a photopolymerizable group in a molecule, and the like. In a case where a sol-gel material is used as an inorganic precursor, the hybrid means that a photopolymerizable resin is included in addition to the sol-gel material including a silane coupling agent. In the case of the hybrid type, for example, a metal alkoxide, a silane coupling agent having a photopolymerizable group, and a radical polymerization based resin may be mixed. In order to more improve a transfer accuracy, silicone may be added to these materials. In order to improve dry etching resistance, the part of the sol-gel material may be preliminarily condensed in advance. A mixing ratio between the metal alkoxide having a silane coupling agent and the photopolymerizable resin is preferably set to 3:7 to 7:3 from the viewpoint of dry etching resistance and a transfer accuracy. More preferably, the mixing ratio is set to 3.5:6.5 to 6.5:3.5. The resin used in the hybrid type may be a radical polymerization system or a cation polymerization system without a particular limitation with it is photopolymerizable.

In a case where an inorganic precursor having an inorganic precursor and a photopolymerizable group in a molecule is used as the hybrid type, a metal alkoxide having a metal species other than silicon (Si) may be used as the inorganic precursor, and a silane coupling agent having a photopolymerizable group may be used as an inorganic precursor having a photopolymerizable group in a molecule. In addition, silicone may be included.

In the layered product 201 consisting of [the object 200 to be processed/the first mask layer 103/the second mask layer 102] obtained using the layered product for fine pattern formation, a molecule having covalent bond between an organic polymer and an inorganic segment or an inorganic precursor and an inorganic precursor having a photopolymerizable group in a molecule are preferably used in order to reduce roughness in a side face of the first mask layer 103 when the first mask layer 103 is etched by using the second mask layer 102 as a etching mask. In the inorganic precursor, for example, a metal alkoxide may be selected as the inorganic precursor. Also, in the inorganic precursor having a photopolymerizable group in a molecule, a silane coupling agent having a photopolymerizable group may be selected. Particularly, a metal species of the metal alkoxide used in the inorganic precursor preferably includes Ti, Ta, Zr, or Zn, and most preferably Ti, Zr, or Zn.

The second mask layer 102 may be arranged on the concavo-convex structure 101a of the mold 101 such that a source material of the second mask layer 102 is diluted with a solvent, and the diluted source material of the second mask layer 102 is coated on the mold 101. The diluent solvent is not particularly limited. In a case of a single solvent, the diluent solvent preferably has a boiling point of 40 to 200° C., more preferably 60 to 180° C., and further preferably 60 to 160° C. Two or more types of diluents may be used.

If a radius of inertia of the solvent is set to 5 nm or smaller in a case where a source material of the second mask layer 102 is dissolved into a solvent having a concentration of 3 weight %, a filling and arrangement accuracy of the second mask layer 102 in the concave portion 101c of the concavo-convex structure 101a of the mold 101 is improved, and a fabrication accuracy is improved when the first mask layer 103 is etched by using the second mask layer 102 as a mask, which is desirable. The radius of inertia is preferably set to 3 nm or smaller, more preferably 1.5 nm or smaller, and most preferably 1 nm or smaller. Here, the radius of inertia is a radius computed by applying a Gunier plot to the measurement result obtained through a small-angle X-ray scattering measurement using X-rays having a wavelength of 0.154 nm.

The photopolymerizable group included in the second mask layer 102 may include an acryloyl group, a methacryloyl group, an acryloxy group, a methacryloxy group, an acrylic group, a methacrylic group, a vinyl group, an epoxy group, an allyl group, an oxetanyl group, and the like.

As a well-known resin included in the second mask layer 102, a resin having both a photopolymerization and a thermopolymerization or any one of them may be used. For example, in addition to the resins of the mold 101 described above, the resin included in the second mask layer 102 may include a photosensitive resin used in photolithography, a photopolymerizable resin used in nanoimprint lithography, a thermopolymerizable resin, and the like. Particularly, a resin in which a ratio Vo1/Vm1 between the etching rate Vm1 of resin of the second mask layer 102 and the etching rate Vo1 of the first mask layer 103 in this dry etching satisfies a condition of $1 \leq Vo1/Vm1 \leq 50$ may be preferably included.

A material of the second mask layer 102 preferably includes a sol-gel material. If the sol-gel material is included, the second mask layer 102 having excellent dry etching resistance can be easily filled in the inside of the fine pattern of the mold 101, and it is possible to increase a ratio $Vr_\perp/Vr_{//}$ between a dry etching rate $Vr_\perp$ in a vertical direction and a dry etching rate $V_{//}$ in a horizontal direction when dry etching is performed for the first mask layer 103. As a sol-gel material, only a metal alkoxide having a single metal species may be used, or metal alkoxides having different metal species may be used together. However, the sol-gel material preferably contains at least two types of metal alkoxides including a metal alkoxide having a metal species M1 (where M1 denotes at least a metal species selected from a group consisting of Ti, Zr, Zn, Sn, B, In, and Al) and a metal alkoxide having a metal species Si. Alternatively, as a material of the second mask layer, a hybrid type including such as sol-gel material and a photopolymerizable group known in the art may be used.

In order to suppress a physical breakdown in dry etching, the second mask material preferably experiences less phase separation after hardening caused by both condensation and photopolymerization or any one of them. Here, phase separation can be recognized by a contrast of a transmission electron microscope (TEM). From the viewpoint of a transferability of the second mask layer 102, a phase separation size is preferably equal to or smaller than 20 nm in the contrast of the TEM. From the viewpoint of physical integrity and dry etching resistance, the phase separation size is preferably set to 15 nm or smaller, and more preferably 10 nm or smaller. From the viewpoint of suppression of the phase separation, the sol-gel material preferably includes a silane coupling agent having a photopolymerizable group.

A photopolymerizable radical-polymerization resin of the second mask layer 102 preferably includes the photopolymerizable radical-polymerization resins of the mold 101 described above excluding fluorine-containing (meth)acrylate. In addition, the photopolymerization initiator included in the material of the second mask layer 102 may include the (C) photopolymerization initiators used in the hardening resin composition as a material of the mold 101 described above.

The photopolymerizable cation-polymerization resin of the second mask layer 102 has at least a composition having a cation hardenable monomer and a photoacid generator. The cation hardenable monomer in the cation hardening resin composition is a compound capable of a hardened material by performing a hardening treatment such as UV irradiation or heating with a cation polymerization initiator. The cation hardenable monomer may include an epoxy compound, an oxetane compound, and a vinyl ether compound. The epoxy compound may include an alicyclic epoxy compound and glycidyl ether. The alicyclic epoxy compound is preferably used to improve a polymerization initiation speed, and the oxetane compound is preferably used to improve a polymerization rate. The glycidyl ether is preferably used to lower a viscosity of the cation-hardening resin composition and improve coatability. More preferably, the alicyclic epoxy compound and the oxetane compound are mixedly used. Further preferably, the alicyclic epoxy compound and the oxetane compound are mixedly used with a weight ratio of 99:1 to 51:49.

Specifically, the following cation-hardenable monomers may be used. The alicyclic epoxy compound may include, for example, 3',4'-epoxycyclohexanecarboxylic acid-3,4-epoxycyclohexylmethyl, 3',4'-epoxy-6'-methylcyclohexanecarboxylic acid-3,4-epoxy-6'-cyclohexyl methyl, vinylcyclohexene monooxide, 1,2-epoxy-4-vinylcyclohexane, 2-(3,4-epoxy cyclohexyl)ethyltrimethoxysilane, and the like.

The glycidyl ether may include, for example, bisphenol-A glycidyl ether, bisphenol-F glycidyl ether, hydrogen-containing bisphenol-A glycidyl ether, hydrogen-containing bisphenol-F glycidylether, 1,4-butanediol glycidyl ether, 1,6-hexanediol glycidyl ether, trimethylolpropane triglycidyl ether, glycidyl methacrylate, 3-glycidyloxypropyltrimethoxysilane, 3-glycidyloxypropylethyldiethoxysilane, 3-glycidyloxypropyltriethoxysilane, and the like.

The oxetane compound may include, for example, 3-ethyl-3-(phenoxy methyl) oxetane, di[1-ethyl(3-oxetanyl)]methyl ether, 3-ethyl-3 allyloxymethyloxetane, 3-ethyl-3-(2-ethylhexyloxymethyl)oxetane, 3-ethyl-3-{[3-(triethoxysilyppropoxy]methyl}oxetane, and the like.

The vinyl ether may include, for example, 2-hydroxy butyl vinyl ether, diethylene glycol monovinyl ether, 2-hydroxy butyl vinyl ether, 4-hydroxy butyl vinyl ether, triethylene glycol divinyl ether, cyclohexanedimethanol divinyl ether, 1,4-butanediol divinyl ether, and the like.

A photoacid generator is not particularly limited if it generates photoacid through light irradiation. For example, the photoacid generator may include aromatic onium salts such as sulfonium salts and iodonium salts. The photoacid generator may include, for example, sulfonium hexafluoroantimonate, benzyl triphenylphophnium hexafluorophosphate, benzyl pyridinium hexafluorophosphate, diphenyliodonium hexafluorophosphate, triphenyl sulfonium hexafluorophosphate, benzoin tosylate, ADEKA OPTOMER sp-170 (produced by ADEKA CORPORATION), ADEKA OPTOMER sp-172 (produced by ADEKA CORPORATION), WPAG-145 (produced by Wako Pure Chemical Industries, Ltd.), WPAG-170 (produced by Wako Pure Chemical Industries, Ltd.), WPAG-199 (produced by Wako Pure Chemical Industries, Ltd.), WPAG-281 (produced by Wako Pure Chemical Industries, Ltd.), WPAG-336 (produced by Wako Pure Chemical Industries, Ltd.), WPAG-367 (produced by Wako Pure Chemical Industries, Ltd.), CPI-100P (produced by San-Apro, Ltd.), CPI-101A (produced by San-Apro, Ltd.), CPI-200K (produced by San-Apro, Ltd.), CPI-210S (produced by San-Apro, Ltd.), DTS-102 (produced by Midori Kagaku Co., Ltd.), TPS-TF (produced by Toyo Gosei CO., Ltd.), DTBPI-PFBS (produced by Toyo Gosei CO., Ltd.), and the like.

If such a photoacid generator is contained in a material of the second mask layer 102, it is possible to improve a hydrolysis/polycondensation speed of the metal alkoxide, a transfer speed, and a transfer accuracy due to the photoacid generated by light irradiation even when only the metal alkoxide is included as a component other than the photoacid generator in a material of the second mask layer 102. The solvent for dissolving the photoacid generator is not particularly limited if it can dissolve the used photoacid generator, and may include, for example, a mixed solvent between propylene carbonate or propylene carbonate and an alcohol, ether, or ketone-based solvent (A), and the like. A mixing ratio between the propylene carbonate and the solvent (A) is preferably set to 5 or higher by weight percent (solvent (A)/propylene carbonate) because mutual solubility is excellent.

In a case where wettability is deteriorated when a diluted material of the second mask is directly coated on a surface of the fine pattern of the mold 101, a surfactant or a leveling agent may be added. Commercially available products, preferably having a photopolymerizable group in the same molecule, may be used for this purpose. The addition concentration is preferably equal to or higher than 40 parts by weight, and more preferably equal to or higher than 60 parts by weight with respect to 100 parts by weight of the mask material from the viewpoint of coatability. Meanwhile, from the viewpoint of dry etching resistance, the addition concentration is preferably equal to or lower than 500 parts by weight, more preferably equal to or lower than 300 parts by weight, and further preferably equal to or lower than 150 parts by weight.

Meanwhile, in order to improve dispersability of the second mask material or improve a transfer accuracy, the addition concentration is preferably set to 20 or lower weight % with respect to the second mask material in a case where a surfactant or a leveling agent is used. If the addition concentration is equal to or lower than 20 weight %, dispersability is significantly improved. If the addition concentration is equal to or lower than 15 weight %, a transfer accuracy is improved, which is desirable. More preferably, the addition concentration is equal to or lower than 10 weight %. Particularly, such a surfactant or a leveling agent preferably contains at least one of a carboxyl group, a urethane group, a functional group having an isocyanuric acid derivative from the viewpoint of mutual solubility. In addition, the isocyanuric acid derivative may have a structure of the isocyanuric acid, in which at least one hydrogen atom bound to a nitrogen atom is substituted with another group. A surfactant or a leveling agent satisfying such a condition includes, for example, OPTOOL DAC produced by DAIKIN INDUSTRIES, Ltd. The additive is preferably mixed with the second mask material while it is dissolved in a solvent.

If a material whose condition is changed when the solvent is volatilized after the coating process is contained in the mask material of the second mask layer 102, it is conceived that a driving force that an surface area of the material itself may also be reduced, acts at the same time. Therefore, the mask material is more effectively filled in the concave portion 101c of the fine pattern of the mold 101. As a result, the distance lcv can be set to a small value, preferably zero, which is desirable. The condition change may include, for example, an exothermic reaction or an increasing viscosity. For example, if a sol-gel material is included, the sol-gel material is reacted with water vapor in the air during the solvent volatilization, so that the sol-gel material is polycondensed. Accordingly, the energy of the sol-gel material becomes unstable. Therefore, a driving force that the sol-gel material tends to be apart from a liquid surface (interface between the solvent and the air) of the solvent lowered as the solvent is dried, acts. As a result, it is conceived that the sol-gel material is appropriately filled in the concave portion 101c of the fine pattern of the mold 101, so that the distance lcv is reduced.

[First Mask Layer (First Layered Product 1)]

If the first layered product 1 of FIG. 4A is laminated with and adhered to the object 200 to be processed by interposing the first mask layer 103, and then, the mold 101 is removed, it is possible to easily transfer the second mask layer 102 onto the object 200 to be processed.

The first mask layer 103 is not particularly limited if it satisfies an etching rate ratio (etching selectivity) described below. A material of the first mask layer 103 may include the photopolymerizable radical-polymerization resins of the mold 101 described above excluding the fluorine-containing (meth)acrylate, the photopolymerizable cation-polymerization resins of the second mask layer 102 described above, other commercially available photopolymerizable or thermopolymerizable resins, organic/inorganic hybrid photopolymerizable resins, and the like. In addition, a material of the first mask layer 103 used in the second layered product 2 described below may also be used.

Preferably, the first and second mask layers 103 and 102 are chemically bound to each other from the viewpoint of a transfer accuracy. For this reason, in a case where the second mask layer 102 contains a photopolymerizable group, it is preferable that the first mask layer 103 also contains the photopolymerizable group. In a case where the second mask layer 102 contains a thermopolymerizable group, it is preferable that the first mask layer 103 also contains the thermopolymerizable group. In order to generate a chemical bond caused by condensation with the sol-gel material of the second mask layer 102, a sol-gel material may be contained in the first mask layer 103. As a photopolymerization type, there are radical type polymerization and cation type polymerization. From the viewpoint of a hardening speed and dry etching resistance, only a radical type or a hybrid type between radical and cation types is preferably used. In the case of the hybrid type, the radical polymerization resin and the cation polymerization resin are preferably mixed with a weight percentage of 3:7 to 7:3, and more preferably 3.5:6.5 to 6.5:3.5.

From the viewpoint of a physical stability and a handling convenience of the first mask layer 103 during dry etching, a glass transition temperature (Tg) of the first mask layer 103 after hardening is preferably set to 30 to 300° C., and more preferably 60 to 250° C.

From the viewpoint of adherence between the first mask layer 103 and the object 200 to be processed and adherence between the first and second mask layers 103 and 102, a hydrometric shrinkage rate of the first mask layer 103 is preferably set to 5% or lower.

The first mask layer 103 is formed on a principal surface of the object 200 to be processed or a fine pattern of the first layered product 1. In a case where the first mask layer 103 is formed on a surface of the fine pattern of the first layered product 1, a thickness of the first mask layer 103 is defined as a distance lor between a top position Scv of the mask layer 102b on the convex portion provided on the convex portion 101b of the concavo-convex structure 101a and a surface position of the first mask layer 103. In addition, in a case where the mask layer 102b on the convex portion does not exist, that is, if the distance lcv is zero, a distance between the top position S of the convex portion of the concavo-convex structure 101a and the surface position of the first mask layer 103 is defined as the distance lor. If both of a thickness of the first mask layer 103 deposited on a principal surface of the object 200 to be processed and a thickness of the first mask layer 103 deposited on a surface of the fine pattern of the first layered product 1 are denoted by lor, a ratio lor/P between the thickness lor and the pitch P of the fine pattern is preferably set to lor/P≤5 (Formula (15)) because a fabrication accuracy and a physical stability of the fine mask pattern 202a are improved. Particularly, the ratio lor/P is more preferably set to lor/P≤4, and most preferably lor/P≤2.5. Meanwhile, from the viewpoint of a laminating accuracy and a transfer accuracy, the ratio lor/P is preferably set to lor/P≥0.05. Variability of the distance lor may be set to, depending on the pitch P of the fine pattern, from the viewpoint of variability of the width of the first mask layer 103 on the object 200 to be processed after the etching of the first mask layer 103, approximately ±30%, more preferably ±25%, and most preferably ±10%.

Furthermore, the first mask layer 103 may have a multilayer structure having n or more layers (where n≥2). For example, a first mask layer 103-1 may be provided on a principal surface of the object 200 to be processed, and a first mask layer 103-2 may be provided on the first mask layer 103-1. Similarly, a first mask layer 103-N+1 may be provided on a first mask layer 103-N. If the first mask layer 103 has a n-multilayer structure, controllability of an inclination of the first mask layer 103 and the like is improved when (dry) etching is performed from the second mask layer 102 surface side for the layered product including the second mask layer 102, the n-layered first mask layer 103, and the object 200 to be processed. For this reason, workability in subsequent fabrication of the object 200 to be processed is improved. In order to further exert this advantage, the number of layers n of the multilayered first mask layer 103 is preferably set to 2 or greater and 10 or smaller, more preferably 2 or greater and 5 or smaller, and most preferably 2 or greater and 4 or smaller. In addition, in the case of the multilayered first mask layer 103, if a total volume of the (n) th layer is set to Vn, a total volume V of the first mask layer 103 becomes V1+V2+ . . . +Vn. In this case, the first mask layer 103 satisfying the etching selectivity (ratio of dry etching rates) described below preferably has a volume of 50% or larger with respect to the total volume V of the first mask layer 103. For example, in a case where the first mask layer 103 has a three-layer structure, a volume of the first layer of the first mask layer 103 is set to V1, a volume of the second layer of the first mask layer 103 is set to V2, and a volume of the third layer of the first mask layer 103 is set to V3. In a case where the second and third layers of the first mask layer 103 satisfy the etching selectivity range, a volume ratio (V2+V3)/(V1+V2+V3) is preferably set to 0.5 or greater. Similarly, in a case where only the third layer satisfies the etching selectivity, a volume ratio (V3)/(V1+V2+V3) is preferably set to 0.5 or greater. Particularly, from the viewpoint of fabrication accuracys of the multilayered first mask layer 103 and the object 200 to be processed, a volume ratio is more preferably set to 0.65 (65%) or higher, and most preferably 0.7 (70%) or higher. If all of the n layers satisfy the etching selectivity range, a fabrication accuracy of the object 200 to be processed is significantly improved. Therefore, a volume ratio is preferably set to 1 (100%).

[First Mask Layer (Second Layered Product 2)]

If the first mask layer 103 of the second layered product 2 illustrated in FIG. 4B is laminated with and adhered to the object 200 to be processed, and then, the mold 101 is removed, it is possible to easily transfer the second mask layer 102 onto the object 200 to be processed.

The first mask layer 103 is not particularly limited if it satisfies the etching rate ratio (etching selectivity) described below, and a reactive diluent and a polymerization initiator is included. If the reactive diluent is included, adhesiveness is improved when the first mask layer 103 is laminated with the object 200 to be processed. Meanwhile, if a polymerization initiator is contained, an interfacial adhesion strength between the first and second mask layers 103 and 102 is improved, and adhesion strength between the first and second mask layers 103 and 102 and adhesion strength between the first mask layer 103 and the object 200 to be processed can be fixed. As a result, a transfer accuracy of the second mask layer 102 is improved.

It is preferable that the first and second mask layers 103 and 102 be chemically bound to each other from the viewpoint of a transfer accuracy. For this reason, in a case where the second mask layer 102 has a photopolymerizable group, it is preferable that the first mask layer 103 also have a photopolymerizable group. In addition, in a case where the second mask layer 102 has a thermopolymerizable group, it is preferable that the first mask layer 103 also have a thermopolymerizable group.

A sol-gel material may be included in the first mask layer 103 in order to generate a chemical bond through condensation with the sol-gel material in the second mask layer 102. As a photopolymerization type, there are radical type polymerization and cation type polymerization. From the viewpoint of a hardening speed and dry etching resistance, only a radical type or a hybrid type between radical and cation types is preferably used. In the case of the hybrid type, the radical polymerization resin and the cation polymerization resin are mixed with a weight percentage of 3:7 to 7:3, and more preferably 3.5:6.5 to 6.5:3.5.

From the viewpoint of a physical stability and a handling convenience of the first mask layer 103 during dry etching, a glass transition temperature (Tg) of the first mask layer 103 after hardening is preferably set to 30 to 250° C., and more preferably 60 to 200° C.

From the viewpoint of adherence between the first mask layer 103 and the object 200 to be processed or adherence between the first and second mask layers 103 and 102, a hydrometric shrinkage rate of the first mask layer 103 is preferably set to 5% or lower.

The first mask layer 103 may include a binder resin. If the binder resin is included, a physical stability of the first mask layer 103 and a laminating accuracy for laminating the first mask layer 103 to the object 200 to be processed are improved. In addition, if the first mask layer 103 includes a binder resin, a reactive diluent, and a polymerization initiator, a precision stability of the first mask layer 103 in the second layered product 2 can be improved. For this reason, transfer can be performed by reflecting an arrangement accuracy of the fine pattern of the second mask layer 102 of the second layered product 2 and a thickness precision of the first mask layer 103 on the object 200 to be processed.

If a binder resin is included, it is possible to dry the first mask layer 103. That is, it is possible to treat the first mask layer 103 as a (semi)solid material having significantly low stickiness. For this reason, a handling convenience until the second layered product 2 is laminated to the object 200 to be processed is improved. In addition, thermocompressive bonding (thermal laminating) can be used in laminating and adhering to the object 200 to be processed, so that a laminating precision and a transfer accuracy are more improved.

The binder resin may be a reactive binder resin. A reactive portion of the reactive binder resin is preferably photoreactive if the reactive diluent is photoreactive. The reactive portion of the reactive binder resin is preferably thermoreactive if the reactive diluent is thermoreactive. If the binder resin is a reactive binder resin, stabilization of adhesiveness between the first mask layer 103 and the object 200 to be processed and stabilization of adhesiveness between the first and second mask layers 103 and 102 are more improved, so that a transfer accuracy is improved.

In addition, the binder resin may be an alkali-soluble resin. If the binder resin is an alkali-soluble resin, remnants including the first mask layer 103 can be easily removed by applying an alkaline development after the fine pattern 220 is formed on the object 200 to be processed. Therefore, a fabrication margin of the object 200 to be processed is widened. From the viewpoint of adherence to the object 200 to be processed and an alkaline developing property, the binder resin preferably includes a carboxyl group. The amount of the carboxyl group is preferably set to 100 to 600, and more preferably 300 to 450 in terms of acid equivalent. The acid equivalent means a mass of linear polymer which has 1 equivalent of a carboxyl group. The measurement of acid equivalent is performed by a potentiometric titration method using sodium hydroxide of 0.1 mol/L with a Hiranuma automatic titration apparatus (COM-555) manufactured by Hiranuma Sangyo Co., Ltd.

The weight-average molecular weight of the binder resin is preferably set to 5,000 to 500,000 from the viewpoint of a transfer accuracy and a laminating property. The weight-average molecular weight of the binder resin is preferably set to 5,000 to 100,000, and more preferably 5,000 to 60,000 in order to improve a physical stability of the first mask layer 103 and further exert an advantage of improving a laminating precision when the first mask layer 103 is laminated to the object 200 to be processed.

A dispersion degree (sometimes, referred to as "molecular-weight distribution") is expressed by a ratio of the weight-average molecular weight and the number-average molecular weight ((dispersion degree)=(weight-average molecular weight)/(number-average molecular weight)). The dispersion degree is approximately set to 1 to 6 and is preferably set to 1 to 4. In addition, the molecular weight is obtained as a weight-average molecular weight (in terms of polystyrene) using a gel permeation chromatography (GPC) manufactured by JASCO Corporation (Pump: Gulliver, PU-1580, columns: four columns of Shodex™ produced by SHOWA DENKO K. K. (KF-807, KF-806M, KF-806M, KF-802.5) in series; solvent for moving phase: tetrahydrofuran, using a calibration curve of polystyrene standard sample.

From the viewpoint of the etching selectivity described below, an element represented by the following general formula (1) is preferably included in a side chain, an inner side of a main chain, or inner sides of the side and main chains of the binder resin.

[Chemical Expression 4]

General formula (1)

A resin obtained by copolymerizing one or more monomers in the following two types of monomers may be selected as the binder resin.

A first monomer is selected from carboxylic acids or anhydrides having a single polymeric unsaturated group in a molecule. For example, the first monomer may include (meth) acrylic acid, fumaric acid, cinnamic acid, crotonic acid, itaconic acid, maleic anhydride, maleic acid half-ester, and the like.

A second monomer is selected from non-acidic compounds having a single polymeric unsaturated group in a molecule such that various characteristics such as flexibility or dry etching resistance of the hardened film can be maintained. For example, the second monomer may contain alkyl (meth)acrylates such as methyl(meth)acrylate, ethyl(meth) acrylate, butyl(meth)acrylate, and 2-ethylhexyl(meth) acrylate, aryl(meth)acrylates such as 2-hydroxyethyl(meth) acrylate, 2-hydroxypropyl(meth)acrylate, (meth) acrylonitrile, benzyl(meth)acrylate, methoxybenzyl(meth) acrylate, chlorobenzyl(meth)acrylate, furfuryl(meth) acrylate, tetrahydrofurfuryl(meth)acrylate, phenoxyethyl (meth)acrylate, phenyl(meth)acrylate, cresyl(meth)acrylate, and naphthyl(meth)acrylate, vinyl compounds (for example, styrene) having a phenyl group, or the like.

Particularly, from the viewpoint of dry etching resistance, benzyl(meth)acrylate is preferably used as the second monomer. The benzyl(meth)acrylate is preferably copolymerized by 10 mass % or higher and 95 mass % or lower within a single molecule of the binder resin. The benzyl(meth)acrylate is more preferably copolymerized by 20 mass % or higher and 90 mass % or lower within a single molecule of the binder resin in order to improve a physical stability of the first mask layer 103 and a laminating precision when the first mask layer 103 is laminated to the object 200 to be processed.

Particularly, the binder resin is preferably obtained by adding an appropriate amount of a radical polymerization initiator such as benzoyl peroxide and azoisobutyronitrile to a solution obtained by diluting a mixture of the first and second monomers with a solvent such as acetone, methylethyl ketone, or isopropanol and heating and agitating the resulting material to perform synthesizing. The synthesizing may be performed by dropping a part of the mixture into a reactive liquid. After the reaction is completed, a solvent may be further added to obtain a desired concentration. As a synthesizing means, there may be used bulk polymerization, suspension polymerization or emulsion polymerization as well as solution polymerization.

The binder resin may include carboxylic acid-containing vinyl copolymer, carboxylic acid-containing cellulose, and the like. An alkaline developing property is improved by incorporating these materials. Here, the carboxylic acid-containing vinyl copolymer is a compound obtained by performing vinyl copolymerization between a first monomer which is at least one monomer selected from α,β-unsaturated carboxylic acids and a second monomer which is at least one monomer selected from a group consisting of alkyl(meth)acrylates, hydroxyalkyl(meth)acrylates, (meth)acrylic amides, compounds obtained by substituting hydrogen on nitrogen thereof with an alkyl group or an alkoxy group, styrene, styrene derivatives, (meth)acrylonitriles, and (meth)acrylic acid glycidyl.

The first monomer used in the carboxylic acid-containing vinyl copolymer may include acrylic acid, methacrylic acid, fumaric acid, cinnamic acid, crotonic acid, itaconic acid, maleic acid half-ester, and the like. These materials may be used solely or in combination of two or more.

The proportion of the first monomer in the carboxylic acid-containing vinyl copolymer is preferably set to 15 mass % or higher and 40 mass % or lower, and more preferably 20 mass % or higher and 35 mass % or lower. In order to maintain an alkaline developing property, the proportion of the first monomer is preferably set to 15 mass % or higher. From the viewpoint of solubility of carboxylic acid-containing vinyl copolymer, the proportion of the first monomer is preferably set to 40 mass % or lower.

The second monomer used in the carboxylic acid-containing vinyl copolymer may include methyl(meth)acrylate, ethyl(meth)acrylate, n-propyl(meth)acrylate, cyclohexyl(meth)acrylate, n-butyl(meth)acrylate, 2-ethylhexyl(meth)acrylate, 2-hydroxyethyl(meth)acrylate, 2-hydroxypropyl(meth)acrylate, 4-hydroxybutyl(meth)acrylate, polyethylene glycol mono(meth)acrylate, polypropylene glycol mono(meth)acrylate, (meth)acryl amide, N-methylolacryl amide, N-butoxymethylacryl amide, styrene,α-methyl styrene, p-methyl styrene, p-chlorostyrene, (meth)acrylonitrile, (meth)acrylic acid glycidyl, or the like. These materials may be used solely or in combination of two or more.

The proportion of the second monomer in the carboxylic acid-containing vinyl copolymer is preferably set to 60 mass % or higher and 85 mass % or lower, and more preferably 65 mass % or higher and 80 mass % or lower. The second monomer preferably includes styrene and styrene derivatives such as α-methyl styrene, p-methyl styrene, and p-chloro styrene. In this case, a proportion of styrene or styrene derivatives in the carboxylic acid-containing vinyl copolymer is preferably set to 5 mass % or higher and 35 mass % or lower, and more preferably 15 mass % or higher and 30 mass % or lower.

The weight-average molecular weight of the carboxylic acid-containing vinyl copolymer is preferably set to 20,000 or greater and 300,000 or smaller, and more preferably 30,000 or greater and 150,000 or smaller. In order to maintain a strength of the hardened film, the weight-average molecular weight of the carboxylic acid-containing vinyl copolymer is preferably equal to or greater than 20,000. From the viewpoint of film formation stability of the first mask layer 103, the weight-average molecular weight of the carboxylic acid-containing vinyl copolymer is preferably equal to or smaller than 300,000.

In the reactive diluents included in the first mask layer 103, the photopolymerizable diluent may include, for example, but not particularly limited to, the resin (photopolymerizable resin) described in conjunction with the second mask layer 102. From the viewpoint of dry etching resistance, the average number of the functional groups in the photopolymerizable diluent is preferable set to 1.5 or greater. In addition, from the viewpoint of film formation stability of the first mask layer 103, the average number of functional groups is preferably set to 4.5 or smaller. In a case where a chlorine-based gas is used when dry etching is performed for the object 200 to be processed, a reactive diluent containing an element represented by the general formula (1) described above in a molecule is preferably used from the viewpoint of dry etching resistance. Furthermore, from the viewpoint of adhesiveness between the first and second mask layers 103 and 102, it is preferable that at least one type of the reactive diluent be commonly contained in the first and second mask layers 103 and 102.

As the reactive diluents, for example, there are known bisphenol-A based reactive diluents such as polyalkylene glycol dimethacrylate in which 2 mol of propylene oxide and 6 mol of ethylene oxide are added to both ends of the bisphenol-A by average, polyethylene glycol dimethacrylate in which 5 mol of ethyleneoxide is added to both ends of the bisphenol-A by average (NK ester BPE-500, produced by SHIN-NAKAMURA CHEMICAL CO., LTD.), and polyethylene glycol dimethacrylate in which 2 mol of ethyleneoxide is added to both ends of bisphenol-A by average (NK ester BPE-200, produced by SHIN-NAKAMURA CHEMICAL CO., LTD.).

The reactive diluents may include, for example, 1,6-hexanediol di(meth)acrylate, 1,4-cyclohexanediol di(meth)acrylate, polypropylene glycol di(meth)acrylate, polyethylene glycol di(meth)acrylate, 2-di(p-hydroxyphenyl)propane di(meth)acrylate, glycerol tri(meth)acrylate, trimethylolpropane tri(meth)acrylate, polyoxypropyl trimethylolpropane tri (meth)acrylate, polyoxyethyl trimethylolpropane triacrylate, pentaerythritol tetra(meth)acrylate, dipentaerythritol penta (meth)acrylate, trimethylolpropane triglycidyl ether tri (meth)acrylate, bisphenol-A diglycidyl ether di(meth)acrylate, β-hydroxypropyl-β'-(acryloyloxy)propyl phthalate, phenoxy polyethylene glycol(meth)acrylate, nonylphenoxy polyethylene glycol(meth)acrylate, nonylphenoxy polyalkylene glycol(meth)acrylate, polypropylene glycol mono (meth)acrylate, and the like.

The urethane compounds may include, for example, diisocyanate compounds such as hexamethylene diisocyanate, tolylene diisocyanate, or 2,2,4-trimethylhexamethylene diisocyanate, urethane compounds obtained through a reaction with compounds (such as 2-hydroxypropyl acrylate and oligopropylene glycol monomethacrylate) having a hydroxyl group and a (meth)acrylic group in a single molecule, and the like. Specifically, a reactant between hexamethylene diisocyanate and oligopropylene glycol monomethacrylate (Blemmer PP1000, produced by NOF CORPORATION).

Compounds at least one [OH] group and at least one addition-polymerizable unsaturated bond in a single molecule may be used as the reactive diluent. If such molecules are used as the reactive diluent, it is possible to improve adherence between the second mask layer 102 and the object 200 to be processed. A plurality of [OH] groups may be included in a molecule. The [OH] group may have an alcohol-like property or a phenol-like property. However, the alcohol-like property is preferable from the viewpoint of adherence and etching resistance.

A plurality of addition-polymerizable unsaturated bonds may be included in a molecule. Compounds having only one addition-polymerizable unsaturated bond in a molecule may include, for example, alkylene glycol derivatives such as polyethylene glycol, polypropylene glycol monoacrylate, and monomethacrylate; bisphenol-A monoacrylate and monomethacrylate; bisphenol-A derivatives obtained by reacting 1 mol or more alkylene glycol with bisphenol-A, reacting one end of the [OH] group with acrylic acid, methacrylic acid, or the like, and esterificating the resulting material; phthalic acid derivatives obtained by reacting 1 mol or more alkylene glycol with phthalic acid, reacting one end of the [OH] group with acrylic acid, methacrylic acid, or the like, and esterificating the resulting material; derivatives of salicylic acids such as salicylic acid acrylate; phenoxy hydroxy alkyl(meth)acrylate; and the like.

As the compounds having only one addition-polymerizable unsaturated bond in a molecule, phthalic acid derivatives are preferably used from the viewpoint of etching resistance. More preferably, β-hydroxypropyl-β'-(acryloyloxy)propyl phthalate is used.

Compounds having a plurality of addition-polymerizable unsaturated bonds in a molecule may include, for example, trimethylolpropane derivatives such as trimethylolpropane dimethacrylate; tetramethylolpropane derivatives such as tetramethylolpropane tri(meth)acrylate; pentaerythritol derivatives such as pentaerythritol trimethacrylate, isocyanuric acid derivatives such as isocyanic dimethacrylate; and the like.

A plurality of types of compounds having at least one [OH] group and at least one addition-polymerizable unsaturated bond may be used. In addition, it is preferable that both compounds having only one addition-polymerizable unsaturated bond in a molecule and compounds having a plurality of addition-polymerizable unsaturated bonds in a molecule be included in the compounds having at least one [OH] group and at least one addition-polymerizable unsaturated bond from the viewpoint of adhesiveness or etching resistance.

As the compounds having only one addition-polymerizable unsaturated bond in a molecule, phthalic acid derivatives are preferable. For example, both of β-hydroxy propyl-β'-(acryloyloxy)propyl phthalate and pentaerythritol triacrylate may be contained at the same time.

For example, multivalence isocyanate compounds such as hexamethylene diisocyanate and toluoylene diisocyanate and compounds urethanated with hydroxy acrylate compounds such as 2-hydroxypropyl(meth)acrylate, oligoethylene glycol mono(meth)acrylate, and oligopropylene glycol mono(meth)acrylate, and the like may be used.

Furthermore, the reactive diluent may include phenoxy tetraethylene glycol acrylate, 1,4-tetramethylene glycol di(meth)acrylate, 1,6-hexanediol di(meth)acrylate, 1,4-cyclohexanediol di(meth)acrylate, heptapropylene glycol di(meth)acrylate, glycerol(meth)acrylate, glycerol tri(meth)acrylate, dipentaerythritol penta(meth)acrylate, dipentaerythritol hexa(meth)acrylate, diallyl phthalate, polyethylene glycol di(meth)acrylate, polypropylene glycol di(meth)acrylate, 4-normal octylphenoxy pentapropylene glycol acrylate, 4-bis(triethylene glycol methacrylate) nonapropylene glycol, bis(tetra ethylene glycol methacrylate)polypropylene glycol, bis(triethylene glycol methacrylate)polypropylene glycol, bis(diethylene glycol acrylate)polypropylene glycol, 4-normal nonylphenoxy octaethylene glycol(meth)acrylate, 4-normal nonylphenoxy heptaethylene glycol dipropylene glycol(meth)acrylate, phenoxy tetrapropylene glycol tetraethylene glycol(meth)acrylate, isocyanurate derivatives such as tris(acryloxyethyl) isocyanurate, and the like.

Moreover, the reactive diluent may include the resins (photopolymerizable resins) described above in conjunction with the second mask layer 102.

In the present embodiment, in the polymerization initiators of the first mask layer 103, the photopolymerization initiators described above in conjunction with the second mask layer 102 may be used as the photopolymerization initiator.

The proportion of the binder resin against the entire first mask layer 103 is set to 20 to 90 mass %, and preferably set to 30 to 70 mass % from the viewpoint of dry etching resistance.

The content of the alkali-solubility binder resin is preferably set to 30 mass % or higher and 75 mass % or lower with respect to the entire mass of the first mask layer 103. More preferably, the content of the alkali-solubility binder resin is set to 40 mass % or higher and 65 mass % or lower. For exhibiting an alkaline developing property, the content of the alkali-solubility binder resin is preferably set to 30 mass % or higher. From the viewpoint of curability, transferability, and dry etching resistance, the content of the alkali-solubility binder resin is preferably set to 75 mass % or lower.

Furthermore, the first mask layer 103 may contain a coloring material such as a dye or pigment. If the coloring material is contained, whether or not the transfer is appropriately performed can be determined through visual inspection even in a case where the fine pattern size provided on a surface of the layered product 201 is sufficiently smaller than the wavelength of visible light when the layered product 201 is transferred using the second layered product 2. In addition, absorption of the coloring material can be used to manage quality of the first mask layer 103 formed on the concavo-convex structure 101*a* of the mold 101.

The used coloring material may include, for example, fuchsine, phthalocyanine green, auramine base, calcoxide green S, paramagenta, crystal violet, methyl orange, nile blue 2B, Victoria blue, malachite green (AIZEN™ MALACHITEGREEN, produced by Hodogaya Chemical Co., Ltd.), basic blue 20, diamond green (AIZEN™ DIAMONDGREENGH, produced by Hodogaya Chemical Co., Ltd.), and the like.

From the viewpoint of the same advantage, a color-developing dye that exhibits a color by irradiating light onto the first mask layer 103 may be contained. The color-developing dye may include, for example, a combination of a leuco dye or a fluoran dye and a halogen compound.

The leuco dyes may include, for example, tris(4-dimethylamino-2-methylphenyl)methane[leuco crystal violet], tris (4-dimethylamino-2-methylphenyl)methane[leuco malachite green], and the like.

The halogen compounds may include, for example, amyl bromide, isoamyl bromide, isoblltylene bromide, ethylene bromide, diphenylmethyl bromide, benzyl bromide, methylene bromide, tribromomethylphenyl sulfone, carbon tetrabromide, tris(2,3-dibromopropyl)phosphate, trichloroacetoamide, amyl iodide, isobutyl iodide, 1,1,1-trichloro-2,2-bis(p-chlorophenyl)ethane, hexachloroethane, triazine compounds, and the like. As the triazine compounds, 2,4,6-tris(trichloromethyl)-s-triazine, 2-(4-methoxyphenyl)-4,6-bis(trichloromethyl)-s-triazine, and the like may be used.

Among such color developing dyes, a combination of tribromomethylphenyl sulfone and a leuco dye or a combination of a triazine compound and a leuco dye is useful.

For improving stability of the first mask layer 103, the first mask layer 103 preferably contains a radical polymerization inhibitor. The radical polymerization inhibitors may include, for example, p-methoxyphenol, hydroquinone, pyrogallol, naphthylamine, tert-butylcatechol, cuprous chloride, 2,6-di-tert-butyl-p-cresol, 2 2'-methylenebis(4-ethyl-6-tert-butylphenol), 2,2'-methylenebis(4-methyl-6-tert-blutylphenol), diphenylnitrosoamine, and the like.

If necessary, the first mask layer 103 may contain additives such as a plasticizer. The additives may include, for example, phthalic esters such as diethylphthalate, p-toluenesulfoneamide, polypropylene glycol, polyethylene glycol monoalkyl ether, and the like.

The first mask layer 103 may has a multilayer structure having n or more layers (where n≥2). For example, two first mask layers 103-1 and 103-2 may be provided over the second mask layer 102 of the first layered product 1. Similarly, the (N+1)th first mask layer 103-(N+1) may be provided over the (N)th first mask layer 103-N. By using the first mask layer 103 having such a n-layer structure, controllability of an inclination of the first mask layer 103 and the like is improved when (dry) etching is performed from the second mask layer 102 surface side to the layered product including the second mask layer 102, the n-layer first mask layer 103, and the object 200 to be processed. For this reason, fabrication freedom of the object 200 to be processed is improved in the subsequent process. In order to further exert this advantage, the number n of layers in the first mask layer 103 having a multilayer structure is preferably set to 2 or greater and 10 or smaller, more preferably 2 or greater and 5 or smaller, and most preferably 2 or greater and 4 or smaller. In a case where the first mask layer 103 has a multilayer structure, if a volume of the (n) th layer is denoted by Vn, the entire volume V of the first mask layer 103 is expressed as V1+V2+ . . . , +Vn. In this case, the first mask layer 103 satisfying the etching selectivity range (ratio of dry etching rates) described below preferably has a volume of 50% or larger with respect to the entire volume V of the first mask layer 103. For example, the first mask layer 103 has a three-layer structure, volumes of the first, second, and third layers of the first mask layer 103 are denoted by V1, V2, and V3, respectively. In addition, if the second and third layers of the first mask layer 103 satisfy the etching selectivity, the volume ratio (V2+V3)/(V1+V2+V3) is preferably set to 0.5 or higher. Similarly, if only the third layer satisfies the etching selectivity range, the volume ratio (V3)/(V1+V2+V3) is preferably set to 0.5 or higher. Particularly, from the viewpoint of the fabrication accuracy of the first mask layer 103 having a multilayer structure and the fabrication accuracy of the object 200 to be processed, the volume ratio is more preferably set to 0.65 (65%) or higher, and most preferably 0.7 (70%) or higher. If overall n layers satisfy the etching selectivity range, the fabrication accuracy of the object 200 to be processed is significantly improved, so that the volume ratio is preferably set to 1 (100%). Furthermore, in the case of n-layered first mask layer 103, the outermost side composition (the layer farthest from the concavo-convex structure 101a) may satisfy the aforementioned composition described in [First Mask Layer 103 (Second Layered Product 2)]. Other layers may have the composition described in [First Mask Layer 103 (First Layered Product 1)] or [Second Mask Layer 102] as well as the composition described in [First Mask Layer 103 (Second Layered Product 2)]. Among them, from the viewpoint of stability of the first mask layer 103, all of the n layers are preferably controlled to have the composition range described above in [First Mask Layer 103 (Second Layered Product 2)].

[Etching Selectivity]

A ratio Vo1/Vm1 between the etching rate Vm1 of the second mask layer 102 and the etching rate Vo1 of the first mask layer 103 through dry etching affects the fabrication accuracy when the first mask layer 103 is etched by using the second mask layer 102 as a etching mask. The condition Vo1/Vm1>1 means that it is difficult to etch the second mask layer 102 in comparison with the first mask layer 103. Therefore, it is preferable that the ratio Vo1/Vm1 be larger.

From the viewpoint of the coatability of the second mask layer 102, the ratio (Vo1/Vm1) preferably satisfies a condition Vo1/Vm1≤150, and more preferably Vo1/Vm1≤100. In addition, from the viewpoint of etching resistance, the ratio Vo1/Vm1 preferably satisfies a condition 3≤Vo1/Vm1 (Formula (7)), more preferably 10≤Vo1/Vm1, and most preferably 15≤Vo1/Vm1.

If the aforementioned ranges are satisfied, dry etching can be performed for the thick first mask layer 103 by using the second mask layer 102 as a ethicng mask, so that fine-patterning can be easily performed. As a result, a fine mask pattern 202a including the first and second mask layers 103 and 102 fine-patterned through dry etching can be formed on the object 200 to be processed. By using the fine pattern structure 202, it is possible to obtain the aforementioned functionalities and easily perform dry etching for the object 200 to be processed.

Meanwhile, etching anisotropy of the first mask layer 103 (a ratio $Vo_\perp/Vo_{//}$ between a horizontal etching rate $Vo_{//}$ and a vertical etching rate $Vo_\perp$) during etching preferably satisfies a condition $Vo_\perp/Vo_{//} > 1$. The higher etching anisotropy is preferable. The ratio $Vo_\perp/Vo_{//}$ is preferably set to, depending on the ratio between the etching rate of the first mask layer 103 and the etching rate of the object 200 to be processed, $Vo_\perp/Vo_{//} \geq 2$, more preferably $Vo_\perp/Vo_{//} \geq 3.5$, and further preferably $Vo_\perp/Vo_{//} \geq 10$.

The vertical direction refers to a thickness direction of the first mask layer 103, and the horizontal direction refers to an in-plane direction of the first mask layer 103. In an area where the pitch has a submicron or smaller scale, in order to stably form the thick first mask layer 103 and easily perform dry etching for the object 200 to be processed, it is necessary to maintain a large width of the first mask layer 103. If the aforementioned range is satisfied, it is possible to maintain a large width (an interval of lines) of the first mask layer 103 after dry etching, which is desirable.

A ratio Vo2/Vi2 between the etching rate Vi2 of the object 200 to be processed and the etching rate Vo2 of the first mask layer 103 is preferably set to a smaller value. If the ratio Vo2/Vi2 satisfies a condition Vo2/Vi2<1, the etching rate of the first mask layer 103 is lower than the etching rate of the object 200 to be processed. Therefore, it is possible to easily fabricate the object 200 to be processed. From the viewpoint of coatability and an etching accuracy of the first mask layer 103, the ratio Vo2/Vi2 preferably satisfies a condition Vo2/Vi2≤3, and more preferably Vo2/Vi2≤2.5. If the ratio Vo2/Vi2 satisfies a condition Vo2/Vi2≤2, it is possible to reduce a thickness of the first mask layer 103, which is desirable. More preferably, the condition is set to Vo2/Vi2≤1.

A ratio between the etching rate of the object 200 to be processed and the etching rate of the hard mask layer 109 (etching rate of the object 200 to be processed/etching rate of the hard mask layer 109) is preferably set to 1 or higher, and more preferably 3 or higher from the viewpoint of workability. In order to perform fabrication of the object 200 to be processed with a high aspect ratio, the etching selectivity is preferably set to 5 or higher, and more preferably 10 or higher. In order to reduce a thickness of the hard mask layer 109, the etching selectivity is more preferably set to 15 or higher.

Since a dry etching rate for the fine pattern is significantly affected by the fine pattern, such an etching selectivity is a value measured for a flat film (beta film) of various materials.

For example, the etching rate for the first mask layer 103 is computed by performing dry etching or wet etching for a flat film obtained by forming the first mask layer 103 on a substrate made of silicon, quartz, sapphire, and the like. In a case where the first mask layer 103 is reactive, the flat film is obtained through hardening.

The etching rate for the second mask layer 102 is computed by performing dry etching for the flat film obtained by forming the second mask layer 102 on a substrate made of silicon, quartz, sapphire, and the like. In a case where the second mask layer 102 is reactive, the flat film is obtained through hardening.

The etching rate for the hard mask layer 109 is computed by forming the hard mask layer 109 on a substrate made of silicon, quartz, sapphire, and the like and performing dry or wet etching.

The etching rate for the object 200 to be processed is computed by performing dry or wet etching for the object 200 to be processed.

The etching selectivity described above is obtained as an etching rate ratio by applying the same etching condition. For example, the ratio Vo1/Vm1 is computed as a ratio between etching rates (Vo1 and Vm1) obtained by performing the same dry etching treatment for the flat film of the first mask layer 103 and the flat film of the second mask layer 102.

Similarly, the ratio Vo2/Vi2 is computed as a ratio between etching rates (Vo2 and Vi2) obtained by performing the same drying or wet etching for the flat film of the first mask layer 103 and the object 200 to be processed.

Similarly, the ratio (between the etching rate of the object 200 to be processed and the etching rate of the hard mask layer 109) is computed as a ratio between the etching rate of the object 200 to be processed and the etching rate of the hard mask layer 109 obtained by performing the same dry or wet etching for the object 200 to be processed and the hard mask layer 109.

[Object to be Processed]

The object 200 to be processed fabricated by using, as a mask, the fine mask pattern 202a fabricated using the layered product for fine pattern formation is not particularly limited if it is appropriately selected depending on a field of use. An inorganic substrate, an organic substrate, or a film can be used. For example, materials of the support substrate 100 or the mold 101 described above may be selected. In addition, for improving both internal quantum efficiency and light-emitting efficiency of LEDs, a sapphire substrate may be used as the object 200 to be processed. In this case, the sapphire substrate is fabricated by using the obtained fine mask pattern 202a as a mask. Meanwhile, a substrate made of GaN may be selected for improving light-emitting efficiency. In this case, the GaN substrate is fabricated by using the obtained fine mask pattern 202a as a mask. In addition, a substrate made of GaAsP, GaP, AlGaAs, InGaN, GaN, AlGaN, ZnSe, AlHaInP, ZnO, SiC, and the like may be used. In order to fabricate anti-reflection surface glass using the fine pattern in a large area, a glass plate, a glass film, and the like may be selected. A silicon (Si) substrate may be used for improving light absorption efficiency, light conversion efficiency and the like in the field of solar cells, and the like. In addition, in order to manufacture a super water-repellent film or a supper hydrophilic film, a film substrate may be used. Furthermore, for a perfect black body, a substrate where carbon black is kneaded or coated may be used. In a case where metal is used in the second mask layer 102, the mask layer itself transferred onto the object 200 to be processed exhibits functionalities, so that it can be applied to a sensor (optical sensor). In this case, the substrate may be appropriately selected depending on a user environment of the sensor.

[Dry Etching: First Mask Layer]

It is possible to easily transfer the second mask layer 102 onto the object 200 to be processed using the layered product for fine pattern formation of FIG. 4. If dry etching is performed for the first mask layer 103 by using the transferred second mask layer 102 as a mask, it is possible to obtain a fine mask pattern 202a on the object 200 to be processed.

The etching condition may be variously designed depending on a material, for example, the following etching method may be used. In order to chemically reactively etching the first mask layer 103, gases such as $O_2$ and $H_2$ may be selected. For improving a vertical etching rate as the amount of ion incidence components increases, gases such as Ar and Xe may be selected. As a gas used in etching, a mixed gas containing at least one of $O_2$ gas, $H_2$ gas, and Ar gas is used. Particularly, only $O_2$ is preferably used.

The etching pressure is preferably set to 0.1 to 5 Pa, and more preferably 0.1 to 1 Pa in order to more improve etching anisotropy by increasing ion incidence energy contributing to reactive etching.

In the mixed gas ratio of $O_2$ gas or $H_2$ gas and Ar gas or and Xe gas, anisotropy is improved when the amount of the chemically reacting etching components and the amount of the ion incidence components are appropriate. Therefore, if a layer flow rate of the gas is 100 sccm, a mixing ratio between $O_2$ gas or $H_2$ gas and Ar gas or Xe gas is preferably set to 99 sccm:1 sccm to 50 sccm:50 sccm, more preferably 95 sccm:5 sccm to 60 sccm:40 sccm, and further preferably 90 sccm:10 sccm to 70 sccm:30 sccm. When a total flow rate of the gas is changed, a mixing ratio of the mixed gas is changed based on the ratio of the flow rate described above.

Plasma etching is performed using capacitively coupled plasma reactive ion etching (RIE), inductively coupled plasma RIE, inductively coupled plasma RIE, or ion injection bias-based RIE. For example, an etching method may be used, in which capacitively coupled plasma RIE or ion injection voltage-based RIE is performed using only $O_2$ gas or a mixed gas obtained by mixing $O_2$ gas and Ar gas with a mixing ratio of 90 sccm:10 sccm to 70 sccm:30 sccm under a processing pressure of 0.1 to 1 Pa. In a case where a total flow rate of the mixed gas used in the etching is changed, the mixing ratio of the mixed gas is changed according to the aforementioned flow rate ratio.

The components (for example, a sol-gel material having a metal element such as Ti, Zr, Ta, Zn, and Si, or a metalloxane bond portion) having a low vapor pressure included in the second mask layer 102 protect a side wall of the first mask layer 103 when the first mask layer 103 is etched. As a result, the thick first mask layer 103 can be easily etched.

[Dry Etching: Object to be Processed]

In order to lower the etching rate ratio Vo2/Vi2 between the object 200 to be processed and the first mask layer 103, the etching may be performed using a chlorine-based gas or a Chlorofluorocarbon-based gas. An oxygen gas, an argon gas, or a mixed gas between oxygen and argon gases may be added to the chlorine-based gas. The mixed gas contains at least one of chlorofluorocarbon-based gases (CxHzFy, where x, y, and z are integers having ranges x=1 to 4, y=1 to 8, and z=0 to 3) by which reactive etching can be easily performed for the object 200 to be processed. The chlorofluorocarbon-based gases may include, for example, $CF_4$, $CHF_3$, $C_2F_6$, $C_3F_8$, $C_4F_6$, $C_4F_8$, $CH_2F_2$, $CH_3F$, or the like. Furthermore, in order to improve the etching rate of the object 200 to be processed, a mixed gas obtained by mixing Ar, $O_2$, and Xe gases in the chlorofluorocarbon-based gas by 50% or less of the entire gas flow rate is used. A mixed gas containing at least one of chlorine-based gases, capable of performing reactive etching for the object 200 to be processed for which it is difficult to perform reactive etching using the Chlorofluorocarbon-based gas (difficult etching substrate), is used. The chlorine-based gases may include, for example, $Cl_2$, $BCl_3$, $CCl_4$, $PCl_3$, $SiCl_4$, HCl, $CCl_2F_2$, $CCl_3F$, and the like. Furthermore, in order to further improve the etching rate of the difficult etching substrate, an oxygen gas, an argon gas, or a mixed gas between oxygen and argon gases may be added to the chlorine-based gas.

The etching pressure is preferably set to 0.1 to 20 Pa, and more preferably 0.1 to 10 Pa in order to improve the etching rate of the object 200 to be processed by increasing ion incidence energy contributing to the reactive etching.

By mixing two types of chlorofluorocarbon-based gases having a different ratio y/x between C and F in the chlorofluorocarbon-based gas (CxHzFy, where x, y, and z are integers having ranges x=1 to 4, y=1 to 8, and z=0 to 3) and increasing and decreasing a sediment amount of the fluorocarbon film that protects an etching sidewall of the object 200 to be processed, an inclination of a taper shape of the fine pattern 220 fabricated on a surface of the object 200 to be processed can be controlled. In a case where the mask shape of the object 200 to be processed is more accurately controlled through dry etching, a ratio of the flow rate between the chlorofluorocarbon gas (F/C≥3) and the chlorofluorocarbon gas (F/C<3) is preferably set to 95 sccm:5 sccm to 60 sccm:40 sccm, and more preferably 70 sccm:30 sccm to 60 sccm:40 sccm. Even when a total flow rate of the gas is changed, the ratio of the flow rate described above is not changed.

In order to improve the etching rate of the object 200 to be processed, in a case where the amount of the reactive etching component and the amount of the ion incidence component are appropriate, the ratio of the gas flow rate between a mixed gas of chlorofluorocarbon-based gas and Ar gas, $O_2$ gas or Xe gas is preferably set to 99 sccm:1 sccm to 50 sccm:50 sccm, more preferably 95 sccm:5 sccm to 60 sccm:40 sccm, and further preferably 90 sccm:10 sccm to 70 sccm:30 sccm. In addition, In order to improve the etching rate of the object 200 to be processed, in a case where the amount of the reactive etching component and the amount of the ion incidence component are appropriate, the ratio of the gas flow rate between a mixed gas of chlorine-based gas and Ar gas, $O_2$ gas or Xe gas is preferably set to 99 sccm:1 sccm to 50 sccm:50 sccm, more preferably 95 sccm:5 sccm to 80 sccm:20 sccm, and further preferably 90 sccm:10 sccm to 70 sccm:30 sccm. Even when a total flow rate of the gas is changed, the ratio of the flow rate described above is not changed.

Only a $BCl_3$ gas, a mixed gas of a $BCl_3$ gas and a $Cl_2$ gas, or a mixed gas of a $BCl_3$ gas and an Ar gas or a Xe gas are preferably used in the etching of the object 200 to be processed using a chlorine-based gas. In order to improve the etching rate of the object 200 to be processed, in a case where the amount of the reactive etching component and the amount of the ion incidence component are appropriate, the ratio of the gas flow rate in these mixed gases is preferably set to 99 sccm:1 sccm to 50 sccm:50 sccm, more preferably 99 sccm:1 sccm to 70 sccm:30 sccm, and further preferably 99 sccm:1 sccm to 90 sccm: 10 sccm. Even when a total flow rate of the gas is changed, the ratio of the flow rate described above is not changed.

Plasma etching is performed by using capacitively coupled plasma RIE, inductively coupled plasma RIE, or ion injection voltage-based RIE. For example, an etching method may be used, in which capacitively coupled plasma RIE or ion injection voltage-based RIE is performed using only an $CHF_3$ gas or a mixed gas obtained by mixing $CF_4$ and $C_4F_8$ gases by setting the ratio of the gas flow rate to 90 sccm:10 sccm to 60 sccm:40 sccm under a processing pressure of 0.1 to 5 Pa. Alternatively, for example, in a case where a chlorine-based gas is used, an etching method may be used, in which capacitively coupled plasma RIE, inductively coupled plasma RIE, or ion injection voltage-based RIE is performed using only a $BCl_3$ gas or a mixed gas obtained by mixing $BCl_3$ and $Cl_2$ or Ar by setting the ratio of the gas flow rate to 95 sccm:5 sccm to 85 sccm:15 sccm under a processing pressure of 0.1 to 10 Pa.

Furthermore, in a case where a chlorine-based gas is used, an etching method may be used, in which capacitively coupled plasma RIE, inductively coupled plasma RIE, or ion injection voltage-based RIE is performed using only a $BCl_3$ gas or a mixed gas obtained by mixing a $BCl_3$ gas and a $Cl_2$ gas or an Ar gas by setting the ratio of the gas flow rate to 95 sccm:5 sccm to 70 sccm:30 sccm under a processing pressure of 0.1 to 10 Pa. Even when a total flow rate of the mixed gas used in the etching is changed, the ratio of the flow rate described above is not changed.

[Fine Pattern]

A shape of the fine pattern of the mold 101 in the layered product for fine pattern formation may include, but not particularly limited to, for example, a line-and-space configuration in which a plurality of palisaded bodies are arranged, a dot configuration in which a plurality of dot-like (convex or protrusion) structures are arranged, a hole configuration in which a plurality of hole-like (concave) structures are arranged, and the like. The dot configuration or the hole configuration may have, for example, a circular conical shape, a circular pillar shape, a pyramid shape, a square pillar shape, a double ring shape, a multi-ring shape, and the like. In such configurations, an outer diameter of the bottom may be warped, or a side face may be curved.

If the fine pattern has a dot configuration, consecutive gaps between dots can be used in the coating of the dilute solution of a material of the second mask layer. Therefore, an arrangement accuracy of the second mask layer 102 is improved. Meanwhile, in a case where the transferred second mask layer 102 serves as a mask in the use of the layered product for fine pattern formation, the fine pattern preferably has a hole configuration. If the fine pattern has a hole configuration, durability (resistance to a physical breakdown) of the fine pattern is improved when the dilute solution of a material of the second mask layer is directly coated on the fine pattern.

In a case where the fine pattern has a dot configuration, it is preferable that neighboring dots be connected to each other through smooth concave portions in order to further exert the aforementioned advantages. In a case where the fine pattern has a hole configuration, the neighboring holes be connected to each other through smooth convex portions in order to further exert the aforementioned advantages.

Figure 16A:
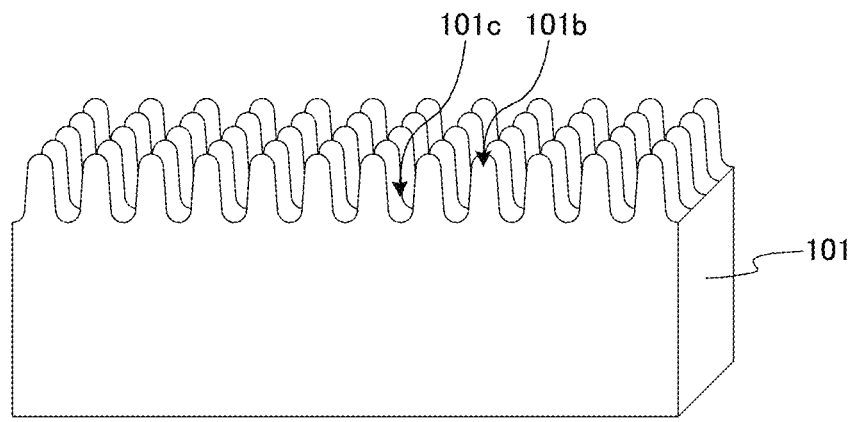
FIGS. 16A and 16B are diagrams illustrating an exemplary fine pattern of the layered product for fine pattern formation according to a first aspect.
Figure 16B:
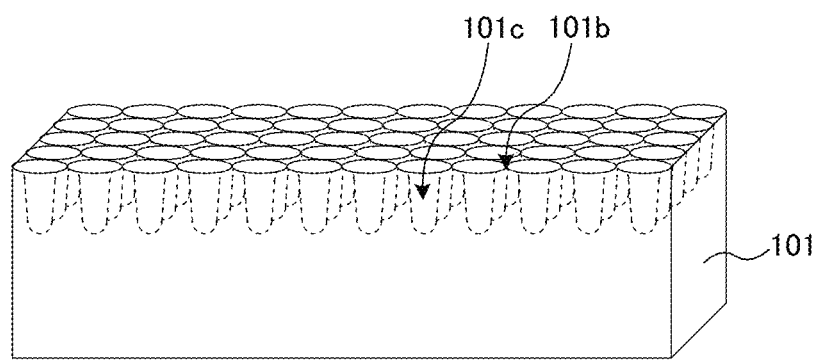

Here, the "dot configuration" refers to a "configuration having a plurality of pillar-like bodies (conical bodies)", and the "hole configuration" refers to a "configuration having a plurality of pillar-like (conical) holes". That is, as illustrated in FIG. 16A, the dot configuration refers to a configuration having a plurality of convex portions 101b (pillar-like (conical) bodies) which are arranged on the surface, and the concave portions 101c between the convex portions 101b are continuous. Meanwhile, as illustrated in FIG. 16B, the hole configuration refers to a configuration having a plurality of concave portions 101c (pillar (conical) hole) which are arranged on the surface, and neighboring concave portions 101c are separated from each other by the convex portion 101b.

In the fine pattern, a distance between centers of the convex portions in the dot configuration or a distance between centers of the concave portions in the hole configuration is preferably set to 50 nm or larger and 5000 nm or smaller, and a height of the convex portion or a depth of the concave portion is preferably set to 10 nm or larger and 2000 nm or smaller. Particularly, a distance between centers of the convex portions in the dot configuration or a distance between centers of the concave portions in the hole configuration is preferably set to 100 nm or larger and 1000 nm or smaller, and a height of the convex portion or a depth of the concave portion is preferably set to 50 nm or larger and 1000 nm or smaller. Although it may be different depending on a field of use, the neighboring distance between convex portions in the dot configuration (interval between apexes of the convex portions) or the neighboring distance between concave portions in the hole configuration (distance between centers of each concave portion) be smaller, and a height of the convex portion or a depth of the concave portion (a height from the bottom of the concave portion to the apex of the convex portion) be larger. Here, the convex portion refers to a portion higher than an average height of the fine pattern, and the concave portion refers to a portion lower than an average height of the fine pattern.

Figure 17A:
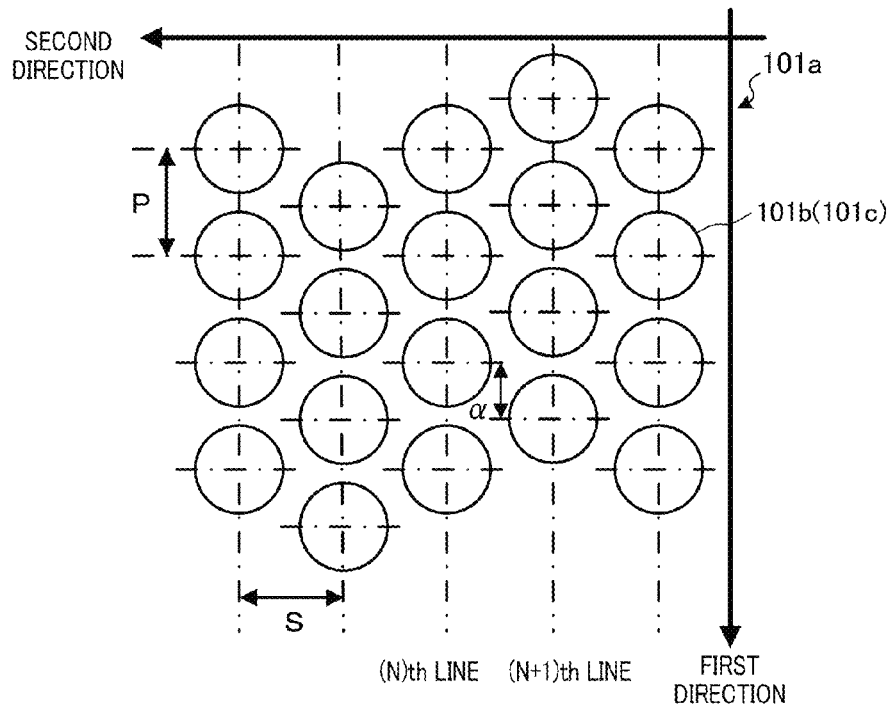
FIGS. 17A and 17B are diagrams illustrating an exemplary array of the fine pattern of the layered product for fine pattern formation according to a first aspect.
Figure 17B:
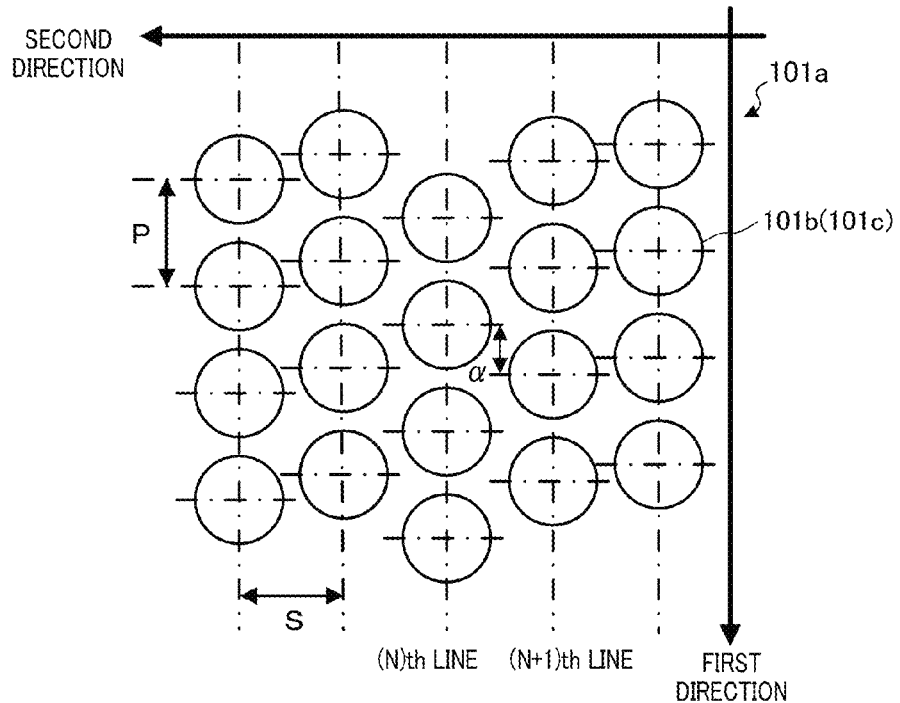

In the concavo-convex structure 101a of the mold 101, assuming that first and second directions are perpendicular to each other in a plane as illustrated in FIGS. 17A and 17B, in a case where convex portions 101b (or concave portions 101c, as will be similarly applied in the following description) are arranged with a pitch P in the first direction and convex portions 101b are arranged with a pitch S in the second direction, the convex portions 101b lined in the second direction may be arranged with high regularity in intervals (shift amount α) in the first direction (refer to FIG. 17A) or may low regularity in the shift amount α. The shift amount α refers to a distance between lines parallel to each other in the second direction passing through the center of the nearest convex portion 101b in neighboring lines parallel to each other in the first direction. For example, as illustrated in FIG. 17A, the shift amount α refers to a distance between a line parallel to the second direction passing through the center of an arbitrary convex portion 101b in the (N)th line parallel to the first direction and a line parallel to the second direction passing through the center of the convex portion 101b in the (N+1)th line nearest to this convex portion 101b. The shift amount α in the array illustrated in FIG. 17A is nearly constant in any line (an arbitrary (N)th line), it can be said that the array has periodicity. Meanwhile, the shift amount α of the array illustrated in FIG. 17B is changed depending on which line is set to the (N)th line. Therefore, it can be said that the array illustrated in FIG. 17B has a periodicity.

The pitches P and S may be appropriately designed depending on a field of use. For example, the pitches P and S may be equal to each other. Although the convex portions 101b are independent without any overlapping in FIGS. 17A and 17B, the convex portions 101b arranged in both the first and second directions or in any one direction may be overlapped.

For example, in a case where a surface of a sapphire substrate of an LED is fabricated, in order to improve internal quantum efficiency of an LED, the concavo-convex structure 101a of the mold 101 preferably has a pitch 100 to 500 nm and a height of 50 to 500 nm. The array is preferably a regular array. Particularly, in order to improve internal quantum efficiency and light-emitting efficiency, the array preferably has a periodicity as described above. In addition, in order to improve both internal quantum efficiency and light-emitting efficiency, the concavo-convex structure 101a of the mold 101 preferably has a hole configuration in which a regular nanoscale array has high periodicity in a micro-scale, and modulation having a micro-scale period is applied to a pitch.

In order to form a structure satisfying the condition of distances lcc and lcv when the layered product for fine pattern formation is manufactured, the following structure and the following mask material are preferably used.

Figure 18A:
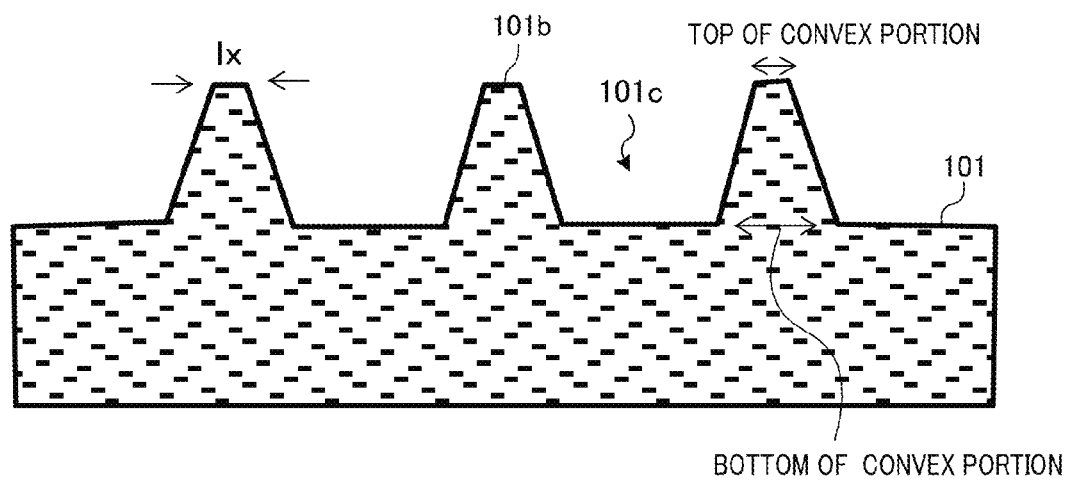
FIGS. 18A and 18B are schematic cross-sectional views illustrating a dot-like fine pattern in the layered product for fine pattern formation according to a first aspect.
Figure 18B:
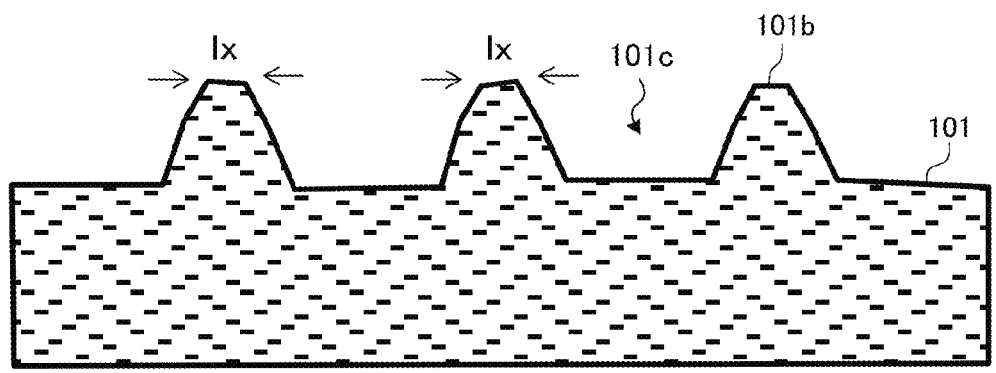

FIGS. 18A and 18B are schematic cross-sectional views illustrating the concavo-convex structure 101a of the mold 101 having a dot configuration in the layered product for fine pattern formation. In a case where the fine pattern of the mold 101 has a dot configuration, if the longest line length lx on a plane where a top portion of a single convex portion is formed has a submicron-scale, a material of the second mask layer 102, which has been diluted and coated, is efficiently filled in the concave portion 101c so as to reduce energy of a system and reduce the distance lcv, which is desirable. Particularly, the longest line length is preferably set to 500 nm or shorter, more preferably 300 nm or shorter, and most preferably 150 nm or shorter in order to further exert the aforementioned advantages. The surface where a top portion of a single convex portion is formed refers to a surface where a surface passing through the top positions of each convex portion intersects with a top portion of a single convex portion.

As illustrated in FIG. 18A, the convex portion 101b preferably has a structure in which an area of the bottom portion of the convex portion is larger than an area of the top portion of the convex portion, that is, the convex portion is tapered, in order to further exert the aforementioned advantages. In addition, as illustrated in FIG. 18B, it is preferable that the top portion of the convex portion and the inclined portion be smoothly and consecutively connected because a pinning effect (a pinning effect caused by TPCL) in a solid-liquid-gas interface can be suppressed when the second mask layer 102 is diluted and coated, so as to further exert the aforementioned advantages.

Figure 19:
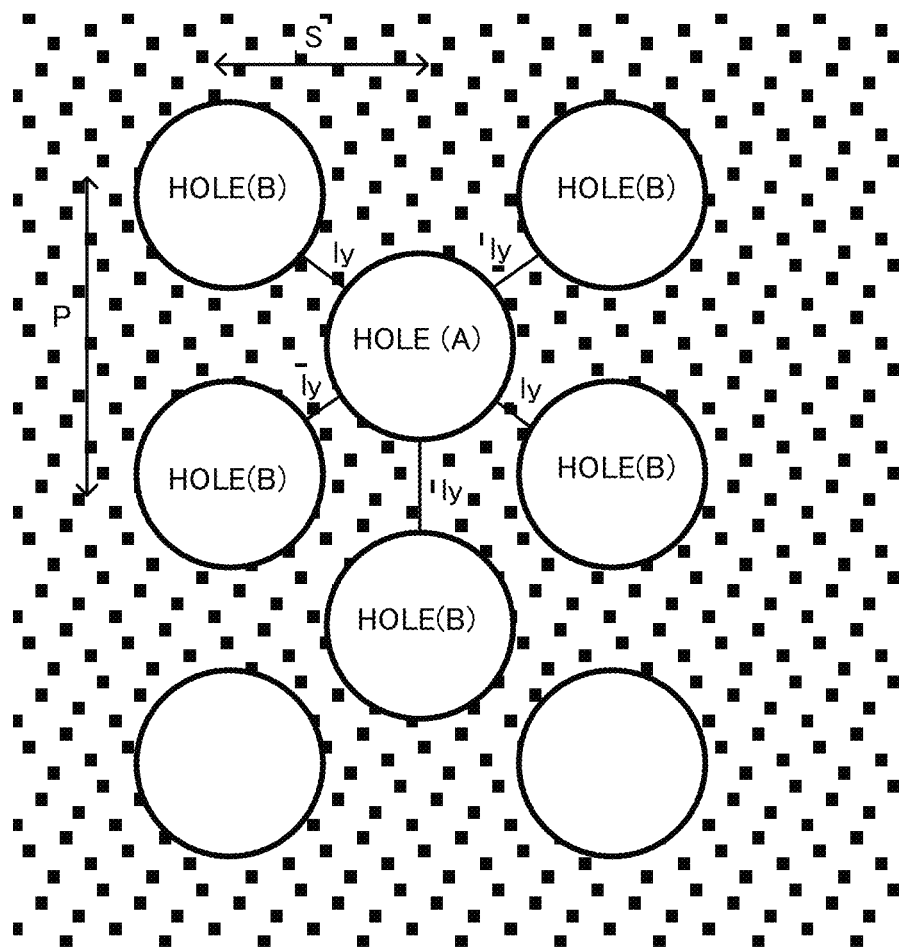
FIG. 19 is a schematic plan view illustrating a hole-like fine pattern in the layered product for fine pattern formation according to a first aspect.

FIG. 19 is a schematic plan view illustrating the concavo-convex structure 101a of the mold 101 having a hole configuration in the layered product for fine pattern formation. In a case where the fine pattern of the mold 101 has a hole configuration, it is preferable that the length of the shortest line ly connecting the opening edges of the holes A and B between the closest holes A and B have a submicron-scale because the second mask layer 102, which has been diluted and coated, is efficiently filled in the concave portion 101c so as to reduce energy of a system and reduce the distance lcv. Particularly, the shortest line length is preferably set to 500 nm or shorter, more preferably 400 nm or shorter, and most preferably 300 nm or shorter in order to further exert the aforementioned advantages. Among them the shortest line length is preferably set to 150 nm or shorter, more preferably 100 nm or shorter, and most preferably 0 nm. In addition, if the shortest line length is set to 0 nm, this means that the opening edges of the holes A and B are partially overlapped.

The area of the hole opening is preferably larger than the area of the hole bottom to further exert the aforementioned advantages. In addition, it is preferable that the opening edge and the side face of the concave portion be consecutively and smoothly connected because it is possible to suppress a pinning effect (pinning effect caused by TPCL) on a solid-liquid-gas interface when the second mask layer 102 is diluted and coated and further exert the aforementioned advantages.

In the layered product for fine pattern formation, the pitches P and S of the concavo-convex structure 101a of the mold 101 are preferably set to 800 nm or shorter, and more preferably 500 nm or shorter to further exert the aforementioned advantages. In addition, the pitches are preferably set to 50 nm or longer from the viewpoint of a transfer accuracy and a filling and arrangement accuracy of the second mask layer 102. An opening ratio is preferably set to 45% or higher when the second mask layer 102 is coated on the fine pattern of the mold 101, and the second mask layer 102 is filled in the concave portion because, in a case where the pitch is within a range of 50 nm to 1000 nm, the second mask layer 102 can recognize the fine pattern and be widely soaked into the inside of the pattern to maximize a radius of curvature of a hypothetical droplet of the second mask layer 102 formed in the fine pattern. The hypothetical droplet refers to a liquid droplet of the second mask layer 102 supposed to exist in the concave portion of the fine pattern of the mold 101. Particularly, the opening ratio is preferably set to 50% or higher, and more preferably 55% or higher. In addition, the opening ratio is further preferably set to 65% or higher because a potential is applied from the convex portion of the fine pattern of the mold 101 to the inner side of the concave portion so that it is possible to avoid the second mask layer 102 from remigrating to the convex portion after a droplet is filled in the concave portion, in addition to the aforementioned advantages. In order to further exert the aforementioned advantages, the opening ratio is preferably set to 70% or higher, more preferably 75% or higher, and further preferably 80% or higher.

Figure 20A:
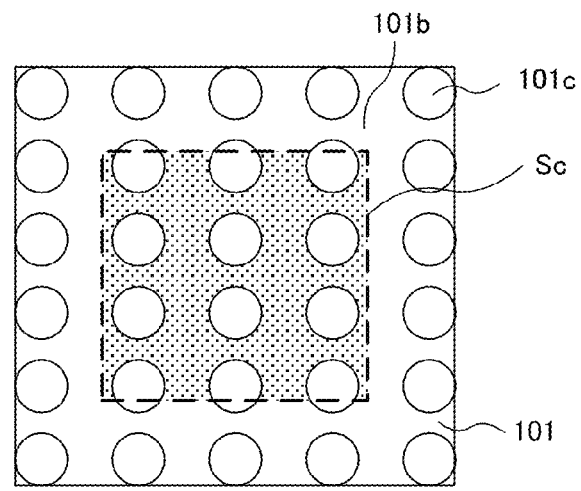
FIGS. 20A to 20C are schematic plan views illustrating a hole-like fine pattern in the layered product for fine pattern formation according to a first aspect.
Figure 20B:
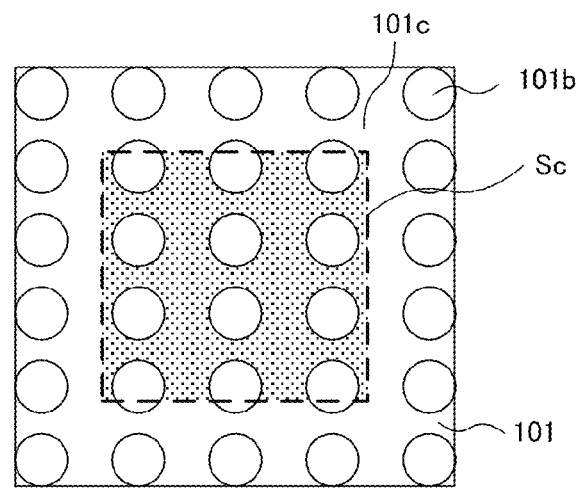
Figure 20C:
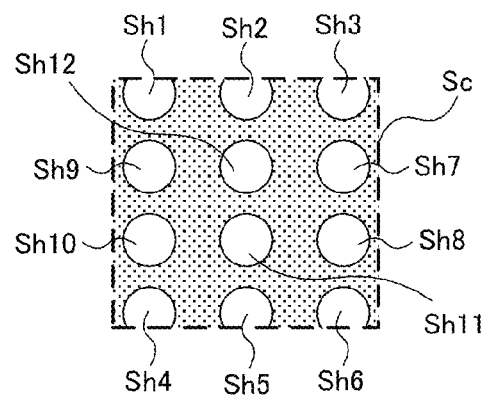

The opening ratio refers to a proportion of the area Sh of the concave portion 101c included in unit area Sc on the fine pattern within a plane parallel to a principal surface of the fine pattern as illustrated in FIG. 20A in a case where the concavo-convex structure 101a of the mold 101 has a hole configuration. FIG. 20C is a schematic diagram illustrating the fine pattern included in unit area Sc of FIG. 20A. In the example of FIG. 20C, twelve fine holes (concave portions 101c) are included in unit area Sc. A sum of opening areas Sh1 to Sh12 of the twelve fine holes (concave portions 101c) is denoted by Sh, and the opening ratio Ar is represented by Sh/Sc. Meanwhile, in a case where the fine pattern has a dot configuration, as illustrated in FIG. 20B, the opening ratio refers to a proportion of the area Sc−Sh of the concave portion 101c included in unit area Sc on the fine pattern within a plane parallel to a principal surface of the fine pattern. FIG. 20C is a schematic diagram illustrating the fine pattern included in unit area Sc of FIG. 20B.

In the example of FIG. 20C, twelve fine dots (convex portions 101b) are included in unit area Sc. A sum of the areas Sh1 to Sh12 of the top portions of the twelve fine dots (convex portions 101b) is denoted by Sh, and the opening ratio Ar is represented by ((Sc−Sh)/Sc). The opening ratio Ar can be expressed as a percentage by multiplying 100.

Figure 21:
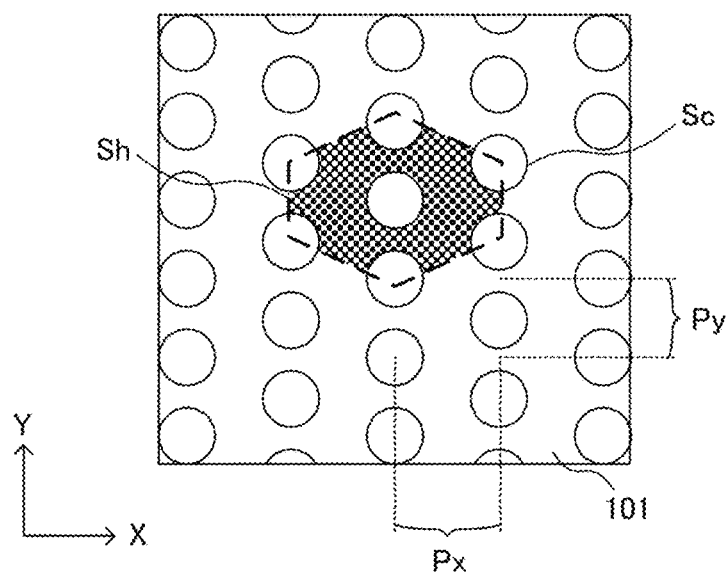
FIG. 21 is an explanatory diagram illustrating an aperture ratio of the fine pattern in the layered product for fine pattern formation according to a first aspect.

For example, in a case where the fine pattern has concave portions arranged in a hexagonal closest-packed structure in which an opening size φ is set to 430 nm, a pitch Px in an x-axis direction is set to 398 nm, and a pitch Py in an y-axis direction is set to 460 nm as illustrated in FIG. 21, the value of Sh/Sc becomes 0.79 (opening ratio 79%).

Similarly, for example, in a concavo-convex structure having concave portions arranged in a hexagonal closest-packed structure in which an opening size φ is set to 180 nm, a pitch Px in an x-axis direction is set to 173 nm, and a pitch Py in an y-axis direction is set to 200 nm, the value of Sh/Sc becomes 0.73 (opening ratio 73%).

Similarly, for example, in a concavo-convex structure having concave portions arranged in a hexagonal closest-packed structure in which an opening size φ is set to 680 nm, a pitch Px in an x-axis direction is set to 606 nm, and a pitch Py in an y-axis direction is set to 700 nm, the value of Sh/Sc becomes 0.86 (opening ratio 86%).

For example, in a case where the fine pattern has convex portions arranged in a hexagonal closest-packed structure in which a diameter φ of the top portion of the convex portion is set to 80 nm, a pitch Px in an x-axis direction is set to 398 nm, and a pitch Py in an y-axis direction is set to 460 nm as illustrated in FIG. 21, the value of (Sc−Sh)/Sc becomes 0.97 (opening ratio 97%).

Similarly, for example, in a concavo-convex structure having convex portions arranged in a hexagonal closest-packed structure in which a diameter φ of the top portion of the convex portion is set to 30 nm, a pitch Px in an x-axis direction is set to 173 nm, and a pitch Py in an y-axis direction is set to 200 nm, the value of (Sc−Sh)/Sc becomes 0.98 (opening ratio 98%).

Similarly, for example, in a concavo-convex structure having convex portions arranged in a hexagonal closest-packed structure in which a diameter φ of the top portion of the convex portion is set to 100 nm, a pitch Px in an x-axis direction is set to 606 nm, and a pitch Py in an y-axis direction is set to 700 nm, the value of (Sc−Sh)/Sc becomes 0.98 (opening ratio 98%).

A coating reformation structure may be included in the concavo-convex structure 101a of the mold 101. It is preferable that the coating reformation structure be arranged to interpose an area (basic structure) where the second mask layer 102 is filled and arranged in the concavo-convex structure 101a of the mold 101, and the pitch of the coating reformation structure be larger than that of the basic structure. It is preferable that the pitch of the coating reformation structure gradually increase from the basic structure side to the film end side. For example, in the case of the hole configuration, it is preferable that the opening ratio of the coating reformation structure be smaller than that of the basic structure.

Next, a method of manufacturing the first layered product 1 according to Embodiment 1 and the second layered product 2 according to Embodiment 2 will be described in detail.

[Manufacturing Method]

The first layered product 1 described above is manufactured by performing, at least, a process of coating a diluted material of the second mask layer 102 on a surface of the concavo-convex structure 101a of the mold 101 regardless of an external shape such as a reel-like or plate shape and a process of removing the surplus solvent in this order. In addition, the second layered product 2 described above is manufactured by performing, at least, a process of coating a diluted material of the first mask layer 103 on a surface of the fine pattern of the first layered product 1 and a process of removing the surplus solvent in this order.

[Reel-Like Layered Product for Fine Pattern Formation]

A method of manufacturing the reel-like layered product for fine pattern formation of FIGS. 4A and 4B will be described. The second layered product 2 having a reel-like shape may be manufactured by performing (1) fabricating a reel-like mold 101 (reel-like mold fabrication process) by transferring a photopolymerizable resin using a reel-like support substrate 100, transferring a thermopolymerizable resin, or transferring to a thermoplastic resin without using the support substrate 100; (2) forming a metal layer 104 if necessary (metal layer fabrication process); (3) forming a demolding layer 105 if necessary (demolding layer forming process); (4) introducing the second mask layer 102 into the inside of the fine pattern (second mask layer filling process); and (5) forming the first mask layer 103 (first mask layer forming process). In addition, the layered product obtained by performing processes until the second mask layer filling process is the first layered product 1.

Figure 22A:
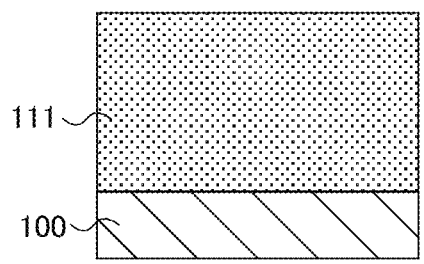
FIGS. 22A to 22C are explanatory diagrams illustrating a process of fabricating a reel-like mold according to a first aspect.
Figure 22B:
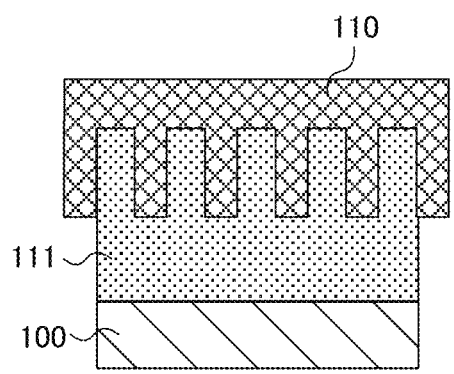
Figure 22C:
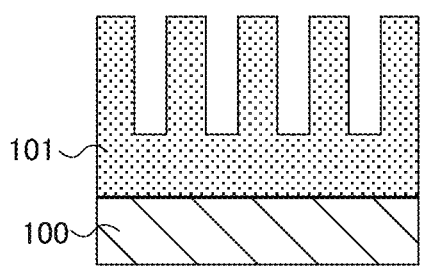

(1) Reel-Like Mold Fabrication Process 1-1. In a Case of Real-Like Substrate Having Support Substrate The reel-like mold 101 having the support substrate 100 may be fabricated by sequentially performing Processes (1) to (4) described below. FIGS. 22A to 22C are explanatory diagrams illustrating a process of fabricating the reel-like mold 101. The following processes are preferably performed through a roll-to-roll continuous transfer process.

Process (1): a process of coating a hardening resin composition 111 on the support substrate 100 (resin coating process, refer to FIG. 22A);

Process (2): a process of pressing the coated hardening resin composition 111 to a master mold after applying a demolding treatment (process of pressing resin to a cast, refer to FIG. 22B)

Process (3): a process of solidifying the hardening resin composition 111 to obtain a hardened material (resin hardening process).

Process (4): removing the hardened material from the master mold 110 to obtain a mold 101 having an inversion shape of the pattern of the master mold 110 (process of removing the hardened material from the template, and process of obtaining the resin mold A, refer to FIG. 22C)

In Process (2), in a case where a resin mold having excellent surface releasability satisfying the ratio Es/Eb described above is fabricated, or a demolding component included in the hardening resin composition 111 is segregated toward the fine pattern surface side of the resin mold (fine pattern surface side of the master mold 110), a master mold 110 after applying the demolding treatment is used. Meanwhile, in a case where Process (2) of fabricating the metal layer 104 and/or Process (3) of forming the demolding layer 105 is performed, the demolding process applied to the master mold 110 may not be performed.

In a case where a photopolymerizable resin composition is used as the hardening resin composition 111, and a roll-to-roll process is performed, particularly, the mold 101 can be consecutively fabricated with a high transfer accuracy if a cylindrical master mold 110 is used as the master mold 110. In Process (3), hardening is performed by irradiating light from the support substrate 100 side. Here, a light source for light irradiation may be appropriately selected based on the photopolymerizable resin composition. Therefore, although not particularly limited, a UV-LED light source, a metal halide light source, a high-pressure mercury lamp light source, and the like may be used. In addition, an integral light intensity from the start of light irradiation to the end of the irradiation is preferably set to 500 to 5,000 mJ/cm$^2$ in order to improve a transfer accuracy. More preferably, the integral light intensity is set to 800 to 2,500 mJ/cm$^2$. Furthermore, light irradiation may be performed using a plurality of light sources. In a case where a thermopolymerizable resin composition is used as the hardening resin composition 111, in Process (3), a system capable of heating both the support substrate 100 side and the master mold 110 side, any one of them, or all of the support substrate 100, the master mold 110, and the hardening resin composition 111 is prepared to perform hardening. Particularly, in order to continuously obtain the resin mold with a high transfer accuracy and high productivity, the hardening resin composition 111 is preferably a photopolymerizable resin composition.

Although the master mold 110 is illustrated as a plate shape in the drawings, the master mold preferably has a cylindrical shape. If a roll having a fine pattern on a surface of the cylinder is used as the master mold 110, it is possible to fabricate the mold 101 through a consecutive process.

In addition, a resin mold B is fabricated by using the resin mold A obtained through Process (4) as a template as illustrated in FIGS. 23A to 23D, and the resin mold B may be used as the reel-like mold 101. The hardening resin composition 111 used to fabricate the resin mold B from the resin mold A is preferably a photopolymerizable resin composition, more preferably a fluorine-containing photosetting resin composition, and most preferably a composition satisfying the aforementioned ratio Es/Eb from the viewpoint of a transfer accuracy.

Figure 23A:
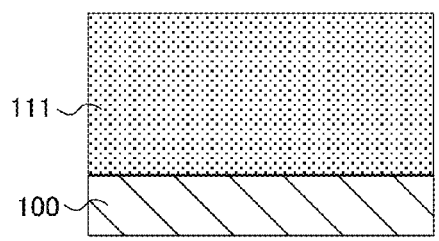
FIGS. 23A to 23D are explanatory diagrams illustrating a process of fabricating a reel-like mold according to a first aspect.

Process (4-1): a process of coating a hardening resin composition 111 on the support substrate 100 (process of coating the resin, refer to FIG. 23A).

Figure 23D:
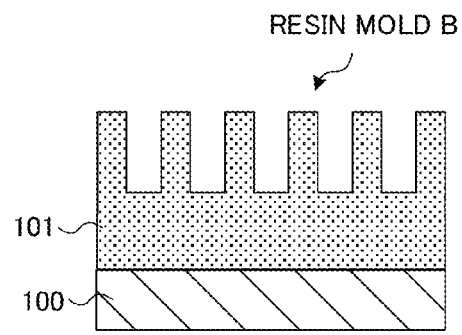
Figure 23B:
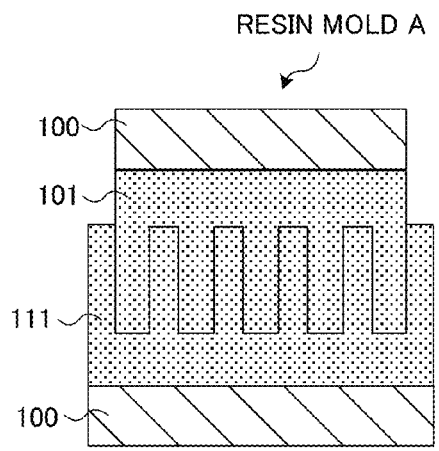

Process (4-2): a process of pressing the coated hardening resin composition 111 to the resin mold A (process of pressing the resin to the template, refer to FIG. 23B).

Figure 23C:
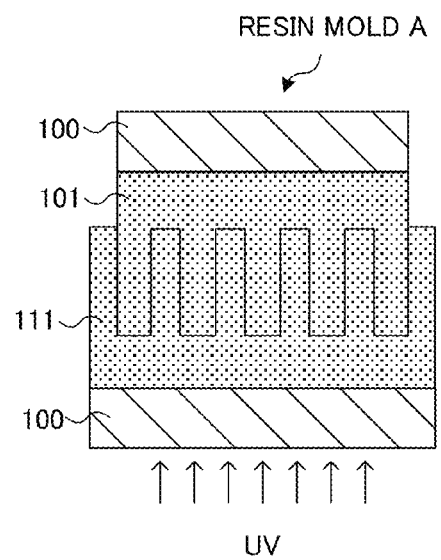

Process (4-3): a process of performing radical photopolymerization for the hardening resin composition 111 to obtain a hardened material by irradiating light from both the support substrate 100 side of the resin mold A and the support substrate 100 side of the resin mold B or from any one of them (process of photosetting resin, refer to FIG. 23C).

Process (4-4): a process of removing the hardened material from the resin mold A to obtain the mold 101 having the same shape as that of the fine pattern of the master mold 110 (process of removing the template from the hardened material, refer to FIG. 23D).

The coating method in Processes (1) and (4-1) may include a roller coat method, a bar coat method, a die coat method, a spray coat method, an air knife coat method, a gravure coat method, a micro-gravure coat method, a flow coat method, a curtain coat method, an inkjet method, and the like.

A process of covering (aligning) and winding a cover film may be added after Processes (4) and (4-4). As the cover film, for example, the protection layer 106 described above may be used.

1-2. In a Case of Real-Like Substrate Having No Support Substrate

By sequentially performing Processes (11) and (12) described below, the reel-like mold 101 having no support substrate 100 can be fabricated. FIG. 24 is an explanatory diagram illustrating a process of fabricating the reel-like mold 101. The following processes are preferably performed through a roll-to-roll consecutive transfer process.

Figure 24A:
FIGS. 24A to 24C are explanatory diagrams illustrating a process of fabricating a reel-like mold according to a first aspect.
Figure 24B:
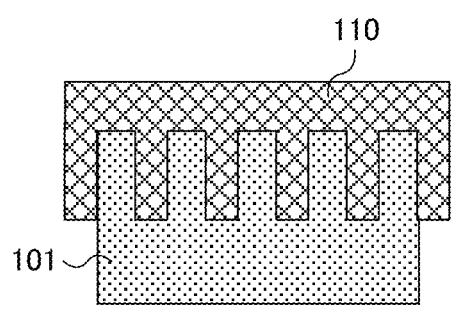

Process (11): a process of pressing the master mold 110 after applying the demolding treatment to the thermoplastic resin composition 101 by heating at a temperature equal to or higher than a glass transition temperature Tg of the thermoplastic resin composition 101 (process of pressing the template to the resin, refer to FIGS. 24A and 24B).

Figure 24C:
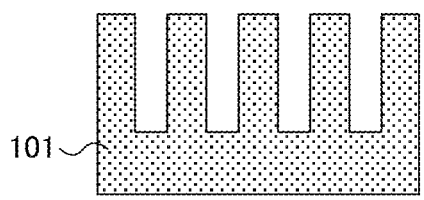

Process (12): a process of removing the master mold 110 from the thermoplastic resin composition 101 at a temperature lower than a glass transition temperature Tg of the thermoplastic resin composition 101 (process of removing the master mold 110 from the template to obtain the resin mold A, refer to FIG. 24C).

After Process (12), a process of covering (aligning) and winding a cover film may be added. As the cover film, for example, the protection layer 106 described above may be used.

Although the master mold 110 is illustrated as a plate shape in the drawings, the master mold preferably has a cylindrical shape. If a roll having a fine pattern on a cylindrical surface is used as the master mold 110, it is possible to fabricate the mold 101 through a consecutive process.

(2) Process of Forming Metal Layer

A metal layer 104 made of metal, metal oxide, or a combination of metal and metal oxide is formed on a surface of the fine pattern of the reel-like mold 101 obtained in Process (1) if necessary. The method of forming the metal layer 104 can be classified into a wet process and a dry process.

In the wet process, the reel-like mold 101 is immersed into a metal layer precursor solution such as a plating solution or metal alkoxides, and the precursor is partially reacted at a temperature of 25 to 200° C. Alternatively, the metal layer precursor solution such as a plating solution or metal alkoxides is coated on a surface of the fine pattern of the reel-like mold 101, and then precursor is partially reacted at a temperature of 25 to 200° C. Subsequently, the metal layer 104 can be formed by rinsing the surplus precursor. Before immersing into the precursor solution, an activation treatment using UV-$O_3$ or an excimer and the like may be performed for a fine pattern surface side of the reel-like mold 101.

In the dry process, the metal layer 104 can be formed by passing the reel-like resin mold through vapor of the metal layer precursor such as metal alkoxides. An activation treatment using UV-$O_3$, an excimer, and the like may be performed for the fine pattern surface side of the reel-like resin mold before the resin mold is exposed to the precursor vapor. Meanwhile, the metal layer 104 may be formed through sputtering or deposition. From the viewpoint of homogeneity of the metal layer 104, the sputtering is preferably used.

(3) Process of Forming Demolding Layer

A demolding layer 105 is formed in the reel-like mold 101 obtained through Process (1) or the reel-like mold 101 having the metal layer 104 obtained through Process (2) if necessary. Hereinafter, both the mold 101 having the metal layer 104 and the mold 101 having no metal layer 104 are referred to as simply a reel-like mold 101. The method of forming demolding layer 105 can be classified into a wet process and a dry process.

In the wet process, the reel-like mold 101 is immersed in a demolding solution, or the demolding solution is coated on the reel-like mold 101. Subsequently, the reel-like mold 101 was passed through a dry atmosphere at a temperature of 25 to 200° C., and finally, the surplus demolding material is rinsed and dried. An activation treatment using UV-$O_3$, an excimer, and the like may be performed for the fine pattern surface side of the reel-like mold 101 before the reel-like mold 101 is immersed in the demolding solution.

Meanwhile, in the dry process, the demolding layer 105 can be formed by passing the reel-like mold 101 through vapor of the demolding material. An activation treatment using UV-$O_3$, an excimer, and the like may be performed for the fine pattern surface side of the reel-like resin mold before the resin mold is exposed to the vapor of the demolding vapor. Decompression may be performed during the heating.

(4) Process of Filling Second Mask Layer

The first layered product 1 can be manufactured by filling the second mask layer 102 in the inside of the fine pattern of the reel-like mold 101 obtained through Processes (1) to (3). FIGS. 25A to 25C and 26A to 26C are explanatory diagrams illustrating a process of manufacturing the first layered product 1. In the following description, the reel-like mold 101 obtained in Process (1), the reel-like mold 101 having the metal layer 104 obtained in Process (2), or the reel-like mold having the demolding layer 105 obtained in Process (3) are simply referred to as a reel-like mold 101.

Figure 25A:
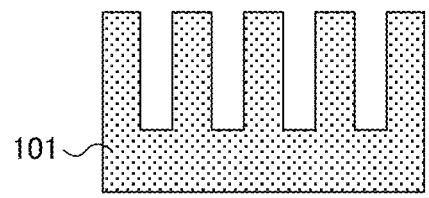
FIGS. 25A to 25C are explanatory diagrams illustrating a process of fabricating a layered product for fine pattern formation according to a first aspect.
Figure 25B:
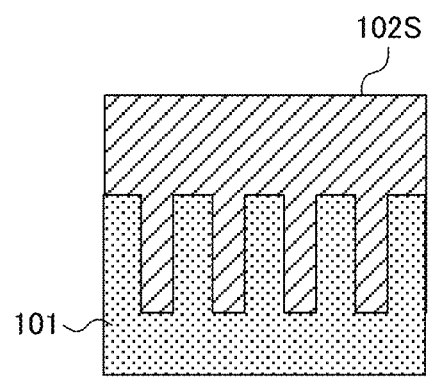
Figure 26A:
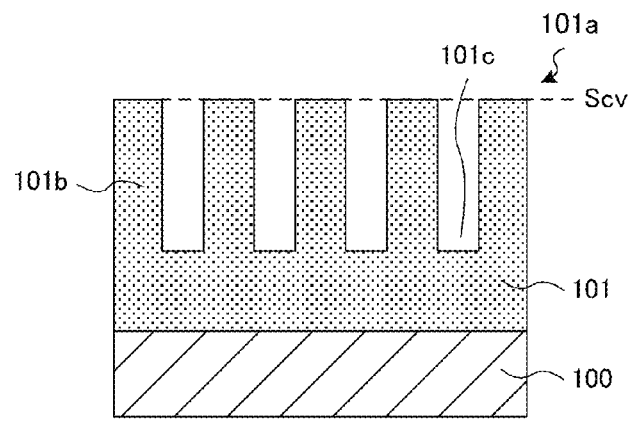
FIGS. 26A to 26C are explanatory diagrams illustrating a process of fabricating a layered product for fine pattern formation according to a first aspect.
Figure 26B:
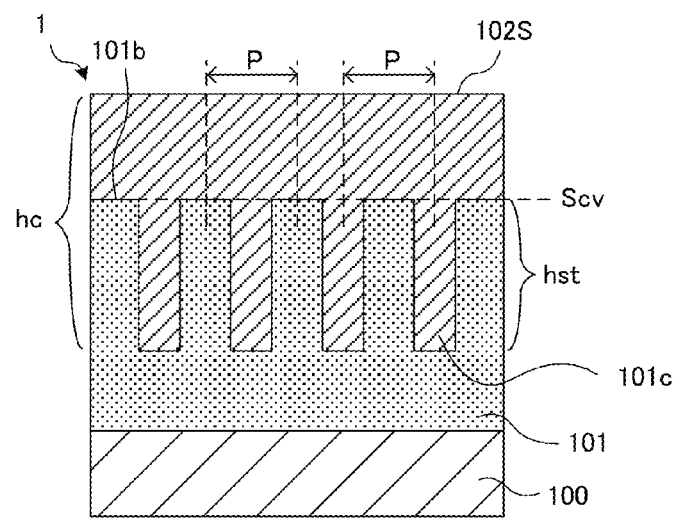

Process (5): a process of coating the diluted second mask material 102S on the fine pattern of the reel-like mold 101 (refer to FIGS. 25A and 26A).

Process (6): a process of drying and removing the surplus solvent to obtain the second mask layer 102 (refer to FIGS. 25B, 25C, 26B, and 26C).

The coating method in Process (5) may include a roller coat method, a bar coat method, a die coat method, a reverse coat method, a spray coat method, a gravure coat method, a micro-gravure coat method, an inkjet method, an air knife coat method, a flow coat method, a curtain coat method, and the like. Particularly, the micro-gravure coat method, the reverse coat method, and the die coat method are preferably used to improve a coating precision of the second mask layer 102. A material of the mask layer is preferably used through dilution, and a concentration thereof is not particularly limited if a solid content of the mask layer material per unit volume is smaller than a volume of the concavo-convex structure provided on unit area. In addition, a coating method relating to filling of the second mask layer 102 will be described in more detail below.

In a case where a sol-gel material is contained in the second mask layer 102, Process (6) also includes condensation of the sol-gel material in addition to the drying of the solvent. In addition, in a case where a sol-gel material is contained in the second mask layer 102, a curing process may be added after the winding process. The curing is preferably performed at a room temperature to 120° C. Particularly, the curing is preferably performed at a room temperature to 105° C.

(5) Process of Forming First Mask Layer

Figure 27A:
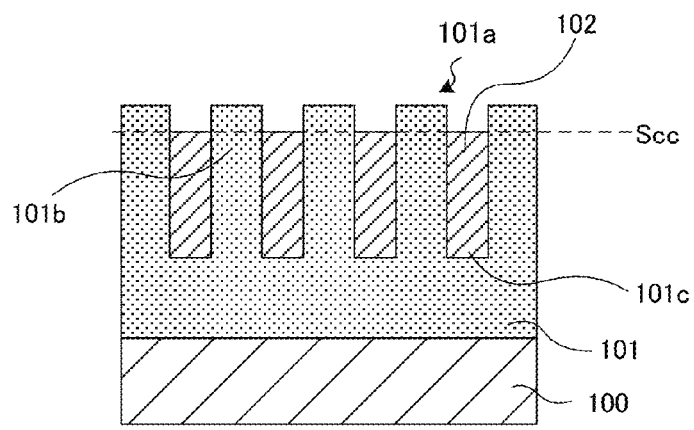
FIGS. 27A to 27C are explanatory diagrams illustrating a process of fabricating a layered product for fine pattern formation according to a first aspect.
Figure 27B:
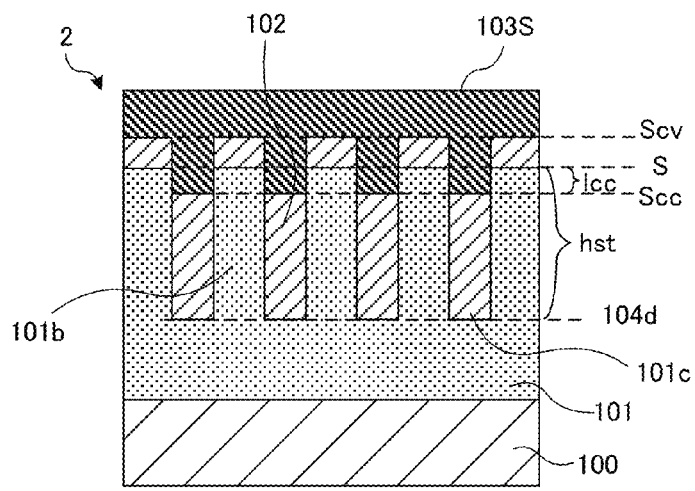
Figure 27C:
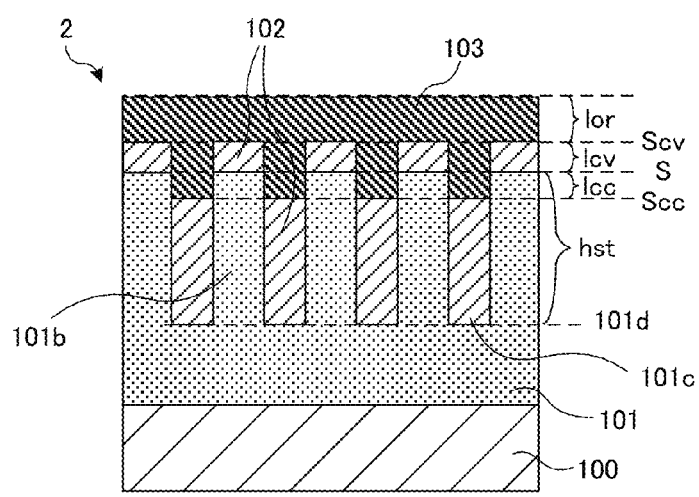

The second layered product 2 can be manufactured by forming the first mask layer 103 on a fine pattern surface of the first layered product 1 obtained in Processes (1) to (4). FIGS. 27A to 27C are explanatory diagrams illustrating a process of manufacturing the second layered product 2. In the following description, in any case where the reel-like mold 101 obtained in Process (1), the reel-like mold 101 having the metal layer 104 obtained in Process (2), or the reel-like mold having the demolding layer 105 obtained in Process (3) is used, the resulting layered product is referred to as a first layered product 1.

Process (7): a process of coating a diluted first mask layer material 103S (refer to FIG. 27B) on the fine pattern of the first layered product 1 (refer to FIG. 27A).

Process (8): a process of obtaining the first mask layer 103 by drying and removing the surplus solvent (refer to FIG. 27C).

The coating method in Process (7) may include a roller coat method, a bar coat method, a die coat method, a spray coat method, a gravure coat method, a micro-gravure coat method, an inkjet method, an air knife coat method, a flow coat method, a curtain coat method, and the like. Particularly, the die coat method is preferably used to improve a coating precision of the first mask layer 103. In addition, a coating method relating to formation of the first mask layer 103 will be described in more detail below.

[Plate Layered Product for Fine Pattern Formation]

Subsequently, a plate layered product for fine pattern formation will be described. The plate second layered product 2 may be manufactured by performing processes of (1) fabricating a plate mold 101 (plate mold fabrication process), (2) forming a metal layer 104 if necessary (metal layer fabrication process), (3) forming a demolding layer 105 if necessary (demolding layer forming process), (4) introducing the second mask layer 102 into the inside of the fine pattern (second mask layer filling process), and (5) forming the first mask layer 103 (first mask layer forming process). In addition, the layered product obtained until the second mask layer filling process is referred to as a first layered product 1.

(1) Plate Mold Fabrication Process 1-1. In a Case of Reel-Like Substrate Having Support Substrate The plate mold 101 can be fabricated by (A) cutting the obtained reel-like mold 101 and laminating the reel-like mold 101 to the plate support substrate 100, (B) forming a transfer structure of the hardening resin composition on the plate support substrate 100 using a template of the obtained reel-like mold 101, (C) forming a transfer structure of the hardening resin composition on the plate support substrate 100 by using the plate master as a template, or arranging the support substrate 100 on a surface opposite to the concavo-convex structure of the plate mold having no support substrate described below in Paragraph 1-2.

1-2. In a Case of Real-Like Substrate Having No Support Substrate

The plate mold 101 can be manufactured by directly fabricating a fine pattern on a plate substrate. The fabrication method may include a laser cutting method, an electron beam lithography method, a photolithography method, a direct-write lithography method using a semiconductor laser, an interference exposure method, an electromolding method, an anodic oxidation method, a thermal lithography method, and the like. Among them, a photolithography method, a direct-write lithography method using a semiconductor laser, an interference exposure method, an electromolding method, and an anodic oxidation method are preferably used, and a direct-write lithography method using a semiconductor laser, an interference exposure method, and an anodic oxidation method are more preferably used. The plate mold 101 may be manufactured by transferring the concavo-convex structure of the plate mold 101 manufactured by the direct fabrication described above onto a thermoplastic resin or a thermosetting resin such as PDMS. In addition, by performing electromolding using nickel (Ni) and the like for the plate mold, a plate mold made of nickel (Ni) can be obtained. Furthermore, the aforementioned reel-like mold can be obtained by fabricating the plate mold 101 in a cylindrical shape and by using the obtained cylindrical master as a template.

(2) Process of Forming Metal Layer

The metal layer 104 is formed on a fine pattern surface of the plate mold 101 obtained in Process (1) if necessary. A method of forming the metal layer 104 can be classified into a wet process and a dry process.

In the wet process, the plate mold 101 is immersed into a metal layer precursor solution such as a plating solution or metal alkoxides, and then the precursor is partially reacted at a temperature of 25 to 200° C. Subsequently, the metal layer 104 can be formed by rinsing the surplus precursor. Before immersing into the precursor solution, a treatment using UV-$O_3$, an excimer, and the like may be performed for a fine pattern surface side of the plate mold. A method of casting a precursor solution on a fine pattern surface of the plate mold 101 or a spin coat method may be used. In addition, a precursor partial reaction process or a rinse process is preferably added.

In the dry process, the metal layer 104 can be formed by disposing the plate mold in vapor of the metal layer precursor such as metal alkoxides. A treatment using UV-$O_3$, an excimer, and the like may be performed for the fine pattern surface side of the plate mold 101 before the mold is exposed to the precursor vapor. Meanwhile, the metal layer 104 may be formed through sputtering or deposition. From the viewpoint of homogeneity of the metal layer 104, the sputtering is preferably used.

(3) Process of Forming Demolding Layer 105

The demolding layer 105 is formed on the plate mold 101 obtained in Process (1) or the plate mold 101 having the metal layer 104 obtained in Process (2) if necessary. Hereinafter, both the mold 101 having the metal layer 104 and the mold 101 having no metal layer 104 are referred to as simply a plate mold 101. The method of forming the demolding layer 105 can be classified into a wet process and a dry process.

In the wet process, the plate mold 101 is immersed into a demolding solution. Subsequently, the plate mold 101 was passed through a dry atmosphere at a temperature of 25 to 200° C., and finally, the surplus demolding material is rinsed and dried. A treatment using UV-$O_3$, an excimer, and the like may be performed for the fine pattern surface side of the plate mold 101 before the plate mold 101 is immersed into the demolding solution. In addition, a method of casting the demolding solution on a fine pattern surface of the plate mold 101 or a spin coat method may be used. In addition, a dry atmosphere process or a rinse process is preferably added.

Meanwhile, in the dry process, the demolding layer 105 can be formed by passing the plate mold 101 through vapor of the demolding material. A treatment using UV-O3, an excimer, and the like may be performed for the fine pattern surface side of the plate mold 101 before the mold is exposed to vapor of the demolding vapor. Decompression may be performed during the heating.

(4) Process of Filling Second Mask Layer 102

The first layered product 1 can be manufactured by filling the second mask layer 102 in the inside of the fine pattern of the plate mold 101 obtained through Processes (1) to (3). FIGS. 25A to 25C and 26A to 26C are explanatory diagrams illustrating a process of manufacturing the first layered product 1. In the following description, the plate mold 101 obtained in Process (1), the plate mold 101 having the metal layer 104 obtained in Process (2), or the plate mold having the demolding layer 105 obtained in Process (3) are simply referred to as a plate mold 101.

Process (5): a process of coating the diluted second mask material 102S (refer to FIGS. 25B and 26B) on the fine pattern of the plate mold 101 (refer to FIGS. 25A and 26A).

Figure 25C:
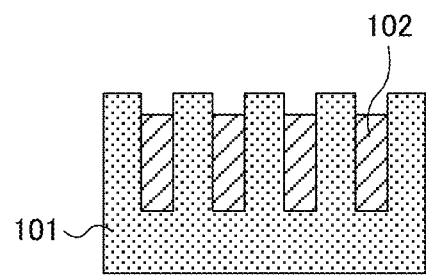
Figure 26C:
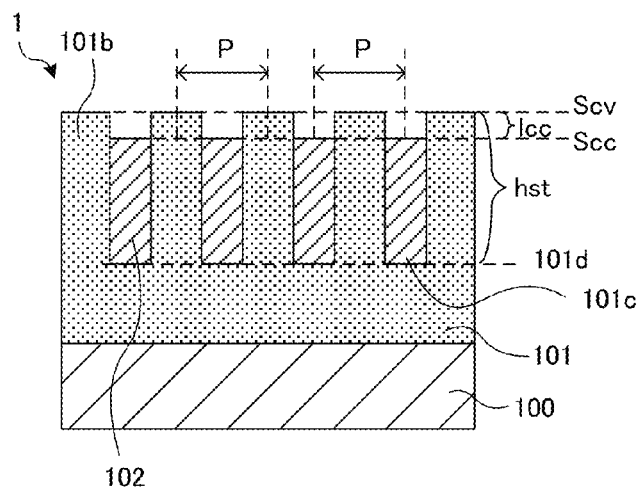

Process (6): a process of drying and eliminating the surplus solvent to obtain the second mask layer 102 (refer to FIGS. 25C and 26C).

The coating method in Process (5) may include, for example, a spin coat method. In addition, a method of performing a spin coat method after a slit coat method, a cast method, a die coat method, a dipping method, and the like may be used. In the spin coat method, it is preferable to form the diluted second mask layer 102S as a liquid film on the fine pattern of the plate mold 101 and then perform spin coating. In a case where a sol-gel material is included in the second mask layer 102, Process (6) also includes condensation of a sol-gel material as well as solvent drying. In addition, a coating method relating to filling of the second mask layer 102 will be described below.

(5) Process of Forming First Mask Layer

The second layered product 2 can be manufactured by forming the first mask layer 103 on a fine pattern surface of the first layered product 1 obtained in Processes (1) to (4). FIGS. 27A to 27C are explanatory diagrams illustrating a process of manufacturing the second layered product 2. In the following description, in any case where the plate mold 101 obtained in Process (1), the plate mold 101 having the metal layer 104 obtained in Process (2), or the plate mold having the demolding layer 105 obtained in Process (3) is used, the resulting layered product is referred to as a first layered product 1.

Process (7): a process of coating a diluted first mask layer material 103S (refer to FIG. 27B) on the fine pattern of the first layered product 1 (refer to FIG. 27A).

Process (8): a process of obtaining the first mask layer 103 by drying and eliminating the surplus solvent.

The coating method in Process (7) may include, for example, a spin coat method. In addition, a spin coat method may be performed after a slit coat method, a cast method, a die coat method, a dipping method, and the like. In the spin coat method, it is preferable to form the diluted first mask layer 103 as a liquid film on the fine pattern of the first layered product 1 and then perform spin coating. In addition, a coating method relating to filling of the first mask layer 103 will be described below.

Next, a method of coating a material of the second mask layer 102 on a fine pattern surface of the mold 101 and a method of forming the first mask layer 103 will be described in more detail.

As described above, the first layered product 1 is manufactured through a coating process (refer to FIGS. 25B and 26B) of coating a dilute solution 102S of the second mask layer material on a fine pattern surface of the mold 101 and a solvent elimination process (refer to FIGS. 25C and 26C) of forming the second mask layer 102 by eliminating the surplus solution.

(Coating Process)

In the coating process, the dilute solution 102S of the second mask layer material is coated on the fine pattern to satisfy Formula (11) Sc·hc·C<Vc, where Sc denotes a unit area in a plane parallel to a principal surface of the mold 101 within a coating region of the coating process, hc denotes a coat film thickness (wet film thickness) of the dilute solution 102S in the coating process (refer to FIG. 26B), C denotes a volumetric concentration of the dilute solution 102S of the second mask layer material, and Vc denotes a volume of the concave portion of the fine pattern existing under the unit area Sc. If the Formula (11) is satisfied, the second mask layer material 102 can be filled uniformly in the concave portion of the fine pattern. In addition, the aforementioned methods may be used as the coating method without any particular limitation if the aforementioned formula is satisfied.

(Unit Area Sc)

Figure 28A:
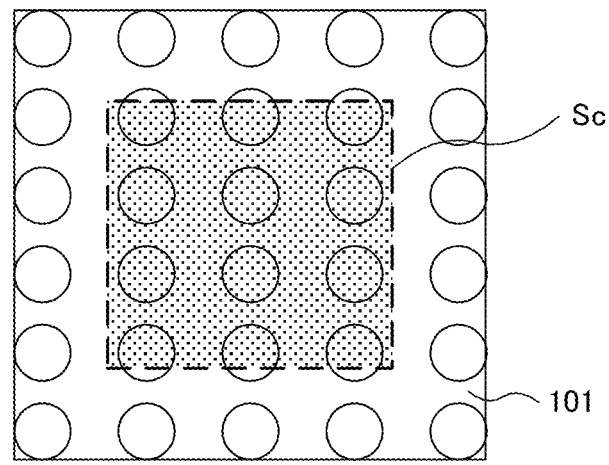
FIGS. 28A and 28B are diagrams illustrating a relationship between a fine pattern of the layered product for fine pattern formation according to a first aspect and a unit area.
Figure 28B:
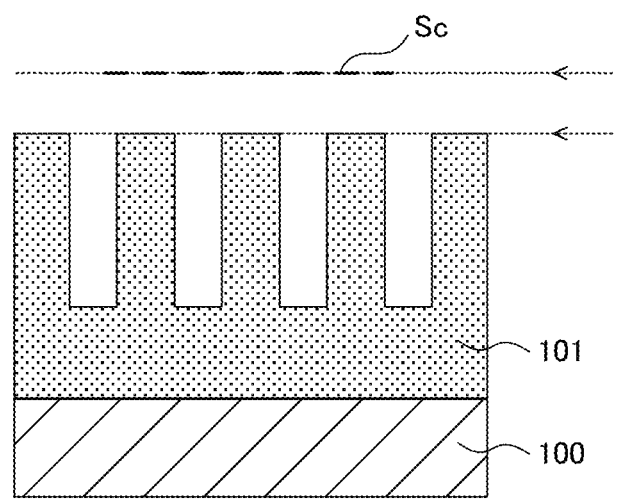

As illustrated in FIGS. 28A and 28B, the unit area Sc within a plane parallel to a principal surface of the mold 101 refers to an area of the plane arranged over the concavo-convex structure 101a of the mold 101 and parallel to a principal surface of the mold 101 (support substrate 100). FIGS. 28A and 28B are diagrams illustrating a relationship between the fine pattern and the unit area Sc. FIG. 28A is a schematic top plan view illustrating a fine pattern surface, and FIG. 28B is a schematic cross-sectional view thereof. As illustrated in FIG. 28B, the unit area Sc refers to an area of the plane arranged over the fine pattern and parallel to a principal surface of the mold 101 (support substrate 100). It is defined that the unit area Sc is equal to or larger than the unit cell area Ac. The unit cell area Ac is defined as follows.

Figure 29A:
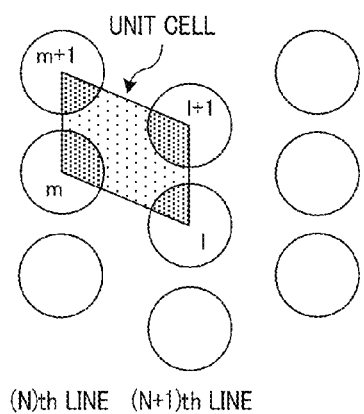
FIGS. 29A to 29C are explanatory diagrams illustrating an array of the fine pattern of the layered product for fine pattern formation according to a first aspect.

1. In a case where the fine pattern is a regular array having a dot configuration or a hole configuration:

FIG. 29A illustrates a state that the fine pattern is a regular array having a dot configuration or a hole configuration. From such a fine pattern, a fine pattern group n including N lines and a fine pattern group (n+1) including (N+1) lines are selected. Subsequently, two neighboring structures m and (m+1) are selected from the fine pattern group n. Subsequently, the fine patterns l and (l+1) closest to the structures m and (m+1) are selected from the fine pattern group (n+1). A region obtained by connecting the centers of the structures m, (m+1), l, and (l+1) is set to a unit cell, and the area of the unit cell is defined as Ac.

Figure 29B:
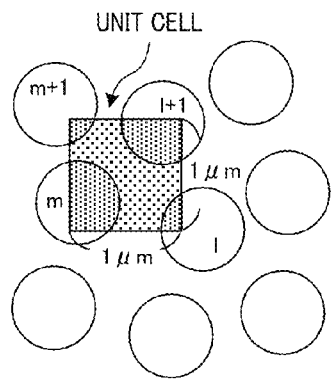

2. In a case where the fine pattern is a less regular array or a random array having a dot configuration or a hole configuration:

FIG. 29B illustrates a state that the fine pattern is a less regular array or a random array having a dot configuration or a hole configuration. In this case, if an average pitch of the fine pattern is smaller than 500 nm, a square of 1 μm by 1 μm within such a fine pattern is defined as a unit cell. In a case where an average pitch of the fine pattern is set to 500 nm or longer and 1000 nm or shorter, the square is set to 2 μm by 2 μm. In a case where an average pitch of the fine pattern is longer than 1000 nm and equal to or shorter than 1500 nm, the square is set to 3 μm by 3 μm.

Figure 29C:
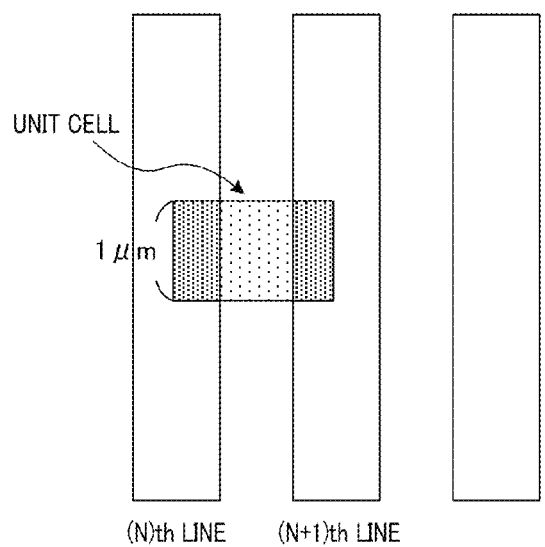

3. In a case where the fine pattern has a line-and-space structure:

FIG. 29C illustrates a case where the fine pattern has a line-and-space structure. Each line may be arranged in an equal interval, or the interval may vary. The (N)th line and the (N+1)th lines are selected from such a fine pattern. Subsequently, a line segment of 1 μm is drawn on each line. A square or a rectangle obtained by connecting end points of the line segments is defined as a unit cell.

An arrangement or a shape of the fine pattern in FIGS. 28A and 28B does not affect the definition of the unit area Sc. As the arrangement or a shape of the fine pattern, those described above may be used.

(Concave Portion Volume Vc)

Figure 30A:
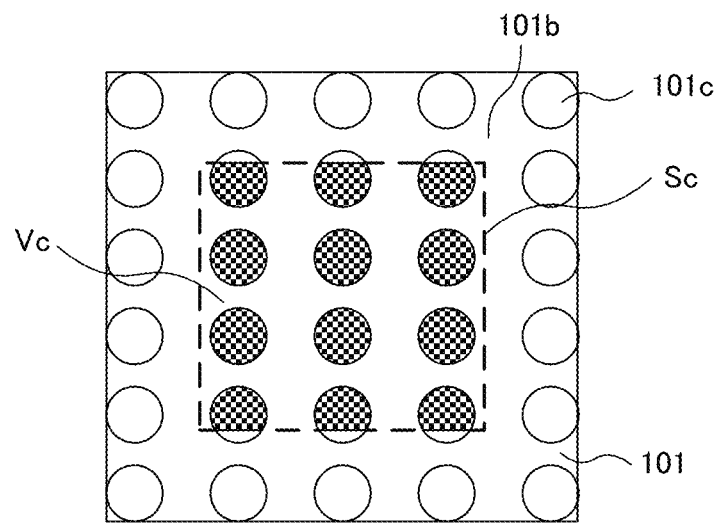
FIGS. 30A and 30B are diagrams illustrating a relationship between a fine pattern according to a first aspect, a unit area, and a volume of concave portions.
Figure 30B:
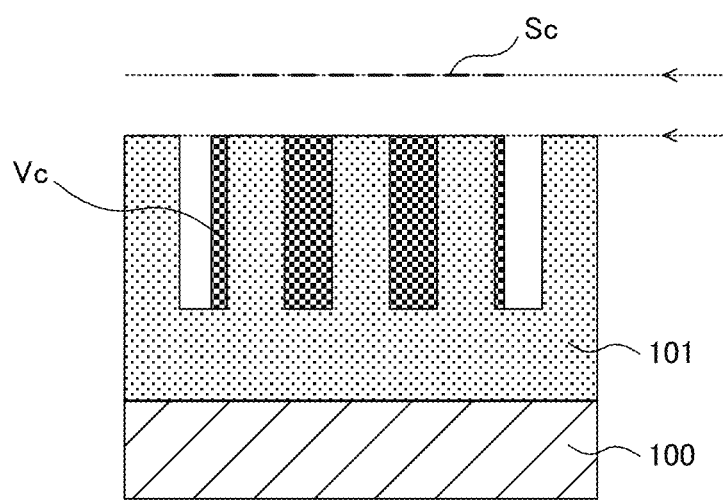

The concave portion volume Vc is defined as a concave portion volume of the fine pattern existing under the unit area Sc as illustrated in FIGS. 30A and 30B. FIGS. 30A and 30B are diagrams illustrating a relationship between the fine pattern, the unit area Sc, and the concave portion volume Vc. FIG. 30A is a schematic top plan view illustrating the fine pattern, and FIG. 32B is a schematic cross-sectional view thereof. As illustrated in FIG. 30B, a volume of the cavity (concave portion 101c) of the fine pattern obtained when the unit area Sc vertically descends to a principal surface of the mold 101 (support substrate 100), passes through the top portion of the fine pattern, and then passes through the bottom portion to the end is referred to as a concave portion volume Vc. Although FIGS. 30A and 30B representatively illustrate a case where the fine pattern has a hole configuration, the concave portion volume Vc is defined similarly in both cases of a dot configuration and a line-and-space configuration. An arrangement or a shape of the concavo-convex structure in FIGS. 30A and 30B does not affect the definition of the concave portion volume Vc, and the arrangement or the shape of the concavo-convex structure described above may be used.

(Coat Film Thickness hc)

The coat film thickness hc is defined as a coat film thickness (wet film thickness) of the dilute solution 102S. However, since it is difficult to measure the coat film thickness while the coating is provided on the fine pattern, a film thickness on a flat film surface made of substantially the same material as that of the fine pattern is defined as a coat film thickness hc. That is, for a flat film made of substantially the same material or the same material as that of the fine pattern, a thickness of a film coated under the same condition as that of the fine pattern is used as the coat film thickness hc. Since the range of the coat film thickness hc can be appropriately set to satisfy the Formula (11), it is not particularly limited but is preferably set to 0.1 μm or larger and 20 μm or smaller from the viewpoint of the coating precision.

(Volumetric Concentration C)

The volumetric concentration C is defined as a volumetric concentration of the dilute solution 102S of the second mask layer material. If a relationship between the unit area Sc, the coat film thickness hc, the volumetric concentration C, and the concave portion volume Vc satisfies the Formula (11), a concave-portion-filling mask layer 102a can be arranged in the concave portion 101c of the fine pattern. From the viewpoint of an arrangement accuracy for arranging the concave-portion-filling mask layer 102a inside the concave portion 101c of the fine pattern, it is preferable that Sc·hc·C≤0.9 Vc, and further preferably Sc·hc·C≤0.8 Vc.

Hereinafter, while description will be made for a fine pattern structure, specific values of the coat film thickness hc and a volumetric concentration C, a manufacturing method according to the present invention is not limited thereto.

Figure 31A:
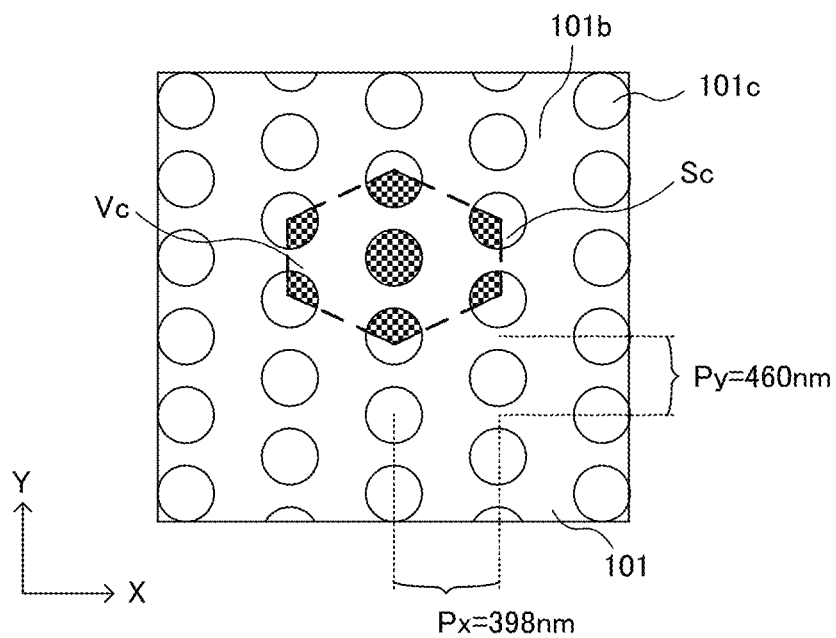
FIGS. 31A and 31B are diagrams illustrating a relationship between a fine pattern according to a first aspect, a unit area, and a volume of concave portions.
Figure 31B:
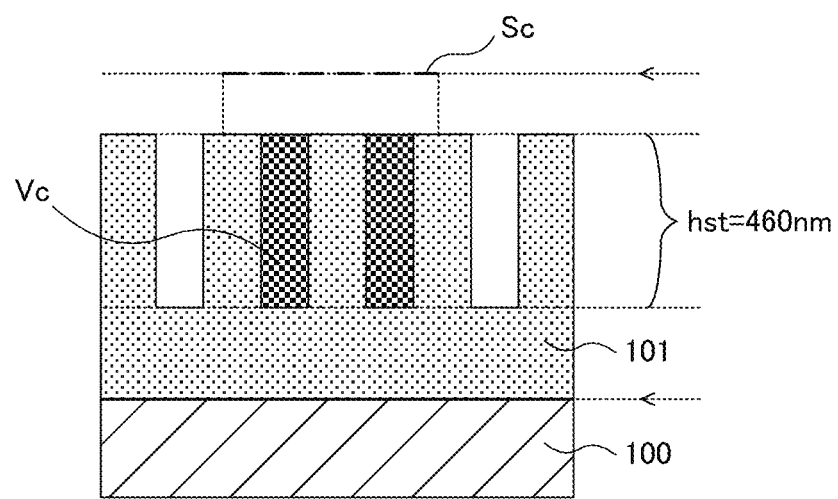

FIGS. 31A and 31B illustrate a fine pattern structure in which circular columnar concave portions having a rounded leading edge with an opening size ($\phi$) of 430 nm, an x-axis-directional pitch of 398 nm, a y-axis-directional pitch of 460 nm, and a depth (height) of 460 nm are arranged side by side in a hexagonal closest-packed structure. In this case, the relationship of the Formula 11 can be conceived as follows.

Figure 32:
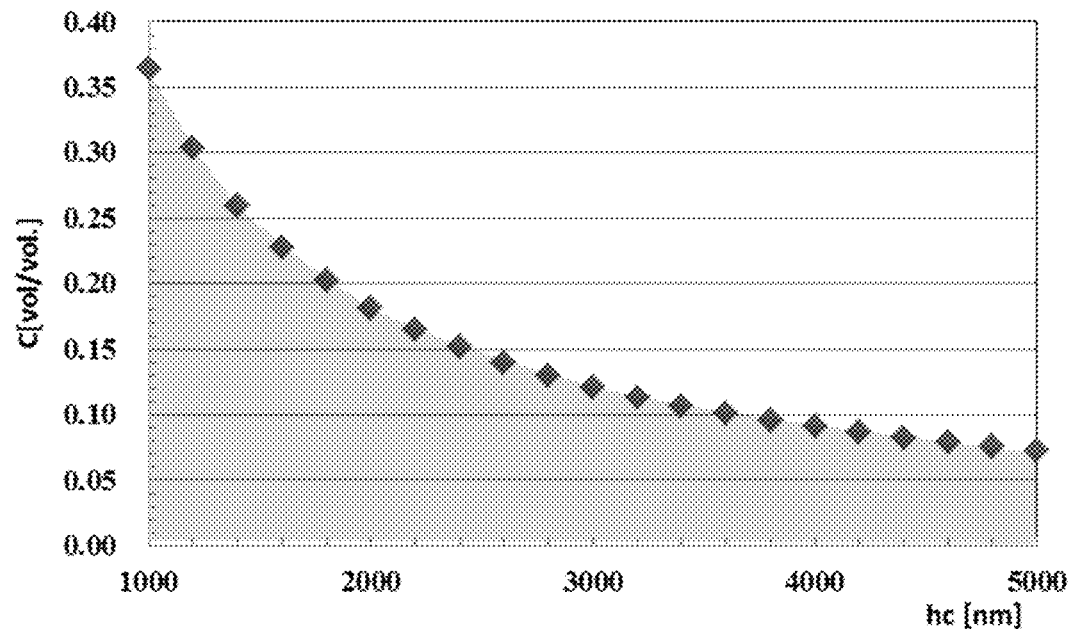
FIG. 32 is a diagram illustrating a coating process condition for the fine pattern of the layered product for fine pattern formation according to a first aspect.

As illustrated in FIG. 31A, if the unit area Sc is considered as a hexagonal unit cell, the unit area Sc and the concave portion volume Vc are determined as hc·C<Vc/Sc=364, assuming that a volume of a single circular columnar concave portion having a rounded leading edge is 80% of a volume of a single circular columnar concave portion. Assuming that the coat film thickness hc is between 1000 nm and 5000 nm, a relationship between the coat film thickness hc and the volumetric concentration C can be summarized as illustrated in FIG. 32. FIG. 32 is a diagram illustrating a relationship between the volumetric concentration C and the coat film thickness hc satisfying the condition hc·C<Vc/Sc=364, that is, a coating process condition for the fine pattern of FIGS. 31A and 31B. The abscissa in FIG. 32 denotes the coat film thickness hc in a nanometer scale, and the ordinate denotes the volumetric concentration C (vol./vol.) which corresponds to volume % by multiplying 100. The plot of FIG. 32 satisfies the condition hc·C<Vc/Sc=364, so that the hatched region under the plot becomes a coating allowable condition.

Figure 33:
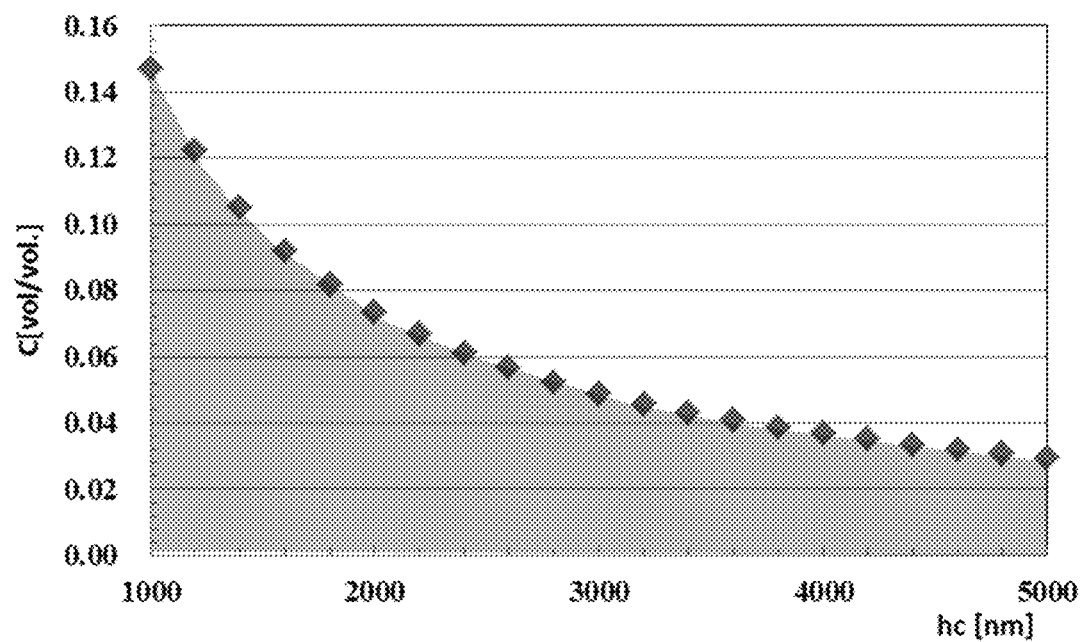
FIG. 33 is a diagram illustrating a coating process condition for the fine pattern of the layered product for fine pattern formation according to a first aspect.

Similarly, for example, in a fine pattern structure in which circular columnar concave portions having a rounded leading edge with an opening size $\phi$ of 180 nm, an x-axis-directional pitch of 173 nm, a y-axis-directional pitch of 200 nm, and a depth (height) of 200 nm are arranged side by side in a hexagonal closest-packed structure, the condition illustrated in FIG. 33 corresponds to the coating process. The abscissa of FIG. 33 denotes the coat film thickness hc in a nanometer scale, and the ordinate denotes the volumetric concentration C (vol./vol.) which corresponds to volume % by multiplying 100. The plot of FIG. 33 satisfies the condition hc·C<Vc/Sc=147, so that the hatched region under the plot becomes a coating allowable condition.

Figure 34:
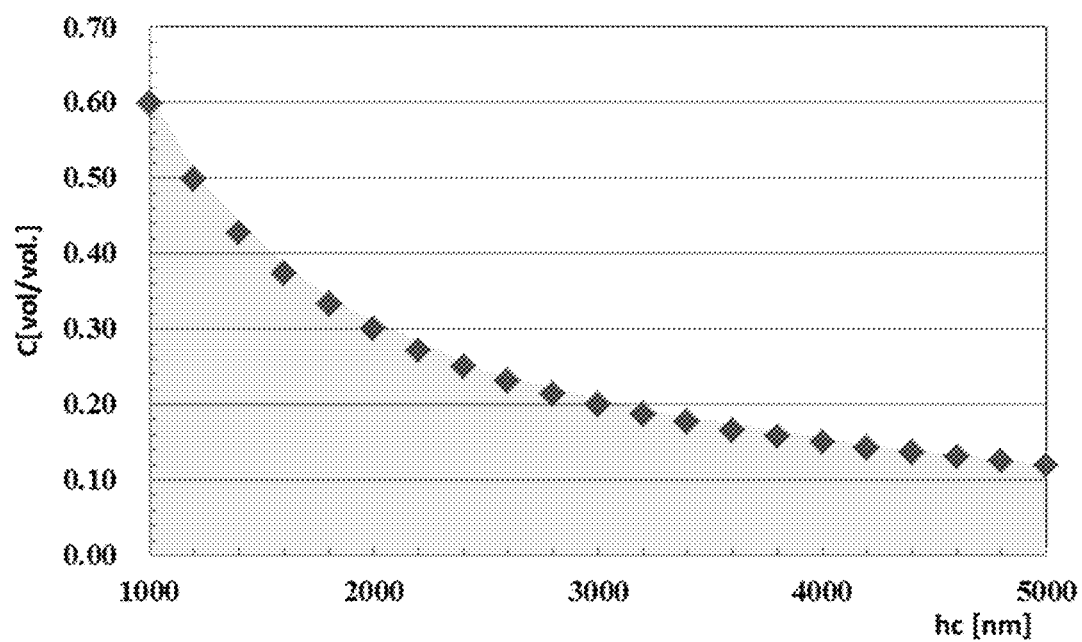
FIG. 34 is a diagram illustrating a coating process condition for the fine pattern of the layered product for fine pattern formation according to a first aspect.
Figure 35A:
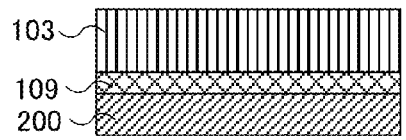
FIGS. 35A to 35G are explanatory diagrams illustrating another example of the process of fabricating the layered product for fine pattern formation according to a first aspect.
Figure 35B:
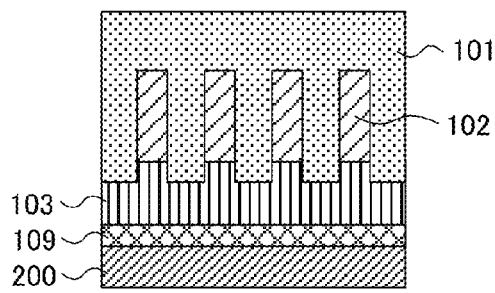
Figure 35C:
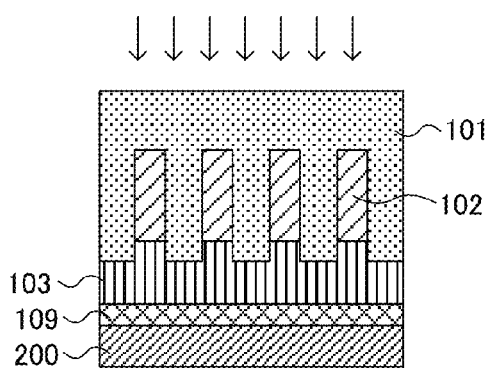
Figure 35D:
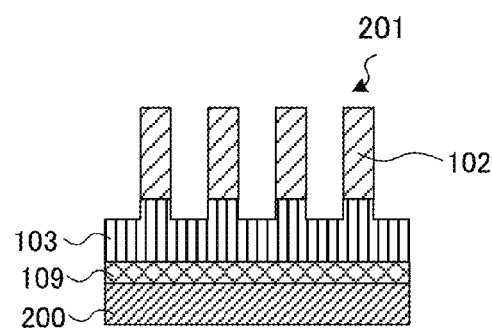
Figure 35E:
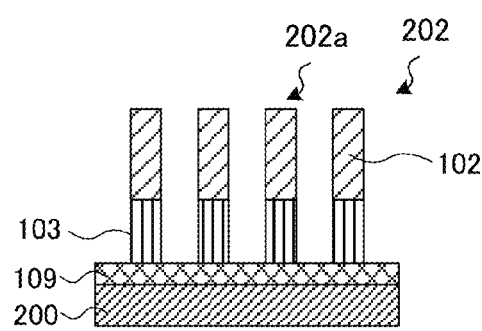
Figure 35F:
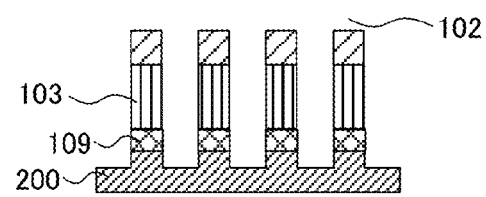
Figure 35G:
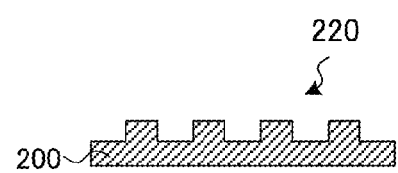

Similarly, for example, in a fine pattern structure in which circular columnar concave portions having a rounded leading edge with an opening size $\phi$ of 680 nm, an x-axis-directional pitch of 606 nm, a y-axis-directional pitch of 700 nm, and a depth (height) of 700 nm are arranged side by side in a hexagonal closest-packed structure, the condition illustrated in FIG. 34 corresponds to the coating process in the present invention. The abscissa of FIG. 34 denotes the coat film thickness hc in a nanometer scale, and the ordinate denotes the volumetric concentration C (vol./vol.) which corresponds to volume % by multiplying 100. The plot of FIG. 34 satisfies the condition hc·C=Vc/Sc=599, so that the hatched region under the plot becomes a coating allowable condition.

(Solvent Elimination Process)

By coating a dilute solution 102S of the second mask layer material on the fine pattern to satisfy the Formula (11) (refer to FIG. 26B) and then performing a solvent elimination process, it is possible to fill the concave-portion-filling mask layer 102a in the concave portion 101c of the fine pattern and manufacture the first layered product 1 (refer to FIG. 26C).

The temperature and the time in the solvent elimination process may be appropriately set depending on the coat film thickness hc and conditions such as a vapor pressure or a boiling point of the solvent used to manufacture the dilute solution 102S of the second mask layer material. Therefore, there is no particular limitation in general, but the temperature is preferably set to 20 to 120° C., and the time is preferably set to 10 seconds to 1 hour in order to improve an arrangement accuracy of the second mask layer 102. A solvent elimination process (1) may be performed such that a relationship between the solvent elimination process temperature T and the boiling point of the used solvent Ts is preferably set to T<Ts, and more preferably T<Ts/2 in order to further improve an arrangement accuracy of the second mask layer 102. Furthermore, after the solvent elimination process (1), a solvent elimination process (2) may be performed such that a relationship between the solvent elimination process temperature T and the boiling point of the used solvent Ts is preferably set to T≈Ts in order to improve storage stability of the first layered product 1 or a transfer accuracy in use. The relationship T≈Ts means that T=Ts±20%, in general.

In the process of manufacturing the first layered product 1, a pre-treatment process of the fine pattern may be performed before the coating process, and an energy ray irradiation process may be performed after the solvent elimination process. That is, in the process of manufacturing the first layered product 1, the pre-treatment process, the coating process, and the solvent elimination process may be performed in this order. Alternatively, the coating process, the solvent elimination process, and the energy ray irradiation process may be performed in this order. Alternatively, the pre-treatment process, the coating process, the solvent elimination process, and the energy ray irradiation process may be performed in this order.

(Pre-Treatment Process)

If a pre-treatment process is performed for the fine pattern surface of the mold 101, excellent coatability of the dilute solution 102S of the mask layer material is maintained, so that an arrangement accuracy of the second mask layer 102 or a transfer accuracy of the second mask layer 102 when the first layered product 1 is used can be improved, which is desirable.

A pre-treatment process (1) for obtaining an advantage of improving an arrangement accuracy of the second mask layer 102 may include formation of the metal layer 104 described above. In addition, an oxygen ashing treatment, a plasma treatment, an excimer treatment, a UV-$O_3$ treatment, an alkali solution treatment, and the like may be performed on a surface of the metal layer 104. A means of forming the metal layer 104 may use the method of forming the metal layer 104 described above. Specifically, the pre-treatment process may include, for example, a surface coating using metal alkoxides such as tetraethoxysilane, a surface treatment using a silane coupling agent having an olefin portion, a dry coating (such as sputtering) of a metal layer including chromium (Cr), a dry coating (such as sputtering) of a metal oxide layer including $SiO_2$, or a combined treatment thereof.

Meanwhile, as a pre-treatment process (2) for obtaining an advantage of improving a transfer accuracy of the second mask layer 102, a process of forming the aforementioned demolding layer 105 may be used.

In the pre-treatment process, a pre-treatment (2) may be performed after the pre-treatment (1).

(Energy Ray Irradiation Process)

If energy rays are irradiated from at least one of the fine pattern surface side (second mask layer 102 surface side) or the substrate 100 surface side (surface side opposite to the fine pattern of the mold 101) after the solvent elimination process, stability of the second mask layer material and a transfer accuracy of the second mask layer 102 when the first layered product 1 is used are improved, which is desirable. Energy rays may include X-rays, ultraviolet rays, infrared rays, and the like.

In the process of manufacturing the first layered product 1, a process of laminating the protection layer 106 may be added. Here, the protection layer 106 may be deposited on a surface of the first mask layer 103 in the second layered product 2. It is possible to protect the fine pattern and the second mask layer 102 by performing the process of laminating the protection layer 106.

The first layered product 1 may be manufactured by sequentially performing two or more and seven or less processes out of the reel-out process, the pre-treatment process, the coating process, the solvent elimination process, the energy ray irradiation process, the protection layer laminating process, and the winding process, necessarily including the coating process and the solvent elimination process in this order.

(Concavo-Cconvex Structure 101a of Mold 101 and Contact Angle)

A material property of the fine pattern used to manufacture the first layered product 1 is not particularly limited. However, a water droplet contact angle on the fine pattern surface is preferably smaller than 90° because an arrangement accuracy of the second mask layer 102 is improved. The water droplet contact angle is preferably equal to or smaller than 70° to further exert such an advantage. Meanwhile, the water droplet contact angle on the fine pattern surface is preferably larger than 90° in order to improve a transfer accuracy of the second mask layer 102 when the manufactured first layered product 1 is used, and is preferably set to 100° or larger in order to further exert the aforementioned advantages.

The water contact angle on the fine pattern surface is preferably set to 90° or larger to reduce the distance lcv. Particularly, in order to set the distance lcv to a zero or approximately zero, it is preferable that the water contact angle of the fine pattern surface be set to 90° or larger, the opening ratio range described below be satisfied, a hydrophilic solvent be selected as a solvent for diluting a material of the second mask layer 102, and the Formula (11) described above be satisfied.

(Material of Second Mask Layer 102 and Dilute Solution 102S)

From the viewpoint of an arrangement accuracy of the second mask layer 102 in the concave portion of the fine pattern, a contact angle of the dilute solution 102S of the second mask layer material on the fine pattern is preferably set to 110° or smaller, and more preferably 90° or smaller. Since a capillary force into the concave portion of the fine pattern can increase, a contact angle of the dilute solution 102S on the fine pattern is preferably set to 85° or smaller, more preferably 80° or smaller, and most preferably 70° or smaller.

A solvent satisfying such a contact angle range may include a hydrophilic solvent. The hydrophilic solvent refers to a solvent having high affinity to water, and may include, for example, alcohols, ethers, ketones, and the like.

As the material of the second mask layer 102, the second mask layer material described above may be selected. Particularly, in order to accelerate filling in the concave portion of the fine pattern, an average molecular weight of the solid content (mask layer material) included in the dilute solution 102S of the mask layer material is preferably set to 100 to 1,000,000. In addition, the material of the second mask layer 102 preferably satisfies the aforementioned requirements regarding the radius of inertia, the prepolymer, the viscosity, and the metalloxane bond in order to further improve a filling and arrangement accuracy in the concave portion of the fine pattern.

If a material whose phase is changed during the solvent elimination process after the dilution coating is contained in the mask material of the second mask layer 102, it is conceived that an surface area of the material itself may also be reduced at the same time. Therefore, the second mask material is more effectively filled in the concave portion 101c to increase an arrangement accuracy of the second mask layer 102, which is desirable. The phase change may include, for example, an exothermic reaction or an increasing viscosity. For example, if a sol-gel material such as metal alkoxides (including a silane coupling agent) is included, the sol-gel material is reacted with water vapor in the air during the solvent elimination process, so that the sol-gel material is polycondensed. Accordingly, the energy of the sol-gel material becomes unstable. Therefore, the sol-gel material tends to be apart from a liquid surface (interface between the solvent and the air) of the solvent lowered as the solvent is dried (solvent removal). As a result, the sol-gel material is appropriately filled in the concave portion 101c, so that an arrangement accuracy of the second mask layer 102 is improved. Particularly, if a plurality of phase-change materials are included, it is possible to further improve an arrangement accuracy of the second mask layer 102 using a change speed difference of the phase change, which is desirable.

A fact that a plurality of phase-change materials are included means that, for example, metal alkoxides having different metal species are included, or metal alkoxides having different types (structures) of the side chain are included even when the same metal species is used. As a former case, for example, metal alkoxides having metal species Si and Ti or metal alkoxides having metal species Si and Zr may be used. As a latter case, for example, a combination of metal alkoxides having silicon Si as a metal species and a silane coupling agent having a photopolymerizable group, and the like may be used.

In order to improve stability in the solvent elimination process, a prepolymer (partial condensation material) may be included in a material of the second mask layer. For example, a prepolymer containing metal alkoxides in which several molecules to several thousands molecules are polycondensed may be used.

In order to improve coatability of the dilute solution 102S of the second mask layer material on the fine pattern and an arrangement accuracy of the second mask layer 102, a surfactant or a leveling agent may be added to the dilute solution 102S of the second mask layer material. Such a material or an addition concentration thereof may include those described above.

As the dilute solution 102S which is used, a single solvent preferably has, but not particularly limited to, a boiling point of 40 to 200° C., more preferably 60 to 180° C., and further preferably 60 to 160° C. Two or more types of diluents may be used. Particularly, in a case where two or more solvents are mixedly used, a difference between boiling points of each solvent is preferably set to 10° C. or greater, and more preferably 20° C. or greater from the viewpoint of a leveling effect of the dilute solution of the second mask layer material. In addition, it is preferable that the diluent solvent 102S be selected in consideration of influences of the second mask layer 102 and the solvent on the radius of inertia, as described above. A shape or an arrangement of the fine pattern may include those described above.

Among them, if the coating satisfies the following opening ratio and the Formula (11), a hydrophilic solvent is selected as a solvent for diluting a material of the second mask layer 102, and a water contact angle on a surface of the concavo-convex structure 101a is set to 75° or larger, preferably 85° or larger, and more preferably 90° or larger, it is possible to easily set the distance lcv to zero or approximately zero, which is desirable. In addition, if the fine pattern has a water contact angle of 90° or larger on the fine pattern surface and is a mold which satisfies the aforementioned range Es/Eb, it is possible to manufacture consecutively the layered product for fine pattern formation with a high accuracy and improve transferability in use, which is desirable.

When a dilute solution 102S of the second mask layer material is coated on the concavo-convex structure 101a to fill the concave portion with the second mask layer 102, the opening ratio Ar ((Sc−Sh)/Sc) if the fine pattern has a dot configuration, or Sh/Sc if the concavo-convex structure 101a has a hole configuration described above preferably satisfies Formula (12) Ar≥0.45.

In a case where the opening ratio Ar satisfies the Formula (12) described above, and the pitch is within a range of 150 nm to 800 nm, the dilute solution 102S of the second mask layer material can recognize the fine pattern. For this reason, the dilute solution 102S of the second mask layer material is widely soaked into the inside of the fine pattern to maximize a radius of curvature of a hypothetical droplet, which is desirable. The hypothetical droplet refers to a liquid droplet of the dilute solution 102S of the second mask layer material supposed to exist in the concave portion of the fine pattern. Particularly, the opening ratio Ar is preferably set to 0.50 or higher, and more preferably 0.55 or higher. Furthermore, the opening ratio Ar preferably satisfies Formula (13) Ar≥0.65.

In a case where the opening ratio Ar satisfies the Formula (13), in addition to the aforementioned advantages, a potential is applied from the convex portion of the fine pattern toward the inside of the concave portion so that it is possible to avoid the dilute solution 102S of the second mask layer material from moving to the convex portion again after a droplet is filled in the concave portion, which is more desirable. In order to further exert the aforementioned advantages, the opening ratio Ar is preferably set to 0.7 or higher, more preferably 0.75 or higher, and further preferably 0.8 or higher.

Particularly, the fine pattern of the mold 101 preferably has a concave shape because the first mask layer 103 is fabricated from the second mask layer 102 surface side of the layered product 201 consisting of [the second mask layer 102/the first mask layer 103/the object 200 to be processed] so as to obtain an object 20 to be processed2 provided with the fine mask pattern 202a.

In addition, if an area of the hole opening is larger than an area of the hole bottom, a pinning effect (a pinning effect caused by TPCL) in a solid-liquid-gas interface in a hole end can be easily suppressed, and the aforementioned advantages can be further exerted, which is desirable. In addition, if the opening edge and the side face of the concave portion are smoothly and consecutively connected, the aforementioned advantages can be further exerted, which is desirable.

The second layered product 2 is manufactured through a second coating process (refer to FIG. 27B) in which the dilute solution 103S of the first mask layer material is coated on the fine pattern incorporating the second mask layer 102 in the first layered product 1 and a second solvent elimination process (refer to FIG. 27C) in which the surplus solution is eliminated to form the first mask layer 103.

(Second Coating Process)

The coatability of the dilute solution 103S of the first mask layer material is not particularly limited if it satisfies Formula (14) Sc·ho·Co≥Vc, where ho denotes a coat film thickness (wet film thickness) of the dilute solution 103S in the coating process (refer to FIG. 27B), and Co denotes a volumetric concentration of the dilute solution 103S of the first mask layer material.

Here, the coat film thickness ho is defined as a coat film thickness of the dilute solution 103S of the first mask layer material. However, since it is difficult to measure the coat film thickness while the coating is made on the fine pattern incorporating the second mask layer 102, a film thickness on a flat film surface manufactured with substantially the same material as that of the fine pattern is defined as ho. That is, for a flat film made of the same material or substantially the same material as that of the fine pattern, a thickness of the film coated under the same condition as that of the film formation condition on the fine pattern of the first layered product 1 is used as the coat film thickness ho.

A range of the coat film thickness ho can be appropriately set to satisfy the condition Sc·ho·Co≥Vc. Therefore it is not particularly limited, but is preferably set to 0.1 μm or larger and 20 μm or smaller, more preferably 0.2 to 10 μm, and most preferably 0.3 to 2 μm from the viewpoint of the coating precision. Particularly, from the viewpoint of the film formation of the first mask layer 103 in the second layered product 2 and the laminating property in use, the coat film thickness preferably satisfies Sc·ho·Co≥1.5 Vc, and more preferably Sc·ho·Co≥2 Vc.

The coating method is not particularly limited if the condition Sc·ho·Co≥Vc is satisfied. For example, the aforementioned coating method may be used.

(Second Solvent Elimination Process)

The first mask layer 103 can be formed on the fine pattern incorporating the second mask layer 102 by coating the dilute solution 103S of the first mask layer material on the fine pattern incorporating the second mask layer 102 to satisfy Formula (14) described above (refer to FIG. 27B) and then performing the second solvent elimination process (refer to FIG. 27C).

The second layered product 2 is manufactured by sequentially performing a second coating process in which the dilute solution 103S of the first mask layer material is coated on the fine pattern incorporating the second mask layer 102 in the first layered product 1 and a second solvent elimination process in which the first mask layer 103 is formed by eliminating the surplus solvent, at least in this order.

That is, in a case where there is a protection layer laminating process and a winding process for the first layered product 1 manufactured by sequentially performing two or more processes out of the reel-out process, the pre-treatment process, the coating process, the solvent elimination process, the energy ray irradiation process, the protection layer laminating process, and the winding process, necessarily including the coating process and the solvent elimination process in this order, the second layered product 2 is manufactured by sequentially performing the reel-out process and the protection layer removing process in this order and then sequentially performing a second coating process and a second solvent elimination process for the fine pattern surface, at least in this order. Meanwhile, in a case where there is no winding process, and there is the protection layer laminating process, the second layered product 2 is manufactured by sequentially performing a second coating process and a second solvent elimination process for the fine pattern surface after the protection layer removing process, at least in this order. Furthermore, in a case where there is no protection layer laminating process, and there is the winding process, the second layered product 2 is manufactured by sequentially performing a second coating process and a second solvent elimination process for the fine pattern surface after the reel-out process, at least in this order. In addition, in a case where there are no protection layer laminating process and no winding process, the second layered product 2 is manufactured by sequentially performing a second coating process and a second solvent elimination process on the fine pattern surface, at least in this order.

A protection layer laminating process for laminating the protection layer 106 on a surface where the first mask layer 103 of the second layered product 2 manufactured through any one of the aforementioned manufacturing methods is exposed may be performed after the second solvent elimination process. In addition, the protection layer 106 described above may be used as a protection layer 106. The protection layer 106 may be windingly recovered after the protection layer 106 is laminated. The winding may be performed without providing the protection layer 106.

Hereinbefore, a method of manufacturing the first and second layered products 1 and 2 has been described. Subsequently, description will be made for a method of manufacturing a layered product 201 and a fine pattern structure 202 using the first layered product 1 and a method of transferring the fine pattern 220 onto the object 200 to be processed by fabricating the object 200 to be processed by using the obtained fine mask pattern 202*a* as a mask.

[Use of Reel-Like First Layered Product 1]

By sequentially performing the following processes (21) to (27), it is possible to obtain a layered product 201 consisting of [the second mask layer 102/the first mask layer 103/the object 200 to be processed] using the reel-like first layered product 1. By fabricating the first mask layer 103 from the second mask layer 102 surface side of the obtained layered product 201, it is possible to form the fine mask pattern 202*a* on the object 200 to be processed. In addition, by using the obtained fine mask pattern 202*a* as an etching mask, it is possible to fabricate the object 200 to be processed. FIGS. 10A to 10G are explanatory diagrams illustrating a process of forming the fine pattern structure 202 using the first layered product 1 and a process of fabricating the object 200 to be processed.

Process (21): a process of forming the first mask layer 103 on the object 200 to be processed (refer to FIG. 10A).

Process (22): a process of removing the protection layer from the first layered product 1 and laminating the surface side of the second mask layer 102 to the first mask layer 103 (refer to FIG. 10B).

Process (23): a process of irradiating light from both or any one of the mold 101 of the first layered product 1 and the object 200 to be processed (refer to FIG. 10C).

Process (24): a process of removing the mold 101 of the first layered product 1 to obtain the layered product 201 (refer to FIG. 10D).

Process (25): a process of etching the second mask layer 102 surface side of the layered product 201 to form a fine mask pattern 202*a* including the first and second mask layers 103 and 102 (refer to FIG. 10E).

Process (26): a process of etching the object 200 to be processed by using the fine mask pattern 202*a* obtained in Process (25) as an etching mask (refer to FIG. 10F).

Process (27): a process of removing the residue (first mask layer 103) (refer to FIG. 10G).

A light source for light irradiation in the Process (23) may be appropriately selected based on compositions of the first and second mask layers 103 and 102. Therefore, although not particularly limited, a UV-LED light source, a metal halide light source, a high-pressure mercury lamp light source, and the like may be used. In addition, an integral light intensity from the start of light irradiation to the end of the irradiation is preferably set to 500 to 5,000 mJ/cm$^2$ in order to improve a transfer accuracy. More preferably, the integral light intensity is set to 800 to 2,500 mJ/cm$^2$. Furthermore, light irradiation may be performed using a plurality of light sources. Moreover, the light irradiation is preferably performed while the pressure generated in the laminating process of the Process (22) is released.

The operation of removing the protection layer in the Process (22) may be omitted when the protection layer 106 is not arranged in the first layered product 1. In a case where Processes (21) to (27) are performed immediately after the first layered product 1 is manufactured, the protection layer 106 may not be provided in the first layered product 1.

Although a reel-like first layered product 1 having no support substrate 100 is used in the aforementioned description, the invention may be similarly applied to a reel-like first layered product 1 having the support substrate 100. As illustrated in FIGS. 35A to 35G, a hard mask layer 109 may be formed on the object 200 to be processed before Process (21).

By performing the processes up to the Process (25), it is possible to obtain a fine pattern structure 202 provided with the fine mask pattern 202*a* on the object 200 to be processed. Depending on materials of the first and second mask layers 103 and 102, the obtained fine pattern structure 202 may be used as an adhesive tape or a sensor (optical detection sensor). In addition, the fine pattern structure 202 may be used as a (super) water-repellent surface by performing a hydrophobic treatment or may be used as a (super) hydrophilic surface by performing a hydrophilic treatment.

By performing the processes up to the Process (27), it is possible to easily form the fine pattern 220 on a surface of the object 200 to be processed which is difficult to fabricate. In a case where the reel-like first layered product 1 is manufactured through a roll-to-roll process, for example, the reel-like first layered product 1 may be laminated while the objects to be processed 200 having the first mask layer 103 are arranged in an array of X rows and Y columns. In addition, Process (27) may be achieved through the etching process of the Process (26).

A heating process may be added between the Processes (21) and (22). The heating process is performed in order to increase a viscosity of the first mask layer 103 by removing a solvent from the first mask layer 103. The heating temperature is preferably set to 60 to 200° C. In addition, a heating process may be added between the Processes (23) and (24). Furthermore, a heating process or a light irradiation process may be added after the Process (24).

The etching in the Process (25) may be either dry or wet etching. However, dry etching is preferable since the first mask layer 103 is to be anisotropically etched.

Figure 36A:
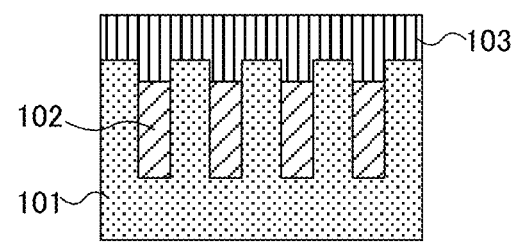
FIGS. 36A and 36B are explanatory diagrams illustrating a process of forming a fine pattern structure using the layered product for fine pattern formation according to a first aspect.
Figure 36B:
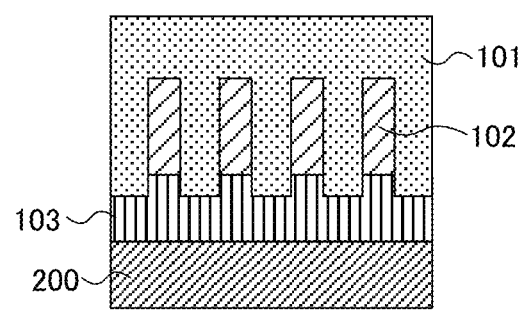

In addition, it is possible to obtain the layered product 201 consisting of [the second mask layer 102/the first mask layer 103/the object 200 to be processed] using the first layered product 1 through the following Processes (31) and (32). It is possible to form the fine mask pattern 202*a* on the object 200 to be processed by fabricating the first mask layer 103 from the second mask layer 102 surface side of the obtained layered product 201. In addition, it is possible to fabricate the object 200 to be processed by using the obtained fine mask pattern 202*a* as a mask. FIGS. 36A and 36B are explanatory diagrams illustrating a process of forming the fine mask pattern 202*a* using the first layered product 1. FIGS. 36A and 36B are explanatory diagrams illustrating a process of fabricating the object 200 to be processed.

Process (31): a process of removing the protection layer from the first layered product 1 and coating the first mask layer 103 on the second mask layer 102 (refer to FIG. 36A).

Process (32): a process of laminating the first mask layer 103 and the object 200 to be processed (refer to FIG. 36B).

The processes subsequent to Process (23) described above may be sequentially performed after Process (32).

An operation of removing the protection layer in the Process (31) may be omitted when the protection layer 106 is not arranged in the first layered product 1. In a case where the first mask layer 103 is coated immediately after the first layered product 1 is manufactured, the protection layer 106 may not be provided.

Although the reel-like first layered product 1 which does not have the support substrate 100 is used in the aforementioned description, this invention may be similarly applied to the reel-like first layered product 1 having the support substrate 100. In addition, in the Process (31), a solvent drying process may be performed after the coating of the first mask layer 103.

In the coating of the first mask layer 103 in the Process (31), the film formation condition of the first mask layer 103 described above (coating of the diluted material of the first mask layer) is preferably applied.

Figure 37A:
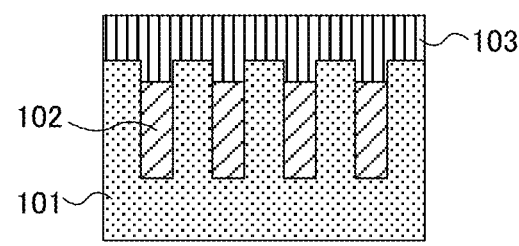
FIGS. 37A and 37B are explanatory diagrams illustrating another exemplary process of forming a fine pattern structure using the layered product for fine pattern formation according to a first aspect.
Figure 37B:
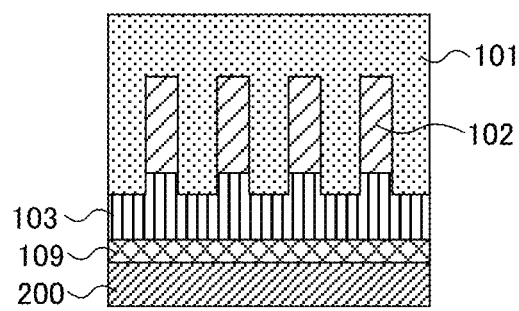

As illustrated in FIGS. 37A and 37B, a hard mask layer 109 may be formed on the object 200 to be processed before the Process (32).

Furthermore, through Processes (41) to (44) described below, it is possible to form the fine mask pattern 202a on the object 200 to be processed using the first layered product 1. In addition, by using the obtained fine mask pattern 202a as a mask, it is possible to fabricate the object 200 to be processed. FIGS. 38A to 38D are explanatory diagrams illustrating a process of forming the layered product 201 using the first layered product 1.

Figure 38A:
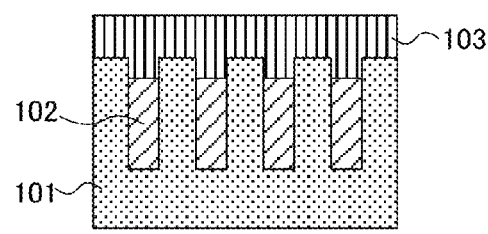
FIGS. 38A to 38D are explanatory diagrams illustrating a process of forming a fine pattern structure using the layered product for fine pattern formation according to a first aspect.

Process (41): a process of coating the first mask layer 103 on the first layered product 1 including the mold 101 and the second mask layer 102 and then drying a solvent (refer to FIG. 38A).

Process (42): a process of laminating the protection layer 106 (refer to FIG. 38B) and winding the layered product 108 including the first mask layer 103, the second mask layer 102, and the mold 101.

Figure 38D:
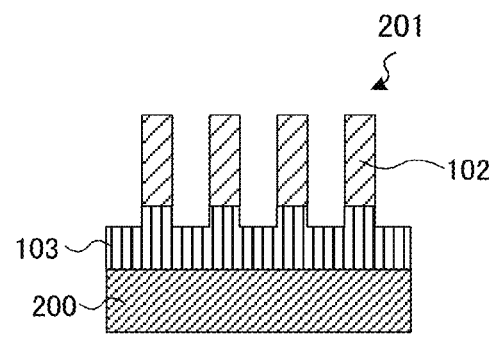
Figure 38B:
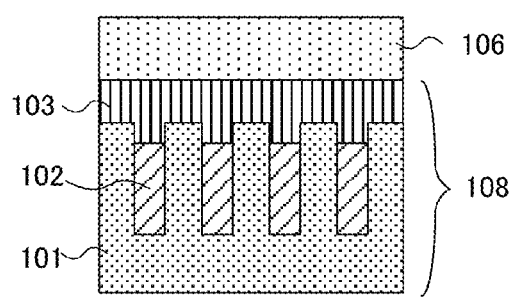
Figure 38C:
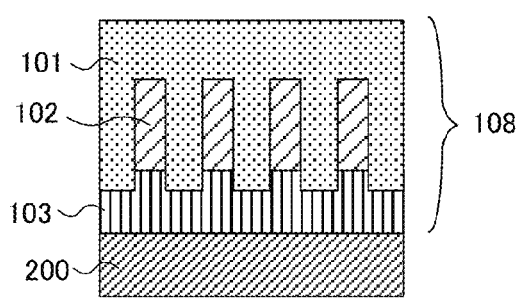
Figure 39A:
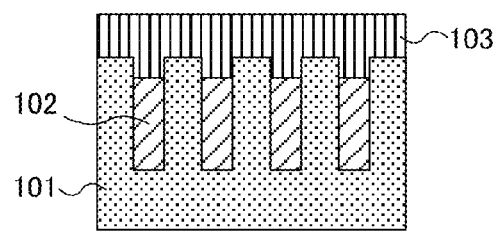
FIGS. 39A to 39D are explanatory diagrams illustrating another exemplary process of forming a fine pattern structure using the layered product for fine pattern formation according to a first aspect.
Figure 39D:
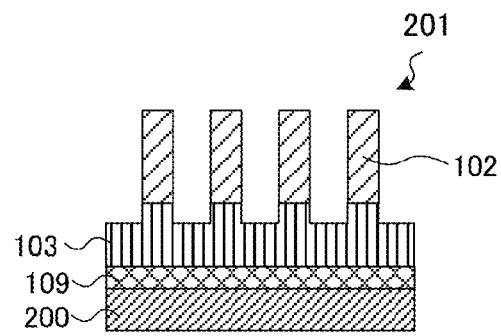
Figure 39B:
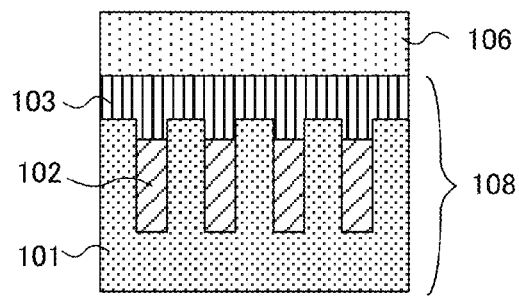
Figure 39C:
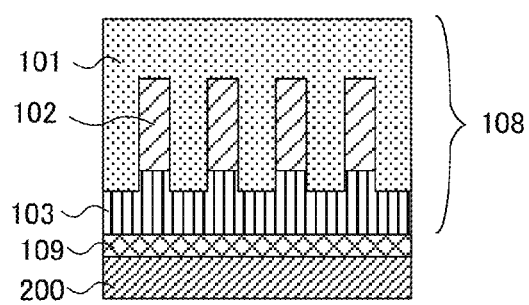

Process (43): a process of removing the protection layer 106 after winding the layered product 108 up and laminating it to the object 200 to be processed while both or any one of the object 200 to be processed and the layered product 108 is heated (refer to FIG. 38C).

Process (44): a process of removing the mold 101 to obtain the layered product 201 (refer to FIG. 38D).

The processes subsequent to Process (25) described above may be sequentially performed after Process (44).

In the aforementioned description, the reel-like first layered product 1 which does not have the support substrate 100 is used. However, the invention may be similarly applied to the reel-like first layered product 1 having the support substrate 100.

The coating of the first mask layer 103 in the Process (41) is preferably performed by applying the condition for forming the second mask layer 102 described above (coating of the diluted material of the second mask layer).

A light irradiation process may be added between the Processes (43) and (44). In a case where a photopolymerizable material is contained in the first and second mask layer 103 and 102, it is possible to robustly bond the first and second mask layers 103 and 102 by performing the light irradiation process. Here, a light source for light irradiation may be appropriately selected based on compositions of the first and second mask layers 103 and 102. Therefore, although not particularly limited, a UV-LED light source, a metal halide light source, a high-pressure mercury lamp light source, and the like may be used. In addition, an integral light intensity from the start of light irradiation to the end of the irradiation is preferably set to 500 to 5,000 mJ/cm$^2$ in order to improve transfer accuracy. More preferably, the integral light intensity is set to 800 to 2,500 mJ/cm$^2$. Furthermore, light irradiation may be performed using a plurality of light sources. Moreover, the light irradiation described above may be performed after the Process (44).

A heating process and a cooling process may be added after the Process (43). If the heating process is added, it is possible to improve stability of the first and second mask layers 103 and 102. If the cooling process is added, releasability of the mold 101 is improved. The heating temperature is preferably set to 30 to 200° C. The cooling is preferably performed such that at least the object 200 to be processed has a temperature of 120° C. or lower in order to improve releasability. Particularly, the cooling temperature is preferably set to 5° C. or higher and 60° C. or lower, and more preferably 18° C. or higher and 30° C. or lower.

As illustrated in FIGS. 39A to 39D, the hard mask layer 109 may be formed on the object 200 to be processed before the Process (43).

[Use of Plate First Layered Product 1]

By performing Processes (21) to (27) described below, it is possible to obtain a layered product 201 consisting of [the second mask layer 102/the first mask layer 103/the object 200 to be processed] using the first layered product 1. It is possible to form the fine mask pattern 202a on the object 200 to be processed by fabricating the first mask layer 103 from the second mask layer 102 surface side of the obtained layered product 201. In addition, it is possible to fabricate the object 200 to be processed by using the obtained fine mask pattern 202a as a mask. FIGS. 10A to 10G are explanatory diagrams illustrating a process of forming the fine mask pattern 202a using the first layered product 1 and a process of fabricating the object 200 to be processed.

Process (21): a process of forming the first mask layer 103 on the object 200 to be processed (refer to FIG. 10A).

Process (22): a process of laminating the second mask layer 102 surface side of the first layered product 1 to the first mask layer 103 (refer to FIG. 10B).

Process (23): a process of performing light irradiation from both or any one of the object 200 to be processed and the mold 101 of the first layered product 1 (refer to FIG. 10C).

Process (24): a process of removing the mold 101 of the first layered product 1 to obtain the layered product 201 (refer to FIG. 10D).

Process (25): etching the second mask layer 102 surface side of the layered product 201 to form the fine mask pattern 202a including the second mask layer 102 and the first mask layer 103 (refer to FIG. 10E).

Process (26): a process of etching the object 200 to be processed by using the fine mask pattern 202a of the fine pattern structure 202 obtained in Process (25) as an etching mask (refer to FIG. 10F).

Process (27): a process of removing the remnants (first mask layer 103) (refer to FIG. 10G).

As a light source used in light irradiation in the Process (23), the light sources and the integral light intensity described in Paragraph [Use of Reel-like First Layered Product 1] may be used. The light irradiation is preferably performed while a pressure generated in the laminating process of the Process (22) is removed.

Although the plate first layered product 1 which does not have the support substrate 100 is used in the aforementioned description, this invention may be similarly applied to the plate first layered product 1 having the support substrate 100.

The Processes (21) to (24) are preferably performed using a step-and-repeat type single sheet transfer method.

The Process (22) is preferably performed under a vacuum (low-pressure) atmosphere or a compressive air atmosphere using pentafluoropropane or carbon dioxide.

As illustrated in FIGS. 35A to 35G, the hard mask layer 109 may be formed on the object 200 to be processed before the Process (21).

By performing the processes up to the Process (25), the fine pattern structure 202 can be used as described in Paragraph [Use of Reel-like First Layered Product 1].

By performing the processes up to the Process (27), it is possible to easily form the fine pattern on a surface of the object 200 to be processed which is difficult to fabricate. In addition, by using a single sheet type step-and-repeat method and the like, it is possible to efficiently form the fine pattern 220 on the object 200 to be processed.

A heating process may be added between the Processes (21) and (22). The heating process is performed to remove a solvent in the first mask layer 103 and increase a viscosity of the first mask layer 103. The heating temperature is preferably set to 60 to 200° C.

In addition, a heating process may be added between the Processes (23) and (24). Furthermore, a heating process or a light irradiation process may be added after Process (24).

The etching in Process (25) may be either dry etching or wet etching. Meanwhile, dry etching is preferable since the first mask layer 103 is to be anisotropically etched.

The layered product 201 can also be formed using the first layered product 1 through Processes (31) and (32) described below. In addition, it is possible to fabricate the object 200 to be processed by fabricating the fine pattern structure 202 from the obtained layered product 201 and using the fine mask pattern 202a as a mask. FIGS. 36A and 36B is an explanatory diagram illustrating a process of forming the fine pattern structure 202 using the first layered product 1 and a process of fabricating the object 200 to be processed.

Process (31): a process of coating the first mask layer 103 on the second mask layer 102 of the first layered product 1 (refer to FIG. 36A).

Process (32): a process of laminating the first mask layer 103 and the object 200 to be processed (refer to FIG. 36B).

The processes subsequent to the Process (23) described above may be sequentially performed after Process (32). Process (32) is preferably performed under a vacuum (low-pressure) atmosphere or a compressive air atmosphere using pentafluoropropane or carbon dioxide in order to exclude incorporation of bubbles.

Although the plate first layered product 1 which does not have the support substrate 100 is used in the aforementioned description, this invention may be similarly applied to the plate first layered product 1 having the support substrate 100.

The coating of the first mask layer 103 in the Process (31) is preferably performed by applying the film formation condition (coating of the diluted material of the first mask layer) of the first mask layer 103 described above.

In addition, in the Process (31), a solvent drying process may be performed after the coating of the first mask layer 103.

As illustrated in FIGS. 37A and 37B, the hard mask layer 109 may be formed on the object 200 to be processed before the Process (32).

In addition, it is possible to obtain the layered product 201 on the object 200 to be processed using the first layered product 1 through Processes (41) to (44) described below. It is possible to form the fine mask pattern 202a by fabricating the first mask layer 103 from the second mask layer 102 surface side of the obtained layered product 201. Furthermore, it is possible to fabricate the object 200 to be processed by using the obtained fine mask pattern 202a as a mask. FIGS. 38A to 38D are explanatory diagrams illustrating a process of forming a fine pattern structure 202 using the first layered product 1 and a process of fabricating the object 200 to be processed.

Process (41): a process of coating the first mask layer 103 on the first layered product 1 including the mold 101 and the second mask layer 102 and then drying the solvent (refer to FIG. 38A).

Process (42): a process of laminating the protection layer 106 and storing the layered product 108 including the first mask layer 103, the second mask layer 102, and the mold 101 (refer to FIG. 38B).

Process (43): a process of removing the protection layer 106 and laminating the layered product 108 to the object 200 to be processed while both or any one of the object 200 to be processed and the layered product 108 is heated (refer to FIG. 38C).

Process (44): a process of removing the mold 101 to obtain the layered product 201 (refer to FIG. 38D).

The processes subsequent to Process (25) may be subsequently performed after Process (44).

Although the plate first layered product 1 which does not have the support substrate 100 is used in the aforementioned description, this invention may be similarly applied to the plate first layered product 1 having the support substrate 100.

The coating of the first mask layer 103 in the Process (41) is preferably performed using the film formation condition (coating of the diluted material of the first mask layer) of the first mask layer 103 described above.

A light irradiation process may be added between the Processes (43) and (44). The condition of the light irradiation process is similar to that described in Paragraph [Use of Reel-like First Layered Product 1], and advantages thereof are also similarly applied.

UV-rays may be irradiated before and/or after removing the mold 101 in Process (44).

As illustrated in FIGS. 39A to 39D, the hard mask layer 109 may be formed on the object 200 to be processed before Process (43).

[Use of Reel-Like Second Layered Product 2]

Subsequently, a method of using the second layered product 2 will be described.

By sequentially performing Processes (2-1) to (2-5) described below, it is possible to obtain the layered product 201 consisting of [the second mask layer 102/the first mask layer 103/the object 200 to be processed] using the second layered product 2. It is possible to transfer the fine pattern structure 202 provided with the fine mask pattern 202a on the object 200 to be processed by fabricating the first mask layer 103 from the second mask layer 102 surface side of the obtained layered product 201. It is possible to fabricate the object 200 to be processed by using the fine mask pattern 202a of the fine pattern structure 202 as a mask. FIGS. 11A to 11F are explanatory diagrams illustrating a process of fabricating the object 200 to be processed using the second layered product 2.

Process (2-1): a process of putting the first mask layer 103 on the object 200 to be processed through a thermocompressive bonding (refer to FIG. 11A).

Process (2-2): a process of irradiating energy rays from at least one of the mold 101 surface side or the object 20 to be processed surface side (refer to FIG. 11B).

Process (2-3): a process of removing the mold 101 to obtain the layered product 201 (refer to FIG. 11C).

Process (2-4): a process of performing etching from the second mask layer 102 surface side of the layered product 201 to form the fine pattern structure 202 having the fine mask pattern 202a including the second mask layer 102 and the first mask layer 103 (refer to FIG. 11D).

Process (2-5): a process of etching the object 200 to be processed by using the fine mask pattern 202a obtained in Process (2-4) as an etching mask (refer to FIG. 11E).

The hard mask layer 109 may be formed on the object 200 to be processed before the Process (2-1), and then, The Processes (2-1) to (2-4) may be sequentially performed. In this case, after the Process (2-4), the hard mask layer 109 may be etched by using the fine mask pattern 202a including the second mask layer 102 and the first mask layer 103 as an etching mask. It is possible to fabricate the object 200 to be processed by using the fine mask pattern 202a including the second mask layer 102 and the first mask layer 103 and the etched hard mask layer 109 (hard mask pattern) as an etching mask. Alternatively, it is possible to fabricate the object 200 to be processed by removing the fine pattern including the second mask layer 102 and the first mask layer 103 remaining after the etching of the hard mask layer 109 and using only the etched hard mask layer 109 as an etching mask. Dry etching and/or wet etching may be used in the method of etching the object 200 to be processed.

A thermocompressive bonding temperature in the Process (2-1) is preferably set to 40° C. or higher and 200° C. or lower. In addition, the thermocompressive bonding may be performed by heating only the object 200 to be processed or heating the entire system including the object 200 to be processed and the second layered product 2. Particularly, from the viewpoint of a transfer accuracy, the thermocompressive bonding is preferably performed by heating the object 200 to be processed.

Furthermore, in the Process (2-1), it is preferable that the first mask layer 103 and the object 200 to be processed be pressedly laminated using a laminate roll provided over the second layered product 2 such that the first mask layer 103 and the object 200 to be processed are overlappingly laminated while the protection layer 106 of the second layered product 2 is removed, or the first mask layer 103 of the second layered product 2 and the object 200 to be processed are overlappingly laminated after the protection layer 106 is removed.

It is preferable that a temperature of the laminate roll be set to 50 to 150° C., and the laminate speed be set to 0.1 to 6 m/minute. It is preferable that a pressure per unit length of the laminate roll be set to 0.01 to 1 MPa/cm, more preferably 0.1 to 1 MPa/cm, and further preferably 0.2 to 0.5 MPa/cm.

A laminator includes a single-stage laminator having a set of laminate rolls over the second layered product 2, a multi-stage laminator having two or more laminate rolls, a vacuum laminator that hermetically seals a portion to be laminated with a container and then performs decompression or vacuuming using a vacuum pump, and the like. It is preferable that the vacuum laminator be used in order to suppress mixing of the air during the laminating.

An energy source of the Process (2-2) may be appropriately selected depending on materials of the first and second mask layers 103 and 102. For example, in a case where an interface between the first and second mask layers 103 and 102 forms a chemical bond through thermopolymerization, the Process (2-2) may be performed by applying thermal energy. Thermal energy may be applied by heating the entire second layered product 2 laminated to object 200 to be processed or irradiating infrared rays from both or any one of the second layered product 2 surface side or the object 200 to be processed surface side.

Alternatively, the Processes (2-1) and (2-2) may be performed simultaneously by controlling the temperature and the laminating (pressed laminating) speed of the Process (2-1). In addition, in a case where an interface between the first and second mask layers 103 and 102 forms a chemical bond through photopolymerization, the Process (2-2) may be performed by applying light energy. Light energy may be appropriately selected from light sources capable of emitting a wavelength appropriate to the photopolymerization initiator contained in the first and second mask layers 103 and 102. Light energy such as ultraviolet light may be irradiated from both or any one of the second layered product 2 surface side and the object 200 to be processed surface side. In a case where any one of the second layered product 2 or the object 200 to be processed is not transparent to light energy, light is preferably irradiated from a light energy transmitting material side. Here, the light source for irradiating light may be appropriately selected depending on compositions of the first and second mask layers 103 and 102. Therefore, although not particularly limited, a UV-LED light source, a metal halide light source, a high-pressure mercury lamp light source, and the like may be used. In addition, an integral light intensity from the start of light irradiation to the end of the irradiation is preferably set to 500 to 5,000 mJ/cm$^2$ in order to improve a transfer accuracy. More preferably, the integral light intensity is set to 800 to 2,500 mJ/cm$^2$. Furthermore, a plurality of light sources may be used to irradiate light.

A heating process and a cooling process may be added between the Processes (2-2) and (2-3). If the heating process is added, it is possible to improve stability of the first and second mask layers 103 and 102. If the cooling process is added, releasability of the mold is improved. The heating temperature is preferably set to 30 to 200° C. The cooling is preferably performed such that at least the object 200 to be processed has a temperature of 120° C. or lower in order to improve releasability. Particularly, the cooling temperature is preferably set to 5° C. or higher and 60° C. or lower, and more preferably 18° C. or higher and 30° C. or lower.

Any technique may be used in the Process (2-3) without a particular limitation. However, it is preferable that the fine pattern be removed by fixing the object 200 to be processed from the viewpoint of a transfer accuracy and reproducibility. If the fine pattern is removed while the object 200 to be processed is fixed, it is possible to alleviate a stress concentration to the second mask layer 102 having the transferred fine pattern.

Both or any one of a light energy irradiation process and a heating process may be added between the Processes (2-3) and (2-4). Depending on a composition of the second mask layer 102, reaction may further progress in some cases even after the fine pattern is removed. In this case, it is possible to promote reaction of the second mask layer 102 and stabilize a shape of the fine pattern after Process (2-4) by irradiating light energy such as ultraviolet light from both or any one of the second mask layer 102 surface side and the object 200 to be processed surface side or by heating or irradiating infrared light.

Here, a light source for irradiating light may be appropriately selected depending on compositions of the first and second mask layers 103 and 102. Therefore, although not particularly limited, a UV-LED light source, a metal halide light source, a high-pressure mercury lamp light source, and the like may be used. In addition, an integral light intensity from the start of light irradiation to the end of the irradiation is preferably set to 500 to 5,000 mJ/cm$^2$ in order to improve a transfer accuracy. More preferably, the integral light intensity is set to 800 to 2,500 mJ/cm$^2$. Furthermore, a plurality of light sources may be used to irradiate light.

The etching of the Process (2-4) may be either dry or wet etching. However, dry etching is preferable since the first mask layer 103 is preferably to be anisotropically etched.

In the Process (2-5), depending on a shape of the fine pattern 220 to be formed on the object 200 to be processed, whether or not the etching is performed until the first mask layer 103 is removed, or whether or not the etching is terminated while the first mask layer 103 remains can be selected. Particularly, in a case where a leading edge of the fine pattern 220 formed on the object 200 to be processed is to be designed to have an acute angle, it is preferable that the etching be performed until the first mask layer 103 is removed. In a case where a cross-sectional shape of the fine pattern 220 formed on the object 200 to be processed is to be designed in a trapezoidal shape, it is preferable that the etching be terminated while the first mask layer 103 remains.

In the latter case, a removal process is preferably added after the Process (2-5). A condition or a method of the removal process may be appropriately selected depending on a composition of the first mask layer 103. If the first mask layer 103 is designed to have an alkali-developing composition, it is possible to easily perform the peel-off using an alkaline solution. Similarly, in the former case, a rinse process is preferably added after the Process (2-5). Through the etching of the Process (2-5), a gas component used in the etching may be doped on an area of the surface layer of the object 200 to be processed within a thickness of several nanometer to several tens nanometers. In order to remove such a layer, a rinse process is preferably performed using an alkaline or acidic solution.

<Second Aspect>

Next, a second aspect of the present invention will be described in detail. In the second aspect, a configuration of the layered product for fine pattern formation manufactured using the aforementioned second line will be described in detail. The layered product for fine pattern formation according to the second aspect includes an object to be processed, a first mask layer provided on the object to be processed, and a second mask layer provided on the first mask layer.

Embodiment 3

Figure 40:
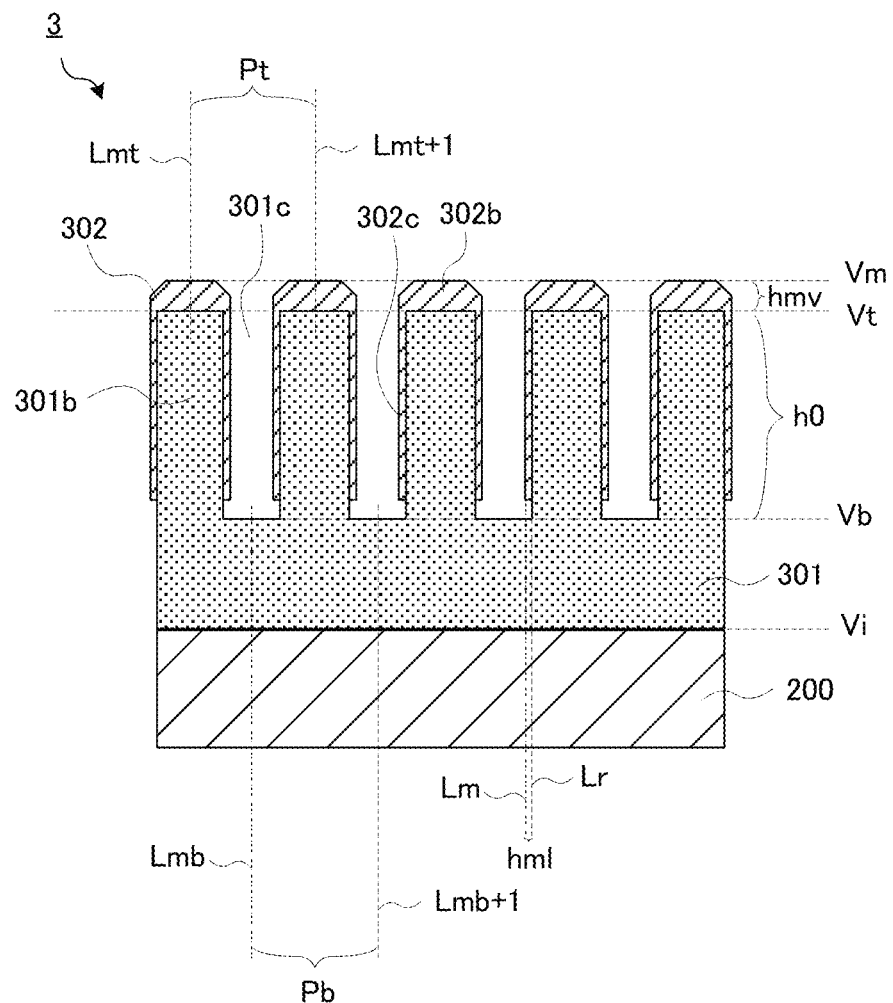
FIG. 40 is a schematic cross-sectional view illustrating an exemplary layered product for fine pattern formation according to a second aspect.

FIG. 40 is a schematic cross-sectional view illustrating a layered product for fine pattern formation (hereinafter, referred to as a "third layered product 3") according to Embodiment 3 of the second aspect of the present invention. As illustrated in FIG. 40, the third layered product 3 includes an object 200 to be processed, a first mask layer 301 that is provided on a principal surface of the object 200 to be processed and has a concavo-convex structure on a surface, and a second mask layer 302 provided on a convex portion 301b of the concavo-convex structure 301a of the first mask layer 301. The second mask layer 302 has a functionality of protecting at least the first mask layer 301 when the first mask layer 301 or the object 200 to be processed is fabricated.

Similar to the first mask layers 103 of the first and second layered products 1 and 2 according to the first aspect described above, the first mask layer 301 serves as a mask layer of the object 200 to be processed. As the first and second mask layers 301 and 302, those of the first and second layered products 1 and 2 according to the first aspect described above may be used. In addition, as the object 200 to be processed, those of the first and second layered products 1 and 2 according to the first aspect described above (for example, inorganic substrate) and the like may be used. In addition, the ratio of the etching rates between the first and second mask layers 301 and 302 and the object 200 to be processed satisfies the range described above in conjunction with the first and second layered products 1 and 2 according to the first aspect.

The first mask layer 301 may have a multilayer structure having n or more layers (where n≥2). For example, a first mask layer 301-1 may be provided on a principal surface of the object 200 to be processed, and another first mask layer 301-2 may be provided on the first mask layer 301-1. In this case, a fine pattern 301a is formed on a surface of the first mask layer 301-2 farthest from the object 200 to be processed. Similarly, the (N+1)th first mask layer (outermost layer) 301-(N+1) may be provided on the (N)th first mask layer 301-N. In this case, the fine pattern 301a is formed on a surface of the (N+1)th first mask layer 301 which is the outermost layer farthest from the object 200 to be processed. If such an n-layered structure of the first mask layer 301 is used, controllability such as an inclination angle of the first mask layer 301 is improved when etching (dry etching) is performed from the surface side of the second mask layer 302 to the third layered product 3. Therefore, workability is improved in the subsequent fabrication of the object 200 to be processed.

In a case where the first mask layer 301 has a multilayer structure, in order to further exert the advantages described above, the number of layers n is preferably set to 1 or greater and 10 or smaller, more preferably 1 or greater and 5 or smaller, and most preferably 1 or greater and 4 or smaller, including a case where the first mask layer 301 has a single-layer structure (n=1). In addition, in a case where the first mask layer 301 has a multilayer structure, if a volume of the (n)th layer is set to Vn, a total volume V of the first mask layer 301 becomes V1+V2+ . . . +Vn. Here, the first mask layer 301 satisfying the etching selectivity (ratio of dry etching rates) of the first mask layer 301 described in conjunction with the first and second layered products 1 and 2 according to the first aspect preferably has a volume of 50% or larger with respect to the total volume V of the first mask layer 301. For example, in a case where the first mask layer 301 has a three-layer structure, a volume of the first layer of the first mask layer 301 is set to V1, a volume of the second layer of the first mask layer 301 is set to V2, and a volume of the third layer of the first mask layer 301 is set to V3. In a case where the second and third layers of the first mask layer 301 satisfy the etching selectivity described above, a volume ratio (V2+V3)/(V1+V2+V3) is preferably set to 0.5 or greater. Similarly, in a case where only the third layer satisfies the etching selectivity described above, a volume ratio (V3)/(V1+V2+V3) is preferably set to 0.5 or greater. Particularly, from the viewpoint of fabrication accuracys of the multilayered first mask layer 301 and the object 200 to be processed, a volume ratio is more preferably set to 0.65 (65%) or higher, and most preferably 0.7 (70%) or higher. If all of the n layers satisfy the etching selectivity range, a fabrication accuracy of the object 200 to be processed is significantly improved. Therefore, a volume ratio is preferably set to 1 (100%).

In the first mask layer 301, a single (for example, a line shape) or a plurality of (for example, a dot shape) convex portions 301b extending a certain direction is/are arranged along a direction perpendicular to the certain direction with a predetermined interval. That is, a plurality of convex portions 301b are formed across the entire surface of the object 200 to be processed as seen in a plan view. In addition, the convex portions 301b are protruded in a direction perpendicular to a principal surface of the object 200 to be processed as seen in a cross-sectional view taken along a thickness direction of the third layered product 3 (as seen in a cross section perpendicular to the perpendicular direction) as illustrated in FIG. 40. The concave portions 301c are formed between the convex portions 301b. The convex portions 301b and the concave portions 301c constitute a fine pattern (uneven structure) 301a.

In FIG. 40, if the second mask layer 302 is provided on the first mask layer 301, a convex-portion-overlying mask layer 302b is formed on the top of the convex portion 301a, and a side mask layer 302c is formed in at least a part of the side face of the convex portion 301b. The side mask layer 302c may cover only a part of the side face of the convex portion 301b consecutively from the convex-portion-overlying mask layer 302b or may cover the entire side face of the convex portion 301b. Here, the height h0 of the concavo-convex structure means a height of the convex portion 301b or a depth of the concave portion 301c. In addition, the height h0 of the concavo-convex structure is a shortest distance between a position of the bottom of the concave portion 301c (position Vb described below) and a position of the top of the convex portion 301b (position Vt described below).

In FIG. 40, the top position of the convex portion Vt refers to a top position of the convex portion 301b of the concavo-convex structure. Here, in a case where the convex portion 301b of the concavo-convex structure has a curvature or concavo-convexe is provided on the convex portion 301b, the highest position is set to the top position. In a case where a height of the concavo-convex structure has variability, the top position of the convex portion Vt refers to an in-plane average position of the top positions of each convex portion 301b. An average number for obtaining the top position Vt of the convex portion is preferably set to 10 or higher. In addition, the top position Vt of the convex portion may be obtained by observing a cross-sectional image using a scanning electron microscope or a transmission electron microscope. In addition, a transmission electron microscope and an energy dispersive X-ray spectroscopy method may be used together.

In FIG. 40, the bottom position Vb of the concave portion refers to the bottom position of the concave portion 301c of the concavo-convex structure. Here, in a case where the concave portion 301c has a curvature or concavo-convex is provided on the concave portion 301c, the lowest position is set to the bottom portion. In a case where a height of the concavo-convex structure has variability, the bottom position Vb of the concave portion refers to an in-plane average position of the bottom positions of each concave portion 301c. An average number for obtaining the bottom position Vb of the concave portion is preferably set to 10 or higher. In addition, the bottom position Vb of the concave portion may be measured by observing a cross-sectional image using a scanning electron microscope or a transmission electron microscope.

The top face position Vm in FIG. 40 refers to a top face position of the second mask layer 302b formed on the top of the convex portion 301b of the concavo-convex structure. In a case where a top face position of the convex-portion-overlying mask layer 302b formed on the top of the convex portion 301b has variability, the top face position Vm refers to an in-plane average position of the top face position of the convex-portion-overlying mask layer 302b of the convex portion 301b. An average number used to obtain the top face position Vm is preferably set to 10 or higher. In addition, in a case where a top face of the convex-portion-overlying mask layer 302b formed on the top of the convex portion 301b is curved, and this curved face forms an upward convex surface, the thickest portion of the mask layer is set to the top face position Vm. The top face position Vm may be obtained by observing a cross-sectional image using a scanning electron microscope or a transmission electron microscope. In addition, a transmission electron microscope and an energy dispersive X-ray spectroscopy method may be used together.

The interfacial position Vi in FIG. 40 refers to a position of the interface with the first mask layer 301 in the object 200 to be processed.

In FIG. 40, the interfacial contour position Lr refers to a contour position of the side face of the concavo-convex structure (interface between the outer face of the convex portion 301b and the inner face of the concave portion 301c). Here, the concavo-convex structure may be provided to extend in a direction perpendicular to a principal surface of the first mask layer 301, or may be inclined from a direction perpendicular to the principal surface of the first mask layer 301. Therefore, the contour position Lr may be positioned in a direction perpendicular to the principal surface of the first mask layer 301 or may be inclined from a direction perpendicular to the principal surface of the first mask layer 301.

In FIG. 40, the surface contour position Lm refers to a position of the exposed surface contour of the side face-overlying mask layer 302c arranged in the side face of the concavo-convex structure. Similar to the interfacial contour position Lr, the surface contour position Lm may be positioned in a direction perpendicular to the principal surface of the first mask layer 301 or may be inclined in a direction perpendicular to the principal surface of the first mask layer 301 depending on the shape of the concavo-convex structure.

In FIG. 40, the top center position Lmt refers to a position of the top center of the convex portion 301b of the concavo-convex structure. In FIG. 40, a top center position Lmt+1 refers to a position of a top center of a convex portion 301b neighboring to the convex portion 301b used to determine the top center position Lmt.

In FIG. 40, a bottom center position Lmb is a position of the bottom center of the concave portion 301c of the concavo-convex structure. In FIG. 40, a bottom center position Lmb+1 refers to a position of a bottom center of a concave portion 301c neighboring to the concave portion 301c used to determine the bottom center position Lmb.

In FIG. 40, the distance hmv refers to a thickness of the convex-portion-overlying mask layer 302b arranged on the convex portion 301b of the first mask layer 301. This distance hmv means a distance between the top face position Vm and the top position Vt of the convex portion. In a case where there is variability in the top position Vt of the convex portion or the top face position Vm in a thickness direction, an average distance between the top face position Vm of an arbitrary convex portion 301b and the top position Vt of the convex portion is used. An average number for obtaining the distance hmv is preferably set to 10 or higher A ratio hmv/h0 between the distance hmv and the height h0 of the concavo-convex structure is preferably set to 0<hmv/h0≤100, more preferably 0<hmv/h0≤50, and further preferably 0<hmv/h0≤20 (Formula (16)) in order to easily form the fine pattern structure 202 having a distance as a height between the interfacial position Vi and the top face position Vm when the object 200 to be processed is fabricated. In a case where the ratio hmv/h0 satisfies this range, a mask material can be stably supplied to a side face mask layer 302c that protects the outer circumferential face of the convex portion 301b (or inner circumferential face of the concave portion 301c) from the convex-portion-overlying mask layer 302b arranged on the convex portion 301b of the concavo-convex structure while dry etching is performed for the first mask layer 301. Therefore, it is possible to increase an anisotropic aspect ratio (vertical dry etching rate/horizontal dry etching rate). Particularly, the ratio hmv/h0 is preferably set to 0<hmv/h0≤10, and most preferably 0<hmv/h0≤3. From the same viewpoint, the distance hmv is preferably set to 0 nm<hmv<1,000 nm (Formula (18)), more preferably 5 nm≤hmv≤800 nm, and further preferably 10 nm≤hmv≤400 nm.

In FIG. 40, the distance hml refers to a thickness of the side face mask layer 302c arranged in the side face of the convex portion 301b of the first mask layer 301 and means a distance between the interfacial contour position Lr and the surface contour position Lm. A distance between the interfacial contour position Lr and the surface contour position Lm can be determined as follows. First, an arbitrary point P(Lr) on the interfacial contour position Lr is selected, and a line segment parallel to the principal surface of the first mask layer 301 passing through this point P(Lr) is drawn. Then, a cross point between this line segment and the surface contour position Lm is set to a point P(Lm). Subsequently, a point Pmin(Lm) is determined such that a line segment Lrm that links the points P(Lr) and P(Lm) is minimized. A distance between the selected points P(Lr) and Pmin(Lm) is set to the distance between the interfacial contour position Lr and the surface contour position Lm.

The distance hml may form a distribution in a height direction of the concavo-convex structure. Particularly, an inclination may be provided such that the distance hml is reduced from the top position Vt of the convex portion of the concavo-convex structure to the bottom position Vb side of the concave portion. A ratio hml/hmv between the distance hml and the thickness hmv of the convex-portion-overlying mask layer 302b arranged on the convex portion 301b of the concavo-convex structure is preferably set to 0≤hml/hmv<1 (Formula (17)) in order to form the fine mask pattern 202a for performing dry etching of the object 200 to be processed by reflecting shapes of the concave portion 301c and convex portion 301b of the concavo-convex structure by performing dry etching for the first mask layer 301. Similarly, the thickness hml is preferably set to 0 nm≤hml≤50 nm (Formula (19)), more preferably 0 nm≤hml≤30 nm, and further preferably 0 nm≤hml≤10 nm.

A sum of the height of the first mask layer 301 and the distance hmv as a thickness of the convex-portion-overlying mask layer 302b arranged on the convex portion 301b of the concavo-convex structure, that is, a distance between the top face position Vm and the interfacial position Vi is preferably set to 100 nm or greater and 1,500 nm or smaller, more preferably 200 nm or greater and 1,000 nm or smaller, and further preferably 400 nm or greater and 800 nm or smaller in order to easily form the fine mask pattern 202a for fabricating the object 200 to be processed through dry etching with a high precision.

The pitch P of the concavo-convex structure is represented by a distance Pt between the position Lmt and the position Lmt+1 or a distance Pb between the position Lmb and the position Lmb+1. In a case where a plurality of values can be used for the distance Pt, the minimum value is set to the distance Pt. In a case where a plurality of values can be used for the distance Pb, the minimum value is set to the distance Pb. The pitch P is preferably set to 50 nm or longer and 1,000 nm or shorter, more preferably 100 nm or longer and 800 nm or shorter, and further preferably 100 nm or longer and 700 nm or shorter in order to easily form the fine mask pattern 202a for fabricating the object 200 to be processed through dry etching with a high precision.

As a shape or an arrangement of the concavo-convex structure of the third layered product 3, the shape or the arrangement of the concavo-convex structure 101a of the mold 101 in the first and second layered products 1 and 2 described above may be used. Among them, it is preferable that a dot configuration be selected as the shape or the arrangement of the concavo-convex structure of the third layered product 3.

Figure 41:
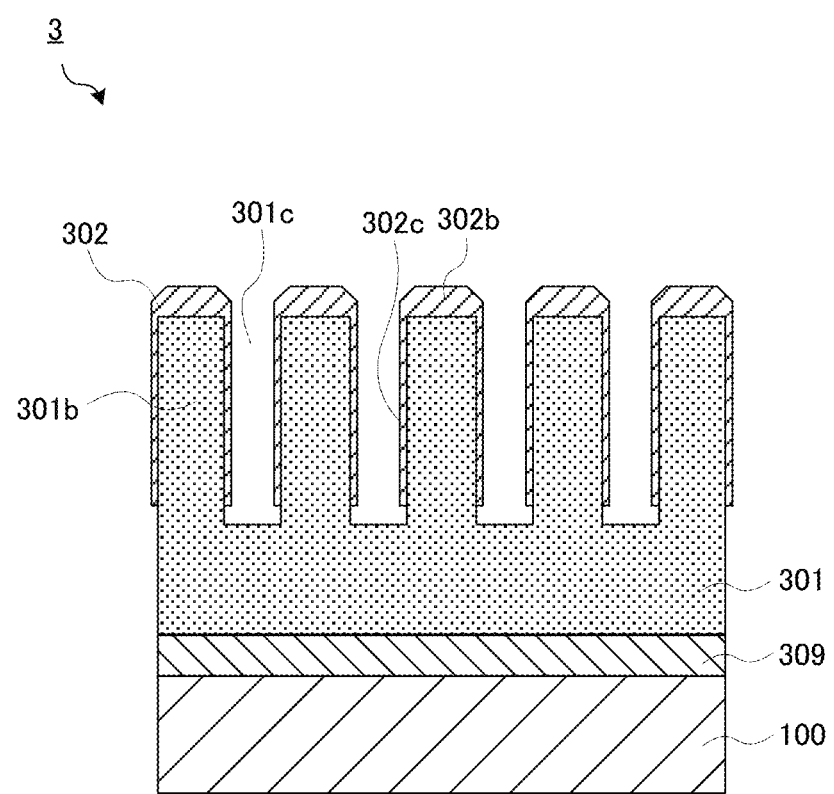
FIG. 41 is a schematic cross-sectional view illustrating a layered product for fine pattern formation according to a second aspect having a hard mask layer.

A hard mask layer 309 may be provided between the object 200 to be processed and the first mask layer 301. FIG. 41 is a schematic cross-sectional view illustrating the third layered product 3 having the hard mask layer 309. If the hard mask layer 309 is provided, it is possible to easily fine-pattern the hard mask layer 309 by using the fine mask pattern 202a including the first and second mask layers 301 and 302 as a mask. It is possible to easily etch the object 200 to be processed by using the obtained fine-patterned hard mask pattern as a mask. As a material, a thickness, and the like of the hard mask layer 309, those of the hard mask described above in conjunction with the first and second layered products 1 and 2 according to the first aspect may be used.

Next, a method of manufacturing the third layered product 3 will be described.

The third layered product 3 is an intermediate product in the method of nanofabricating the object 200 to be processed using the first and second layered products 1 and 2 described above. That is, the third layered product 3 includes the layered product 201 consisting of [the second mask layer 102/the first mask layer 103/the object 200 to be processed] obtained using the first and second layered products 1 and 2 described above, and the fine pattern structure 202 obtained by etching the second mask layer 102 surface side of the layered product 201. In this case, before dry etching for the first mask layer 103, that is, the distance hml in the layered product 201 is set to 0 nm. The ratio hmv/h0 can be controlled based on the distance lcc between the first and second layered products 1 and 2. A sum (distance between the position Vm and the position Vi) between the first mask layer 301 and the distance hmv of the convex-portion-overlying mask layer 302a arranged on the convex portion 301b of the concavo-convex structure can be controlled based on the thicknesses of the first mask layers 301 of the first and second layered products 1 and 2 and the distance lcc.

It is possible to form a layer having a distance hml satisfying the aforementioned range by performing dry etching from the surface of the second mask layer 302 side for the layered product consisting of [the second mask layer 302 having a distance hml=0 nm/the first mask layer 301/the object 200 to be processed], which has been manufactured using the first and second layered products 1 and 2.

As an etching condition, the etching condition of the first mask layer 301 described above may be used. In addition, the film thickness of the distance hml can be controlled based on conditions such as a gas flow rate, power, and a pressure during dry etching, and a thickness hmv of the second mask layer. Particularly, if a low-vapor-pressure component (for example, a sol-gel material having a metal species such as Ti, Zr, Ta, Zn, and Si, or the metalloxane bond described above) is contained in the second mask layer 302, it is possible to form a layer having an appropriate distance hml, which is desirable.

Embodiment 4

Figure 42A:
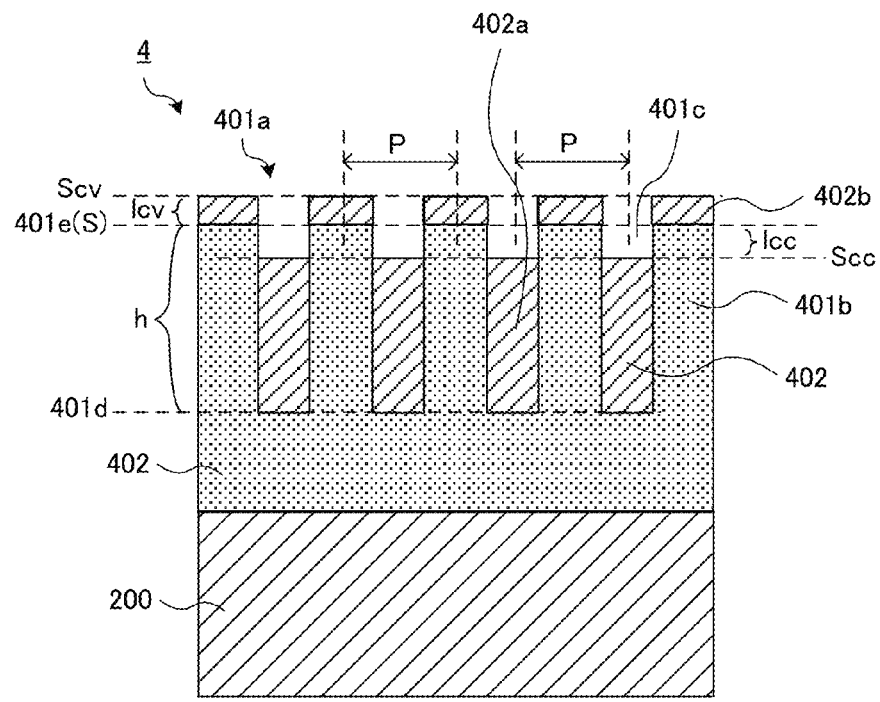
FIGS. 42A and 42B are schematic cross-sectional views illustrating a layered product for fine pattern formation according to a second aspect.
Figure 42B:
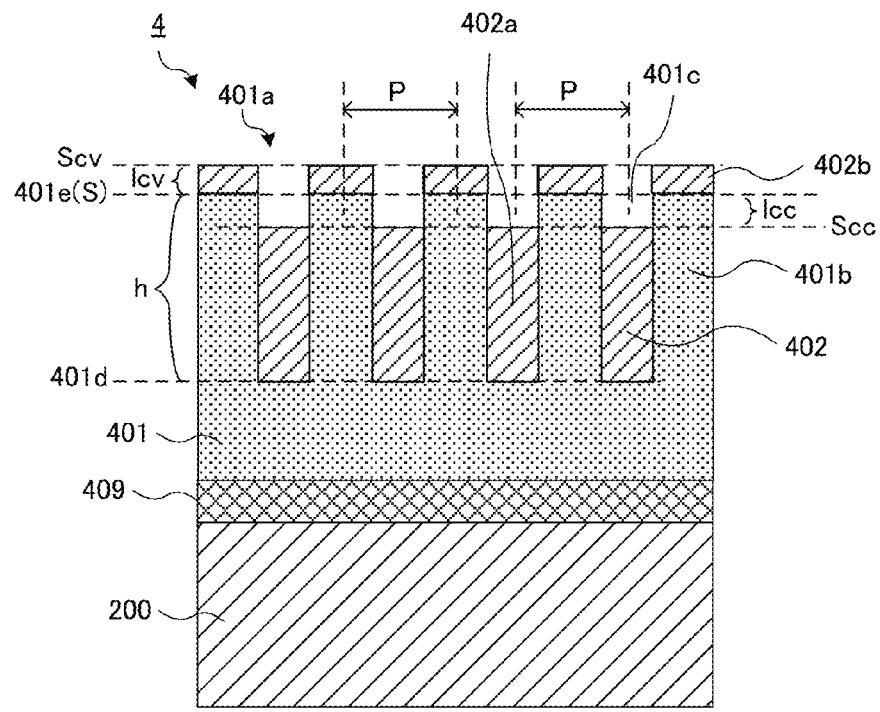

Next, FIGS. 42A and 42B are schematic cross-sectional views illustrating a layered product for fine pattern formation (hereinafter, referred to as a "fourth layered product 4") according to Embodiment 4 of the second aspect of the present invention. As illustrated in FIGS. 42A and 42B, the fourth layered product 4 includes an object 200 to be processed (for example, inorganic substrate), a first mask layer 401 that is provided on a principal surface of the object 200 to be processed and has a concavo-convex structure on a surface, and a second mask layer 402 provided on the concavo-convex structure 401a of the first mask layer 401. The second mask layer 402 has at least a functionality of masking the first mask layer 401 when the first mask layer 401 or the object 200 to be processed is fabricated.

As materials of the first and second mask layers 401 and 402, those described above in conjunction with the first and second layered products 1 and 2 according to the first aspect may be used. The object 200 to be processed may be made of various inorganic materials without a particular limitation. In addition, the ratio of the etching rates between the first and second mask layers 401 and 402 and the object 200 to be processed satisfies the range described above in conjunction with the first and second layered products 1 and 2 according to the first aspect.

In the fourth layered product 4, etching is performed from a surface of the second mask layer 402 side, so that the second mask layer (mask layer 402a in the concave portion) arranged in the concave portion of the first mask layer 401 serves as a mask, and the first mask layer 401 provided under the mask layer 402a in the concave portion is selectively protected from the etching. As a result, it is possible to obtain a fine pattern structure 202 in which the fine mask pattern 202a including the mask layer 402a in the concave portion and the first mask layer 401 is provided on the object 200 to be processed. Therefore, it is possible to obtain the fine mask pattern 202a capable of easily fabricating the object 200 to be processed. Furthermore, the first mask layer 401 may have a multilayer structure similar to the third layered product 3.

In the first mask layer 401, a single (for example, a line shape) or a plurality of (for example, a dot shape) convex portions 401b extending a certain direction is/are arranged along a direction perpendicular to the certain direction with a predetermined interval. That is, a plurality of convex portions 401b are formed across the entire surface of the object 200 to be processed as seen in a plan view. In addition, the convex portions 401b are protruded in a direction perpendicular to a principal surface of the object 200 to be processed as seen in a cross-sectional view taken along a thickness direction of the fourth layered product 4 (as seen in a cross section perpendicular to the perpendicular direction) as illustrated in FIGS. 42A and 42B. A concave portion 401c is formed between the convex portions 401b. The convex portions 401b and the concave portions 401c constitute a concavo-convex structure 401a. As a shape, an arrangement, a size, and the like of the concavo-convex structure, those of the concavo-convex structure 101a of the mold 101 described above in conjunction with the first and second layered products 1 and 2 may be used. Particularly, a hole shape is preferable.

<Top Position S of Convex Portion>

Similar to the first layered product 1 described above, the top position S of the convex portion of FIGS. 42A and 42B refers to a top position of the convex portion 401b of the concavo-convex structure 401a. The top position S of the convex portion may be obtained using the method similar to that of the first layered product 1 described above.

<Interfacial Position Scc>

Similar to the first layered product 1 described above, the interfacial position Scc of FIGS. 42A and 42B refers to a position of the interface between the air layer and the surface of the mask layer 402a formed in the concave portion 401c of the concavo-convex structure 401a. This interfacial position Scc can be obtained using a method similar to that of the first layered product 1 described above.

<Top Face Position Scv>

Similar to the first layered product 1 described above, the top face position Scv of FIGS. 42A and 42B refers to a top face position of the mask layer 402b of the convex portion formed on the top of the convex portion 401b of the concavo-convex structure 401a. This top face position Scv can be obtained using a method similar to that of the first layered product 1 described above.

<Distance lcc>

Similar to the first layered product 1 described above, the distance lcc of FIGS. 42A and 42B refers to a distance between the top position S of the convex portion and the interfacial position Scc. This distance lcc can be obtained using a method similar to that of the first layered product 1 described above. In addition, a relationship between the distance lcc and the height h of the concavo-convex structure is also similar to that of the first layered product 1.

<Distance lcv>

The distance lcv of FIGS. 42A and 42B is a distance between the top position S of the convex portion and the top face position Scv and also refers to a thickness of the mask layer 402b on the convex portion. Therefore, if there is variability in the top position S of the convex portion or the top face position Scv, an average value of the thickness of the mask layer 402b over the convex portion is used. From the viewpoint of reduction of the width of the second mask layer 402 through dry etching, the distances lcv and lcc and the height h the concavo-convex structurepreferably satisfies Formula (20) $0 \leq lcv < (h-lcc)$, and more preferably Formula (21) $0 \leq lev \leq (h-lcc)/2$.

The distance lcv preferably satisfies Formula (20) described above because it is possible to more easily remove the mask layer 402b on the convex portion having a thickness of the distance lcv through dry etching. The distance lcv is more preferably set to $lcv \leq 0.01 h$, and most preferably satisfies Formula (5) $lcv=0$. If the distance lcv satisfies Formula (5), a fabrication accuracy of the fine mask pattern 202a formed on the object 200 to be processed is significantly improved.

A thickness of the first mask layer 401 represented by the distance between an interface between the first mask layer 401 and the object 200 to be processed and the top position S of the convex portion satisfies a range of 100 nm or greater and 1,500 nm or smaller. If this range is satisfied, it is possible to improve physical stability of the fine mask pattern 202a when dry etching is performed from the surface of the second mask layer 402 side of the fourth layered product 4, and a fabrication accuracy when the object 200 to be processed is fabricated. In order to further exert the aforementioned advantages, a thickness of the first mask layer 401 is more preferably set to 200 nm or greater and 1,000 nm or smaller, and most preferably 250 nm or greater and 900 nm or smaller.

A hard mask layer 409 may be provided between the object 200 to be processed and the first mask layer 401. FIG. 42B is a schematic cross-sectional view illustrating the fourth layered product 4 having the hard mask layer 409. If the hard mask layer 409 is provided, it is possible to easily fine-pattern the hard mask layer 409 by using the fine mask pattern including the first and second mask layers 401 and 402 as a mask. It is possible to easily etch the object 200 to be processed by using the obtained fine-patterned hard mask pattern as a mask. As a material, a thickness, and the like of the hard mask layer 409, those of the hard mask described above in conjunction with the first and second layered products 1 and 2 may be used.

Next, description will be made for a method of manufacturing the fourth layered product 4.

The fourth layered product 4 can be manufactured by using an inorganic material (such as sapphire, Si, ZnO, SiC, and nitride semiconductor) as the object 200 to be processed in the first and second layered products 1 and 2 described above.

By applying the dry etching condition of the first mask layer 401 using the first and second layered products 1 and 2 described above from a surface of the second mask layer 402 side of the fourth layered product 4, it is possible to easily fabricate the first mask layer 401 and obtain the fine mask pattern 202a on the object 200 to be processed. If the dry etching condition of the object 200 to be processed in the first and second layered products 1 and 2 described above is applied by using the obtained fine mask pattern 202a as a mask, it is possible to easily fabricate the object 200 to be processed.

<Semiconductor Light-Emitting Element>

Figure 43:
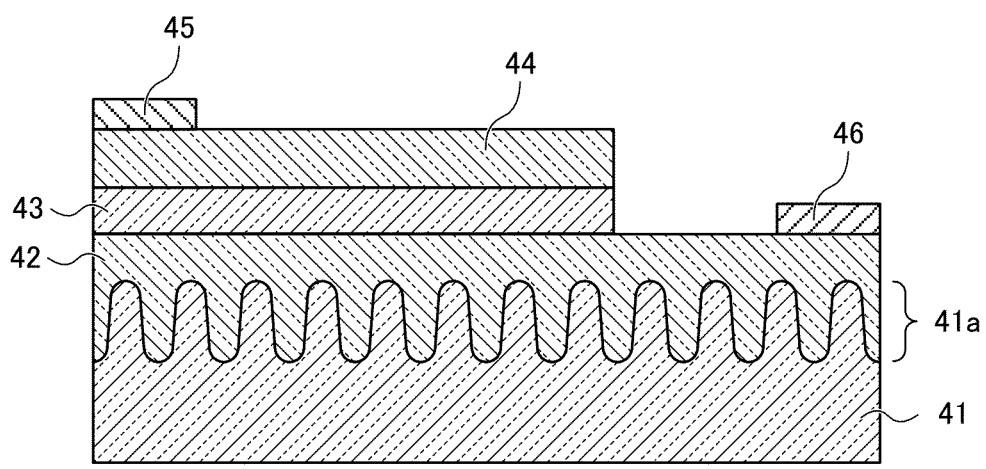
FIG. 43 is a schematic cross-sectional view illustrating a semiconductor light-emitting element using an object to be processed fabricated using the layered product for fine pattern formation according to first and second aspects.

Next, description will be made for a semiconductor light-emitting element using the object 200 to be processed manufactured using the first to fourth layered products 1 to 4 described above with reference to FIG. 43. FIG. 43 is a schematic cross-sectional view illustrating a semiconductor light-emitting element 40 using the object 200 to be processed manufactured using the first to fourth layered products 1 to 4. FIG. 43 illustrates an example in which the fine pattern 41a is provided on a sapphire substrate 41 as an object 200 to be processed using the first to fourth layered products 1 to 4. Here, an LED element as a semiconductor light-emitting element will be described. In addition, the object 200 to be processed manufactured using the first to fourth layered products 1 to 4 described above may be applied to various semiconductor light-emitting elements without limiting to an LED element.

The sapphire substrate 41 may include, for example, a 2-inch($\phi$) sapphire substrate, a 4-inch($\phi$) sapphire substrate, a 6-inch($\phi$) sapphire substrate, a 8-inch($\phi$) sapphire substrate, and the like.

As illustrated in FIG. 43, the semiconductor light-emitting element 40 includes an n-type semiconductor layer 42, a light-emitting semiconductor layer 43, and a p-type semiconductor layer 44 sequentially laminated on the fine pattern 41a provided on a principal surface of the sapphire substrate 41, an anode 45 formed on the p-type semiconductor layer 44, and a cathode 46 formed on the n-type semiconductor layer 42. As illustrated in FIG. 43, the semiconductor light-emitting element 40 has a double hetero-structure. However, the layered structure of the light-emitting semiconductor layer 43 is not particularly limited. A buffer layer (not illustrated) may be provided between the sapphire substrate 41 and the n-type semiconductor layer 42.

If the semiconductor light-emitting element is manufactured using the sapphire substrate 41 provided on a surface with the fine pattern 41a, it is possible to improve external quantum efficiency depending on the fine pattern 41a and efficiency of the semiconductor light-emitting element. Particularly, if the pitch of the fine pattern is set to 100 to 500 nm, and the height of the fine pattern is set to 50 to 500 nm, it is possible to improve crystallinity of the semiconductor light-emitting layer. More specifically, it is possible to significantly reduce the number of levels and improve internal quantum efficiency. Furthermore, if the arrangement is made as illustrated in FIG. 8B in which periodicity is modified, it is presumed that light-emitting efficiency can be improved at the same time. As a result, external quantum efficiency is significantly improved. Furthermore, if the concavo-convex structure has a dot configuration in which a regular nanoscale array has high periodicity in a microscale, and modulation is applied to a pitch having a microscale period, it is possible to further improve the aforementioned advantages and manufacture a high-efficiency semiconductor light-emitting element.

EXAMPLES

Hereinafter, description will be made for examples performed to clarify the advantages of the present invention. In addition, the present invention is not limited to examples and comparative examples described below.

In the following examples and comparative examples, the materials and the measurement method described below were used.

DACHP: fluorine-containing urethane(meth)acrylate (OPTOOL DAC HP produced by DAIKIN INDUSTRIES, ltd.)

M350: trimethylolpropane (EO-modified)triacrylate (M350 produced by TOAGOSEI CO., LTD.)

M309: trimethylolpropane triacrylate (M309 produced by TOAGOSEI CO., LTD.)

I.184: 1-hydroxy-cyclohexyl-phenyl-ketone (Irgacure™ 184 produced by BASF Corporation)

I.369: 2-benzyl-2-dimethylamino-1-(4-morpholinophenyl)-butanone-1 (Irgacure™ 369 produced by BASF Corporation)

TTB: titanium(IV) tetrabutoxid monomer (produced by Wako Pure Chemical Industries, Ltd.)

DEDFS: diethoxydiphenylsilane (LS-5990 produced by Shin-Etsu Silicone Co., Ltd.)

TEOS: tetraethoxysilane

X21-5841: end —OH-modified silicone (produced by Shin-Etsu Silicone Co., Ltd.)

SH710: phenyl-modified silicone (produced by Dow Corning Toray Corporation)

3APTMS: 3-acrylioxypropyl trimethoxysilane (KBM5103 produced by Shin-Etsu Silicone Co., Ltd.)

M211B: bisphenol-A EO-modified diacrylate (Aronix M211B produced by TOAGOSEI CO., LTD.)

M101A: phenol EO-modified acrylate (Aronix M101A produced by TOAGOSEI CO., LTD.)

M313: isocyanuric acid EO-modified di- and triacrylate (diacrylate 30 to 40%) (Aronix M313 produced by TOAGOSEI CO., LTD.)

OXT221: 3-ethyl-3 {[(3-ethyloxetane-3-yl)methoxy]methyl}oxetane (ARONE oxetane OXT-221, produced by TOAGOSEI CO., LTD.)

CEL2021P: 3,4-epoxycyclohexenylmethyl-3',4'-epoxycyclohexene carboxylate

DTS102: diphenyl[4-(phenylthio)phenyl]sulfonium hexafluorophosphate (produced by Midori Kagaku Co., Ltd.)

DBA: 9,10-dibutoxyanthracene (Anthracure™ UVS-1331, produced by KAWASAKI KASEI CHEMICALS LTD.)

PGME: propylene glycol monomethyl ether

MEK: methylethyl ketone

MIBK: methylisobutyl ketone

PO-A: phenoxyethyl acrylate (Light Acrylate PO-A, produced by KYOEISHA CHEMICAL Co., LTD.)

Es/Eb: a ratio between a surface fluorine concentration Es and an average fluorine concentration Eb measured through an X-ray photoelectron spectroscopy (XPS) method for the resin mold having a fine pattern on a surface.

The surface fluorine concentration Es of the resin mold was measured through an XPS method under the following measurement condition. In the XPS method, a penetration length of X-rays on a sample surface reaches several nanometers, which is very shallow. Therefore, the XPS measurement value was used as the fluorine concentration Es of the resin mold surface. The resin mold was diced into small pieces having a size of approximately 2 mm by 2 mm, and a slot type mask having a size of 1 mm by 2 mm was covered, so that XPS measurement was performed under the following condition.

<XPS Measurement Condition>
Measurement Station: ESCALAB250 produced by Thermo Fisher Scientific Inc.
Excitation Source: mono. AlKα 15 kV×10 mA
Analysis Size: about 1 mm (elliptical shape)
Survey Area
  Survey Scan: 0 to 1,100 eV
  Narrow Scan: F 1 s, C 1 s, O 1 s, N 1 s
Pass Energy
  Survey Scan: 100 eV
  Narrow Scan: 20 eV Meanwhile, in order to measure an average fluorine concentration Eb in the resin of the resin mold, sliced fragments physically separated from the support substrate were decomposed through a flask combustion method, and then, an ion-chromatography analysis was performed, so that an average fluorine concentration Eb in the resin was measured.

First, the inventors manufactured the first and second layered products 1 and 2 according to the first aspect, and a fine pattern was transferred onto the object to be processed using the manufactured first and second layered products 1 and 2 to investigate the effect thereof. Hereinafter, details of the investigation performed by the inventors will be described.

Example 1

(a) Manufacturing of Cylindrical Master
(Manufacturing of Template for Resin Mold)

Quartz glass was used as a substrate of the cylindrical master. A fine pattern was formed on a surface of the quartz glass through a direct-write lithography method using a semiconductor laser. On the surface of the quartz glass roll having a fine concavo-convex surface, Durasurf HD-1101Z (produced by DAIKIN INDUSTRIES, ltd.) was coated, and the coated quartz glass roll was heated at a temperature of 60° C. for one hour and was then disposed at a room temperature for 24 hours for solidification. Then, the quartz glass roll was rinsed three times using Durasurf HD-ZV (produced by DAIKIN INDUSTRIES, ltd), and a demolding treatment was performed.

(b) Manufacturing of Resin Mold

A curable resin composition was prepared by mixing DACHP, M350, I.184, and I.369. The curable resin composition contained 10 to 20 parts by mass of DACHP relative to 100 parts by mass of M350. In the process of manufacturing the resin mold B from the resin mold A described below, the resin mold B was manufactured using the same resin as that used in manufacturing of the resin mold A.

The curable resin composition was coated on an easy adhesion surface of a PET film (A4100, produced by TOYOBO CO., LTD.) using Micro Gravure Coating, produced by Yasui Seiki Co., Ltd., to obtain a coated film having a thickness of 6 μm. The PET film has a width of 300 mm and a thickness of 100 μm. While the PET film having the coated curable resin composition was pressed against the cylindrical master using a nip roll (0.1 MPa), ultraviolet rays were irradiated to the curable resin composition to continuously perform photo curing of the curable resin composition. As a result, a reel-like resin mold A having a transferred fine pattern on its surface was obtained. The UV irradiation was performed by using a UV light exposure apparatus (H-bulb, produced by Fusion UV Systems Japan K. K.) under an atmospheric pressure at a temperature of 25° C. and a humidity of 60%. In the UV irradiation, an integral exposure light amount under a lamp center was 600 mJ/cm². The reel-like resin mold A has a length of 200 m and a width of 300 mm. The shape of the fine pattern of the reel-like resin mold A was observed using a scanning electron microscope. As a result, the distance between neighboring convex portions was 460 nm, and a height of the convex portion was 460 nm.

The same curable resin composition as that of the resin used to manufacture the resin mold A was coated on an easy adhesion surface of a PET film (A4100, produced by TOYOBO CO., LTD.) using a Micro Gravure Coating, produced by Yasui Seiki Co., Ltd., to obtain a coated film having a thickness of 6 μm. The PET film has a width of 300 mm and a thickness of 100 μm. While the PET film having the coated curable resin composition was pressed against the reel-like resin mold A using a nip roll (0.1 MPa), ultraviolet rays were irradiated to the curable resin composition to continuously perform photo curing of the curable resin composition. This process was performed several times, As a result, a plurality of a reel-like resin mold B having a transferred fine pattern on its surface were obtained. The UV irradiation was performed by using a UV light exposure apparatus (H-bulb, produced by Fusion UV Systems Japan K. K.) under an atmospheric pressure at a temperature of 25° C. and a humidity of 60%. In the UV irradiation, an integral exposure light amount under a lamp center was 600 mJ/cm².

The reel-like resin molds B have the same fine pattern as that of the cylindrical master and have a length of 200 m and a width of 300 mm. The shape of the fine pattern of the reel-like resin mold B was observed using a scanning electron microscope. As a result, the opening width (φ) of a concave portion was 230 nm, a distance between neighboring concave portions was 460 nm, and a depth of the concave portion was 460 nm.

The ratio Es/Eb between the surface fluorine concentration Es and the average fluorine concentration Eb of the obtained resin molds B was controllable in the range of 40 to 80 depending amount of DACHP. The resin molds B have a fine pattern having a dot configuration, so the resin mold is referred to as a resin mold (hole) hereinafter. In addition, in the following investigation using the resin mold (hole), resin molds (hole) having the ratio Es/Eb set to 74.1, 55.4, and 49.0 were selected, and all of the resin molds were investigated.

Under the same condition, a resin mold B having a line-and-space type fine pattern on its surface was also manufactured. Hereinafter, the resin mold B is referred to as a resin mold (L/S). The fine pattern of the obtained resin mold (L/S) had a pitch of 130 nm and a height of 150 nm. The ratio Es/Eb between the surface fluorine concentration Es and the average fluorine concentration Eb of the obtained resin mold (L/S) was controllable in the range of 40 to 90 depending amount of DACHP. In the following investigation using the resin mold (L/S), resin molds (L/S) having the ratio Es/Eb set to 80.5, 57.6, and 47.7 were selected, and the overall resin molds were investigated.

(c) Manufacturing of First Layered Product 1 (Hole)

A first layered product 1 was manufactured using the resin mold (hole) as follows. As a second mask material, three types of mask materials were prepared. The three types of mask materials were referred as the second mask materials A to C respectively. The same investigation was performed for all of them.

The Second Mask Material A

TTB, DEDFS, TEOS, X21-5841, and SH710 was sufficiently mixed with a mixing ratio of 65.25:21.75:4.35:4.35: 4.35 [g] to obtain a mixture. Subsequently, 2.3 ml of ethanol containing 3.25% of water was slowly dropped into the mixture with agitating to obtain a solution. Then, the solution was cured for 4 hours at a temperature of 80° C., and vacuum drawing was performed to obtain the second mask material A.

The Second Mask Material B

TTB, DEDFS, X21-5841, SH710, 3APTMS, M211B, M101A, M350, I.184, and I.369 was sufficiently mixed with a mixing ratio of 33.0:11.0:4.4:4.4:17.6:8.8:8.8:8.8:2.4:0.9 [g] to obtain the second mask material B.

The Second Mask Material C

TTB, DEDFS, X21-5841, SH710, and 3 APTMS was mixed with a mixing ratio of 46.9:15.6:6.3:6.3:25.0 [g] to obtain a mixture. Subsequently, 2.3 ml of ethanol containing 3.25% of water was slowly dropped into the mixture with agitating to obtain a solution. Then, the solution was cured for 2.5 hours at a temperature of 80° C., and vacuum drawing was performed. To the aforementioned solution, a mixed solution obtained by mixing M211B, M101A, M350, I.184, and I.369 with a mixing ratio of 29.6:29.6:29.6:8.1:3.0 [g] and sufficiently agitating them was added by 42.2 g so as to obtain the second mask material C.

Subsequently, the following investigation was made for each of the second mask materials A, B, and C. Hereinafter, the second mask materials A, B, and C are collectively referred to as a second mask material without any distinction.

In order to manufacture the first layered product 1, the second mask material was diluted with a MEK solution containing DACHP. The MEK solution contained DACHP in the range of 20 to 600 parts by weight relative to the second mask material of 100 g. The dilution ratio was set such that the solid content amount contained in the coating on unit planar area is equal to or smaller than a volume of the fine pattern of the resin mold (hole). Here, the solid content amount refers to a total amount of the second mask material and the fluorine-containing (meth)acrylate in DACHP. Specifically, the concentration was determined such that the distance lcc becomes 0, 9.2 nm (0.02 h), 230 nm (0.5 h), 322 nm (0.7 h), 414 nm (0.9 h), and 437 nm (0.95 h). Dilution to adjust concentration of DACHP was performed by dropping propylene glycol monomethyl ether (PGME) into the second mask material and sufficiently agitating them.

The coating of the second mask material on the surface having the fine pattern of the resin mold (hole) was performed using the same apparatus as that used in the manufacturing of the resin mold. Using the Micro Gravure Coating, the diluted second mask material was coated on a fine pattern surface of the resin mold (hole) to obtain a coated resin mold (hole). The coated resin mold (hole) was passed through a dry atmosphere at a temperature of 80° C. Then, a cover film was laminated on the surface of the coated resin mold (hole) to obtain the first layered product. The first layered product was wound up. Hereinafter, the first layered product 1 is referred to as "first layered product 1(1)."

The cross section of the obtained first layered product 1(1) was observed using a scanning electron microscope, a transmission electron microscope, and an energy dispersive X-ray spectroscopy method to measure distances lcc and lcv. In the case that a targeted distance lcc in the first layered product 1(1) is zero, portions in which a mask layer in the concave portion was connected to a mask layer on the convex portion were observed. The "mask layer in the concave portion" means the second mask material filling to the concave portion of the fine pattern and the "mask layer on the convex portion" means the second mask material on the convex portion. The result might show the following matters; these portions become a factor for a variation of the remaining film when the second mask layer is transferred on the first mask layer by using the first layered product 1(1). The variation might causes a distribution of diameters of the concave portions or the convex portion with a high aspect ratio in the fine mask pattern obtained by etching the first mask layer by using the second mask layer as a mask.

In other conditions, the second mask layer (mask layer in the concave portion) in the concave portion was formed with a margin of ±10% for the targeted distance lcc. Meanwhile, in a case where the targeted distance lcc is not zero, it was difficult to observe the distance lcv using a transmission electron microscope. Therefore, it was determined that the second mask layer is not formed on the convex portion, or the distance lcv is several nanometer or shorter even if it exists. This observation was performed using a combination of a transmission electron microscope and an energy dispersive X-ray spectroscopy (EDX) method.

Figure 44:
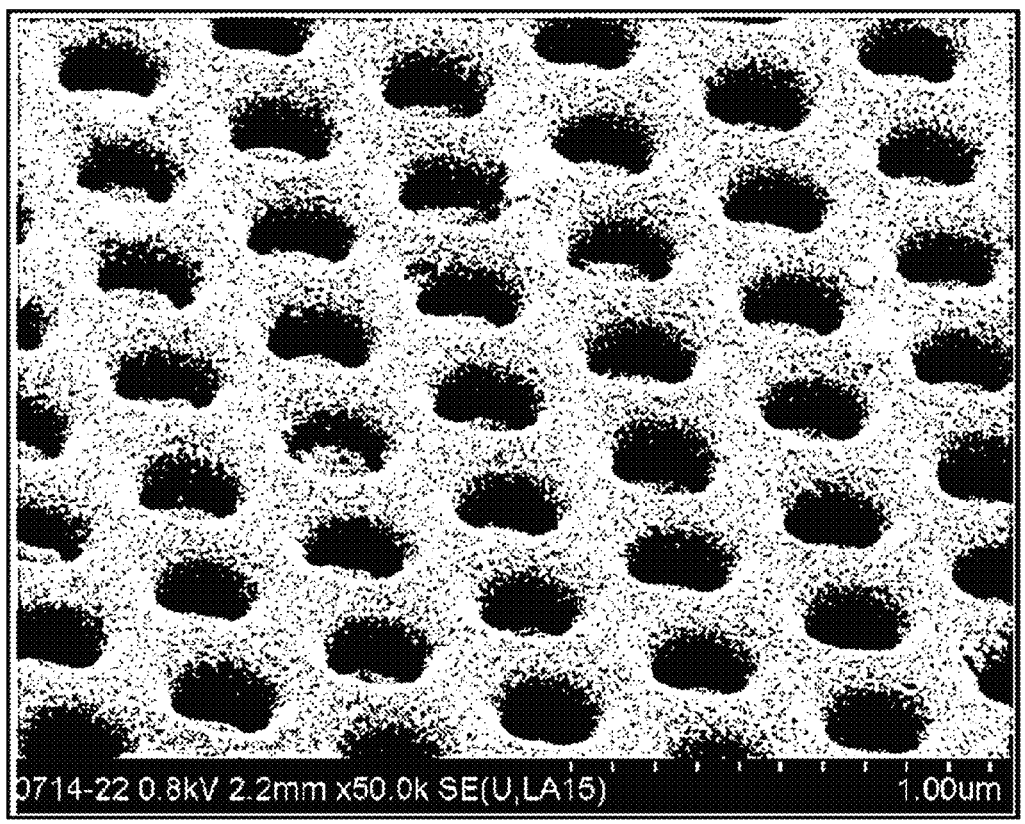
FIG. 44 is a scanning electron microscope (SEM) photographic image according to an example of the invention.

Particularly, in the EDX analysis, the distance lcv was determined by observing titanium (Ti) of the second mask material. An example of the first layered product 1(1) is illustrated in FIG. 44. FIG. 44 shows an image obtained by observing obliquely downwardly the first layered product 1(1) using a scanning electron microscope. In FIG. 44, it is recognized that the second mask layer is filled in the concave portion of the resin mold having a pitch of 460 nm and an opening width of 230 nm. By obliquely downwardly observing the first layered product 1(1) using a scanning electron microscope, it was recognized that the second mask material is filled only in the concave portion of the resin mold having an opening ratio of 23% in which holes having a circular opening of an opening width of 230 nm are hexagonally arranged with a pitch of 460 nm.

Although a test method will be described below, in a case where the targeted distance lcc is 437 nm (0.95 h), the first layered product 1(1) can be manufactured. However, there is a problem in etching resistance when dry etching is performed for the object to be processed. This problem might be caused by two things. One is non-homogeneity of the second mask layer (mask layer in the concave portion) formed in the concave portion of the resin mold. It is because a volume of the second mask material to be filled is too small. The other one is disappearance of the second mask layer when the first mask layer was dry etched. It is because volume of the second mask layer is significantly small. In a case where the targeted distance lcc is equal to or shorter than 414 nm (0.9 h), there is no problem in the dry etching resistance. From the aforementioned consideration, it would appear that, in a case where the distance lcc is 9.2 nm (0.02 h) or longer and 414 nm (0.9 h) or shorter, the first layered product 1 achieves a function.

Figure 45:
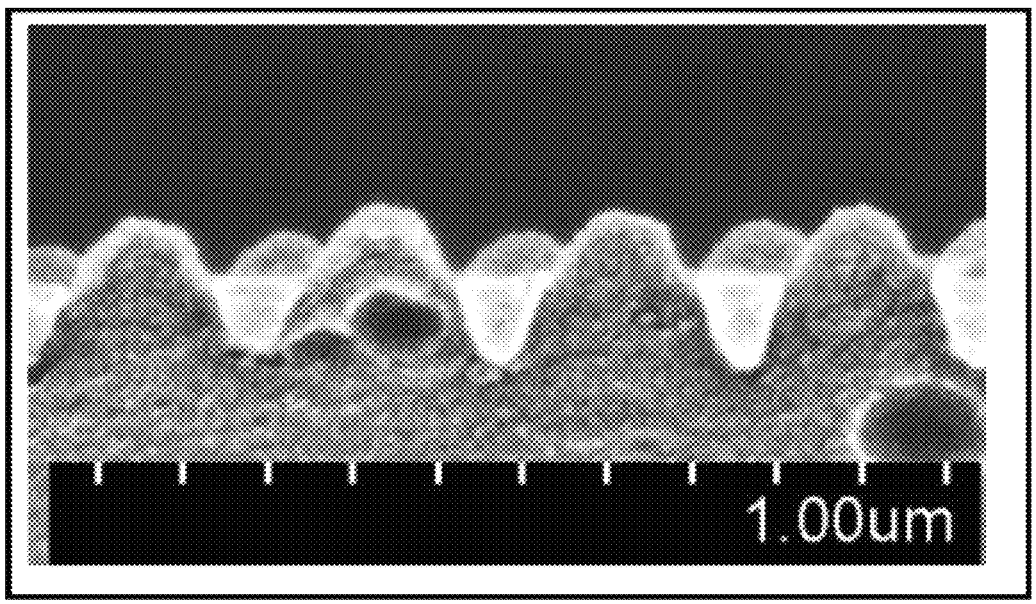
FIG. 45 is a SEM photographic image according to an example of the invention.
Figure 46:
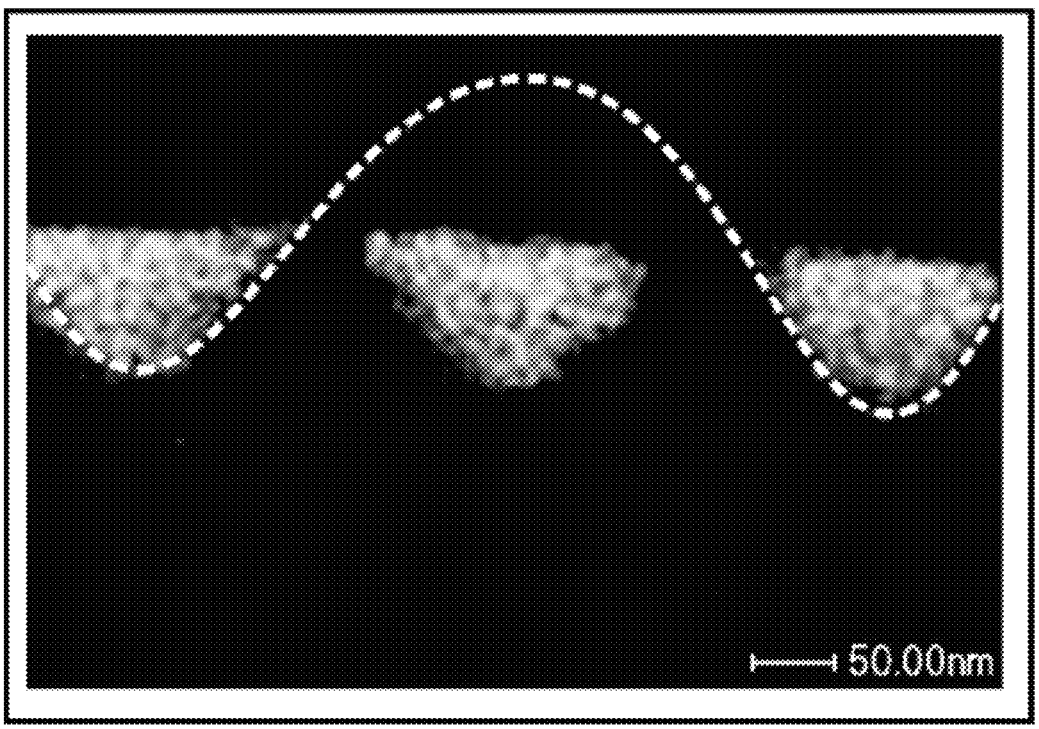
FIG. 46 is a SEM photographic image according to an example of the invention.

The same result was obtained for the fine pattern having a hole configuration different from that of the present test in which a distance between concave portions is set to 460 nm. FIG. 45 is a scanning electron microscope (SEM) photographic image of an example of the first layered product 1(1). In FIG. 45, it is recognized that a mask material is filled in the concave portion of the fine pattern of the resin mold. It was determined whether or not a bright convex portion in FIG. 45 corresponds to the distance lcv using a transmission electron microscope and an energy dispersive X-ray spectroscopy (EDX) analysis. The result is shown in FIG. 46. In FIG. 46, a white mapping portion corresponds to the second mask layer, and the dashed line corresponds to a contour of the fine pattern.

The cross section of the first layered product (1) was observed using a scanning electron microscope. As a result, based on the contrast difference of the scanning electron microscope, it was observed that the second mask layer is filled in the concave portion of the resin mold. In addition, the convex portion of the resin mold was observed using a transmission electron microscope and an EDX analysis. As a result, the second mask layer was not observed on the convex portion of the resin mold from both the contrast difference of the transmission electron microscope and the Ti peak strength of the EDX analysis. From the aforementioned results, it can be determined that the distance lcv is several nanometers or shorter i.e., equal to or shorter than a resolution of the transmission electron microscope and the EDX analysis.

(d) First Layered Product 1 (L/S)

The first layered product 1 was also manufactured by using a line-and-space configuration different from the hole configuration described in Paragraph (c). As the second mask material, three second mask materials A, B, and C described above were prepared using the resin mold (L/S). The same investigation was made for all of the three second mask materials. Hereinafter, the second mask materials A, B, and C are collectively referred to as a second mask material without any distinction.

In order to manufacture the first layered product 1, the second mask material was diluted with a MEK solution containing DACHP. The MEK solution contained DACHP in the range of 20 to 600 parts by weight relative to the second mask material of 100 g. The dilution ratio was set such that the solid content amount contained in the coating on unit planar area is equal to or smaller than a volume of the fine pattern of the resin mold (L/S). Here, the solid content amount refers to a total amount of the second mask material and the fluorine-containing (meth)acrylate in DACHP. Specifically, the concentration was determined such that the distance lcc becomes 0, 3 nm (0.02 h), 75 nm (0.5 h), 105 nm (0.7 h), 135 nm (0.9 h), and 143 nm (0.95 h). Dilution to adjust concentration of DACHP was performed by dropping a MEK solution containing DACHP into the second mask material and sufficiently agitating them. The coating of the second mask material on the surface having the fine pattern of the resin mold (L/S) was performed as in Paragraph (c) First Layered Product 1 described above.

The cross section of the obtained first layered product 1 was observed using a scanning electron microscope and a transmission electron microscope to measure the distances lcc and lcv. The same result was obtained as that of the investigation (c). That is, even when the resin mold (L/S) is used, the second mask material is filled only in the concave portion of the resin mold, and the distance lcv was equal to or shorter than the detection limitation of a transmission electron microscope or an EDX analysis.

The used solution used in this investigation was coated on quartz through a spin coat method to obtain a thin film, and dry etching resistance was evaluated. As a result, it was an excellent result in the case that the amount of DACHP was equal to or smaller than 500 parts by mass. More preferably, the amount of DACHP was 300 or less parts by mass, and further preferably 150 or less parts by mass. Meanwhile, regarding coatability, if the amount of DACHP is 40 or more parts by mass, wettability was improved. By setting the amount of DACHP to 60 or more parts by mass, it was possible to more satisfactorily perform the coating.

(e) Manufacturing of Third Layered Product 3 Using First Layered Product 1(1)

Using the first layered product 1(1), it was confirmed whether or not the fine mask pattern can be easily formed on the object to be processed in a large scale. Although described below in more detail, here, it is confirmed whether or not the third layered product 3 can be manufactured using the first layered product 1, and then, the object to be processed can be fine-patterned. As the first layered product 1, the first layered product 1(1) described above was used.

The used first layered product 1(1) was obtained by cutting a roll of the first layered product 1(1) wound by 200 m. As an exterior of the first layered product 1(1), a width was set to 300 mm, and a length was set to 600 mm.

A fine mask pattern formation portion (portion where the second mask material is filled in the concave portion of the concavo-convex structure of the resin mold) has a width of 250 mm and a length of 600 mm. The fine mask pattern was formed on the object to be processed by laminating the first layered product 1(1) to the object to be processed by interposing the first mask layer, and then irradiating light to manufacture the third layered product 3. Specifically, the manufacturing was made as follows.

As the first mask layer, the first mask layer A described below and the first mask layer B described below were separately used. Since both the first mask layers A and B are similarly used, hereinafter, they are simply referred to as a first mask layer. In addition, a c-plane sapphire substrate was used as the object to be processed.

First Mask Layer A
Solution A=OXT221:CEL2021P:M211B:M101A=20 g:80 g:50 g:50 g
Solution B=PGME:DTS102:DBA:1.184=300 g:8 g:1 g:5 g
Solution A:Solution B=100 g:157 g
First Mask Layer B
Photosetting resin (MUR-XR02, produced by MARUZEN PETROCHEMICAL CO., LTD.)

UV-O3 cleaning was performed for the surface of the object to be processed having a size of 2 inches ($\phi$) for 10 minutes to remove particles, and a hydrophilic treatment was applied. Subsequently, the material of the first mask layer was diluted with a solvent (PGME, MIBK or cyclohexane), and a spin coat method at a speed of 2000 rpm was performed to form a thin film on a UV-O3 treatment surface of the objects to be processed. Subsequently, the coated object to be processed was disposed on a hot plate at a temperature of 80° C. for 2 minutes and then disposed on a hot plate at a temperature of 120° C. for 2 minutes to eliminate the solvent.

The surface of the second mask layer side of the first layered product 1(1) (surface of the fine pattern formation surface side of the resin mold) was laminated to the first mask layer on the object to be processed using a laminate roll at a pressure of 0.01 MPa. Here, a total of 36 objects to be processed (array of 4×9) having the first mask layers were arranged, and the first layered product 1(1) having a size of 300 mm×600 mm was laminated to the objects to be processed.

While a pressure of 0.05 MPa was applied to the layered product after the laminating from its resin mold side, UV light was irradiated to the layered product from the resin mold side by an integral light intensity of 1000 mJ/cm$^2$. After UV light irradiation, the layered product was disposed at a room temperature for 10 minutes. Subsequently, the layered product was baked using an oven at a temperature of 105° C. for 1.5 minutes. When the temperature of the objected to be processed become 30° C. or lower again, the resin mold was removed. In a case where the first mask layer A is used, UV light was irradiated again after the resin mold was removed. At this time, the UV light irradiation was set to have an integral light intensity of 1000 mJ/cm².

The resulting layered product consisting of [the second mask layer/the first mask layer/the object to be processed] was observed using a scanning electron microscope. As a result, a structure of the third layered product 3 consisting of [the second mask layer/the first mask layer/the object to be processed] was observed. In addition, it was observed that there is no second mask layer in the bottom of the concave portion of the concavo-convex structure consisting of the first mask layer. From the aforementioned results, it is recognized that a third layered product 3 having the second mask layer having a large total area and no remaining film can be easily formed by using the first layered product 1(1).

The obtained third layered product 3 has a thickness (hml) of 0 nm. In addition, by observing cross-sectional images of a transmission electron microscope, the thickness of the obtained third layered product 3 was 450 nm, 230 nm, 130 nm, 40 nm, and 20 nm for the distances lcc of the first layered product 1(1) of 0.02 h, 0.5 h, 0.7 h, 0.9 h, and 0.95 h, respectively. Similarly, the thickness (hmv)/h0 was 45, 1, 0.39, 0.095, and 0.045, respectively. From the aforementioned results, it was recognized that transferring onto the object to be processed can be performed by reflecting an accuracy of the second mask layer of the first layered product 1 by using the first layered product 1.

(f) Manufacturing of Third Layered Product 3 Using Second Layered Product 2

It was confirmed whether or not the fine mask pattern can be easily formed on the object to be processed in a large scale to manufacture the third layered product 3 by using the second layered product 2. Accordingly, it was determined whether or not transferring can be performed by reflecting precisions of the first and second mask layers of the second layered product 2 by using the second layered product 2. As the second layered product 2, the second layered product 2(1) manufactured using the first layered product 1(1) was used.

First, the first layered product 1(1) coated with the second mask material and wound up was reeled out. Subsequently, the diluted material of the first mask layer was coated on the second mask layer. After eliminating the solvent, a cover film (protection layer) was laminated on the first mask to obtain a second layered product (1). The second layered product was wound up. Using a scanning electron microscope, it was observed that the thickness lor of the first mask layer in the second layered product (1) was coated with a precision of ±5% with respect to the center thickness.

The used second layered product (1) was obtained by cutting a necessary portion from a roll of the second layered product 2(1) wound by 200 m and removing the cover film, so as to be used. As the exterior, a width was set to 300 mm, and a length was set to 600 mm. The fine mask pattern formation portion had a width of 250 mm and a length of 600 mm. The second layered product (1) was laminated to the object to be processed (thermocompressive bonding), and light irradiation was performed, so that a fine mask pattern was formed on the object to be processed, and the third layered product 3 was obtained. Specifically, manufacturing was performed as follows.

As the material of the first mask layer, a resin having a carboxyl group, which contains 50% of a binder polymer as an acrylic copolymer, approximately 40% of a monomer component, and a multifunctional acrylic compound as a crosslinking agent was used. A material of the first mask layer was diluted with a solvent (MEK and PGME) to obtain the solution of 5 weight % of the material of the first mask layer. As the object to be processed, a c-plane sapphire substrate was used.

UV-O3 cleaning was performed for the surface of the object to be processed having a size of 2 inches (φ) for 10 minutes to remove particles, and a hydrophilic treatment was applied. Subsequently, the object to be processed was heated at a temperature of 80 to 100° C., and the surface of the first mask layer side of the second layered product (1) was laminated to the object to be processed. Here, the laminating was performed with a pressure of 0.01 MPa using a laminate roll from a surface of the resin mold side of the second layered product (1). In addition, the second layered product (1) having a size of 300 mm×600 mm was laminated to a total of 36 objects to be processed (4×9 array).

After the laminating, UV light of an integral light intensity of 1200 mJ/cm² was irradiated to the obtained layered product after the laminating toward the resin mold. Subsequently, the object to be processed was heated at a temperature of 120° C. for 30 minutes. Then, the resin mold was removed while a temperature of the object to be processed was equal to or lower than 40° C.

The obtained layered product consisting of [the second mask layer/the first mask layer/the object to be processed] was observed using a scanning electron microscope. As a result, a structure consisting of [the second mask layer/the first mask layer/the object to be processed] was observed. In addition, it was confirmed that there is no second mask layer in the bottom of the concave portion of the fine pattern including the first mask layer. Furthermore, a thickness of the first mask layer (distance between an interface between the object to be processed and the first mask layer and the top position of the concavo-convex structure of the first mask layer) was ±7% with respect to the center thickness. From the aforementioned results, it was recognized that, a second mask layer having a large total area and having no remaining film (or very thin) can be easily manufactured by using the second layered product 2(2), and precisions of the first and second mask layers of the second layered product 2(1) can be reflected on the object to be processed. Particularly, in a case where the fine mask pattern is transferred onto the object to be processed by interposing the first mask layer using the first layered product 1(1) described above, a thickness of the transferred first mask layer had a distribution of ±25% with respect to the center thickness). From the aforementioned consideration, it was recognized that, by using the second layered product 2(1), transferring can be made on the object to be processed with higher precisions of the first and second mask layers. It would appear that this is because a flow of the first mask layer affects the precision when the laminating to the object to be processed is performed.

The resulting third layered product 3 consisting of [the second mask layer/the first mask layer/the object to be processed] had a thickness hml of 0 nm. In addition, the thickness hmv of the resulting third layered product 3 was 450 nm, 230 nm, 130 nm, 40 nm, and 20 nm, for the distance lcc of the second layered product 2(1) 0.02 h, 0.5 h, 0.7 h, 0.9 h, and 0.95 h, respectively, as a result of observation of the cross-sectional image of a transmission electron microscope. Similarly, the thickness hmv/h0 was 45, 1, 0.39, 0.095, and 0.045, respectively. For the aforementioned results, it was recognized that the fine mask pattern was transferred onto the object to be processed by reflecting precisions (heights) of first and second mask layers of the second layered product 2.

Finally, it was verified whether or not the object to be processed can be fabricated. As the second layered product 2(1), the resin mold (hole) was used. That is, the third layered product 3 was fabricated using the second layered product 2(1), and it was determined whether or not the object to be processed can be fabricated by using the third layered product 3.

First, from a surface of the second mask layer side of the third layered product 3, $O_2$ etching (oxygen ashing) was performed to cause the first mask layer to have a fine structure. In a case where the targeted distance lcc is set to 437 nm (0.95 h), the second mask layer was partially disappear before the first mask layer is etched to an interface between the object to be processed and the first mask layer. In a case where the targeted distance lcc was equal to or shorter than 414 nm (0.9 h), it was possible to cause the first mask layer to have a fine structure up to the interface with the object to be processed. From the aforementioned results, it would appear that the second layered product (1) achieves a function when the distance lcc is 9.2 nm or longer and 414 nm or shorter.

In this manner, it is presumed that the first mask layer is anisotropically etched to an interface with the object to be processed because the second mask layer is moved to the side face of the first mask layer and protects the side face of the first mask layer during the oxygen ashing. In practice, it was observed that the second mask layer is attached to the side face of the first mask layer and protects the side wall as the third layered product is fabricated through oxygen etching. It was possible to observe this state by mapping Ti included in the second mask layer using a transmission electron microscope (TEM) and an energy dispersive X-ray spectroscopy method (EDX). The thickness hml of the third layered product 3 was saturated several tens seconds later after the start of the oxygen etching, and the thickness hml of the film was 10 nm or thinner.

Subsequently, in a case where the distance lcc was 9.2 nm or longer and 414 nm or shorter, the object to be processed was etched with a fluorine-based or chlorine-based gas by using the fine mask pattern including the first and second mask layers having a high aspect ratio as a mask. Finally, both the first and second mask layers were eliminated through ashing. The obtained object to be processed was observed using a scanning electron microscope. As a result, a fine pattern having the same pitch as that of the fine pattern of the resin mold was formed on the surface. In addition, in the nanostructure on the obtained sapphire surface, a plurality of convex portions are arranged side by side matching with the arrangement of the fine pattern of the resin mold. A single convex portion has a curved shape in which a side face of the cone is swollen. A shape of the top portion of the convex portion was changed depending on the dry etching treatment time, so that no-flat-top state as well as a flat-top state (table top) was observed.

(g) Calculation of Etching Rate Ratio

An etching rate ratio was calculated for a combination of the first and second mask layers described in the aforementioned investigation and those having the same result as that of the aforementioned investigation. The etching rate ratio was calculated as Vo1/Vm1, where Vo1 denotes an etching rate of the first mask layer, and Vm1 denotes an etching rate of the second mask layer. The first mask layer diluted with PGME or the second mask layer diluted with PGME was formed on a quartz substrate through a spin coat method and was dried at a temperature of 80° C. for 30 minutes. Subsequently, in a case where a photo polymerizable group is included, UV-light was irradiated to perform photo-polymerization. For the obtained sample, etching rates of the first and second mask layers were inferred by changing a mixing ratio between the oxygen gas and the argon gas. Based on the result, the ratio Vo1/Vm1 of etching rates were calculated. As a result, it was possible to obtain a etching selectivity Vo1/Vm1=10, 16, 20, 51, 55, and 80. Meanwhile, a ratio Vo2.Vi2 between the etching rate Vi2 of the object to be processed (sapphire substrate) and the etching rate Vo2 of the first mask layer was also calculated using the chlorine-based gas. As a result, it was possible to obtain etching selectivity Vo2/Vi2 of 2.5, 2.0, 1.7, 1.4, and 0.75

Example 2

(a) Manufacturing of Cylindrical Master (Manufacturing of Template for Resin Mold)

Three types of cylindrical masters were manufactured. The manufacturing method was similar to that of Example 1. A fine pattern having a pitch of 200 nm was formed on the first quartz glass. A fine pattern having a pitch of 460 nm was formed on the second quartz glass. A fine pattern having a pitch of 700 nm was formed on the third quartz glass. The demolding treatment was performed for three types of quartz glass in a similar manner as Example 1. Hereinafter, similar processes were performed for three types of quartz glass.

(b) Manufacturing of Resin Mold

A reel-like resin mold A was obtained in a similar manner as Example 1. This reel-like resin mold A had a length of 200 m and a width of 300 mm. When the first quartz glass is used, as a fine pattern shape of the reel-like resin mold A, a distance between convex portions was 200 nm, and a height was 250 nm. When the second quartz glass was used, a distance between convex portions was 460 nm, and a height was 500 nm. When the third quartz glass was used, a distance between convex portions was 700 nm, and a height was 750 nm.

Then, a plurality of reel-like resin molds B were obtained in a similar manner as Example 1. These reel-like resin molds B had a fine pattern similar to that of the cylindrical master. A length was 200 m, and a width was 300 mm. As a fine pattern shape of the reel-like resin mold B, in the case of the first quartz glass, a distance between concave portions was 200 nm, and an opening width was 180 nm (opening ratio 73%). In the case of the second quartz glass, a distance between concave portions was 460 nm, and an opening width was 430 nm (opening ratio 79%). In the case of the third quartz glass, a distance between concave portions was 700 nm, and an opening width was 650 nm (opening ratio 78%).

Other reel-like resin molds B were also manufactured by changing the manufacturing condition of the cylindrical master. A distance between concave portions was 460 nm, an opening width was 340 nm (opening ratio 50%), 380 nm (opening ratio 62%), and 400 nm (opening ratio 69%).

The ratio Es/Eb between the surface fluorine concentration Es and the average fluorine concentration Eb of the obtained resin mold B was controllable in the range of 40 to 80 depending on amount of DACHP. Hereinafter, regardless of differences of the pitch or the opening width, the resin molds (B) are referred to as a resin mold (hole).

(c) Manufacturing of First Layered Product 1 (Dot)

The first layered product 1 was manufactured using the resin mold (hole) as follows. As the second mask material, the second mask material B used in Example 1 described above was used.

In order to manufacture the first layered product 1, the second mask material was diluted with PGME. The dilution ratio and the coat film thickness were adjusted such that the solid content is reduced in comparison with a volume of the fine pattern. Specifically, the concentration was determined such that the distance lcc becomes 0.3 h. The dilution was performed by dropping PGME on the second mask material and sufficiently agitating it.

Similar to Example 1, the coating of the mask material on the fine pattern formation surface of the resin mold (hole) was performed to manufacture the first layered product 1 (hereinafter, the first layered product 1 will be referred to as a "first layered product 1(2)").

The distances lcc and lcv were measured by observing the cross section of the obtained first layered product 1(2) using a scanning electron microscope and a transmission electron microscope. Regardless of the used fine pattern, the second mask layer was filled in the overall concave portions. The distance lcc was set between 0.2 h to 0.4 h. Meanwhile, it was impossible to observe the distance lcv using a transmission electron microscope. Therefore, it was determined that the second mask layer is not formed on the convex portion, or the distance lcv is equal to or smaller than several nm even if it is formed.

(d) Manufacturing of Third Layered Product 3 Using First Layered Product 1(2) 1

It was confirmed whether or not the third layered product as a layered product consisting of [the second mask layer/the first mask layer/the object to be processed] can be easily manufactured in a large scale by using the first layered product 1(1).

The first layered product 1(2) was reeled out from a roll of the first layered product 1(2) having a length of 200 m, cut and used. As the exterior of the first layered product 1(2), a width was set to 300 mm, and a length was set to 600 mm. The fine pattern formation portion had a width of 250 mm and a length of 600 mm.

The first layered product 1(2) was laminated to the object to be processed by interposing the first mask layer, and light irradiation was performed. As a result, the third layered product 3 as a layered product consisting of [the second mask layer/the first mask layer/the object to be processed] was manufactured. Specifically, the process was performed as follows.

As the first mask layer, the first mask layer A and the first mask layer B was separately used as follows. Since the use method was similar, hereinafter, they will be similarly referred to as a first mask layer. In addition, as the object to be processed, a c-plane sapphire substrate was used.

First Mask Layer A
Solution A=OXT221:CEL2021P:M211B:M309:M313=20 g:80 g:20 g:40 g:40 g.
Solution B=PGME:DTS102:DBA:I.184=300 g:8 g:1 g:5 g.
Solution A:Solution B:PGME=100 g:157 g:200 g.
First Mask Layer B
Photosetting Resin (MUR-XR02, produced by MARUZEN PETROCHEMICAL CO., LTD.)

The particles were removed by cleaning the surface of the object to be processed having a size of 2 inches (φ) using ozone, and a hydrophilic treatment was performed. Subsequently, a spin coat method was performed at a speed of 2000 rpm for the first mask layer A and at a speed of 5000 rpm for the first mask layer B, so that a thin film was formed on the UV-O3 treatment surface of the processing object. Subsequently, the resulting material was disposed on a hot plate at a temperature of 80° C. for 2 minutes to eliminate the solvent.

The second mask layer side surface (fine pattern side surface of the resin mold) of the first layered product 1(2) was laminated to the first mask layer on the object to be processed by applying a pressure of 0.01 MPa using a laminate roll. Here, the first layered product 1(2) having a size of 300 mm×600 mm was laminated to a total of 36 objects to be processed (4×9 array) having the first mask layer.

After the laminating, a pressure of 0.05 MPa was applied from the resin mold, and UV light was irradiated from the resin mold. In a case where the first mask layer A was used, after the UV light irradiation, the resulting material was disposed at a room temperature for 10 minutes. Then, the resin mold was released, and UV light was irradiated.

The obtained layered product consisting of [the second mask layer/the first mask layer/the object to be processed] was observed using a scanning electron microscope. As a result, a configuration consisting of [the second mask layer/the first mask layer/the object to be processed] was observed. In addition, it was also observed that the second mask layer is not arranged in the bottom of the concave portion of the fine pattern made including the first mask layer. From the aforementioned results, it is recognized that the third layered product 3 having the second mask layer having a large total area and no remaining film (or very thin) can be easily formed by using the first layered product 1(2).

Figure 47:
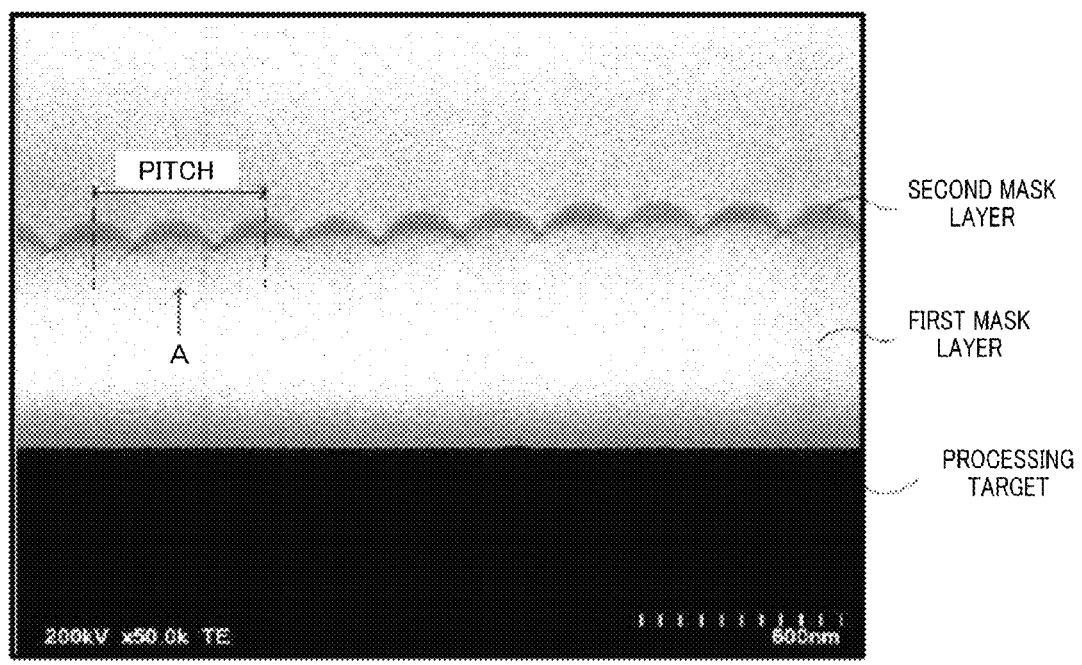
FIG. 47 is a SEM photographic image according to an example of the invention.

FIG. 47 is a cross-sectional transmission electron microscope photographic image illustrating a example of the results. Since it is a transmission electron microscope photographic image, the fine patterns overlap each other in the image. However, as illustrated in FIG. 47, a distance between a certain convex portion and the secondly closest convex portion corresponds to the pitch. That is, the point A in FIG. 47 corresponds to the concave portion. In FIG. 47, the black portion in the bottom corresponds to the object to be processed, and the white portion over the object to be processed corresponds to the first mask layer. In addition, the black portion over the first mask layer corresponds to the second mask layer. Since there is no contrast in the second mask layer in the position of the point A (concave bottom portion), it is recognized that there is no remaining film.

As recognized from FIG. 47, through the cross-sectional observation using the transmission electron microscope, it was recognized, from the contrast difference, that the second mask layer is arranged over the first mask layer, and the second mask layer is not arranged in the concave portion of the nanostructure formed by the first mask layer. In a case where the second mask layer is arranged in the concave portion of the nanostructure formed from the first mask layer, this serves as a remaining film. That is, it was recognized that the second mask layer can be transferred onto the object to be processed by interposing the first mask layer and remove the remaining film using the first layered product 1(2).

(e) Manufacturing of Third Layered Product 3 Using First Layered Product 1(2) 2

It was confirmed whether or not the third layered product 3 as a layered product consisting of [the second mask layer/the first mask layer/the object to be processed] can be easily manufactured in a large scale using the first layered product 1(2). Here, the second layered product 2 was manufactured from the first layered product 1(2), and the third layered product 3 was manufactured by using the obtained second layered product 2.

First, the first layered product 1(2) that has been wound up was reeled out, and the diluted material of the first mask layer was coated on the second mask layer. After eliminating the solvent, the cover film was laminated to obtain the second layered product 2. The second layered product 2 was wound up. Hereinafter, this second layered product will be referred to as a "second layered product (2)". It was recognized, from observation of a scanning electron microscope, that the coating precision of the first mask layer was ±7% with respect to the center film thickness.

The used second layered product (2) was reeled out from a roll of the second layered product 2 having a length of 200 m, cut. and remove the cover film and used. As the exterior, the width was 300 mm, and the length was 600 mm. The fine mask pattern formation portion has a width of 250 mm and a length of 600 mm. The second layered product (2) was laminated (thermocompressive bonding) to the object to be processed, and light irradiation was performed, so that the fine mask pattern was formed on the object to be processed. Specifically, the process was performed as follows.

As the first mask layer, a resin having a carboxyl group was used. This resin contains 50% of an acrylic copolymer as a binder polymer, approximately 40% of a monomer component, and a multifunctional acrylic compound as a crosslinking agent. The material of the first mask layer was diluted with a solvent (MEK and PGME) to obtain a solution containing 12% of the material of the first mask layer. In addition, a sapphire substrate was used as the object to be processed.

The particles were removed by cleaning the surface of the object to be processed having a size of 2 inches ($\phi$) for 10 minutes using UV-O3, and a hydrophilic treatment was performed. Subsequently, the object to be processed was heated at a temperature of 105° C., and the first mask layer side surface of the second layered product (2) was laminated to the object to be processed. Here, the laminating was performed by applying a pressure of 0.01 MPa using a laminate roll from the side surface of the resin mold of the second layered product (2). The second layered product (2) having size of 300 mm×600 mm was laminated to a total of 36 objects to be processed (4×9 array). UV light was irradiated to the obtained layered product after the laminating toward the resin mold with an integral light intensity of 1200 mJ/cm$^2$, and the resin mold was removed.

The obtained layered product consisting of [the second mask layer/the first mask layer/the object to be processed] was observed using a scanning electron microscope. As a result, a configuration consisting of [the second mask layer/the first mask layer/the object to be processed] was observed. In addition, it was recognized that the second mask layer is not arranged in the bottom of the concave portion of the fine pattern made from the first mask layer. Furthermore, the thickness of the first mask layer (distance between an interface between the object to be processed and the first mask layer and the top position of the concavo-convex structure of the first mask layer) was ±8% with respect to the center film thickness. From the aforementioned results, it was recognized that the second mask layer having a large total area and no remaining film (or very thin) can be easily manufactured by using the second layered product (2), and precisions of the first and second mask layers of the second layered product (2) can be reflected on the object to be processed.

Particularly, in a case where a layered product consisting of [the second mask layer/the first mask layer/the object to be processed] is manufactured by interposing the first mask layer using the first layered product 1(2) described above, the thickness of the first mask layer after the transferring has a distribution of ±15% with respect to the center film thickness. From the aforementioned result, it is recognized that the transferring onto the object to be processed can be performed with higher precisions of the first and second mask layers by using the second layered product (2). It would appear that this is because the flow of the first mask layer affects the precisions when the process of laminating to the object to be processed is performed. The obtained layered product consisting of [the second mask layer/the first mask layer/the object to be processed] is a third layered product having a thickness hml of 0 nm. From the aforementioned result, it is recognized that the third layered product having the second mask layer having a large total area and no remaining film (or very thin) can be easily formed by using the second layered product (2), and the thickness precision of the first mask layer can be improved.

Figure 48:
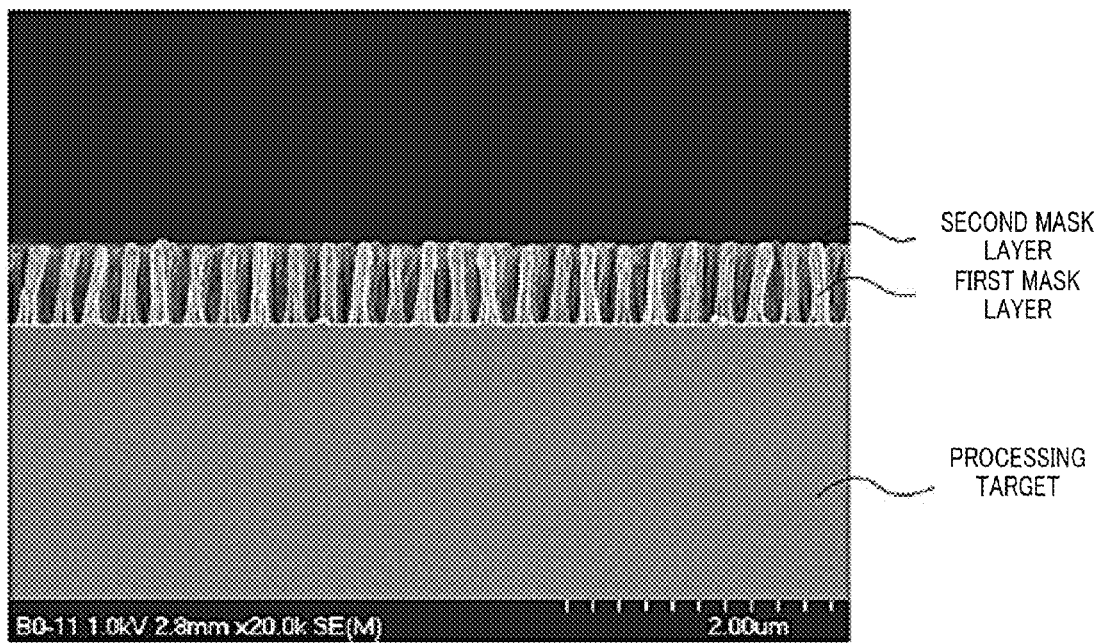
FIG. 48 is a SEM photographic image according to an example of the invention.

Finally, it was verified whether or not the object to be processed can be fabricated using the third layered product 3. First, $O_2$ etching was performed toward a surface of the second mask layer side to nanostructure the first mask layer. Through the cross-sectional scanning electron microscope observation, it was recognized that the first mask layer can be nanostructured to the interface with the object to be processed. A representative example is illustrated in FIG. 48. As illustrated in FIG. 48, it is recognized that the fine mask pattern having a high aspect ratio (fine pattern including the first and second mask layers) is formed on the object to be processed. In addition, it was recognized, from the TEM-EDX and XPS measurement, that the second mask layer exists over the first mask layer.

Through the cross-sectional scanning electron microscope observation, it was recognized that the first mask layer is removed to the interface between the object to be processed and the first mask layer, and the fine mask pattern (fine-patterned first and second mask layers) having a high aspect ratio is formed with an interval corresponding to the pitch of the resin mold on the object to be processed. Furthermore, through the transmission electron microscope and the energy dispersive X-ray spectroscopy method, it was determined that the second mask layer exists on the top portion of the first mask layer.

In this manner, it is assumed that the first mask layer can be anisotropically etched to the interface with the object to be processed because the second mask layer moves to the side face of the first mask layer during the oxygen ashing, so as to protect the side face of the first mask layer. In practice, it was observed that the second mask layer is attached to the side face of the first mask layer as the oxygen etching is performed for the third layered product 3, so as to protect the side face. It was possible to observe this state by mapping titanium (Ti) contained in the second mask layer along with the transmission electron microscope (TEM) and energy dispersive X-ray spectroscopy (EDX) method. The thickness hml of the third layered product was saturated within several tens seconds after oxygen etching starts, and the thickness hml was 10 nm or smaller.

Finally, the object to be processed was etched with a fluorine-based or chlorine-based gas by using the first and second mask layers fine-patterned through oxygen ashing as a mask. In addition, in a case where the first mask layer A is used, the etching was performed by adding an argon gas to the chlorine-based gas. Finally, the overall first and second mask layers were removed through oxygen ashing. The obtained object to be processed was observed using a scanning electron microscope. As a result, it was recognized that a fine pattern having the same pitch as that of the fine pattern of the resin mold was formed.

In addition, in the nanostructure on the obtained sapphire surface, a plurality of convex portions are arranged side by side matching with the arrangement of the fine pattern of the resin mold. A single convex portion has a curved shape in which a side face of the cone is swollen. A ratio $\phi/P$ between the pitch P and the diameter $\phi$ of the bottom of the convex portion was 0.4 to 0.6. In addition, a shape of the top portion of the convex portion was changed depending on the dry etching treatment time, so that no-flat-top state as well as a flat-top state (table top) was observed.

Comparative Example 1

A first layered product 1(a) having a thick remaining film was manufactured using the second mask material C described above and the resin mold (hole).

The mask material C was diluted with PGME. The dilution rate was determined such that the amount of the mask material (solid content) contained in the coated film on unit planar area is sufficiently larger than a volume of the fine pattern of the resin mold (hole). The dilution concentration and the coat film thickness were determined such that the film thickness after removing the solvent (distance between the top position of the convex portion of the concavo-convex structure of the resin mold and the surface of the solid content in a material of the formed mask layer) becomes 100 nm.

The coating of the mask material C for the fine pattern formation surface of the resin mold (hole) was performed using the same apparatus as that of the manufacturing of the resin mold. Using the Micro Gravure Coating, the diluted mask material C was coated on the fine pattern formation surface of the resin mold (hole), and the resulting material was passed through a dry atmosphere at a temperature of 80° C. Then, the cover film was laminated, and then, the first layered product 1(a) was wound up.

The cross section of the obtained first layered product 1(a) was observed using a scanning electron microscope. As a result, the remaining film thickness (distance lcv) was 90 nm. That is, the second mask layer was provided to fill the entire concavo-convex structure of the resin mold. Since the resin mold (hole) has a height of 460 (h=460 nm), the first layered product 1(a) did not satisfy the condition 0≤distance lcv≤0.05 h.

The first layered product 1(a) having the remaining film was cut from a roll of the first layered product 1(a) having a length of 200 m and used. As the exterior, the width was set to 300 mm, and the length was set to 600 mm. The fine mask pattern formation portion has a width of 250 mm and a length of 600 mm. The layered product for fine pattern formation was laminated to the object to be processed by interposing the first mask layer A, and light irradiation was performed, so that the fine mask pattern was formed on the object to be processed. Specifically, the process was performed as follows. A sapphire substrate was used as the object to be processed.

UV-O3 cleaning was performed for the surface of the object to processed having a size of 2 inches ($\phi$) for 10 minutes to remove particles, and a hydrophilic treatment was applied. Subsequently, the material of the first mask layer A was diluted with a solvent (PGME, MIBK, or cyclohexane), and a spin coat method was performed at a speed of 2000 rpm to form a thin film on an ozone treatment surface of the object to processed. Subsequently, the resulting material was disposed on a hot plate at a temperature of 80° C. for 2 minutes. Then, the resulting member was disposed on a hot plate at a temperature of 120° C. for 2 minutes, and the solvent was eliminated.

The second mask layer side surface (fine pattern side surface of the resin mold) of the first layered product 1(a) was laminated to the first mask layer on the object to be processed by applying a pressure of 0.01 MPa using a laminate roll. Here, the first layered product 1(a) having a size of 300 mm×600 mm was laminated to a total of 36 objects to be processed (4×9 array) having the first mask layer.

In addition, in the process of laminating the first layered product 1(a) to the first mask layer on the object to be processed, a lot of voids that not observed in the first layered product 1(1) and the first layered product 1(2) according to Examples 1 and 2, in which the second mask layer is arranged only in the concave portion, were observed. It would appear that this is because the thickness of the second mask layer was set to be greater than the distance lcv, so that the hardness of the first layered product 1(a) was improved. In addition, since the second mask layer component contains an inorganic content at a predetermined composition, a crack was also observed as a bulk thin film was formed.

While a pressure of 0.05 MPa was applied from the resin mold, UV light was irradiated to the obtained layered product toward the resin mold with an integral light intensity of 1200 mJ/cm². After the UV light irradiation, the resulting member was disposed at a room temperature for 10 minutes. Subsequently, the resulting member was heated in an oven at a temperature of 105° C. for 1.5 minutes to remove the resin mold. After removing the resin mold, UV light was irradiated again.

The fine pattern side surface of the obtained object to be processed was observed using a scanning electron microscope. As a result, a configuration consisting of [the second mask layer/the first mask layer/the object to be processed] was observed. In addition, no fine pattern was observed in an interface between the first and second mask layers. A distance between the interface between the first and second mask layers and the top position of the convex portion of the concavo-convex structure including the second mask layer was 90 nm.

Subsequently, oxygen etching of the obtained layered product was performed toward the surface of the second mask layer of the obtained layered product. The etching was performed to remove the remaining film of the second mask layer (having a thickness of 90 nm) and subsequently fabricate the first mask layer. Etching was performed up to the interface between the first mask layer and the object to be processed, and the cross section thereof was observed using a scanning electron microscope. As a result, a volume of the second mask layer was reduced through the remaining film treatment, so that, accordingly, the width of the first mask layer was reduced, and the height was lowered. The height was lowered because the second mask layer was disappeared in the middle of the process, and the subsequent etching of the first mask layer was performed with a low anisotropic aspect ratio. Subsequently, dry etching of the object to be processed was tried using the chlorine-based gas. However, since the fine pattern (including the first and second mask layers) formed on the object to be processed has a thin thickness and a small width, it was difficult to fabricate the object to be processed.

Example 3

(a) Manufacturing of Cylindrical Master
(Manufacturing of Template for Resin Mold)

A cylindrical master having a hole-configuration fine pattern having a pitch of 200 nm and a cylindrical master having a hole-configuration fine pattern having a pitch of 460 nm were manufactured in a similar manner as Example 1.

(b) Manufacturing of Resin Mold A

A reel-like resin mold A (having a length of 200 m and a width of 300 mm) having a transferred fine pattern on a surface was obtained in a similar manner as Example 1. The ratio Es/Eb between the surface fluorine concentration Es and the average fluorine concentration Eb of the obtained resin mold A was controllable between 40 and 80 depending on amount of DACHP.

(c) Manufacturing of Resin Mold B

A plurality of reel-like resin molds B (having a length of 200 m and a width of 300 mm) having the same fine pattern as that of the cylindrical master having a transferred fine pattern on a surface were obtained in a similar manner as Example 1. The ratio Es/Eb between the surface fluorine concentration Es and the average fluorine concentration Eb of the obtained resin mold B was controllable between 35 and 75 depending on amount of DACHP. The structure of the obtained resin mold B and the ratio Es/Eb are represented in the following Table 1.

TABLE 1

| Resin Mold | Type | Structure | Es/Eb |
|---|---|---|---|
| (B) | Concave(hole) | pitch; 200 nm, depth; 200 nm, openning diameter; 180 nm pitch; 460 nm, depth; 460 nm, openning diameter; 430 nm | 35 to 37 |

Hereinafter, in the manufacturing of the first layered product 1 and the test to investigate the use thereof, a resin mold shown in Table 2 described below was used as the resin mold B. Since they are used using a similar method, they are collectively referred to as a resin mold regardless of a structure and the like thereof.

TABLE 2

| Resin Mold | Type | Structure | Es/Eb |
|---|---|---|---|
| (B) | Concave(hole) | pitch; 200 nm, height; 200 nm, openning diameter; 180 nm | 55 |
|  |  |  | 49 |
|  |  |  | 74 |
|  |  | pitch; 460 nm, depth; 460 nm, openning diameter; 430 nm | 68 |
|  |  |  | 49 |
|  |  |  | 43 |

(d) Manufacturing of Second Layered Product 2(3) Using First Layered Product 1(3)

The following two materials were used as the second mask material.
Second Mask Material D: a mixture of TTB, DEDFS, SH710, 3APTMS, M211B, M101A, M350, I.184, and I.369 with a mixing ratio of 170 g:50 g:40 g:60 g:40 g:40 g:20 g:11 g:4 g.
Second Mask Material E: 50 parts by weight of DACHP was added with respect to 100 parts by weight of Material 1.
Subsequently, the second mask materials D and E were diluted with a PGME solvent, and the resulting material was used as a coating material of the resin mold B.

The coating of the mask material on the fine pattern formation surface of the resin mold B was performed using the same apparatus as that of manufacturing of the resin mold. Using the Micro Gravure Coating, the diluted second mask material was coated on the fine pattern formation surface of the resin mold B, and the resulting material was passed through a dry atmosphere at a temperature of 80° C. Then, the cover film was laminated, and the resulting member was wound up, so that a first layered product 1(3) was manufactured.

Figure 49A:
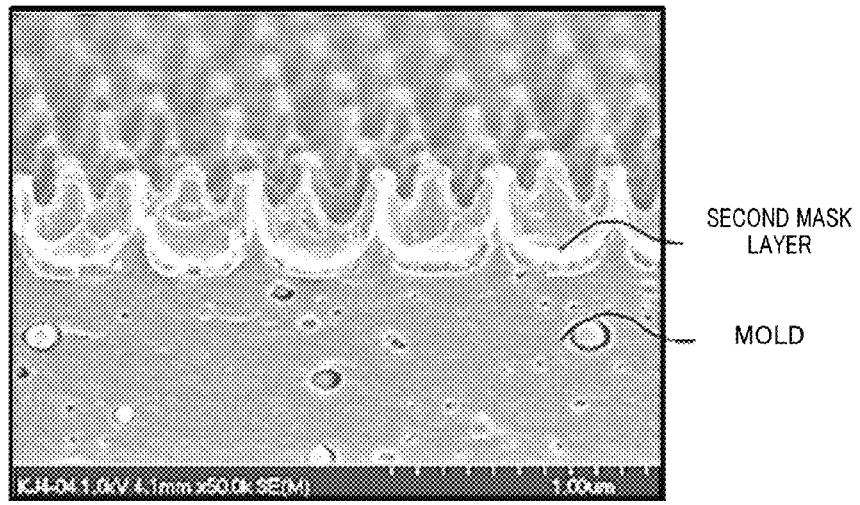
FIGS. 49A to 49C are SEM photographic images according to an example of the invention.
Figure 49B:
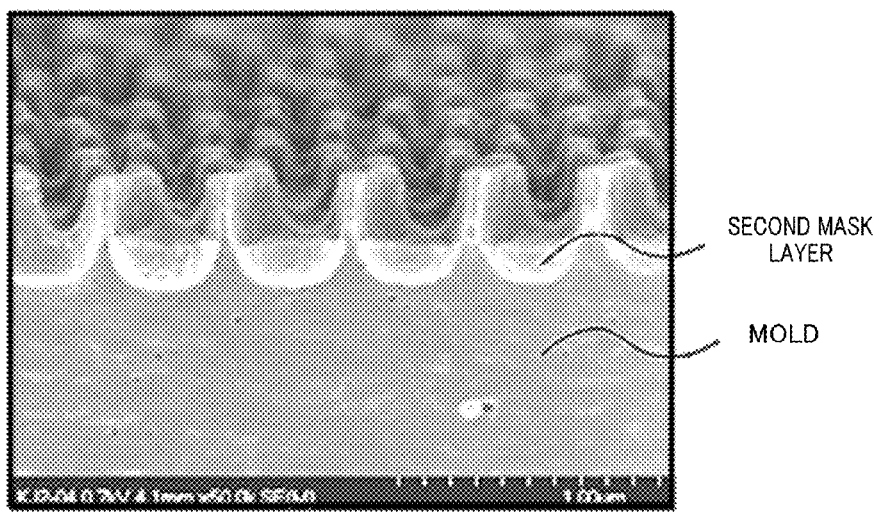
Figure 49C:
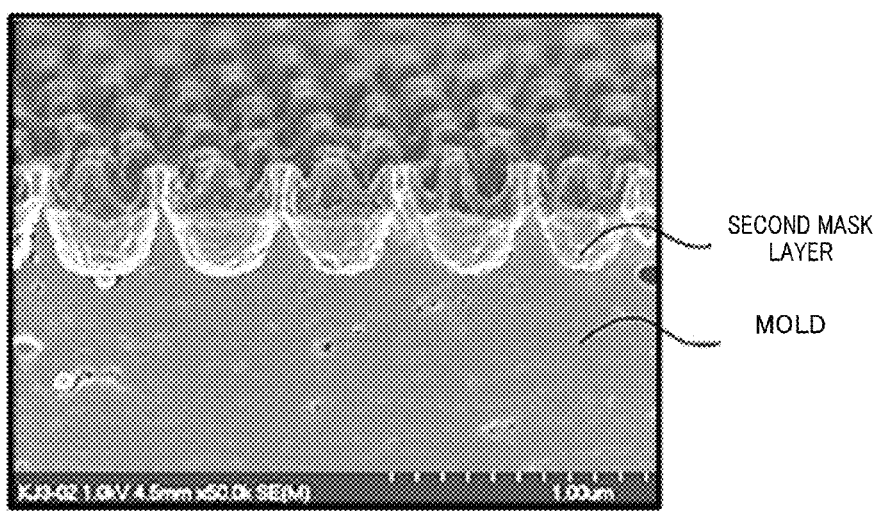

The cross section of the obtained first layered product 1 was observed using a scanning electron microscope and a transmission electron microscope by excluding the cover film (protection layer) to measure the distances lcc and lcv. FIGS. 49A to 49C are scanning electron microscope photographic images illustrating a result when the pitch is set to 460 nm. A filling ratio of the second mask layer is different in three images of FIGS. 49A to 49C.

By observing the cross section using a scanning electron microscope, it was recognized that the second mask layer is filled in the concave portion of the resin mold, and that the filling amount of the second mask layer can be controlled by changing a dilution concentration of the second mask material. In addition, it was observed that there is no second mask layer on the convex portion of the resin mold through a transmission electron microscope and an energy dispersive X-ray spectroscopy method. The distance lcc was calculated based on the scanning electron microscope photographic image. The result is shown in Table 3. In addition, the distance lcv was measured using a transmission electron microscope and an energy dispersive X-ray spectroscopy method. However, as a result, it was concluded that the distance lcv was equal to or lower than a resolution (indicated as →0).

TABLE 3

| Figure Number | lcc | lcv |
|---|---|---|
| FIG. 49A | 0.86 h | →0 |
| FIG. 49B | 0.70 h | →0 |
| FIG. 49C | 0.48 h | →0 |

Meanwhile, in a case where the distance lcc is smaller than zero, that is, in a case where a volume of the second mask layer is larger than a volume of the concave portion of the resin mold, Repelling the diluted second mask material on the surface of the resin mold was observed simultaneously with the coating, and an uneven coating of the second mask layer was observed.

Subsequently, the second layered product 2(3) was manufactured by forming a dry film resist (first mask layer) on the first layered product 1(3). As the dry film resist, an acrylate monomer and a photo-polymerization initiator were added to a benzyl-based acrylic polymer. A material of the dry film resist was diluted with PGME and MEK with a concentration of 25%, and a film was formed using the same apparatus as that used to manufacture the resin mold B on the fine pattern formation surface of the second layered product 2(3). After forming a film, the solvent was volatilized at a room temperature atmosphere, the cover film was laminated, and the resulting member was wound up.

Figure 50A:
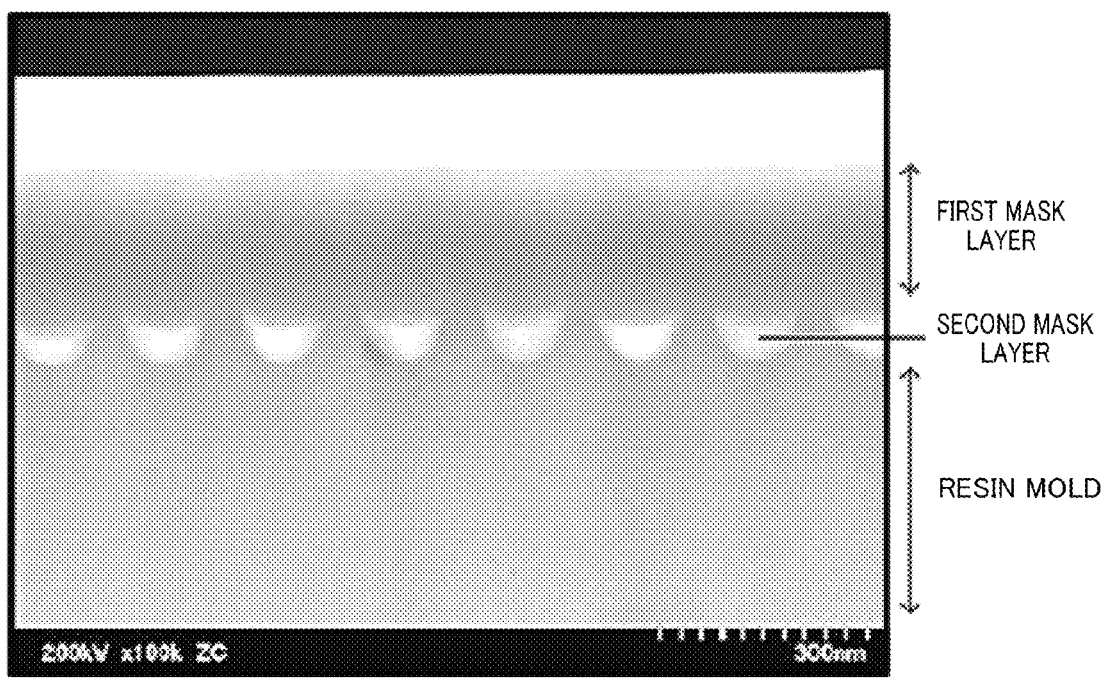
FIGS. 50A and 50B are SEM photographic images according to an example of the invention.
Figure 50B:
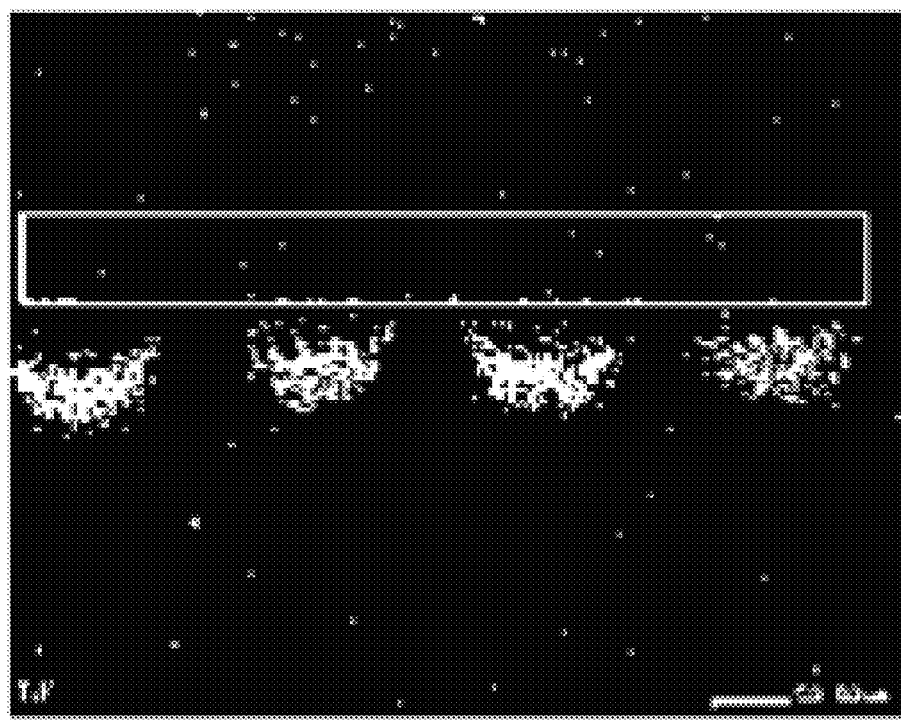

The obtained second layered product 2(3) was observed using a transmission electron microscope by removing the cover film (protection layer). A result thereof is illustrated in FIGS. 50A and 50B, in which the pitch is set to 460 nm. FIG. 50A illustrates a transmission electron microscope photographic image, and FIG. 50B illustrates an EDX mapping image of a transmission electron microscope. In FIG. 50B, white falcate isolated portions correspond to titanium (Ti) contained in the mask material. Since the distance lcv is equal to or shorter than an EDX resolution (→0), it is recognized that the mask material exists only in the concave portion of the resin mold, and the dry film resist (first mask layer) covers the top of the fine structure.

The cross section was observed using a transmission electron microscope. As a result, it was recognized, from the contrast difference, that the second mask layer is arranged in the concave portion of the resin mold, and the dry film resist (first mask layer) is formed to cover both the second mask layer and the concavo-convex structure of the resin mold. The shape of the filled second mask layer reflects the shape of the concave portion of the resin mold. In addition, by additionally using an energy dispersive X-ray spectroscopy method, it was recognized that there was no second mask layer on the convex portion of the resin mold, and the titanium component (Ti) of the second mask layer did not dispersively move in the first mask layer.

(e) Manufacturing of Third Layered Product 3(3) Using First Layered Product 1(3)

Fabrication of the object to be processed (sapphire substrate) was tried using the manufactured first layered product 1(3). In a case where the first layered product 1(3) was used, the first layered product 1(3) and the sapphire substrate were laminated to each other by interposing a photosetting resin (MUR-XR02 series, produced by MARUZEN PETROCHEMICAL CO., LTD.) as the first mask layer. Meanwhile, in a case where the second layered product 2(3) was used, the second layered product 2(3) and the sapphire substrate were (thermocompressively) laminated to each other by interposing a dry film resist (first mask layer).

In a case where the first layered product 1(3) was used, specifically, investigation was performed as follows. First, the first mask layer was formed on the c-plane sapphire substrate having a size of 2 inches (ϕ) through a spin coat method at a speed of 5,000 rpm. A total of 30 sapphire substrates (3×10, horizontally 3 and vertically 10) were arranged side by side, and the fine pattern formation surface of the first layered product 1(3) was laminated on a surface of the first mask layer. Here, the laminating was performed with a pressure of 0.01 MPa using a laminate roll. After the laminating, a pressure of 0.05 MPa was additionally applied from the resin mold for 3 minutes by interposing a rubber plate, and subsequently, UV light was irradiated from the resin mold with an integral light intensity of 1200 mJ/cm$^2$. After the light irradiation, the resin mold was released, and UV light was irradiated again with an integral light intensity of 1000 mJ/cm$^2$.

In a case where the second layered product (2) was used, specifically, investigation was performed as follows. First, a total of 30 c-plane sapphire substrates (3×10, horizontally 3 and vertically 10) having a size of 2 inches (ϕ) were arranged side by side on a hot plate at a temperature of 90° C. Subsequently, the dry film resist (first mask layer) layer side surface was laminated on a surface of the sapphire substrate with a pressure of 0.01 MPa using a laminate roll. Subsequently, under a room temperature, UV light was irradiated from the resin mold with an integral light intensity of 1200 mJ/cm$^2$, and the resin mold was released. Finally, UV light was irradiated again with an integral light intensity of 1000 mJ/cm$^2$.

Figure 51A:
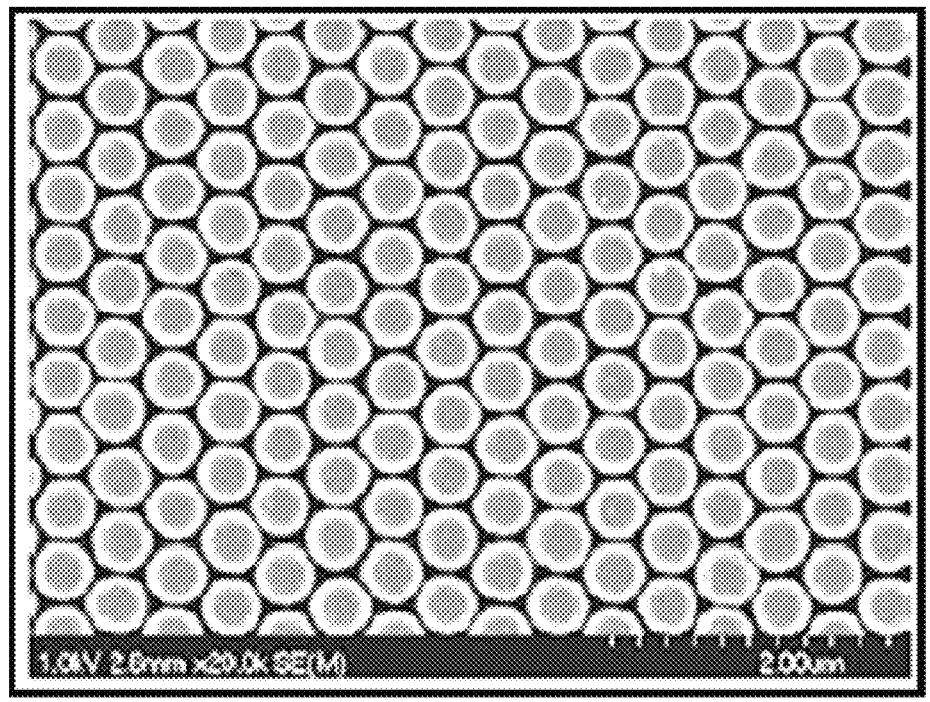
FIGS. 51A and 51B are SEM photographic images according to an example of the invention.
Figure 51B:
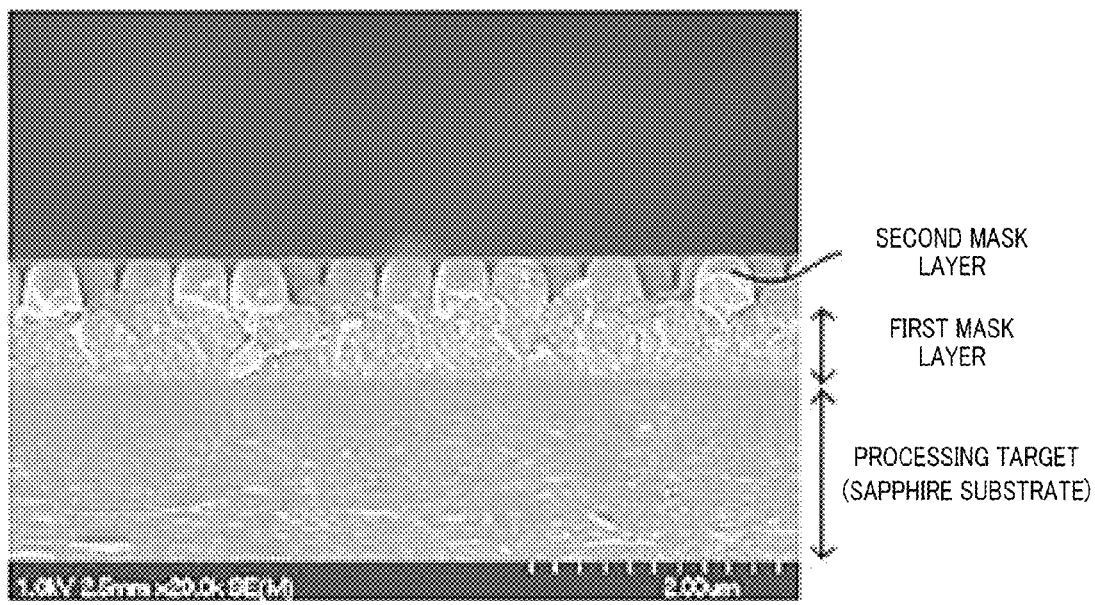

FIGS. 51A and 51B are scanning electron microscope photographic images illustrating a result of the layered product consisting of [the second mask layer/the first mask layer/the object to be processed (sapphire substrate)] with a pitch of 460 nm using the first layered product 1(2). FIG. 51A is a photographic image observed immediately above the fine structure, and FIG. 51B is a photographic image observed in a cross-sectional direction. From the aforementioned description, it is recognized that a fine structure including the second mask layer is orderly transferred onto the object to be processed (sapphire substrate).

In a case where the first layered product 1(3) was used, the fine mask pattern formation surface of the obtained object to be processed was observed using a scanning electron microscope. As a result, a structure corresponding to a transfer shape of the concavo-convex structure of the resin mold was recognized. In addition, by observing a cross section using a scanning electron microscope, it was recognized that the second mask layer of the first layered product 1(3) was transferred because the depth of the concavo-convex structure of the resin mold was equal to the height of the transferred nanostructure.

Figure 52A:
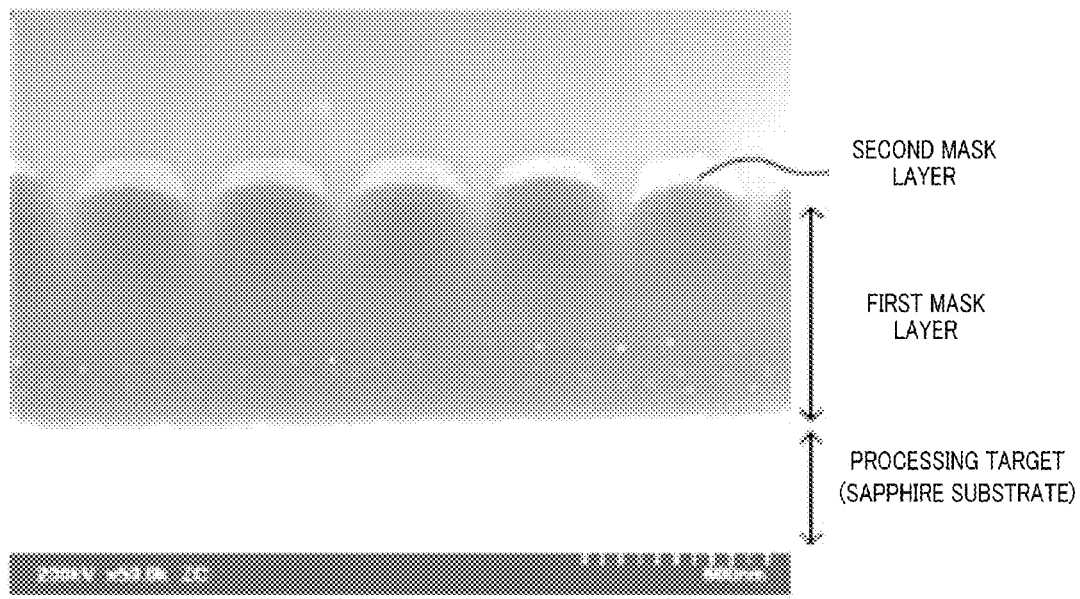
FIGS. 52A and 52B are SEM photographic images according to an example of the invention.
Figure 52B:
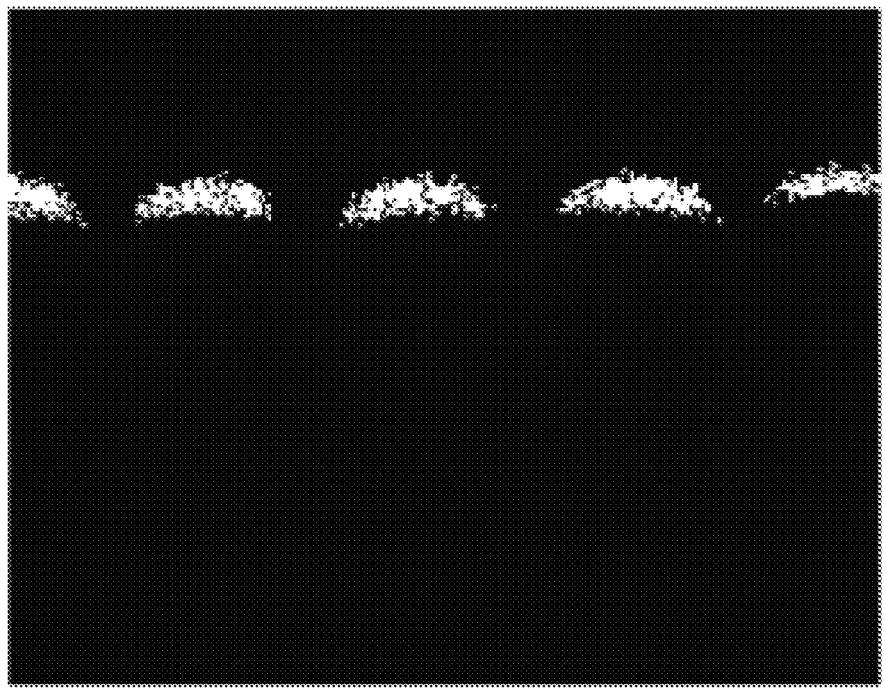

FIGS. 52A and 52B are transmission electron microscope photographic images illustrating a result of the pitch of 460 nm when the second layered product 2(3) was used. FIG. 52A is a transmission electron microscope photographic image observed in a cross-sectional direction, and FIG. 52B is an EDX mapping image of FIG. 52A. The white portions in FIG. 52B correspond to the second mask layer. From the aforementioned description, it is recognized that the second mask layer is transferred only on top of the convex portion of the fine structure.

In a case where the second layered product 2(3) was used, the fine mask pattern formation surface of the obtained object to be processed was observed using a scanning electron microscope. As a result, a structure corresponding to a transfer shape of the concavo-convex structure of the resin mold was recognized. In addition, by observing a cross section using a scanning electron microscope, it was recognized that the second mask layer of the second layered product 2(3) was transferred because the depth of the concavo-convex structure of the resin mold was equal to the height of the transferred nanostructure. Furthermore, by observing a cross section using both a transmission electron microscope and an energy dispersive X-ray spectroscopy method, it was recognized that the second mask layer was formed only on top of the convex portion of the nanostructure formed using the first mask layer.

Furthermore, a distance to the top position of the convex portion of the transferred nanostructure from the interface between the object to be processed and the first mask layer was measured, and a distribution thereof was measured. In a case where the first layered product 1(3) was used, there was a fluctuation of ±20% with respect to the center thickness in a plane. However, in a case where the second layered product 2(3) was used, a thickness distribution of ±7.5% was observed with respect to the center thickness in a plane. From the aforementioned description, it was recognized that precisions of the first and second mask layers of the second layered product 2(3) can be reflected on the object to be processed. It would appear that this is because a flow of the first mask layer affects the precision when the laminating to the object to be processed is performed. Therefore, it was recognized that the third layered product 3 having the second mask layer having a large total area and no remaining film (or very thin) can be easily formed using the second layered product 2(3), and the thickness precision of the first mask layer can be further improved.

Figure 53A:
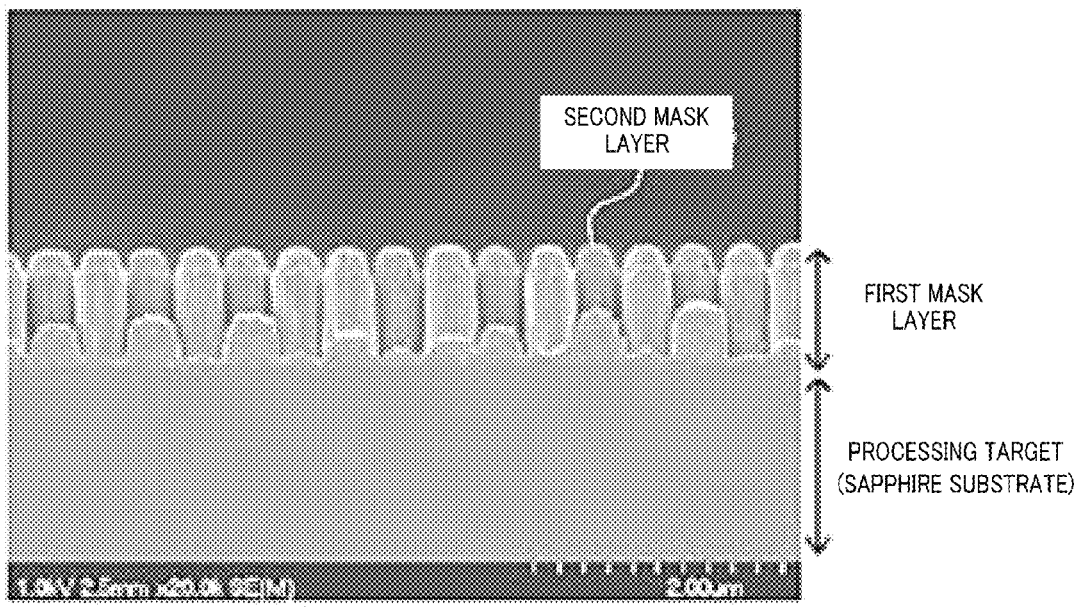
FIGS. 53A and 53B are SEM photographic images according to an example of the invention.
Figure 53B:
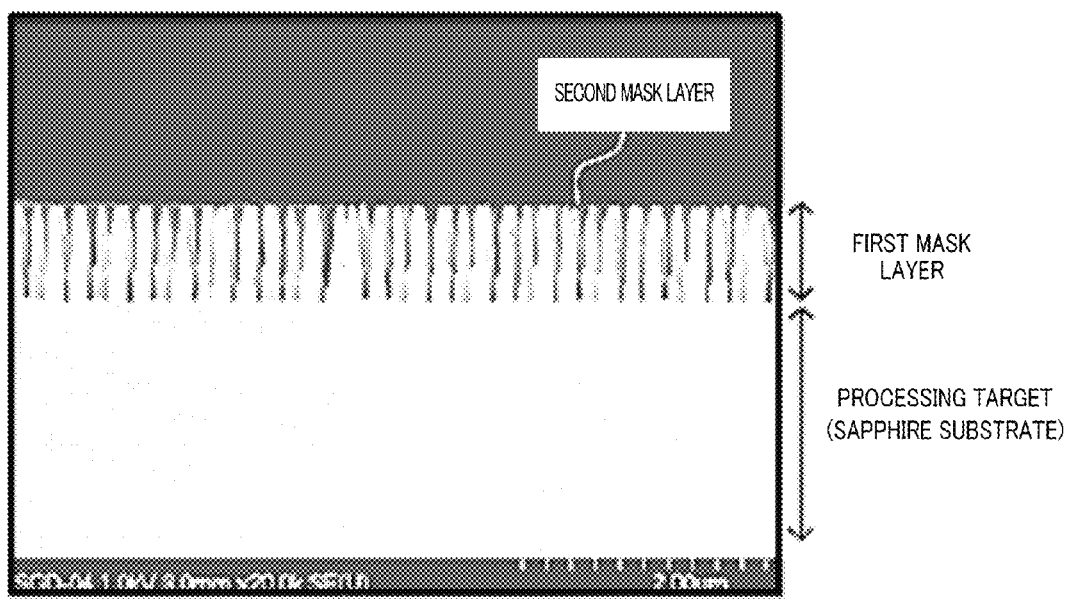

Subsequently, oxygen ashing was performed for the first mask layer through dry etching. The condition of the oxygen ashing was controlled so as to reach the sapphire substrate. FIGS. 53A and 53B are scanning electron microscope photographic images in a case where the first layered product 1 and the second mask material E were used. FIG. 53A corresponds to a case where the pitch is set to 460 nm, and the FIG. 53B corresponds to a case where the pitch is set to 200 nm. In any pitch, it is recognized that the fine mask pattern is formed on the sapphire with a high aspect ratio.

By observing a cross section using a scanning electron microscope, it was recognized that the first mask layer was removed up to the interface with the object to be processed, and a fine mask pattern (fine-patterned first and second mask layers) having a high aspect ratio was formed with an interval corresponding to the pitch of the resin mold on the object to be processed. In addition, it was determined that the second mask layer exists in the top portion of the first mask layer through a transmission electron microscope and an energy dispersive X-ray spectroscopy method.

In a case where the oxygen ashing is not performed for the third layered product 3 obtained by using the first layered products 1(3) having distances lcc of 0.86 h, 0.70 h, and 0.48 h shown in Table 3, the thickness ratio hmv/h0 was 0.16, 0.43, and 1.08, respectively. In addition, the thickness hml was 0 nm for overall distances. By performing the oxygen ashing, the first mask layer was fine-patterned. Accordingly, components in the second mask layer were attached to a side wall of the fabricated first mask layer. This means that the thickness hml has been changed from 0 nm to a finite value. Through observation using a transmission electron microscope and an energy dispersive X-ray spectroscopy method, it was observed that the thickness hml was equal to or smaller than 10 nm during the oxygen ashing.

Finally, the sapphire was fabricated with a chlorine-based gas using the formed fine mask pattern. That is, sapphire fabrication was tested using the third layered product 3 manufactured by the first or second layered products 1(3) or 2(3). The plasma etching condition for fabricating the sapphire substrate was set such that only a $BCl_3$ gas or a mixed gas of $BCl_3$ and $Cl_2$ or Ar obtained by setting the ratio of gas flow rates to 90 ccm:10 sccm to 85 sccm:15 sccm was used, a processing pressure was set in the range of 0.1 to 6.5 Pa, and the inductively coupled plasma RIE apparatus was used.

Figure 54:
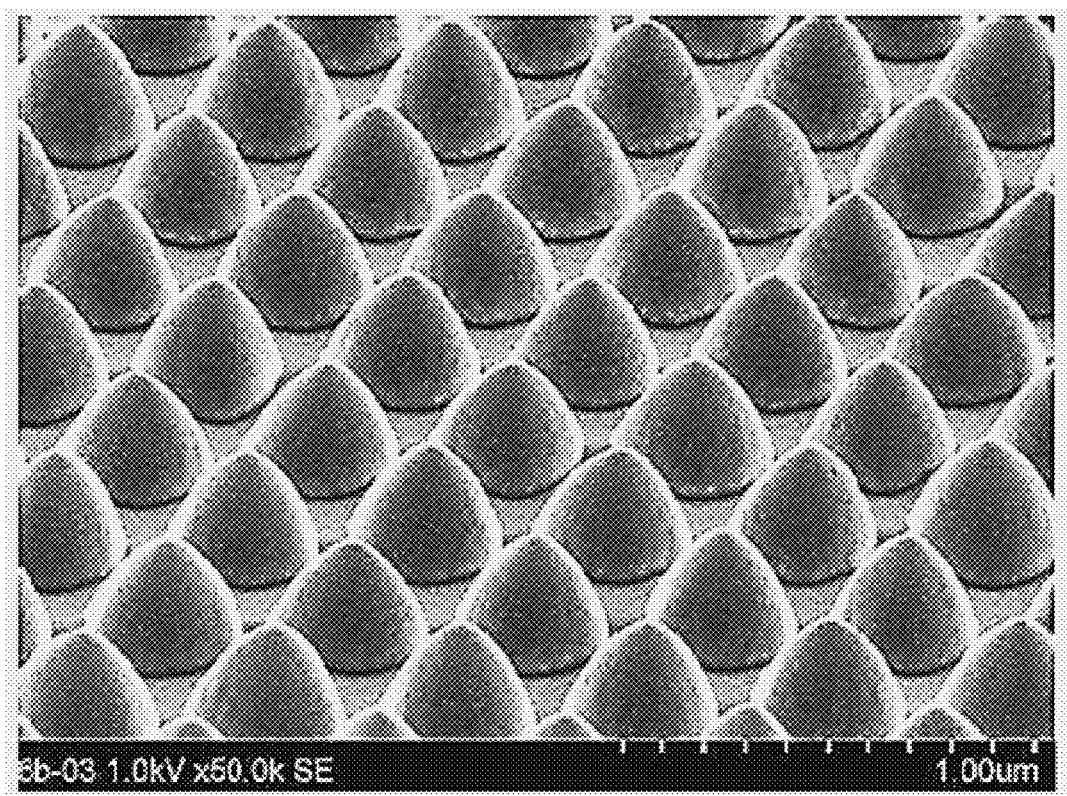
FIG. 54 is a SEM photographic image according to an example of the invention.

After the dry etching using a chlorine gas, the remnant (first mask layer) was rinsed by using a mixed solution of a sulfuric acid and oxygenated water. FIG. 54 is a scanning electron microscope photographic image observed from a cross section in a case where the pitch is set to 460 nm. As illustrated in FIG. 54, it is recognized that a fine pattern is formed on a surface of the object to be processed (sapphire substrate).

A surface of the obtained object to be processed was observed using a scanning electron microscope. As a result, it was recognized that a nanostructure was formed with an interval corresponding to the pitch of the nanostructure of the mold on a surface of the object to be processed. The shape of the formed nanostructure was a conical convex portion. The inclination side of the cone was swollen in a convex shape. Furthermore, there was no table top (face) on top of the convex portion.

A deviation of the nanostructure in the surface of the object to be processed was more improved in a case where the second layered product 2(3) was used. It would appear that this is because the transferring to the object to be processed can be performed with higher precisions of the first and second mask layers by using the second layered product 2(3).

From the result described above, the distance lcv was equal to or shorter than a resolution (lcv→0), and the distance lcc was 0.85 h to 0.05 h. In a case where the distance lcc is zero or negative, a remaining film thickness unevenness caused by an uneven coating of the second mask material was observed. In order to absorb this remaining film thickness unevenness, it is necessary to perform over-etching in the oxygen ashing. For this reason, it was observed that the height (aspect ratio) of the fine pattern consisting of [the second mask layer and the first mask layer] tends to decrease.

Example 4

(a) Manufacturing of Cylindrical Master (Manufacturing of Template for Resin Mold)

A cylindrical master having a hole-configuration fine pattern having a pitch of 460 nm and a cylindrical master having a hole-configuration fine pattern having a pitch of 700 nm were manufactured in a similar manner as Example 1.

(b) Manufacturing of Reel-Like Resin Mold A

As a hardening resin composition, the following transfer materials 1 to 3 were used.
Transfer Material 1: DACHP, M350, I.184, and I.369 was mixed with a mixing ratio of X g:100 g:5.5 g:2.0 g. DACHP was added by 10 to 20 parts by weight.
Transfer Material 2: M309, M350, silicone diacrylate, I.184, and I.369 was mixed with a mixing ratio of 20 g:80 g:1.5 g:5.5 g:2.0 g. As the silicone diacrylate, EBE-CRYL350 produced by DAICEL-CYTEC Company LTD. was used.
Transfer Material 3: DACHP, M350, I.184, and I.369 was mixed with a mixing ratio of Y g:100 g:5.5 g:2.0 g. DACHP was added by 0.5 to 2 parts by weight.

In addition, in the process of manufacturing the resin mold B from the resin mold A described below, the resin mold B was manufactured for each of the transfer materials 1 to 3 by using the resin mold A manufactured using the transfer material 1 as a template. Although description will be made for a method of manufacturing the resin mold A, the same process was separately performed for each of the transfer materials 1 to 3. Therefore, the transfer materials 1 to 3 will be collectively referred to as a transfer material.

A reel-like resin mold A (having a length of 200 m and a width of 300 mm) having a transferred fine pattern on a surface was obtained in a similar manner as Example 1 except that the integral light intensity was changed to 1000 mJ/cm$^2$.

(c) Manufacturing of Resin Mold B

In the process of manufacturing the resin mold B, the reel-like resin mold B was manufactured by using a reel-like resin mold A manufactured using the transfer material 1 (X=15) as a template and by using each of the transfer materials 1 to 3 as a transfer material.

A plurality of reel-like resin molds B (having a length of 200 m and a width of 300 mm) having the same fine pattern as that of the cylindrical master having a transferred fine pattern on a surface were obtained in a similar manner as Example 1 except that the transfer material 1 was used instead of the hardening resin composition of Example 1, and the integral light intensity was changed to 1000 mJ/cm$^2$.

(d) Metal Layer and Mold-Releasing Layer

A metal layer as follows (metal oxide layer) 2-1 or 2-2 was formed on the fine pattern of the resin mold. Furthermore, a mold-releasing layer 2-1 or 2-2 was formed thereon, so that a mold was manufactured.

Metal Layer 2-1: SiO$_2$ and Cr were sequentially sputtered on a surface of the fine pattern of the resin mold up to a thickness of 10 nm.

Metal Layer 2-2: SiO$_2$ were sputtered on a surface of the fine pattern of the resin mold up to a thickness of 10 nm.

layer, the mold-releasing layer, or the like was formed, to further fabricate the nanostructure of the resin mold until the opening ratio becomes 80% or higher, which was used. The obtained resin molds A and B were summarized as in the following Table 4.

TABLE 4

| Name of Template | Transfer Type | Material/ Substrate | Structure | Mold-removing Layer | Tickness [nm] of Mold-removing Layer | Es/Eb | 2nd Mask Material | Openning Ratio |
|---|---|---|---|---|---|---|---|---|
| Resin Mold (A) | Convex (dot) | (1) | pitch; 700 nm, height; 680 nm | — | — | 45 | (F) | >80% |
| | | | pitch; 460 nm, height; 460 nm | — | — | 46 | (F) | |
| | | (2) | pitch; 700 nm, height; 680 nm | — | — | — | (G) | |
| | | | | Durasurf 1101Z/SiO2 | <5 | →∞ | (F) | |
| | | | | Durasurf 2101Z/Cr/SiO2 | <5 | →∞ | (F) | |
| | | | pitch; 460 nm, height; 460 nm | — | — | — | (G) | |
| | | | | PDMS/Cr/SiO2 | — | — | (F) | |
| | | | | PDMS/SiO2 | — | — | (F) | |
| | | (3) | pitch; 700 nm, height; 680 nm | Durasurf 1101Z/SiO2 | <5 | / | (F) | |
| | | | | Durasurf2010Z/Cr/SiO2 | <5 | / | (F) | |
| | | | pitch; 460 nm, height; 460 nm | PDMS/Cr/SiO2 | — | →0 | (F) | |
| | | | | — | — | 380 | (F) | |
| Resin Mold (B) | Concave (hole) | (1) | pitch; 700 nm, depth; 680 nm, openning diameter; 650 nm | — | — | 43 | (F) | 78% |
| | | | pitch; 460 nm, depth; 460 nm, openning diameter; 430 nm | — | — | 49 | (F) | 79% |
| | | (2) | pitch; 700 nm, depth; 680 nm, openning diameter 650 nm | — | — | — | (G) | 78% |
| | | | | Durasurf 1101Z/SiO2 | <5 | →∞ | (F) | |
| | | | | Durasurf 2101Z/Cr/SiO2 | <5 | →∞ | (F) | |
| | | | pitch; 460 nm, depth; 460 nm, openning diameter 430 nm | — | — | — | (G) | 79% |
| | | | | PDMS/Cr/SiO2 | — | — | (F) | |
| | | | | PDMS/SiO2 | — | — | (F) | |
| | | (3) | pitch; 700 nm, depth; 680 nm, openning diameter; 650 nm | Durasurf 1101Z/SiO2 | <5 | / | (F) | 78% |
| | | | | Durasurf2010Z/Cr/SiO2 | <5 | / | (F) | |
| | | | pitch; 460 nm, depth; 460 nm, openning diameter; 430nm | PDMS/Cr/SiO2 | <5 | →0 | (F) | 79% |
| | | | | — | — | 385 | (F) | |

Mold-releasing Layer 2-1: the fine pattern formation surface including the metal layers 2-1 and 2-2 were rinsed with UV-O3, and then, the resulting material was immersed into Durasurf 2101Z or Durasurf 1101Z. The immersion was performed at a temperature of 25° C. for 10 minutes. Then, the resin mold was lifted and cured at a temperature of 25° C. and 60° C. and a humidity of 60% for 12 hours. Finally, the resulting material was rinsed with Durasurf HD-ZV and was dried using an air blower. In addition, in a case where the outermost surface includes chromium (Cr), Durasurf 2101Z was used. In a case where the outermost surface includes silicon oxide (SiO$_2$), Durasurf 1101Z was used.

Mold-releasing Layer 2-2: P7266-DMS was spin-coated on a surface of the fine structure including the metal layer 2-1 or 2-2 at a speed of 1500 rpm, and the resulting member was solidified under a decompressed atmosphere. After the solidification, the remaining PDMS (P7266-DMS) was rinsed, and the resulting material was dried using an air blower.

In a case where the resin mold has a dot configuration (resin mold A), dry etching was performed in a state before the metal layer, the mold-releasing layer, or the like was formed, to further fabricate the nanostructure of the resin mold until the opening ratio becomes 80% or higher, which was used.

(e) Manufacturing of First Layered Product 1(4)

The first layered product 1(4) was manufactured by combining the resin mold described in Table 4 and the second mask material described below.

Second Mask Material F: TTB, DEDFS, SH710, 3APTMS, M211B, PO-A, M350, I.184, and I.369 was mixed with a mixing ratio of 170 g:50 g:40 g:60 g:40 g:40 g:20 g:11 g:4 g.

Second Mask Material G: 50 parts by weight of DACHP was added with respect to 100 parts by weight of the mask material F.

Subsequently, the second mask materials F and G were diluted with a PGME solvent, and the resulting material was used as a coating material on the resin mold. In addition, in order to control the distance lcc, a filling amount in the concave portion of the resin mold of the second mask material was changed by changing the dilution concentration of the second mask materials F and G while the coating conditions of the second mask materials F and G were set to be constant.

The coating of the second mask materials F and G on the fine pattern formation surface of the resin mold was performed using the same apparatus as that used in manufacturing of the reel-like resin mold.

Figure 55:
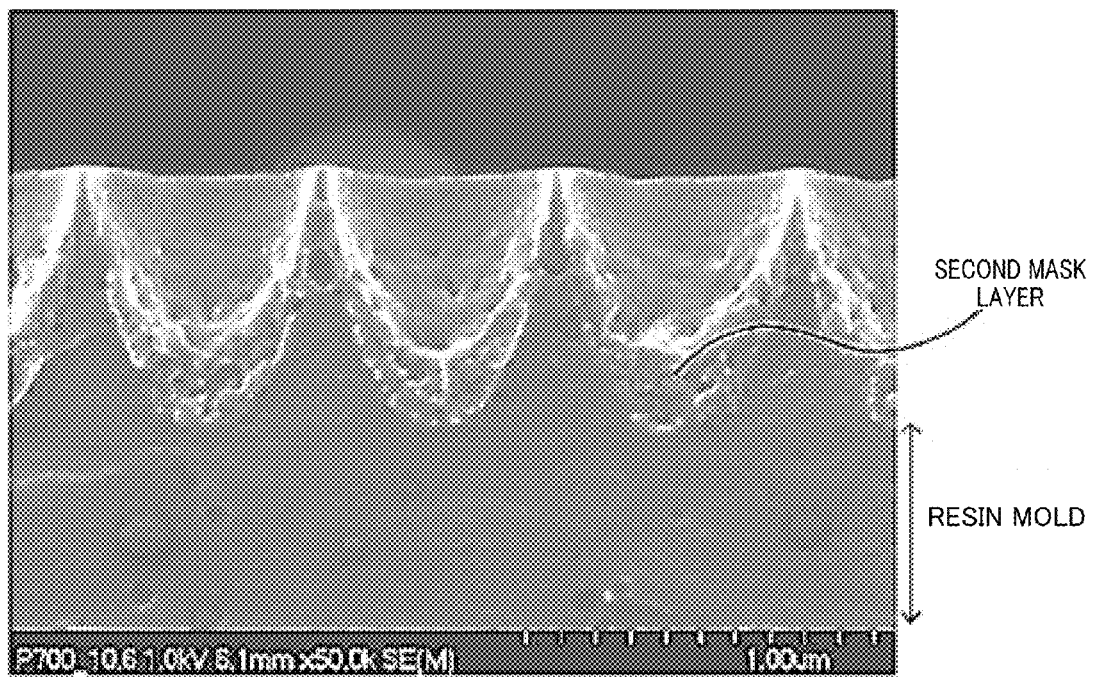
FIG. 55 is a SEM photographic image according to an example of the invention.

The cross section of the obtained first layered product 1(4) was observed using a scanning electron microscope and a transmission electron microscope. FIG. 55 is a scanning electron microscope photographic image illustrating an exemplary result when the pitch was set to 700 nm. From the transmission electron microscope photographic image and the EDX method, the distance lcv was equal to or shorter than a resolution (→0).

By observing the cross section of the first layered product 1(4) using a scanning electron microscope, it was recognized that the second mask material was filled in the concave portion of the nanostructure of the resin mold. In addition, the filling amount of the mask material was controllable by changing the dilution ratio of the second mask material, and the distance lcc was controllable between 0.85 h and 0.1 h. Furthermore, by using both the scanning electron microscope and the energy dispersive X-ray spectroscopy method, it was recognized that the second mask layer was not formed on the top of the convex portion of the nanostructure of the resin mold. From the viewpoint of the resolution of the transmission electron microscope and the energy dispersive X-ray spectroscopy method, it was determined that the distance lcv is several nanometers or shorter, or zero.

Subsequently, the first mask layer (dry film resist) was formed on the first layered product 1(4) to manufacture the second layered product 2(4). As a material of the dry film resist, an acrylate monomer and a photo-polymerization initiator were added to a benzyl-based acrylic polymer. The material of the dry film resist was diluted with PGME and MEK by a concentration of 20%, and a film was formed by using the same apparatus as that used to manufacture the resin mold on a fine pattern formation surface of the first layered product 1(4). The thickness of the dry film resist subjected to the drying was set to 400 to 650 nm. A thickness precision of the dry film resist was measured in a plane. As a result, the thickness precision was ±10% with respect to the center film thickness.

Through a transmission electron microscope, it was recognized that the second layered product 2(4) was satisfactorily manufactured in all of the first layered products 1(4). In addition, by using both the transmission electron microscope and the energy dispersive X-ray spectroscopy method, it was recognized that titanium (Ti) in the second mask layer is not dispersed to the first mask layer (dry film resist), and the second mask layer material does not flow or move when the first mask layer (dry film resist) is formed. That is, in the second layered product 2(4), the second mask material was filled and arranged in the concave portion of the resin mold in a distance lcc range of 0.85 h to 0.1 h, and distance lcv was zero. Furthermore, the first mask layer (dry film resist) was formed to cover both the second mask material and the nanostructure of the resin mold.

Finally, it was confirmed whether or not the sapphire substrate can be fabricated using the first layered product 1(4) manufactured using the resin mold B. In a case where the first layered product 1(4) was used, the sapphire substrate and a surface of the fine structure of the first layered product 1(4) were laminated by applying a pressure of 0.01 MPa using a laminate roll by interposing a photosetting resin (MUR series, produced by MARUZEN PETROCHEMICAL CO., LTD.) as the first mask layer. In a case where the pitch was 460 nm, the thickness of the first mask layer was set to 650 nm. In a case where the pitch was 700 nm, the thickness of the first mask layer was set to 400 nm. Here, the film formation precision was ±5% with respect to the center film thickness in a plane. A pressure of 0.05 MPa was applied to the obtained layered product after the laminating for 5 minutes. Then, in a case where the resin mold is optically transparent (when there is no chromium layer in this discussion), UV light was irradiated through the resin mold with an integral light intensity of 1200 mJ/cm$^2$. In a case where the resin mold is not optically transparent (when there is a chromium layer in this discussion), UV light was irradiated through the sapphire substrate with the same integral light intensity. Subsequently, the resin mold was removed, and UV light was irradiated again from the second mask layer side surface of the third layered product 3 consisting of [the second mask layer/the first mask layer/the object to be processed].

Meanwhile, in a case where the second layered product 2(4) was used, the first mask layer (dry film resist) of the second layered product 2(4) was directly thermocompressively laminated onto the sapphire substrate. The thermocompressive bonding was performed at a temperature of 80° C. using a laminate roll by applying a pressure of 0.01 MPa. Then, in a case where the resin mold was optically transparent (when there is no chromium layer in this discussion), UV light was irradiated through the resin mold with an integral light intensity of 1200 mJ/cm$^2$. In a case where the resin mold is not optically transparent (when there is a chromium layer in this discussion), UV light was irradiated through the sapphire substrate with the same integral light intensity. Subsequently, the resin mold was removed, and UV light was irradiated again from the second mask layer side surface of the third layered product 3 consisting of [the second mask layer/the first mask layer/the objects to be processed (sapphire substrate)].

Oxygen ashing was performed from the second mask layer side surface to the obtained third layered product 3 (consisting of [the second mask layer/the first mask layer/the object to be processed]). Through the oxygen ashing, the first mask layer was anisotropically etched by using the second mask layer as a mask. The oxygen ashing was performed until the surface of the object to be processed (sapphire substrate) is exposed. Subsequently, the sapphire substrate was fabricated using a chlorine-based gas by using the fine mask pattern (a pillar consisting of [the second mask layer/the first mask layer]) having a high aspect ratio as a mask.

In addition, in a case where the second layered product 2(4) having a pitch of 460 nm and the distance lcc of 0.26 h, 0.35 h, and 0.70 h was used, the thickness hml of the third layered product 3 was 0 nm, and the thickness ratio hmv/h0 was 2.83, 1.88, and 0.43, respectively, before the dry etching is performed. Using a transmission electron microscope and an energy dispersive X-ray spectroscopy method, it was observed that, as the dry etching (oxygen ashing) is performed, the second mask layer component moves from the second mask layer to the first mask layer to protect the side wall of the first mask layer. By performing the oxygen ashing for several tens seconds or longer, the thickness hml as a thickness of the second mask layer that protects the side wall was saturated and remained in 10 nm or smaller.

If the oxygen ashing is performed up to the interface between the sapphire substrate and the first mask layer, the thickness ratio hmv/h0 of the third layered product 3 was 0.44, 0.38, and 0.15, respectively. Meanwhile, the thickness ratio hml/hmv was 0.033, 0.038, and 0.095, respectively.

Meanwhile, in a case where the first layered product 1 having a pitch of 700 nm used, and the distance lcc of 0.49 h, 0.59 h, and 0.84 h was used, the thickness hml of the third layered product 3 was 0 nm, and the thickness ratio hmv/h0 was 1.06, 0.70, and 0.19, respectively, before the dry etching is performed. As in the case of the pitch of 460 nm, it was observed that, as the dry etching (oxygen ashing) is performed, the second mask layer component moves from the second mask layer to the first mask layer to protect the side wall.

If the oxygen ashing was performed up to the interface between the sapphire substrate and the first mask layer, the thickness ratio hmv/h0 of the third layered product 3 was 0.41, 0.32, and 0.08, respectively. Meanwhile, the thickness ratio hml/hmv was 0.032, 0.042, and 0.167, respectively. In addition, regarding the thickness hml, it is difficult to more precisely quantify the thickness equal to or smaller than 10 nm. Therefore, the thickness hml set to 10 nm was used in order to compute the thickness ratio hml/hmv.

An in-plane distribution of the distance from the interface between the sapphire substrate and the first mask layer to the top position S of the convex portion of the nanostructure was measured before the ashing. In a case where the first layered product 1(4) was used, the in-plane distribution was ±20% with respect to the center film thickness. Meanwhile, in a case where the second layered product 2(4) was used, the in-plane distribution was ±13%.

From the result described above, it is recognized that the precisions of the first and second mask layers transferred onto the sapphire substrate by using the second layered product 2(4) can be improved. It is assumed that this is caused by the flow of the first mask layer during the laminating. From the aforementioned description, it is recognized that the precisions of the first and second mask layers can be reflected on the sapphire substrate, and the precision of the second mask layer formed on the sapphire substrate can be further improved by using the second layered product 2(4).

The plasma etching condition for fabricating the sapphire substrate was set such that only a $BCl_3$ gas or a mixed gas of $BCl_3$ and $Cl_2$ or Ar obtained by setting the ratio of gas flow rates to 90 ccm:10 sccm to 85 sccm:15 sccm was used, a processing pressure was set in the range of 0.1 to 6.5 Pa, and the inductively coupled plasma RIE apparatus was used. As a result, similar to Example 3, it was recognized that sapphire can be easily fabricated even when any resin mold B was used.

Example 5

(a) Manufacturing of Cylindrical Master
(Manufacturing of Template for Resin Mold)

Similar to Example 1, a cylindrical master having a hole-configuration fine pattern having a pitch of 460 nm and a cylindrical master having a hole-configuration fine pattern having a pitch of 700 nm were manufactured.

(b) Manufacturing of Reel-Like Resin Mold A

As the transfer material 4, a mixed solution obtained by mixing DACHP, M350, I.184, and I.369 with a mixing ratio of 15 g:100 g:5.5 g:2.0 g was used.

A reel-like resin mold A (having a length of 200 m and a width of 300 mm) having a transferred fine pattern on a surface was obtained in a similar manner as Example 1 except that the integral light intensity was changed to 1000 mJ/cm².

(c) Manufacturing of Resin Mold B

A plurality of reel-like resin molds B (having a length of 200 m and a width of 300 mm) having the same transferred fine pattern as that of the cylindrical master on a surface were obtained in a similar manner as Example 1 except that the content of DACHP in the transfer material 4 was changed to 17.5 g, and the integral light intensity was set to 1000 mJ/cm².

(d) First Layered Product 1(5)

As the second mask material F, a mixed solution obtained by mixing TTB, DEDFS, SH710, 3APTMS, M211B, PO-A, M350, I.184, and I.369 with a mixing ratio of 150 g:50 g:40 g:60 g:40 g:40 g:20 g:11 g:4 g was prepared.

Subsequently, the second mask material was diluted with a PGME solvent, and the resulting member was used as a coating material on the resin mold B. The coating of the second mask material on the fine pattern surface (a surface having a fine pattern) of the resin mold B was performed using the same apparatus as that used in manufacturing of the reel-like resin mold. The cross section of the obtained first layered product 1(5) was observed using a scanning electron microscope and a transmission electron microscope. As a result, it was possible to obtain the same result as that of Example 4.

Subsequently, the first mask layer (dry film resist) was formed on the first layered product 1(5) to manufacture the second layered product (5). A benzyl-based acrylic polymer containing an acrylate monomer and a photo-polymerization initiator is used as a material of the first mask layer. The material was diluted with PGME and MEK by a concentration of 20%, and a first mask layer was formed by using the same apparatus as that used to manufacture the resin mold on a fine pattern formation surface of the first layered product (5). The thickness of first mask layer was set to 650 nm for a pitch of 460 nm or to 400 nm for a pitch of 700 nm as a thickness in a case where the coating is performed for a PET film having no fine pattern.

Using a transmission electron microscope, it was recognized that the second layered product 2(5) was satisfactorily manufactured for all of the first layered products 1(5).

(e) Fabrication of Sapphire Substrate

It was tested whether or not the sapphire substrate can be fabricated using the first layered product 1(5) manufactured using the resin mold B. Here, a hard mask layer was formed on the sapphire substrate, and the hard mask layer was fabricated using the first layered product 1(5). Then, the sapphire substrate was fabricated by using the fabricated hard mask layer as a mask. That is, the first layered product 1 was formed on the hard mask layer to obtain the third layered product 3(5). The hard mask was fine-patterned using the obtained third layered product 3, and fabrication of sapphire substrate was tested by using the fine-patterned hard mask pattern as a mask.

As the sapphire substrate, a double-side c-plane sapphire substrate having a size of 2 inches (φ) was used. A chromium film having a thickness of 50 nm was formed on one surface of the sapphire substrate to form the hard mask layer.

In a case where the first layered product 1(5) was used, the hard mask layer on the sapphire substrate and the fine-patterned surface of the first layered product 1(5) were laminated by interposing a photosetting resin (MUR series, produced by MARUZEN PETROCHEMICAL CO., LTD.) as the first mask layer. In a case where the pitch was 460 nm, the thickness of the photosetting resin was set to 650 nm. In a case where the pitch was 700 nm, the thickness of the photosetting resin was set to 400 nm. After the laminating, a pressure of 0.05 MPa was applied for 5 minutes. Then, UV light was irradiated over the resin mold. Subsequently, the resin mold was removed, and UV light was irradiated again toward the second mask layer side surface of the layered product including the arrangement of the second mask layer/the first mask layer/the hard mask layer/the object to be processed. The processes hereinbefore were performed by laminating the reel-like first layered product 1(5) while a total of 30 sapphire substrates (3×10, horizontally 3 and vertically 10) subjected to formation of the first mask layer were arranged side by side.

Meanwhile, in a case where the second layered product 2(5) was used, the first mask layer of the second layered product 2(5) was directly thermocompressively laminated onto the hard mask layer formed on the sapphire substrate. The thermocompressive laminating was performed at a temperature of 80° C. by applying a pressure of 0.01 MPa. Then, UV light was irradiated over the resin mold. Subsequently, the resin mold was removed, and UV light was irradiated again toward the second mask layer side surface of the layered product including the arrangement of the second mask layer/the first mask layer/the hard mask layer/the object to be processed. The processes hereinbefore were performed by laminating the reel-like second layered product 2(5) while a total of 30 sapphire substrates (3×10, horizontally 3 and vertically 10) subjected to formation of the first mask layer were arranged side by side.

Oxygen ashing was performed to the second mask layer side surface of the obtained third layered product 3 (consisting of the second mask layer/the first mask layer/the hard mask layer/the object to be processed). Through the oxygen ashing, the first mask layer was anisotropically etched by using the second mask layer as a mask. The oxygen ashing was performed until the chromium surface of the object to be processed is exposed. Subsequently, the hard mask layer was wet etching by using a chromium wet etchant. After the etching, a pillar consisting of [the second mask layer/the first mask layer] was removed using an alkali solution.

In addition, in a case where the second layered product 2(2) having a pitch of 460 nm, and the distance lcc of 0.26 h, 0.39 h, and 0.59 h was set, the third layered product was the thickness hml of 0 nm and the thickness ratio hmv/h0 of 4.11, 1.56, and 0.70, respectively, before the dry etching is performed. It was observed that, as the dry etching (oxygen ashing) is performed, a component of the second mask layer moves from the second mask layer to the first mask layer to protect the side wall by a TEM and an EDX. By performing the oxygen ashing for several tens seconds or longer, the thickness (hml) of the second mask layer that protects the side wall was saturated and remained in 10 nm or smaller.

If the oxygen ashing is performed up to the interface with the object to be processed, the third layered product 3 has the thickness ratio hmv/h0 of 0.48, 0.35, and 0.22, respectively. Meanwhile, the third layered product 3 has the thickness ratio hml/hmv of 0.030, 0.041, and 0.065, respectively.

Meanwhile, in a case where the first layered product 1 having a pitch of 700 nm, and the distance lcc of 0.31 h, 0.44 h, and 0.73 h was used, the third layered product 3 has the thickness hml of 0 nm, and the thickness ratio hmv/h0 of 2.18, 1.26, and 0.37, respectively, before the dry etching is performed. As in the case of the pitch of 460 nm, it was observed that, as the dry etching (oxygen ashing) is performed, the second mask layer component moves from the second mask layer to the first mask layer to protect the side wall.

If the oxygen ashing was performed up to the interface with the object to be processed, the third layered product 3 has the thickness ratio hmv/h0 of 0.57, 0.45, and 0.19, respectively and the thickness ratio hml/hmv of 0.023, 0.029, and 0.071, respectively. In addition, regarding the thickness hml, it is difficult to more precisely quantify the thickness equal to or smaller than 10 nm. Therefore, the thickness hml was set to 10 nm in order to compute the thickness ratio hml/hmv.

The sapphire substrate was etched by using the hard mask pattern on the obtained sapphire substrate as a mask. The plasma etching was set under a condition such that only a $BCl_3$ gas or a mixed gas of $BCl_3$ and $Cl_2$ or Ar obtained by setting the ratio of gas flow rates to 90 sccm:10 sccm to 85 sccm:15 sccm was used, a processing pressure was set to 0.1 to 6.5 Pa, and the inductively coupled plasma RIE apparatus was used.

By performing dry etching as described above, it was possible to easily form a fine structure on a sapphire substrate surface. Meanwhile, although it was possible to wet etch the sapphire substrate using phosphoric acid, the aspect ratio of the fine pattern formed on the sapphire substrate was lower than that of the dry etching.

Next, the fine mask pattern was transferred onto the object to be processed by using a plate first layered product 1 and a plate second layered product 2 and was investigated the effect thereof, regarding the first layered product 1 and the second layered product 2 according to the embodiment described above. Hereinafter, description will be made for the investigation made by the inventors.

Example 6

(a) Manufacturing of Cylindrical Master
(Manufacturing of Template for Resin Mold)

Similar to Example 1, a cylindrical master having a hole-configuration fine pattern having a pitch of 200 nm, a cylindrical master having a hole-configuration fine pattern having a pitch of 460, and a cylindrical master having a hole-configuration fine pattern having a pitch of 700 nm were manufactured, respectively.

(b) Manufacturing of Reel-Like Resin Master A

A mixed solution obtained by mixing DACHP, M350, I.184, and I.369 with a mixing ratio of 15 g:100 g:5.5 g:2.0 g was used as a transfer material.

A reel-like resin master A (having a length of 200 m and a width of 300 mm) having a transferred fine pattern on a surface was obtained in a similar manner as Example 1 except that the integral light intensity is set to 1000 mJ/cm$^2$. Observed using a scanning electron microscope, depending on a type of the cylindrical master, the surface fine pattern had a fine dot configuration having a pitch of 200 nm and a height of 200 nm, a fine dot configuration having a pitch of 460 nm and a height of 460 nm, or a fine dot configuration having a pitch of 700 nm and a height of 700 nm.

Hereinafter, regardless of the type of the fine pattern of the reel-like resin master A, they will be collectively referred to as a resin master A.

(c) Manufacturing of Reel-Like Resin Master B

A reel-like resin master B was manufactured by using the reel-like resin master A as a template, and by using a mixed solution obtained by mixing DACHP, M350, I.184, and I.369 with a mixing ratio of 17.5 g:100 g:5.5 g:2.0 g as a transfer material (5).

A plurality of reel-like resin masters B (having a length of 200 m and a width of 300 mm) having the same fine pattern as that of the cylindrical master having a transferred fine pattern on a surface were obtained in a similar manner as Example 1 except that the integral light intensity was set to 1000 mJ/cm$^2$. Observed using a scanning electron microscope, the surface fine pattern had a fine hole configuration having a pitch of 200 nm, an opening diameter of 180 nm, and a depth of 200 nm, a fine hole configuration having a pitch of 460 nm, an opening diameter of 430 nm, and a depth of 460 nm, or a fine hole configuration having a pitch of 700 nm, an opening diameter of 680 nm, and a depth of 700 nm, depending on the type of the fine pattern of the reel-like resin master A.

(d) Manufacturing of Quartz Mold

A negative resist or a positive resist was respectively coated on quartz glass having a size of 4 inches (φ), and a fine pattern was formed on the quartz glass surface through a direct lithography method using a semiconductor laser. As the fine pattern, a fine hole configuration having a pitch of 200 nm, an opening width of 180 nm, and a depth of 200 nm, a fine hole configuration having a pitch of 460 nm, an opening width of 430 nm, and a depth of 460 nm, a fine hole configuration having a pitch of 700 nm, an opening width of 680 nm, and a depth of 700 nm, a fine dot configuration having a pitch of 200 nm and a height of 200 nm, a fine dot configuration having a pitch of 460 nm and a height of 460 nm, and a fine dot configuration having a pitch of 700 nm and a height of 700 nm were obtained, respectively.

(e) Manufacturing of PDMS Mold

A PDMS solution was cast and expanded on the surface having the fine pattern in the quartz mold. Subsequently, the PDMS was thermally set at a temperature of 200° C. Finally, by releasing the PDMS from the quartz mold, a mold having a fine pattern on the PDMS surface was obtained.

(f) Manufacturing of PMMA Mold

The surface having the fine pattern in the quartz mold was treated by a UV-$O_3$ for 20 minutes. Then, Durasurf HD-1101 Z (produced by DAIKIN INDUSTRIES, ltd.) was coated on the fine patterned surface, and the resulting mold was heated at a temperature of 60° C. for one hour and was then disposed at a room temperature for 24 hours for solidification. Then, the resulting mold was rinsed three times using Durasurf HD-ZV (produced by DAIKIN INDUSTRIES, ltd.), and a releasing treatment was performed.

A PMMA film was formed on a silicon (Si) wafer with a thickness of 1000 nm using a spin coat method. Subsequently, the quartz mold and the silicon wafer were heated at a temperature of 120 to 150° C., and the fine pattern formed-surface of the quartz mold and the PMMA film were laminated under a reduced pressure atmosphere. Then, the temperatures of the silicon wafer and the quartz mold were lowered to a temperature of 80° C. while a pressure of 13 MPa was applied, so that the quartz mold was released from the PMMA to manufacture a PMMA mold.

(g) Manufacturing of Resin Mold on Quartz

The quartz surface having a size of 4 inches (φ) was treated by a UV-$O_3$ for 20 minutes. Then, a monomolecular layer was formed on the processing surface using a silane coupling agent (3-acrylioxypropyl trimethoxysilane) having the terminal acryloxy group. Then, the transfer material (5) described above and the transfer material (6) described below were formed on the silane-coupling-processed silicon wafer with a thickness of 1000 nm using a spin coat method. Then, using a rubber roller, the transfer material (5) described above and the transfer material (6) described below are laminated on a fine pattern formed-surface of the reel-like resin master A or B, and UV light was irradiated from the resin master. Finally, by releasing the resin master, a mold having a fine pattern made of resin was provided on the quartz substrate.

Transfer Material (6): M309:M350:silicone diacrylate: I.184:I.369=20 g:80 g:1.5 g:5.5 g:2.0 g

(h) Metal Layer

A mold having a metal layer on a fine patterned surface was manufactured fine patterned surface. Chromium (Cr) or silicon oxide ($SiO_2$) was used as a material of the metal layer. The metal layer was formed by sputtering Cr or $SiO_2$ on the fine patterned surface of the mold. The film thickness was set to 10 nm in any case. In addition, another mold was also manufactured by forming a $SiO_2$-film of 10 nm and then forming a Cr-film of 10 nm.

(i) Mold-Releasing Layer

A mold having a mold-releasing layer on the fine patterned-surface was manufactured fine patterned surface. A fluorine-based mold-releasing layer or a PDMS mold-releasing layer was used as the mold-releasing layer.

Durasurf 1101Z or Durasurf 2101Z was used as the fluorine-based mold-releasing layer. Specifically, the fine patterned-surface of the mold was activating-treated using UV-$O_3$ for 20 minutes. Then, the resulting mold was immersed into Durasurf 1101Z or Durasurf 2101Z. The immersion was performed at a temperature of 25° C. for 10 minutes. Then, the mold was lifted and was cured at a temperature of 25° C. and a humidity of 60% for 12 hours. Finally, the resulting mold was rinsed using Durasurf HD-ZV and was dried using an air blower.

The PDMS mold-releasing layer was manufactured as follows. P7266-DMS was spin-coated on the fine patterned-surface in the mold at a speed of 1500 rpm and was baked under a reduced pressure atmosphere. After baking at a temperature of 200° C., the remaining PDMS (P7266-DMS) was rinsed with toluene. Finally, the toluene was perfectly volatilized, and the process was completed.

(j) First Layered Product 1(6)

The mold used in the following discussion is described in detail in Table 5. The meanings of entries in Table 5 are as follows. In Table 5, if the pattern type is designated as "dot," a dry etching treatment was performed in the resin mold was dry-etched, and was fine-patterned so that the opening ratio becomes 80% or higher. That is, even in the dot configuration, it has an opening ratio of 80% or higher and satisfies the requirements in Table 5.

Pattern Type: indicates whether the fine pattern of the mold has a hole (concave) configuration or a dot (convex) configuration.

Material/Support Substrate: indicates a material/support substrate of the fine pattern. If the support substrate and the fine pattern are integrated into a single body, the slash "/" is not written, and only "Material" is written.

Fine Pattern: indicates details of the fine pattern of the mold.

Mold-releasing Layer/Metal Layer: indicates the used mold-releasing agent/metal layer configuration. In a case where the metal layer is not provided, the slash "/" is not written, and only the used mold-releasing agent is written. In addition, the dash "-" means a case where the mold-releasing layer is not formed.

Mold-releasing Layer Thickness: indicates a thickness of the mold-releasing layer. A dimension was set to a nanometer scale "nm", and a notation "<number" means that a thickness smaller than the "number."

Es/Eb: indicates a ratio Es/Eb between the surface fluorine concentration Es and the average fluorine concentration Eb of the mold material. A notation "→∞" means that a case where the average fluorine concentration Eb is approximated to zero although the surface fluorine concentration Es has a value, so that the ratio Es/Eb becomes an indefinitely high value. In addition, the entry "/" means a case where measurement is not available even when the ratio Es/Eb has a finite value.

Opening Ratio: indicates a ratio of the vacant openings (concave portions) on a basal plane as a percentage assuming that the top position S of the convex portion of the nanostructure is the basal plane.

A spin coat method was used in the coating of the second mask material on the fine patterned-surface of the mold. The spin coating was performed at a temperature of 25° C. and a humidity of 50%, and the film thickness was controlled based on the rotation number and the coating material concentration. The film thickness was set such that the solid content contained in the coating material per unit area is 20% or smaller than a volume of the fine pattern per unit area. Furthermore, the spin coating was performed such that casting is performed until the diluent solution of the second mask material is coated on the entire fine patterned surface of the mold to form a coat film of the diluent solution of the second mask material, and rotation is then performed.

The obtained first layered product 1(6) was observed using a transmission electron microscope (TEM), an energy dispersive X-ray spectroscopy (EDX) method, and a scanning electron microscope (SEM) to check whether or not the first

TABLE 5

| Patern Type | Material/ Substrate | Fine Pattern | Mold-removing Layer/Metal Layer | Tickness [nm] of Mold-removing Layer | Es/Eb | Openning Ratio |
|---|---|---|---|---|---|---|
| Concave (hole) | Quartz | pitch; 200 nm depth; 200 nm openning diameter; 180 nm | Durasurf 1101Z PDMS | <5 <5 | →∞ →∞ | 73% |
|  | PDMS | pitch; 460 nm depth; 460 nm openning diameter; 430 nm | — Durasurf 2101Z/Cr/SiO$_2$ | — <5 | — →∞ | 79% |
|  | PMMA/Si | pitch; 700 nm depth; 700 nm openning diameter; 680 nm | Durasurf 2101Z/Cr/SiO$_2$ Durasurf 1101Z/SiO$_2$ | <5 <5 | →∞ →∞ | 85% |
|  | Transfer Material1/ Quartz | pitch; 460 nm depth; 460 nm openning diameter;430nm | Durasurf 2101Z/Cr | <5 | 49 / | 79% |
|  | Transfer Material2/ Quartz | pitch; 460 nm depth; 460 nm openning diameter; 430 nm | Durasurf 2101Z/Cr Durasurf 1101Z/SiO$_2$ | <5 <5 | →∞ →∞ |  |
| Convex (dot) | Quartz | pitch; 200 nm height; 200 nm | Durasurf 1101Z PDMS | <5 <5 | →∞ →∞ | >80% |
|  | PDMS | pitch; 460 nm height; 460 nm | — Durasurf 2101Z/Cr/SiO$_2$ | — <5 | — →∞ |  |
|  | PMMA/Si | pitch; 700 nm height; 700 nm | Durasurf 2101Z/Cr/SiO$_2$ Durasurf 1101Z/SiO$_2$ | <5 <5 | →∞ →∞ |  |
|  | Transfer Material1/ Quartz | pitch; 460 nm height; 460 nm | — Durasurf 2101Z/Cr | — <5 | 46 / |  |
|  | Transfer Material2/ Quartz | pitch; 460 nm height; 460 nm | Durasurf 2101Z/Cr Durasurf 1101Z/SiO$_2$ | <5 <5 | →∞ →∞ |  |

In the mold described in Table 5, a first layered product 1(6) was manufactured using the second mask material described below.

Second Mask Material H: TTB, DEDFS, SH710, 3APTMS, M211B, PO-A, M350, I.184, and I.369 was mixed with a mixing ratio of 170 g:50 g:40 g:60 g:40 g:40 g:20 g:11 g:4 g.

Second Mask Material I: 50 parts by weight of DACHP was added with respect to 100 parts by weight of Material 1.

Subsequently, the second mask materials 1 and 2 were diluted with PGME solvent, and the resulting member was used as a material for coating on the fine patterned-surface of the mold described in Table 5.

layered product 1(6) was manufactured. Regardless of the molds described in Table 5, the following result was nearly similar to that within the scope of the present invention, so that a part thereof will be described.

Figure 56:
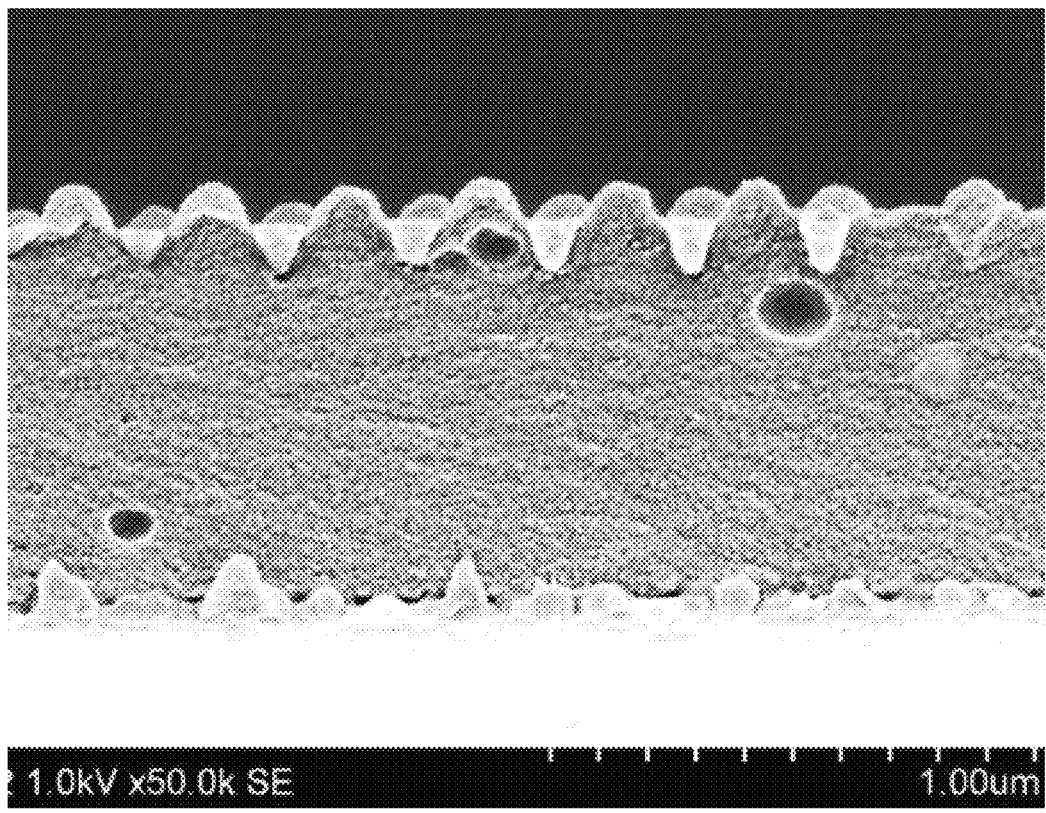
FIG. 56 is a SEM photographic image according to an example of the invention.
Figure 57:
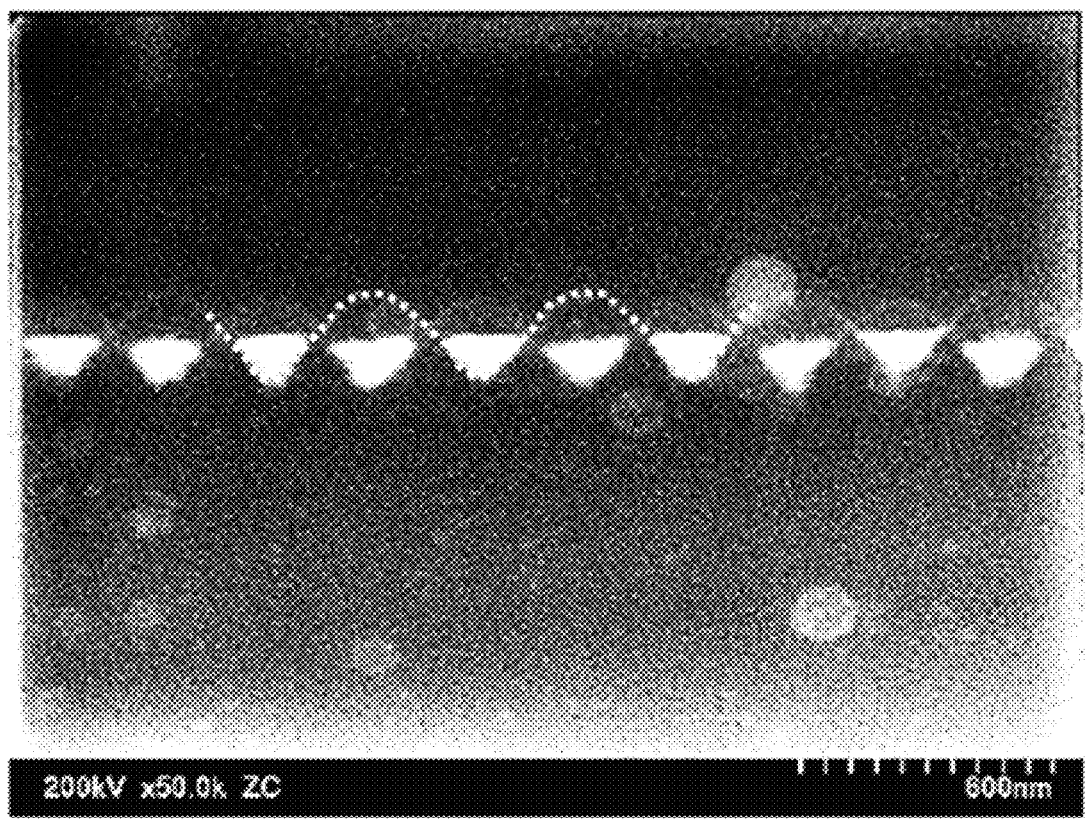
FIG. 57 is a SEM photographic image according to an example of the invention.

FIG. 56 is an SEM photographic image illustrating an example of the first layered product 1(6). In FIG. 56, the convex portions are brightly illustrated. Through a TEM and EDX analysis, it was recognized whether or not this portion corresponds to the distance lcv. The result is shown in FIG. 57. In FIG. 57, the white mapping portions correspond to the second mask layer. In addition, the dotted line corresponds to a contour of the fine pattern. From the aforementioned description, it can be determined that the distance lcv is equal to or shorter than several nanometers (equal to or shorter than a resolution of the TEM and EDX analysis). Meanwhile, in the case of FIG. 56, the distance lcc was 0.4 h.

By observing the cross section of the first layered product 1(6) using a scanning electron microscope, it was observed that the second mask material was filled in the concave portion of the nanostructure. Furthermore, as a result of observation using both a transmission electron microscope and an energy dispersive X-ray spectroscopy method, the second mask material on the convex portion was not observed. From the viewpoint of the resolution in such a method, it was determined that the distance lcv is 0 nm or several nanometers or shorter.

Figure 58A:
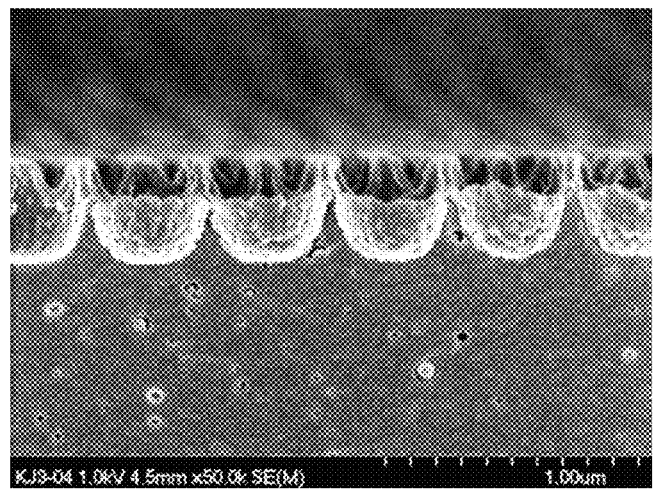
FIGS. 58A to 58C are SEM photographic images according to an example of the invention.
Figure 58B:
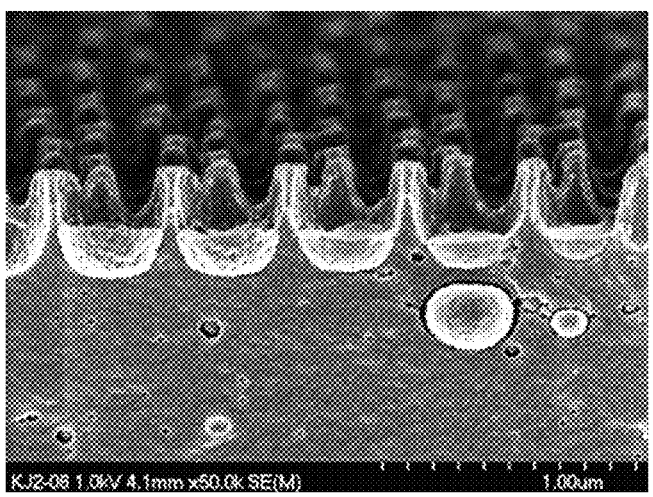
Figure 58C:
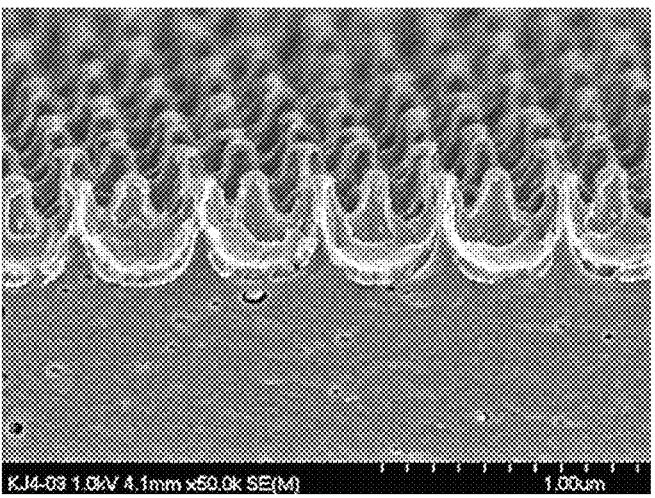

The distance lcc was flexibly controllable depending on a concentration in coating and the coating condition. An example is illustrated in FIGS. 58A to 58C. FIGS. 58A to 58C are SEM photographic images illustrating an example of the first layered product 1(6). Three images of FIGS. 58A to 58C have a different filling rate of the second mask layer. The cross-sectional image was observed using a scanning electron microscope in a case where the pitch was set to 460 nm. As a result, it was recognized that the filling is possible with the distance lcc within a range of 0.48 h to 0.86 h. In addition, the second mask layer on the convex portion was observed by using both a transmission electron microscope and an energy dispersive X-ray spectroscopy method. In any case, the distance lcv was zero.

The distance lcc was calculated based on this SEM photographic image. The calculation result is shown in Table 6. The distance lcv was measured using a TEM and an EDX method, it was determined that the distance lcv is equal to or shorter than a resolution (denoted by →0).

TABLE 6

| Figure Number | lcc | lcv |
|---|---|---|
| FIG. 58A | 0.48 h | →0 |
| FIG. 58B | 0.70 h | →0 |
| FIG. 58C | 0.86 h | →0 |

(k) Second Layered Product 2(6)

Subsequently, the first mask layer (dry film resist) was formed on the first layered product 1(6) to manufacture the second layered product 2(6). A benzyl-based acrylic polymer containing an acrylate monomer and a photo-polymerization initiator was used as a material of the first mask layer.

The material of the first mask layer was diluted with PGME and MEK, and a film was formed on a fine patterned-surface of the first layered product 1(6) (surface where the second mask layer is provided) through a spin coat method. The spin coating was performed at a temperature of 25° C. and a humidity of 50%, and the film thickness was controlled based on the rotation number and the solution concentration. The film thickness was obtained in advance from film formation investigation for the substrate having no fine pattern. The film thickness of the substrate having no fine pattern was set to 360 nm if the pitch was 200 nm. If the pitch was 460 nm, the film thickness was set to 650 nm. If the pitch was 700 nm, the film thickness was set to 400 nm. The spin coating was performed such that casting is performed until the diluent solution of the first mask material is coated on the entire fine patterned-surface of the mold to form a coat film of the diluent solution of the first mask material, and rotation is then performed.

The obtained second layered product 2(6) was observed using a transmission electron microscope (TEM), an energy dispersive X-ray spectroscopy (EDX) method, and a scanning electron microscope (SEM) to check whether or not the second layered product 2(6) was manufactured. Regardless of the molds described in Table 5, the following result was nearly similar to that within the scope of the present invention, so that a part thereof will be described.

Figure 59:
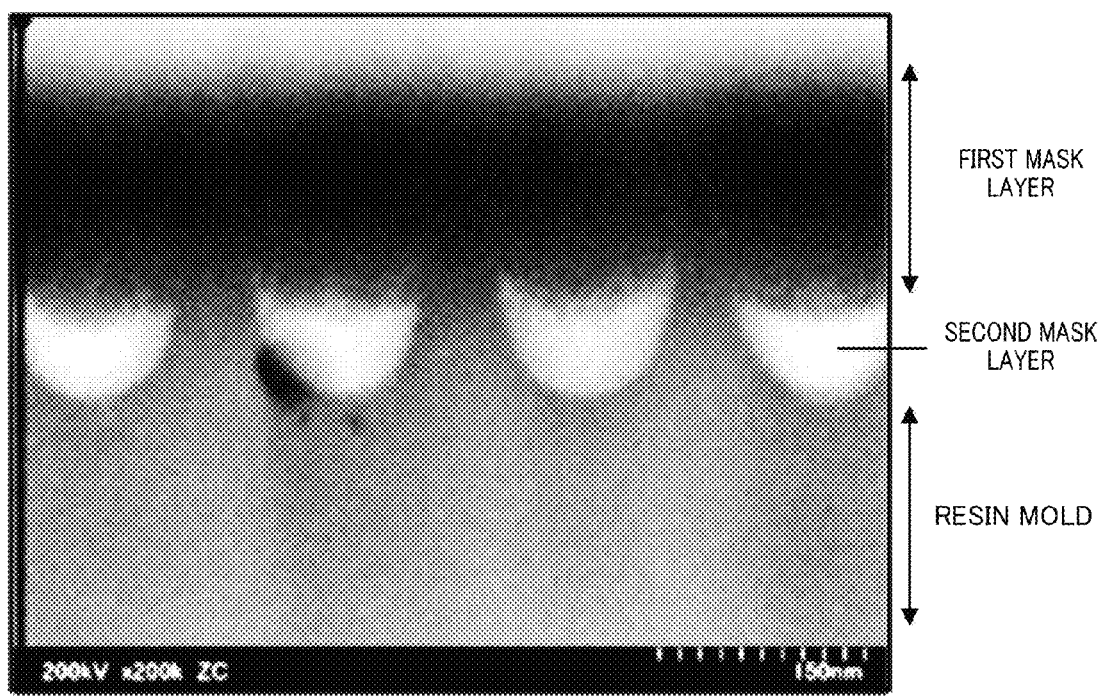
FIG. 59 is a SEM photographic image according to an example of the invention.
Figure 60:
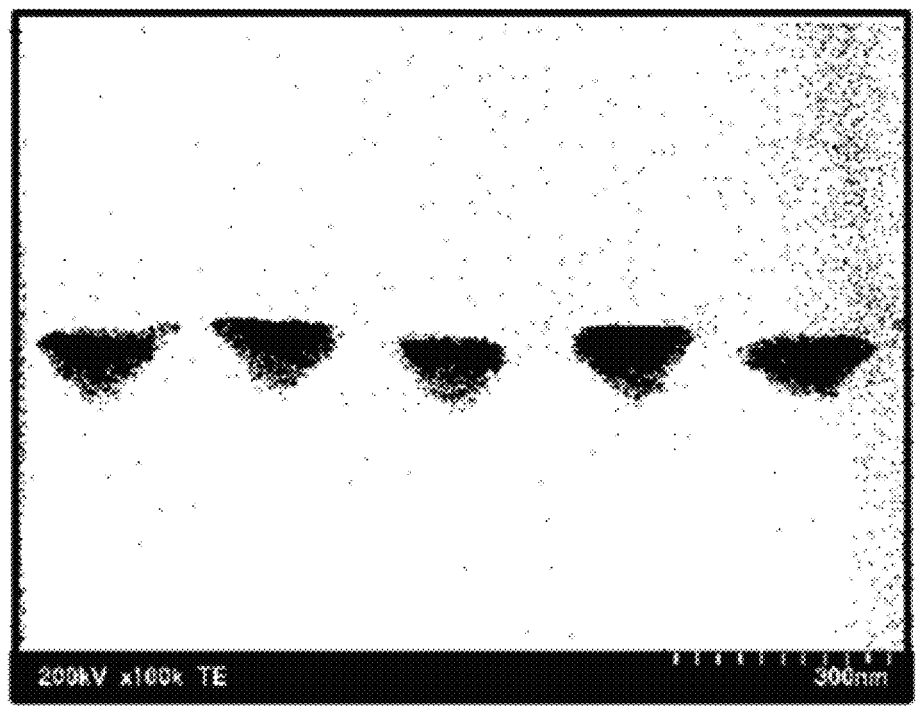
FIG. 60 is a SEM photographic image according to an example of the invention.

FIG. 59 is a TEM photographic image illustrating an example of the second layered product (6). Since FIG. 59 is a TEM photographic image, a depth of the fine pattern is also reflected. For this reason, the height of the fine pattern seems to be low. However, through the SEM observation, the pitch was 460 nm, and the height was approximately 460 nm. In FIG. 59, the white portion in the concave portion was the second mask layer (6). This is apparent from FIG. 60 obtained through observation using a TEM and an EDX method. The black portion in FIG. 60 corresponds to a titanium (Ti) mapping portion included in the second mask layer. It was determined that the distance lcv was equal to or shorter than several nanometers (equal to or shorter than a resolution of the TEM and EDX analysis). Meanwhile, in FIG. 59, the distance lcc was 0.18 h. The distance lcc was flexibly controllable depending on a concentration in coating and the coating condition.

The cross-sectional image of the first layered product 1 was observed for the case where the pitch is set to 460 nm. As a result, it was recognized that the distance lcc was 0.18 h, and the distance lcv was zero. In addition, it was recognized that the shape of the second mask layer corresponds to the shape of the concave portion of the mold, and the first mask layer is formed to cover both the second mask layer and the concave-convex structure of the mold. A fact that the distance lcv is zero means that the distance is equal to or shorter than a measurement limitation of the transmission electron microscope and the energy dispersive X-ray spectroscopy method. Since the measurement limitation in this method is in a several nanometer scale, it can be determined that the distance lcv is zero or several nanometers or shorter.

Example 7

From Example 6, it was recognized that the first layered product 1(6) and the second layered product 2(6) can be formed for the mold described in Table 5. Next, a test was performed regarding whether or not a third layered product 3 provided with a fine mask pattern having a high aspect ratio on the object to be processed can be formed using the first and second layered products 1(6) and 2(6).

First, the first layered product 1(6) was laminated to the object to be processed (2 inch (ϕ) sapphire substrate) by interposing the first mask layer. A photosetting resin (MUR series, produced by MARUZEN PETROCHEMICAL CO., LTD.) was used as the material of the first mask layer. As the laminating method, the following two methods were used.

(Laminating Method 1)

The first mask layer was formed on the sapphire substrate with a thickness of 360 nm for a pitch of 200 nm, a thickness of 650 nm for a pitch of 460 nm, and a thickness of 400 nm for a pitch of 700 nm using a spin coat method. Then, the resulting member was disposed at a temperature of 25° C. and a humidity of 50% for 2 minutes. The fine patterned-surface of the first layered product 1 and the first mask layer were laminated under a vacuum atmosphere.

(Laminating Method 2)

The first mask layer was spin-coated on the fine patterned-surface of the first layered product 1(6). The thickness in the spin coating was set similarly to that of the laminating method 1. After the spin coating, the resulting product was disposed at a temperature of 25° C. and a humidity of 50% for 2 minutes.

Then, the resulting product was laminated to the sapphire substrate under a vacuum atmosphere. The spin coating was performed such that casting is performed until the first mask layer is coated on the entire fine patterned surface of the mold to form a coat film of the first mask layer, and rotation is then performed.

The operation subsequent to the laminating was similarly performed regardless of the laminating method. After the laminating, the surface opposite to the fine pattern formation surface of the first layered product 1(6) was pressed by applying a pressure of 0.05 MPa for 5 minutes. After the pressing, the first layered product 1 was released. In a case where the first layered product 1(6) is optically UV-transparent (when there is no chromium layer in this example), UV light was irradiated toward the first layered product 1(6) with an integral light intensity of 1200 mJ/cm$^2$. In a case where the first layered product 1(6) is not optically transparent (when there is a chromium film in this example), UV light was irradiated toward the sapphire substrate surface with the same integral light intensity. After the light irradiation, the resulting member was left as it is for 10 minutes. Then, the first layered product 1 was released. In this case, only the mold was released. Subsequently, UV light was irradiated onto the fine mask patterned-surface on the sapphire substrate again with an integral light intensity of 1000 mJ/cm$^2$.

In a case where the second layered product 2(6) was used, specifically, the following investigation was performed. First, the sapphire substrate was heated at a temperature of 90° C., and the first mask layer side surface was pressed to the sapphire substrate surface under a reduced pressure atmosphere. UV light was irradiated at a room temperature with an integral light intensity of 1200 mJ/cm$^2$. The condition of the UV light irradiation was similar to that of the first layered product 1(6). After the UV light irradiation, the resulting member was left as it is for 10 minutes. Then, the second layered product (6) was released. In this case, only the mold was released. Subsequently, UV light was irradiated onto the fine patterned-surface on the sapphire substrate again with an integral light intensity of 1000 mJ/cm$^2$.

In the aforementioned method, it was observed whether or not the third layered product 3 consisting of [the second mask layer/the first mask layer/the object to be processed] was transferred using a transmission electron microscope (TEM), an energy dispersive X-ray spectroscopy (EDX) method, and a scanning electron microscope (SEM). Regardless of the type of the substrate, the type of the first mask layer, and the type of the fine pattern, the following result was nearly similar to that within the scope of the present invention, so that a part thereof will be described.

Figure 61:
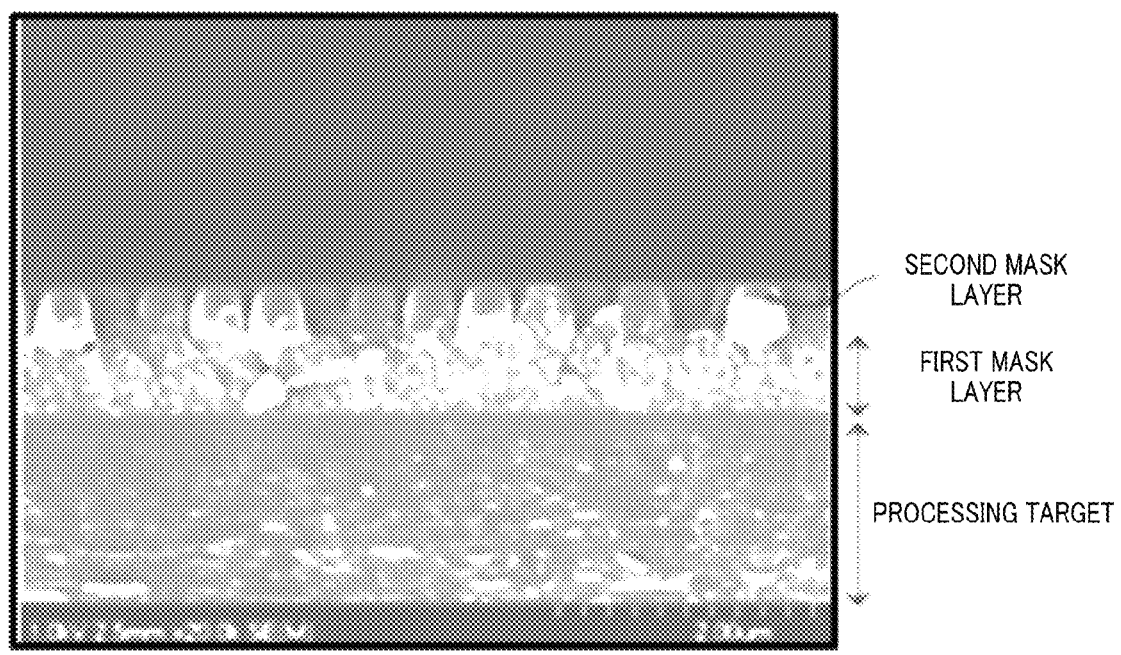
FIG. 61 is a SEM photographic image according to an example of the invention.
Figure 62:
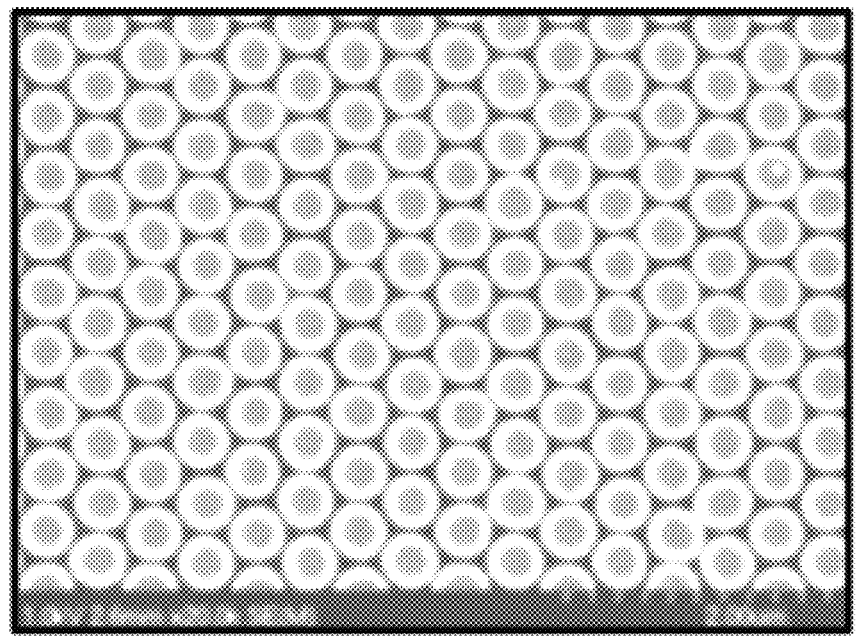
FIG. 62 is a SEM photographic image according to an example of the invention.

First, a result in a case where the first layered product 1(6) was used is shown in FIGS. 61 and 62. FIG. 61 is an SEM photographic image observed in a cross section. FIG. 62 is an SEM photographic image in a case where the pitch is set to 460 nm, and the fine pattern is observed in top view. From the aforementioned description, it is recognized that the layered product consisting of [the second mask layer/the first mask layer/the object to be processed] was transferred.

The patterned-surface of the sapphire substrate formed by transferring the second mask layer using the first layered product 1(6) was observed using a scanning electron microscope. As a result, it was recognized that the pattern was transferred with an interval corresponding to the concave-convex structure of the mold. In addition, by observing the cross-sectional image, it was recognized that the height of the nanostructure formed on the sapphire substrate is equal to the height of the nanostructure of the mold. From the aforementioned description, it was recognized that the second mask layer was transferred onto the sapphire substrate by using the first layered product 1(6).

Figure 63:
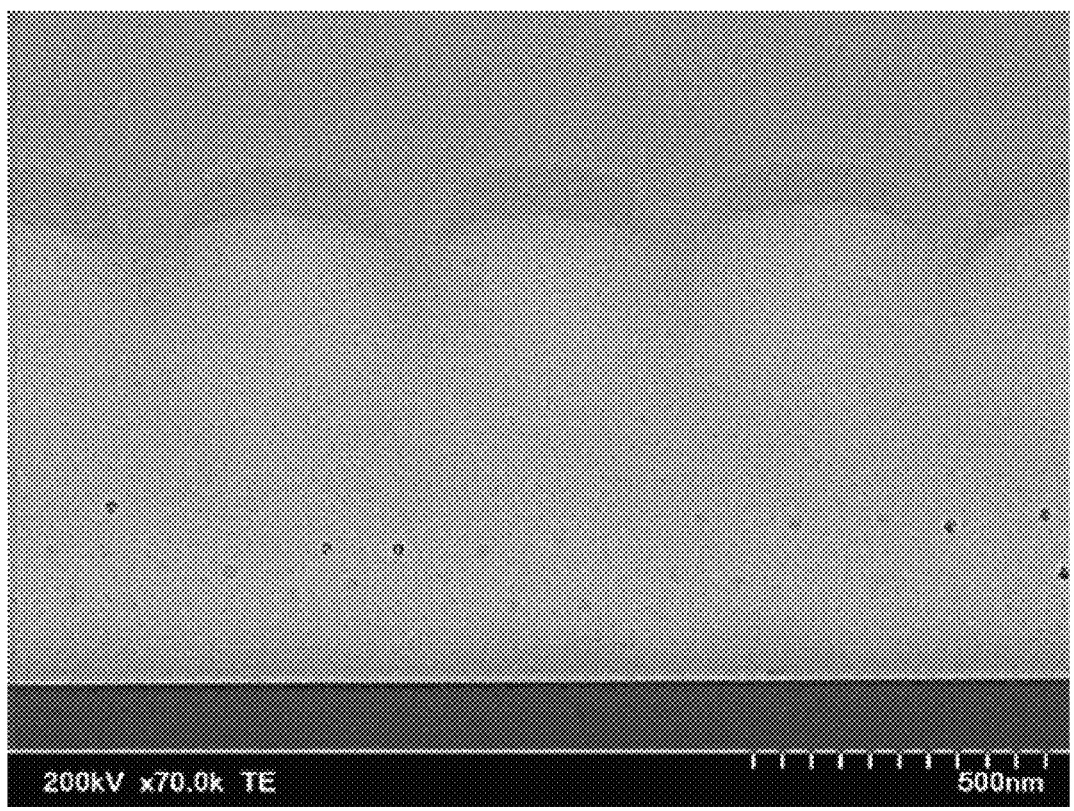
FIG. 63 is a SEM photographic image according to an example of the invention.
Figure 64:
FIG. 64 is a SEM photographic image according to an example of the invention.

Next, a result in a case where the second layered product 2(6) was used is illustrated in FIGS. 63 and 64. FIG. 63 is a TEM photographic image in a case where the pitch is set to 460 nm, and the fine pattern is observed in a cross section. In FIG. 63, the second mask layer has a black falcate shape. Meanwhile, FIG. 64 is a TEM-EDX photographic image observed in a cross section. In FIG. 64, the white falcate portion corresponds to the second mask layer. From the aforementioned description, it is recognized that the layered product consisting of [the second mask layer/the first mask layer/the object to be processed] was transferred.

The fine patterned-surface of the sapphire substrate in a case where the second layered product 2(6) was used was observed using a scanning electron microscope. As a result, it was recognized that the pattern was transferred with an interval corresponding to the concave-convex structure of the mold. In addition, by observing the cross-sectional image, it was recognized that the height of the nanostructure formed on the sapphire substrate is equal to the height of the nanostructure of the mold. From the aforementioned description, it was recognized that the second mask layer (6) was transferred onto the sapphire substrate by using the second layered product 2(6). In addition, by observing the cross section using both a transmission electron microscope and an energy dispersive X-ray spectroscopy method, it was recognized that titanium (Ti) in the second mask layer is not diffused into the first mask layer, and the second mask layer is formed only on the top of the convex portion of the nanostructure including the first mask layer transferred onto the sapphire substrate.

Subsequently, in order to form the fine mask pattern having a high aspect ratio on the object to be processed, dry etching was performed from the second mask layer side of the layered product consisting of [the second mask layer/the first mask layer/the object to be processed]. The dry etching was performed by using oxygen ashing until the sapphire substrate or the metal layer interface (Cr or SiO$_2$) is exposed.

Figure 65:
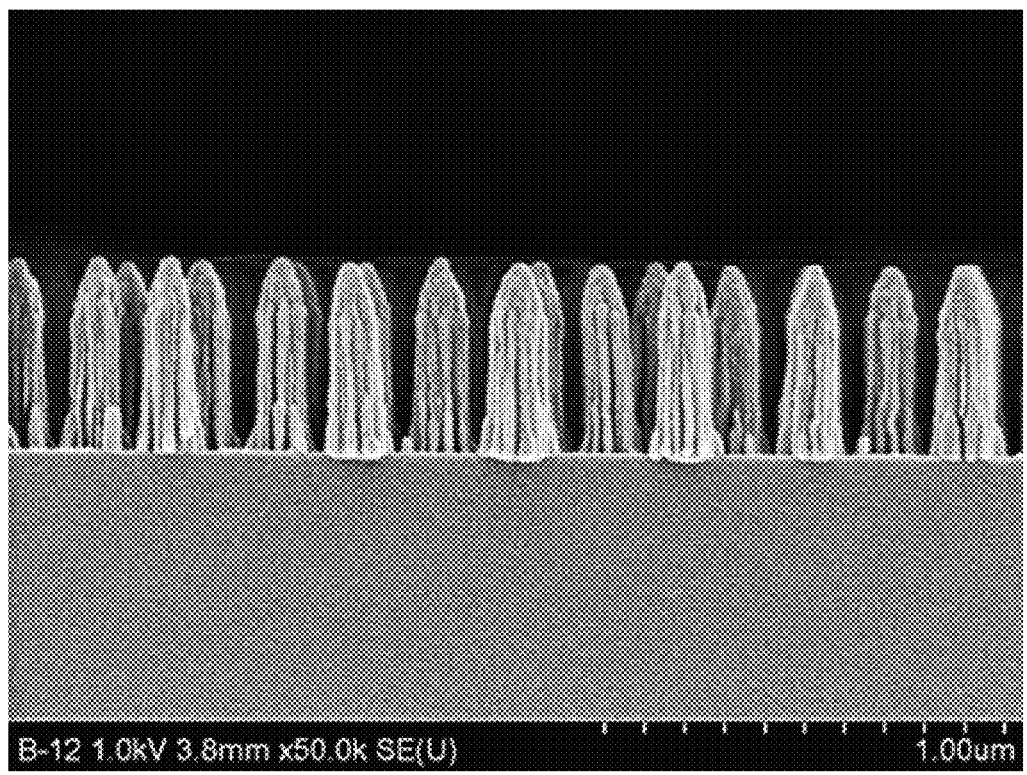
FIG. 65 is a SEM photographic image according to an example of the invention.
Figure 66:
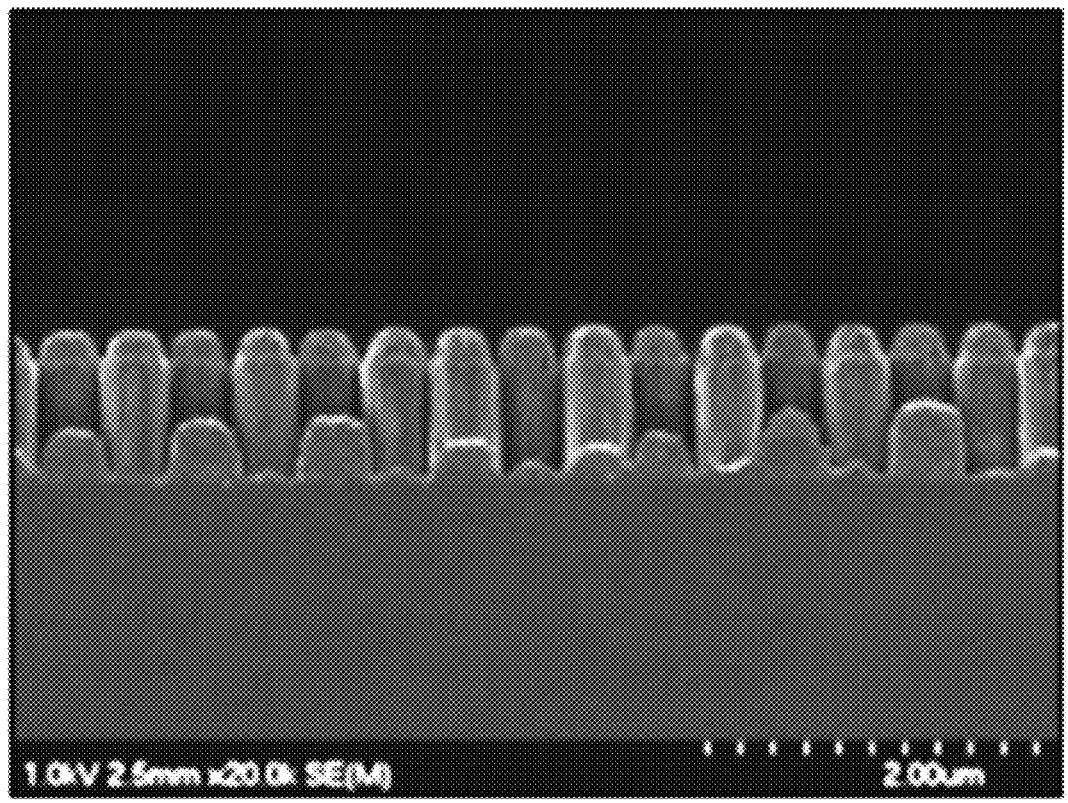
FIG. 66 is a SEM photographic image according to an example of the invention.

An example of the result is shown in FIGS. 65 and 66. FIGS. 65 and 66 are cross-sectional SEM photographic images. Since the aspect ratios of the fine patterns manufactured using the first layered product 1(6) in FIGS. 65 and 66 were 2.4 and 5.5, respectively, it is recognized that a very high aspect ratio can be obtained. The cross-sectional shape after the oxygen ashing was observed using a scanning electron microscope. Through observation using a scanning electron microscope, it was recognized that the fine mask pattern (fine pattern including the first and second mask layers) having a high aspect ratio was arranged with an interval corresponding to the pitch of the concave-convex structure of the mold in both the case where the first layered product 1 is used and the case where the second layered product 2 is used. Since the aspect ratio was 2.4 and 5.5 in the tested samples, it was recognized that the fine mask pattern having a high aspect ratio can be easily formed on the object to be processed.

It was recognized that a hydrophilic surface having a contact angle of 10° or smaller can be formed by performing a UV-O$_3$ treatment from the fine pattern side surface of the obtained fine mask pattern having a high aspect ratio. It was also recognized that a water-repellent (antifouling) surface having a contact angle of 140° or larger can be formed by applying a hydrophobic treatment using a fluorine-based silane coupling agent and the like after the UV-O$_3$ treatment.

In addition, in a case where the second layered product 2(6) having a pitch of 460 nm and the distance lcc of 0.33 h, 0.52 h, and 0.63 h was used, the thickness hml of the third layered product 3 was 0 nm, and the thickness ratio hmv/h0 was 2.07, 0.92, and 0.59, respectively, before the dry etching is performed. Using a TEM and an EDX method, it was observed that, as the dry etching (oxygen ashing) is performed, the component of the second mask layer moves from the second mask layer to the first mask layer to protect the side wall. By performing the oxygen ashing for several tens seconds or longer, the thickness hml as a thickness of the second mask layer that protects the side wall was saturated and remained in 10 nm or smaller.

If the oxygen ashing was performed up to the interface with the object to be processed, the thickness ratio hmv/h0 of the third layered product 3 was 0.38, 0.25, and 0.18, respectively. Meanwhile, the thickness ratio hml/hmv was 0.038, 0.057, and 0.08, respectively.

Meanwhile, in a case where the first layered product 1 having a pitch of 700 nm, and the distance lcc of 0.44 h, 0.61 h, and 0.79 h was used, the thickness hml of the third layered product 3 was 0 nm, and the thickness ratio hmv/h0 was 1.26, 0.63, and 0.27, respectively, before the dry etching is performed. Similar to the case where the pitch was set to 460 nm, it was observed that, as the dry etching (oxygen ashing) is performed, the component of the second mask layer moves from the second mask layer to the first mask layer to protect the side wall.

If the oxygen ashing was performed up to the interface with the object to be processed, the thickness ratio hmv/h0 of the third layered product 3 was 0.45, 0.29, and 0.13, respectively. Meanwhile, the thickness ratio hml/hmv was 0.029, 0.045, and 0.1, respectively.

Meanwhile, in a case where the second layered product 2(6) having a pitch of 200 nm, and the distance lcc of 0.4 h, 0.45 h, and 0.6 h was used, the thickness hml of the third layered product 3 was 0 nm, and the thickness ratio hmv/h0 was 1.5, 1.22, and 0.67, respectively, before the dry etching is performed. Similar to the case where the pitch was set to 460 nm, it was observed that, as the dry etching (oxygen ashing) is performed, the component of the second mask layer moves from the second mask layer to the first mask layer to protect the side wall.

If the oxygen ashing was performed up to the interface with the object to be processed, the thickness ratio hmv/h0 of the third layered product 3 was 0.25, 0.225, and 0.15, respectively. Meanwhile, the thickness ratio hml/hmv was 0.1, 0.11, and 0.17, respectively. In addition, regarding the thickness hml, it is difficult to more precisely quantify the thickness equal to or smaller than 10 nm. Therefore, the thickness hml set to 10 nm was used in order to compute the thickness ratio hml/hmv.

Example 8

From Examples 6 and 7, it was recognized that the third layered product 3 provided with a fine mask pattern having a high aspect ratio can be easily formed on the object to be processed by using the first and second layered products 1(6) and 2(6) for a combination of the molds shown in Table 5 and various first mask layers, and a hydrophilic surface or a water-repellent surface can be also easily obtained. Next, it was tested whether or not the object to be processed can be processed by using, as a mask, the fine mask pattern having a high aspect ratio manufactured using the first and second layered products 1(6) and 2(6).

Through the methods described in Examples 6 and 7, the layered product including the second mask layer, the first mask layer, and object to be processed was formed, and then, dry etching was performed for the first mask layer through oxygen ashing until the interface with the object to be processed.

Subsequently, sapphire substrate was etched by using, as a mask, the obtained fine mask pattern having a high aspect ratio (the fine pattern structure including the first and second mask layers). The etching was performed using a chlorine gas through inductively coupled plasma reactive ion etching (ICP-RIE).

The plasma etching condition for processing the sapphire substrate was set such that only a $BCl_3$ gas or a mixed gas of $BCl_3$ and $Cl_2$ or Ar obtained by setting the ratio of gas flow rates to 90 ccm:10 sccm to 85 sccm:15 sccm was used, a processing pressure was set to 0.1 to 6.5 Pa, and the inductively coupled plasma RIE apparatus was used.

Figure 67:
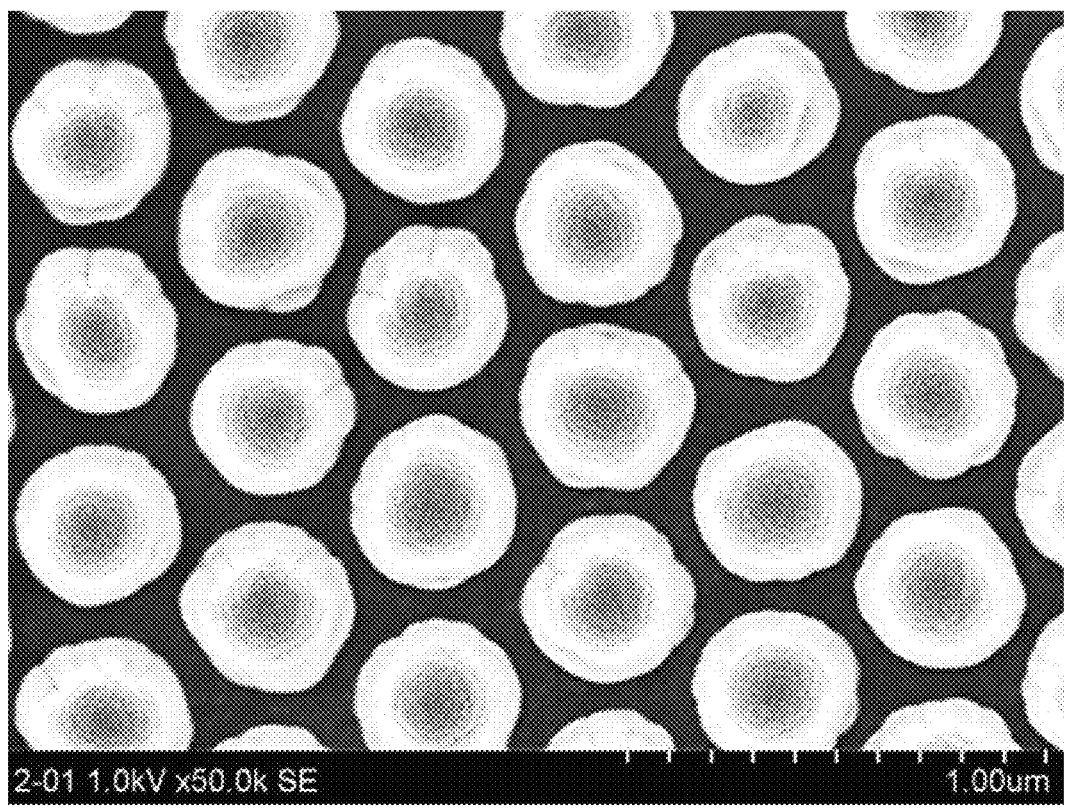
FIG. 67 is a SEM photographic image according to an example of the invention.

After the etching, the residue of the first mask layer was removed through rinsing using a mixed solution of a sulfuric acid and an oxygenated water. A result in a case where the pitch was set to 460 nm was shown in FIG. 67. FIG. 67 is an SEM photographic image observed in top view. From FIG. 67, it is recognized that the fine pattern is formed on the surface of the sapphire substrate.

The surface of the obtained sapphire substrate was observed using a scanning electron microscope. As a result, it was recognized that the nanostructure is formed with an interval corresponding to the pitch of the mold. The contour of the formed nanostructure was not a perfect circle, but had a distortion. By observing the cross section, it was recognized that a band was formed in a height direction in the side face.

The result described above was obtained when the distance lcv is set to →0, and the distance lcc is set to 0.85 h to 0.05 h. In a case where the distance lcc was set to zero, an uneven coating of the first mask layer was significantly reflected. Meanwhile, in a case where the distance lcc has a negative value, that is, in a case where the coat film of the second mask layer was filled in the entire fine pattern to form a thin film, a remaining film thickness unevenness was observed due to the uneven coating of the second mask material. In order to absorb this remaining film thickness unevenness, it was necessary to perform over-etching the oxygen ashing. For this reason, it was observed that the height of the fine pattern including the second mask layer and the first mask layer tends to decrease.

Next, the inventors manufactured first and second layered products 1 and 2 having a different configuration from those of Examples described above, and transferred a fine mask pattern onto a object to be processed using the obtained first and second layered products 1 and 2, and the effect thereof was investigated. Hereinafter, details of the investigation made by the inventors will be described.

Example 9

(a) Manufacturing of Cylindrical Master
(Manufacturing of Template for Resin Mold)

A concave-convex structure was formed on a quartz glass surface through a semiconductor laser direct lithography method by using quartz glass as a material of the cylindrical master. First, a resist layer was formed on a quartz glass surface through a sputtering method. The sputtering method was performed by using a CuO (containing 8 atm % of Si) having a size of 3 inches (φ) as a target (resist layer) and applying electric power of RF100W to form a resist layer of 20 nm. Subsequently, exposure was performed using a semiconductor laser having a wavelength of 405 nm while the cylindrical master was rotated. Then, the resist layer after applying the exposure was developed. The development of the resist layer was performed using a glycine water solution of 0.03 wt % for 240 seconds. Then, dry etching was performed for the etching layer (quartz glass) by using the developed resist layer as a mask. The dry etching was performed by using $SF_6$ as an etching gas and applying a processing electric power of 300 W at a processing gas pressure of 1 Pa for a processing time of 5 minutes. Then, only the residue of the resist layer was removed using hydrochloric acid of pH1 from the cylindrical master having a transferred fine structure on a surface. The removal time was set to 6 minutes.

For the surface concave-convex structure of the obtained cylindrical master, Durasurf HD-1101Z (produced by DAIKIN INDUSTRIES, ltd.) was coated and heated at a temperature of 60° C. for one hour. Then, the resulting member was disposed at a room temperature for 24 hours for solidification. Then, rinsing was performed three times using Durasurf HD-ZV (produced by DAIKIN INDUSTRIES, ltd.), and perform a releasing treatment was performed. In addition, the shape or the arrangement of the concave-convex structure provided on a surface of the cylindrical master was controlled based on the output power of the semiconductor laser, an operation pattern, or a processing speed. Subsequently, a resin concave-convex structure was formed on a film through a consecutive UV transfer method from the cylindrical master.

(b) Manufacturing of Reel-Like Resin Mold A

As a transfer material, the following transfer material 7 was used.

Transfer Material 7: a mixture of DACHP, M350, I.184, and I.369 was mixed with a mixing ratio of 17.5 g:100 g:5.5 g:2.0 g A reel-like resin mold A (having a length of 200 m and a width of 300 mm) having a transferred concave-convex structure on a surface was obtained in a similar manner as Example 1 except that the transfer material 7 was used, and the integral light intensity was changed to 1000 $mJ/cm^2$.

Then, a resin mold B was manufactured through a consecutive UV transfer method by using the reel-like resin mold A as a template.

(c) Manufacturing of Resin Mold B

In the process of manufacturing the resin mold B, transferring was performed for the transfer material 7 described above or the transfer material 8 described below by using the reel-like resin mold A as a template.

Transfer Material 8: a mixture of M309, M350, silicone diacrylate, I.184, and I.369 mixed with a mixing ratio of 20 g:80 g:1.5 g:5.5 g:2.0 g. EBECRYL350 produced by DAICEL-CYTEC Company LTD. was used as the silicone diacrylate.

A plurality of reel-like resin molds B (having a length of 200 m and a width of 300 mm) having the same transferred concave-convex structure as that of the cylindrical master on a surface were obtained in a similar manner as Example 1 except that the transfer materials 7 and 8 described above were used, and the integral light intensity was set to 1000 $mJ/cm^2$.

Then, the second mask layer was formed in the fine pores (concave portions) of the resin mold B, and then, the first mask layer was formed, so that a second layered product 2(7) was manufactured.

(d) Manufacturing of Second Layered Product 2(7)

As a material of the second mask layer, the following material J was used.

Second Mask Layer Material J: a mixture of TTB, DEDFS, SH710, 3APTMS, M211B, PO-A, M350, I.184, and I.369 mixed with a mixing ratio of 170 g:50 g:40 g:60 g:40 g:40 g:20 g:11 g:4 g.

The material J was diluted with a PGME solvent, and was used as a coating material of the second mask layer on the resin mold B. The coating concentration was set such that a volume of the second mask layer material per unit planar area is smaller than a volume of the fine pores (concave portions) per unit planar area.

As the first mask layer material, the first mask layer materials K to M described below were used.

First Mask Layer Material K: a mixture of benzyl-based binder resin, M211B, PO-A, M350, I.184, and I.369 mixed with a mixing ratio of 150 g:40 g:40 g:20 g:11 g:4 g. An MEK solution of a binary copolymer containing 80 mass % of benzyl methacrylate and 20 mass % of methacrylic acid (solid content 50%, weight-average molecular weight 56000, acid equivalent 430, dispersity 2.7) was used as the benzyl-based binder resin. In the notation described above, the mass is a solid content mass.

First Mask Layer Material L: benzyl-based binder resin, polyalkylene glycol dimethacrylate A, polyalkylene glycol dimethacrylate B, trimethylolpropane triacrylate, 4,4'-bis(diethylamine)benzophenone, 2-(o-chlorophenyl)-4,5-diphenylimidazole dimmer, diamond green, and leuco crystal violet were mixed with a mixing ratio of 50 g:15 g:15 g:10 g:0.3 g:3 g:0.2 g:0.2 g, by adding MEK of 10 g. An MEK solution of a binary copolymer containing 80 mass % of benzyl methacrylate and 20 mass % of methacrylic acid (solid content 50%, weight-average molecular weight 56000, acid equivalent 430, dispersity 2.7) was used as the benzyl-based binder resin. Polyalkylene glycol dimethacrylate obtained by adding average 3 mol of ethylene oxide to both ends of polypropylene glycol obtained by adding average 12 mol of propylene oxide was used as the polyalkylene glycol dimethacrylate A. Polyethylene glycol dimethacrylate obtained by adding average 2 mol of ethylene oxide to both ends of the bisphenol-A (NK ester BPE-200, produced by SHIN-NAKAMURA CHEMICAL CO., LTD.) was used as the polyalkylene glycol dimethacrylate B. AIGEN DIAMOND GREEN GH (produced by HODOGAYA CHEMICAL CO., LTD.) was used as the diamond green. The mass described above is the solid content mass.

First Mask Layer Material M: styrene-based binder resin, M211B, PO-A, M350, I.184, and I.369 was mixed with a mixing ratio of 150 g:40 g:40 g:20 g:11 g:4 g. The mass described above is the solid content mass. The binder resin A and the binder resin B mixed at a mixing ratio of 8:3 (parts by mass) was used as the styrene-based binder resin. An MEK solution of copolymer obtained by mixing methacrylic acid, styrene, and benzyl methacrylate with a mixing ratio of 30 g:20 g:50 g was used as the binder resin A (weight-average molecular weight 55000, dispersity 1.8, acid equivalent 290, solid content concentration 41.1%). An MEK solution of copolymer obtained by mixing methacrylic acid, styrene, 2-ethylhexyl acrylate: and 2-hydroxyethyl methacrylate with a mixing ratio of 30 g:40 g:20 g:10 g was used as the binder resin B (weight-average molecular weight 47000, dispersity 4.4, acid equivalent 290, solid content concentration 40.5%).

Mask Layer Materials K to M were diluted with PGME solvent. The diluted material was used as a coating material of the first mask layer to the resin mold where the second mask layer was filled.

The diluted second mask layer material was coated on the concave-convex structure surface of the resin mold B using Micro Gravure coating (produced by Yasui Seiki Co., Ltd.).

Then, the resulting member was disposed at a temperature of 25° C. and a humidity of 60% under an atmospheric pressure for 5 minutes. Then, the resulting member was disposed at a temperature of 80° C. and a humidity of 60% under an atmospheric pressure for 5 minutes to remove the solvent (first layered product 1). Subsequently, the diluted first mask layer material was coated on the concave-convex structure surface of the resin mold (first layered product 1), where the second mask layer was filled, using Micro Gravure coating (produced by Yasui Seiki Co., Ltd.). Then, the resulting member was disposed at a temperature of 25° C. and a humidity of 60% under an atmospheric pressure for 10 minutes to remove the solvent. As a result, a second reel-like layered product 2(7) (having a length of 200 m and a width of 300 mm) was obtained. After removing the solvent described above, a protection layer made of PE that can absorb visible light was laminated to the reel-like second layered product 2(7), and then, the resulting member was windingly recovered. In the analysis or deployment of the second layered product 2(7) described below, operation was performed for the second layered product 2(7) which was reeled out, and from which the protection layer was separated.

In a case where the resin mold B was manufactured using the transfer material 8, the resin mold was cut, and a chromium film having a thickness of 10 nm was formed on the concave-convex structure surface through a sputtering method. Then, Durasurf 1101Z was coated, and the resulting member was disposed at a temperature of 25° C. and a humidity of 50% for one day. Subsequently, the resulting member was rinsed three times using Durasurf HD-ZV and was dried using an air blower, so that a releasing process was performed to obtain the resin mold B. The filling of the second mask layer and the formation of the first mask layer were performed using a bar coater method. The manufactured second layered products 2(7) are listed in Table 7 as follows.

TABLE 7

| No. | P | lcc/h | lcv | Sh/Sc | Concave-Convex Structure | Mold-removing Layer | 2nd Mask Layer | 1st Mask Layer | lor/P | Es/Eb |
|---|---|---|---|---|---|---|---|---|---|---|
| 1 | 200 | 0.75 | →0 | 0.73 | (7) | — | Matrial J | Material K | 1.0 | 45 |
| 2 | 460 | 0.86 | →0 | 0.79 | (7) | — | Matrial J | Material K | 0.4 | 49 |
| 3 | 460 | 0.70 | →0 | 0.79 | (7) | — | Matrial J | Material K | 0.4 | 49 |
| 4 | 460 | 0.48 | →0 | 0.79 | (7) | — | Matrial J | Material K | 0.4 | 49 |
| 5 | 700 | 0.64 | →0 | 0.86 | (7) | — | Matrial J | Material K | 0.1 | 43 |
| 6 | 700 | 0.31 | →0 | 0.86 | (7) | — | Matrial J | Material K | 0.1 | 43 |
| 7 | 700 | 0.24 | →0 | 0.86 | (7) | — | Matrial J | Material K | 0.1 | 43 |
| 8 | 700 | 0.11 | →0 | 0.86 | (7) | — | Matrial J | Material K | 0.1 | 43 |
| 9 | 460 | 0.70 | →0 | 0.79 | (7) | — | Matrial J | Material K | 0.9 | 49 |
| 10 | 460 | 0.70 | →0 | 0.79 | (7) | — | Matrial J | Material K | 0.1 | 49 |
| 11 | 460 | 0.70 | →0 | 0.79 | (7) | — | Matrial J | Material L | 0.4 | 49 |
| 12 | 460 | 0.70 | →0 | 0.79 | (7) | — | Matrial J | Material M | 0.4 | 49 |
| 13 | 460 | 0.70 | →0 | 0.79 | (8) | Cr/Durasurf 1101Z | Matrial J | Material K | 0.4 | →∞ |

The terminologies described in Table 7 have the following meanings.

No.: indicates a reference number of the second layered product 2(7).

P: indicates a pitch of the concave-convex structure in a nanometer scale.

Distance lcc/h: the second layered product 2(7) satisfies the condition $0<lcc<1.0\,h$. If both sides are divided by the height h, the condition may be modified to $0<lcc/h<1.0$, so that the condition becomes dimensionless. In addition, the values were calculated from the cross-sectional image obtained through observation using a scanning electron microscope.

Distance lcv: indicates a thickness lcv of the second mask layer (mask layer on the convex portion) existing on the top of the convex portion of the concave-convex structure in a nanometer scale. The notation "→0" means that a length is equal to or shorter than a resolution when a transmission electron microscope and an energy dispersive X-ray spectrometry method were applied to a sliced segment of the second layered product 2(7).

Concave-convex structure: indicates a material of the concave-convex structure. That is, the concave-convex structure includes a solidified substance of the described material.

Mold-releasing Layer: the notation "-" means an unprocessed state. The notation "Cr/Durasurf 1101Z" means that a chromium film having a thickness of 10 nm was formed, and then, a releasing process was performed using Durasurf 1101Z.

Second Mask Layer: indicates a material of the second mask layer.

First Mask Layer: indicates a material of the first mask layer.

lor/P: indicates a dimensionless value representing a ratio between the distance lor from the top of the convex portion of the concave-convex structure to the exposed surface of the first mask layer and the pitch P.

Es/Eb: indicates a ratio between the surface fluorine concentration Es of the concave-convex structure of the resin mold and the average fluorine concentration Eb of the material of the concave-convex structure of the resin mold. In addition, the notation "→∞" means that, as the average fluorine concentration Eb approaches zero, the ratio Es/Eb is diverged to the infinite ∞.

Sh/Sc: indicates an opening ratio of the concave-convex structure. This value is dimensionless and can be expressed as a percentage by multiplying 100.

From the second layered products 2(7) numbered in No. 1 to 8 in Table 7, it is recognized that the distance lcc/h as an index of the filling state of the second mask layer may be arbitrarily changed within a range of 0.11 to 0.86 regardless of the pitch. The distance lcc/h was controllable depending on a concentration of the second mask layer material, a volume of the fine pores (concave portions) of the concave-convex structure, and a coating concentration. It was possible to easily perform the filling if a volume of the solid content of the second mask layer material existing on the unit planar area when the second mask layer material is coated is smaller than a volume of the fine pores (concave portions) of the concave-convex structure existing under the unit planar area.

Comparing Nos. 3, 9, and 10 in Table 7, it is recognized that the index lor/P of the thickness of the first mask layer can be changed flexibly. The thickness of the first mask layer was controllable depending on a concentration of the first mask layer material and the coating film thickness.

Comparing Nos. 3, 11, and 12 in Table 7, it is recognized that the first mask layer can be formed regardless of a material of the first mask layer.

Comparing Nos. 3 and 13 in Table 7, it is recognized that the second layered product 2(7) can be manufactured regardless of whether or not the mold-releasing layer exists.

Figure 68:
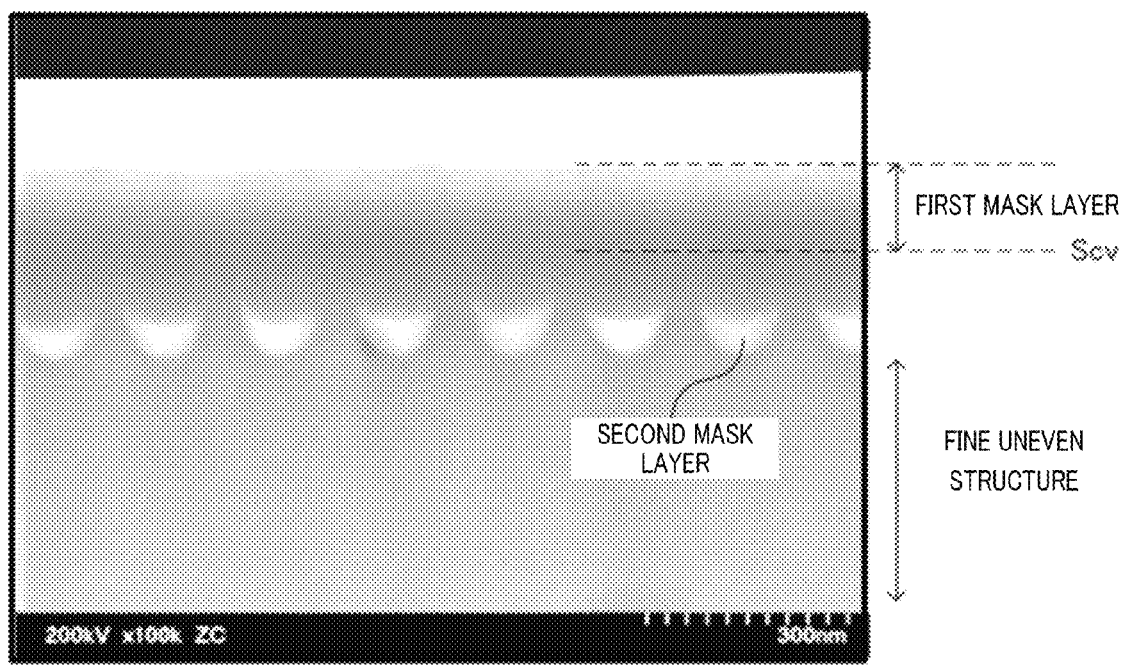
FIG. 68 is a SEM photographic image according to an example of the invention.

An example of the manufactured second layered product 2(7) is shown in FIG. 68. FIG. 68 illustrates a cross-sectional scanning electron microscope photographic image of the second layered product 2 corresponding to No. 4 in Table 7. In FIG. 68, the thickness lor of the first mask layer was measured as 200 nm. In addition, titanium (Ti) contained in the second mask layer material was analyzed by combining a transmission electron microscope and an energy dispersive X-ray spectrometry method. As a result, it was recognized that the second mask layer material was not formed on the top of the convex portion in the concave-convex structure (distance lcv→0).

The cross section of the second layered product 2 corresponding to No. 4 in Table 7 was observed using a scanning electron microscope. As a result, the thickness lor of the first mask layer was measured as 200 nm. In addition, by performing measurement using a transmission electron microscope and an energy dispersive X-ray spectroscopy method, it was recognized that the second mask material was arranged only in the concave portion of the nanostructure of the mold, titanium (Ti) in the second mask material was not dispersed into the first mask layer, and the second mask layer did not move when the first mask layer was formed. That is, in the state of the second layered product 2, it was recognized that the second mask layer was arranged to match the concave portion of the mold, and the first mask layer was formed to cover the nanostructure of the mold and the second mask layer. By performing similar observation, the thickness lor and the distance lcc were measured. The results are described in Table 7 as entries lor/P and lcc/h.

Similarly, for other second layered products 2(7), it was also recognized that the second mask layer was filled in the fine pores (concave portions) of the concave-convex structure, the first mask layer was formed on the concave-convex structure, and the distance lcv was "→0".

Next, FIGS. 69A to 69C and 70A to 70C illustrate cross-sectional scanning electron microscope photographic images for making a value of the distance lcc/h clear. FIGS. 69A to 69C and 70A to 70C illustrate an analysis result for the first layered product 1(7).

Figure 69A:
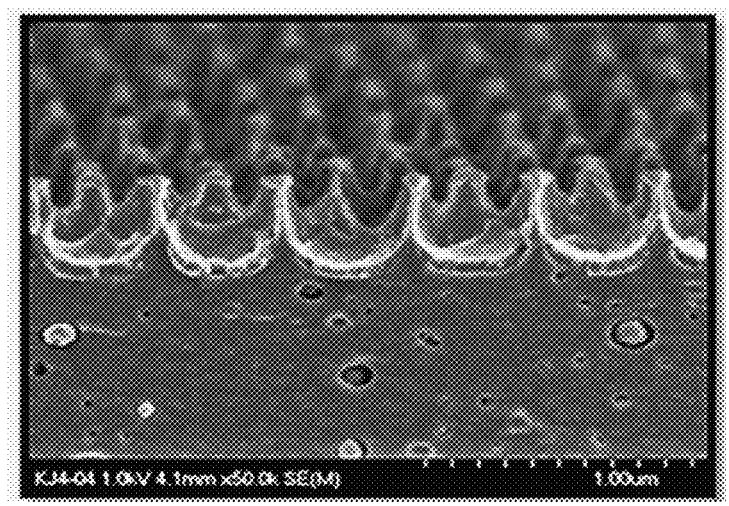
FIGS. 69A to 69C are SEM photographic images according to an example of the invention.
Figure 69B:
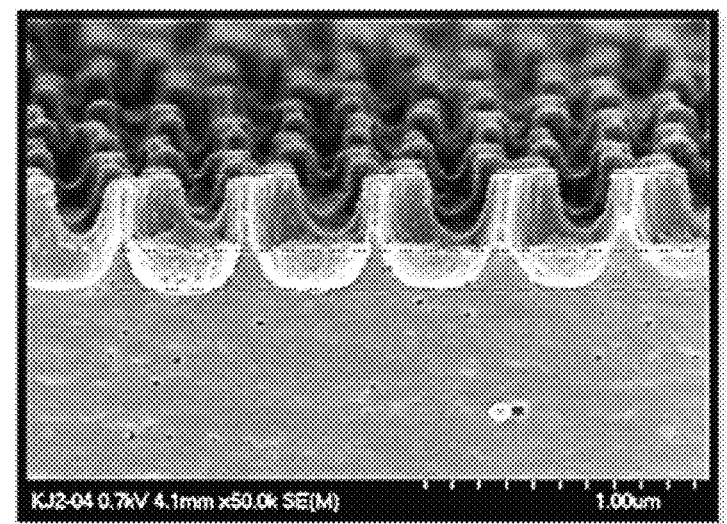
Figure 69B:
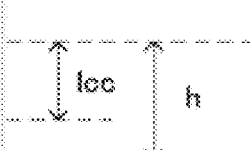
Figure 69C:
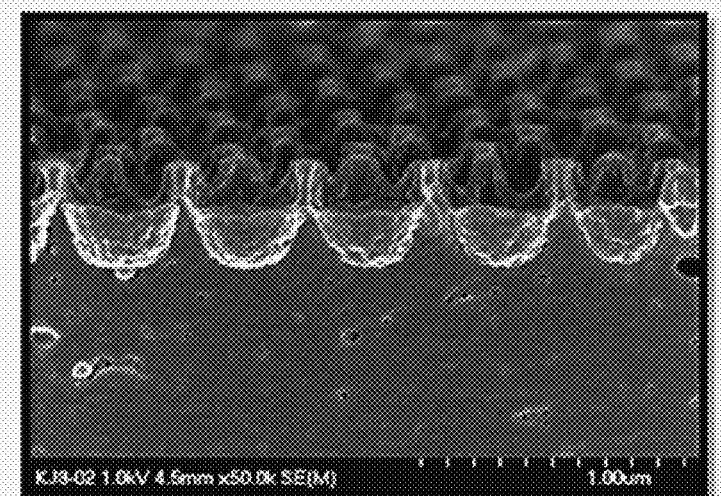

FIGS. 69A to 69C correspond to Nos. 2 to 4 in Table 7. As illustrated in FIGS. 69A to 69C, it is recognized that the second mask layer is filled in the fine pores (concave portions), and the interfacial position between the second mask layer and the air layer is variable. In addition, titanium (Ti) contained in the second mask layer material was analyzed by combining a transmission electron microscope photographic image and an energy dispersive X-ray spectrometry method. As a result, it was recognized that the second mask layer material was not formed on the top of the convex portion of the concave-convex structure (distance lcv→0).

Figure 70A:
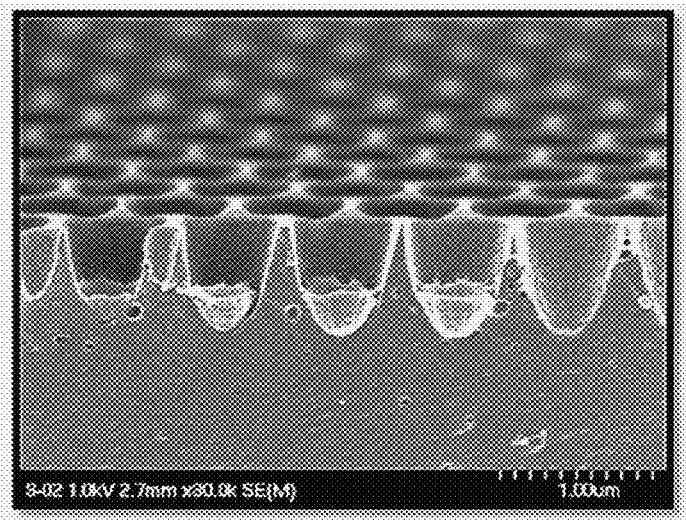
FIGS. 70A to 70C are SEM photographic images according to an example of the invention.
Figure 70B:
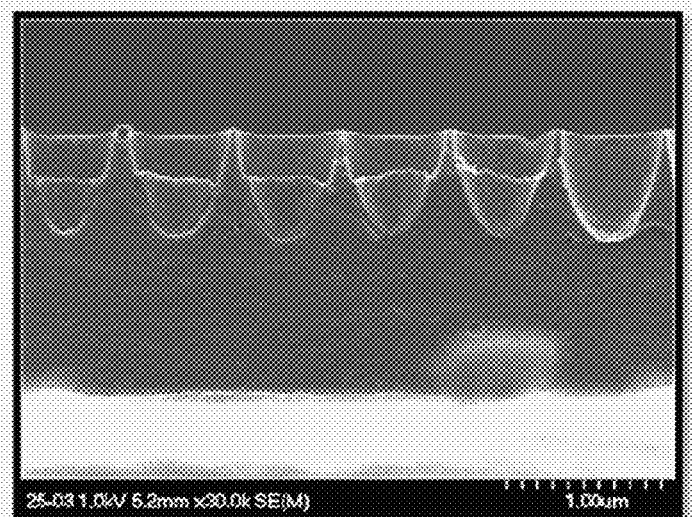
Figure 70C:
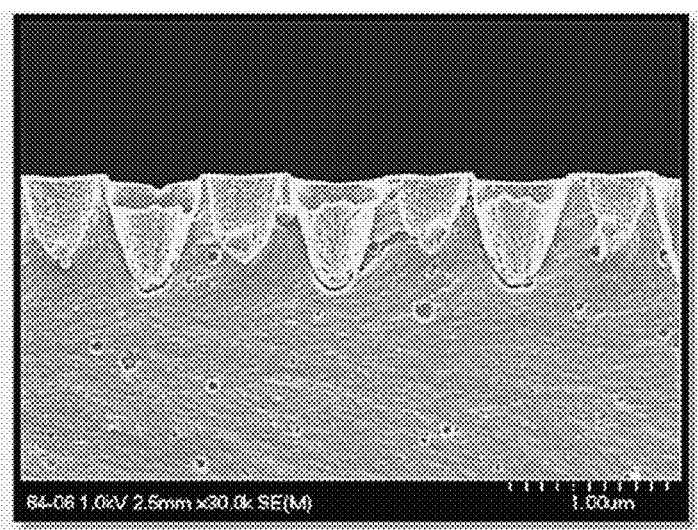

FIGS. 70A to 70C correspond to Nos. 5 to 7 in Table 7. As illustrated in FIGS. 70A to 70C, it is recognized that the second mask layer is filled in the fine pores (concave portions), and the interfacial position where the second mask layer is exposed is variable. In addition, titanium (Ti) contained in the second mask layer material was analyzed by combining a transmission electron microscope photographic image and an energy dispersive X-ray spectrometry method. As a result, it was recognized that the second mask layer material was not formed on the top of the convex portion of the concave-convex structure (distance lcv→0).

(e) Use of Second Layered Product 2(7)

Using the second layered product 2(7) of Nos. 9 and 10 described in Table 7, a sapphire substrate as a object to be processed was fabricated. As the sapphire substrate, c-plane sapphire substrate having a size of 2 inches (φ) was used.

The first mask layer of the second layered product 2(7) was directly thermocompressively bonded to the sapphire substrate. The thermocompressive bonding was performed by applying a pressure of 0.01 MPa using a laminate roll at a temperature of 80 to 120° C. Then, UV light was irradiated over the resin mold with an integral light intensity of 1200 mJ/cm$^2$, and the resulting member was disposed under an atmospheric pressure at a temperature of 25° C. and a humidity of 50% for 10 minutes. Subsequently, the resin mold was released, and UV light was irradiated again toward the second mask layer side surface of the layered product including the second mask layer, the first mask layer, and the sapphire substrate with an integral light intensity of 1000 mJ/cm$^2$.

Figure 71C:
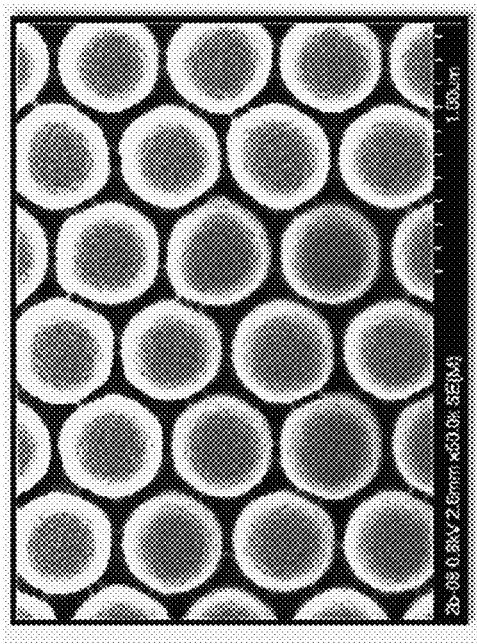
FIGS. 71A to 71D are SEM photographic images according to an example of the invention.
Figure 71D:
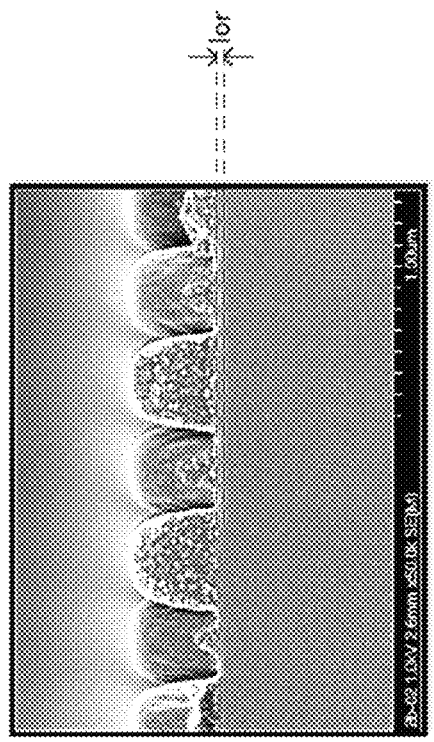
Figure 71A:
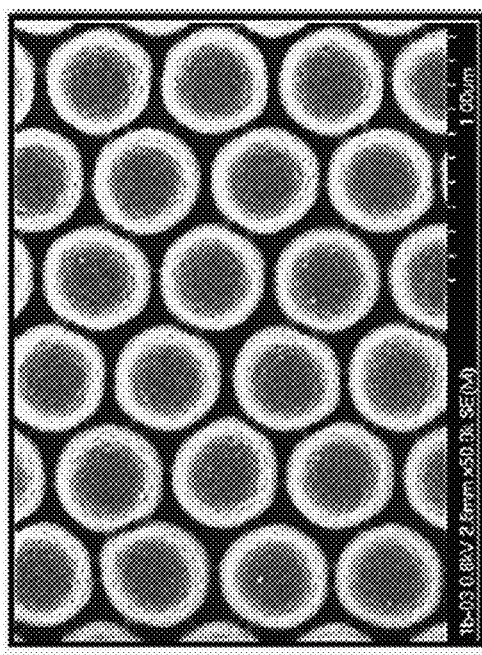
Figure 71B:
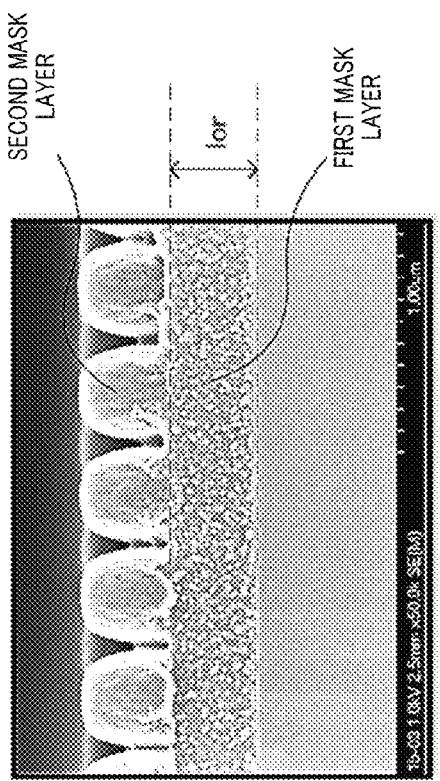

A scanning electron microscope photographic image of the obtained third layered product 3 (layered product consisting of [the second mask layer/the first mask layer/the object to be processed]) is illustrated in FIGS. 71A to 71D. It is recognized that transferring was satisfactorily performed in both the second layered product 2(7) of No. 9 described in Table 7 (lor=405 nm, lor/P=0.9) as illustrated in FIGS. 71A and 71B and the second layered product 2(7) of No. 10 described in Table 7 (lor=40 nm, lor/P=0.1) as illustrated in FIGS. 71C and 71D.

Out of the obtained third layered product 3 (layered product consisting of [the second mask layer/the first mask layer/the object to be processed]), a case where the second layered product 2(7) of No. 9 described in Table 7 (lor=405 nm, lor/P=0.9) was used, and a case where the second layered product 2(7) of No. 10 described in Table 7 (lor=40 nm, lor/P=0.1) was used were representatively observed using a scanning electron microscope. By observing the surface, it was recognized that the nanostructure was transferred with an interval corresponding to the pitch of the nanostructure of the mold. Furthermore, by observing the cross section, it was recognized that the height of the nanostructure on the sapphire substrate is equal to the height of the nanostructure of the mold, so that the second mask layer was transferred. Moreover, by observing the cross section, it was recognized that transferring was satisfactorily performed even in a very thin thickness lor, such as 40 nm, and even when the thickness lor is in a submicron scale such as 450 nm.

An in-plane distribution of the distance lor of the second layered product 2(7) of No. 9 described in Table 7 (lor=405 nm, lor/P=0.9) was ±10% with respect to the film thickness in the center. An in-plane distribution of the distance lor of the second layered product 2(7) of No. 10 described in Table 7 (lor=40 nm, lor/P=0.1) was ±7% with respect to the film thickness in the center. Meanwhile, a distribution of the thickness corresponding to the distance lor transferred onto the sapphire substrate was ±12% in the case of No. 9 and ±8% in the case of No. 10. From the aforementioned description, it is recognized that transferring can be performed by reflecting the precisions of the first and second mask layers on the object to be processed by using the second layered product 2(7).

Figure 72A:
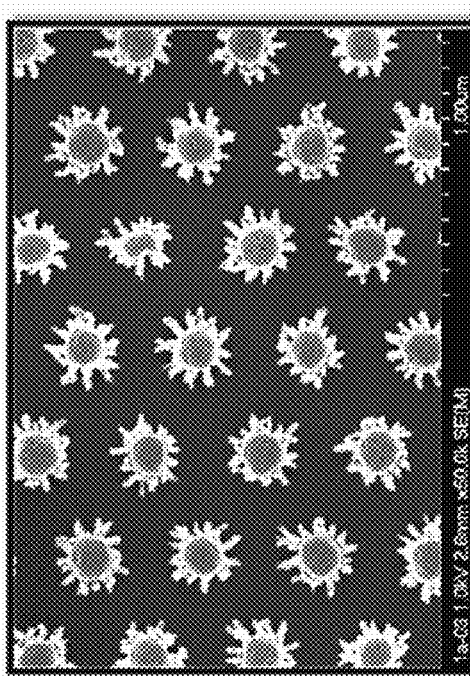
FIGS. 72A to 72D are SEM photographic images according to an example of the invention.
Figure 72B:
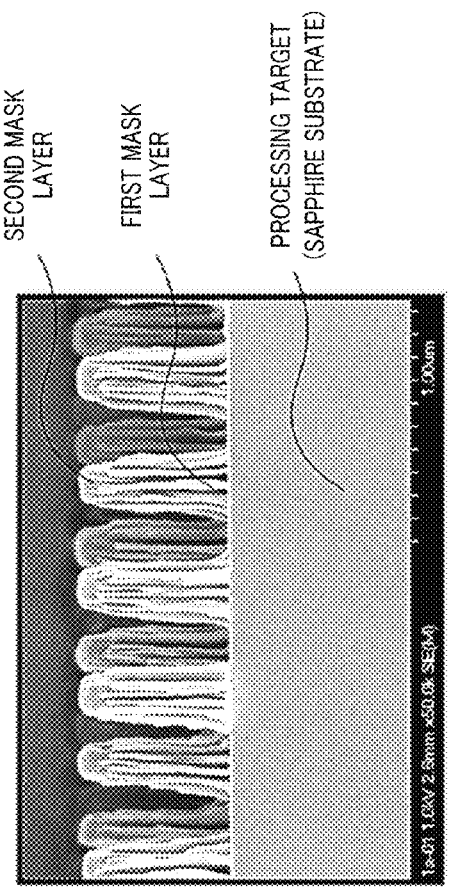
Figure 72C:
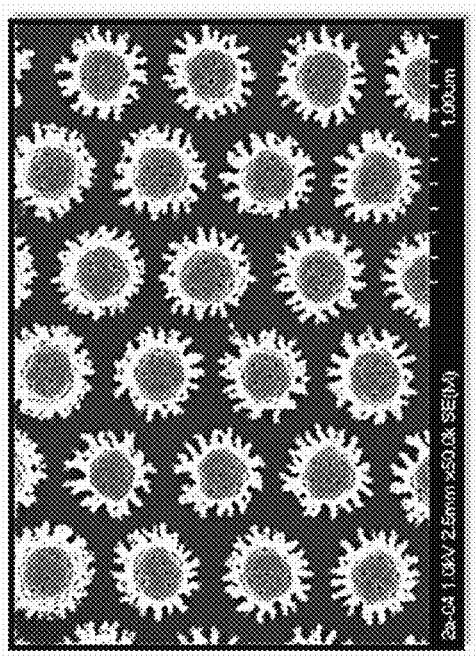
Figure 72D:
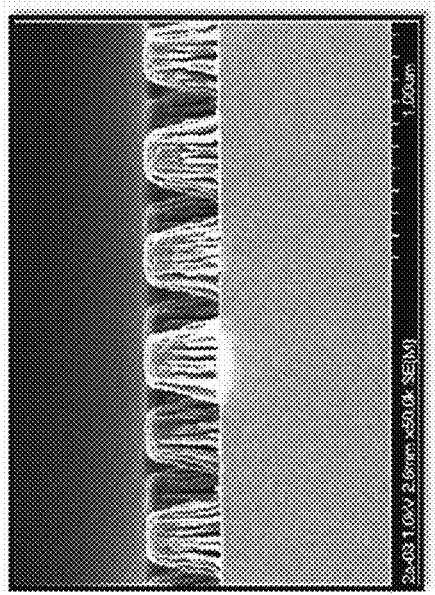

Subsequently, oxygen ashing was performed from the second mask layer side surface. Through the oxygen ashing, the first mask layer was anisotropically etched by using the second mask layer as a mask. The oxygen ashing was performed until the sapphire substrate surface is exposed. A scanning electron microscope photographic image of the fine pattern structure including the fine mask pattern and the object to be processed is illustrated in FIGS. 72A to 72D. FIGS. 72A and 72B illustrate a case where No. 9 of Table 7 was used, and FIGS. 72C and 72D illustrate a case where No. 10 of Table 7 was used.

Using a scanning electron microscope, observation was made, representatively, for a case where Nos. 9 and 10 described in Table 7 were used. By observing the surface, it was recognized that the oxygen ashing progresses up to the sapphire substrate interface so as to remove the first mask layer. Furthermore, by nanofabricating the first mask layer by using the second mask layer as a mask, large roughness was generated in the edge. It is conceived that this is because of an etching rate difference between an organic domain and an inorganic domain of the second mask layer. Due to the etching rate difference, the organic domain is removed in advance. It is conceived that, as a result, roughness is generated, and ashing is performed for the first mask layer by masking the generated roughness, so that roughness is generated in the contour of the first mask layer after applying the ashing. Meanwhile, by observing the cross section, it was recognized that the fine pattern including the first and second mask layers on the sapphire substrate was formed to match the pitch of the mold.

After a material of the second mask layer was mixed with a mixing ratio of TTB:3APTMS=100 g:80 g, preliminary condensation was performed until the viscosity becomes 20 times so as to manufacture a prepolymer. The first mask layer on the sapphire substrate was fabricated by using a mixture of the manufactured prepolymer, Irgacure 184, and Irgacure 369 as the second mask layer material through the method described above. As a result, it was recognized that the side face roughness was significantly reduced.

As illustrated in FIGS. 72A to 72D, it is recognized that a fine mask pattern having a high aspect ratio can be formed on the sapphire substrate using a high etching selectivity between the first and second mask layers through the oxygen ashing. In addition, it is inferred that etching can be performed in such a high anisotropic aspect ratio because the metal alkoxide contained in the second mask layer protects the side wall. Furthermore, the ratio Vo1/Vm1 between the etching rate Vo1 of the first mask layer and the etching rate Vm1 of the second mask layer was 30.

In a case where the second layered product 2(7) of No. 9 (lcc=0.7 h, lor/P=0.9) was used, before dry etching, the thickness hml of the third layered product 3 was 0 nm in all cases, and the thickness ratio hmv/h0 was 0.44. It was observed from the TEM and EDX analysis that, as the dry etching (oxygen ashing) progresses, the second mask layer component moves from the second mask layer to the first mask layer so as to protect the side wall. By performing oxygen ashing for several tens seconds or longer, the thickness hml of the second mask layer that protects the side wall was saturated and remained in 10 nm or smaller. During the oxygen ashing, the side wall protection film having a thickness hml remained. For example, if the height h0 was set to 400 nm, 500 nm, and 734 nm, the thickness ratio hmv/h0 was 0.34, 0.27, and 0.17, respectively, and the thickness ratio hml/hmv was 0.073, 0.075, and 0.081, respectively.

Meanwhile, in a case where the second layered product 2(7) of No. 10 (lcc=0.7 h, lor/P=0.1) was used, before dry etching, the thickness hml of the third layered product was 0 nm in all cases, and the thickness ratio hmv/h0 was 0.44. Similar to the case of the second layered product 2(7) of No. 9 (lcc=0.7 h, lor/P=0.9), it was observed that, as the dry etching (oxygen ashing) progresses, the component of the second mask layer moves from the second mask layer to the first mask layer so as to protect the side wall. During the oxygen ashing, the side wall protection film having a thickness hml remained. For example, in a case where the height h0 was 340 nm, 350 nm, and 366 nm, the thickness ratio hmv/h0 was 0.41, 0.40, and 0.38, respectively, and the thickness ratio hml/hmv was 0.072, 0.072, and 0.072, respectively. In addition, regarding the thickness hml, it is difficult to more precisely quantify the thickness equal to or smaller than 10 nm. Therefore, the thickness hml set to 10 nm was used in order to compute the thickness ratio hml/hmv.

Subsequently, the sapphire substrate was etched through plasma etching. The plasma etching condition was set such that only a $BCl_3$ gas or a mixed gas between $BCl_3$ and $Cl_2$ or Ar obtained by setting the ratio of gas flow rates to 90 ccm:10 sccm to 85 sccm:15 sccm was used, a processing pressure was set to 0.1 to 6.5 Pa, and the inductively coupled plasma RIE apparatus was used. After the dry etching, the sapphire substrate was rinsed using a piranha solution.

Figure 73:
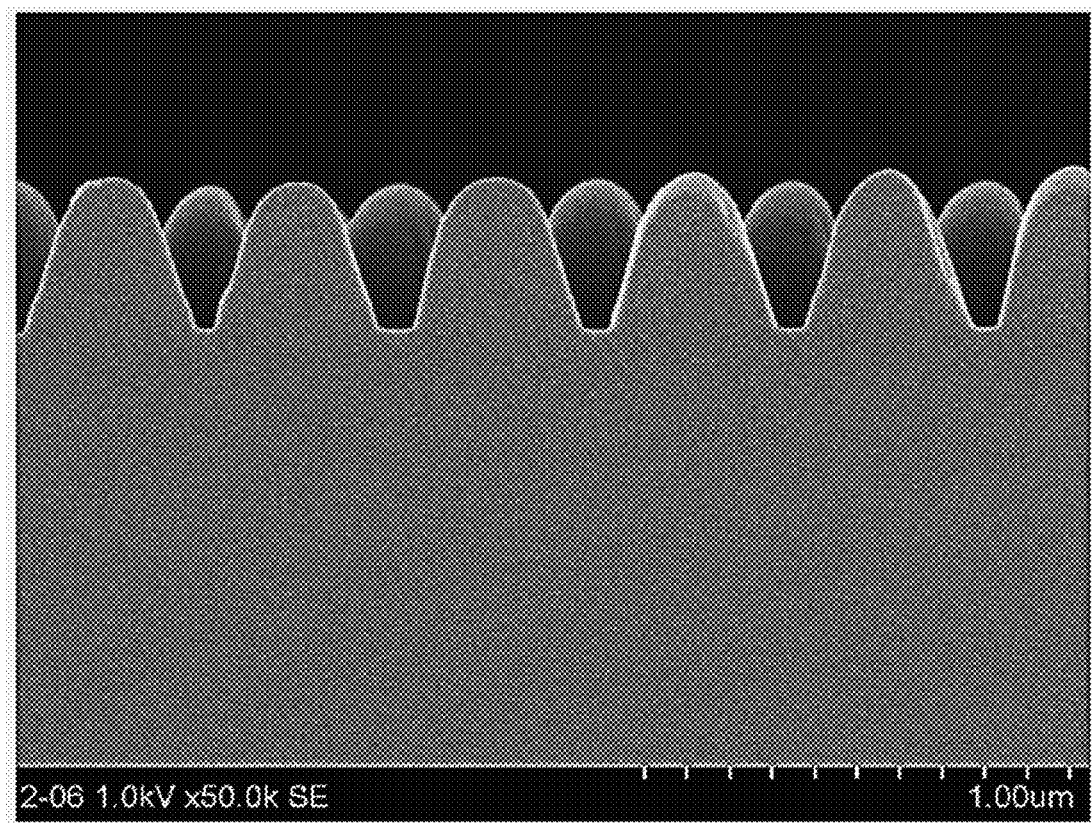
FIG. 73 is a SEM photographic image according to an example of the invention.

A scanning electron microscope photographic image of the obtained nanofabricated sapphire substrate is shown in FIG. 73. FIG. 73 is a cross-sectional scanning electron microscope photographic image illustrating the fabricated sapphire substrate in a case where the second layered product 2(7) of No. 9 in Table 7 is used. As recognized from FIG. 73, it is possible to easily nanofabricate sapphire substrate which is a difficult processing material.

The sapphire substrate, representatively, obtained by using the second layered product 2(7) of Nos. 9 and 10 in Table 7, was observed using a scanning electron microscope. By observing the cross section, sapphire substrate was nanofabricated, and the nanostructure was arranged with an interval matching the pitch of the mold. The height of the nanostructure was approximately 400 nm, the convex portion was round, and the side walls of the convex portions were consecutively linked. In addition, the ratio Vo2/Vi2 between the etching rate Vi2 of the object to be processed (sapphire substrate) and the etching rate Vo2 of the first mask layer was 0.7.

Investigation was similarly made for Nos. 1, 3, and 5 in Table 7, in which the second mask layer material was changed to any of the second mask layer materials O to S as described below. As a result, it was possible to obtain the same result as that described above and fabricate sapphire substrate using the third layered product 3.

Second Mask Layer Material O: a material obtained by partially condensing titanium tetrabutoxide monomer. Condensation was performed through agitation at a temperature of 80° C. The material was agitated under a pressure of 800 hPa for 6 hours and was then agitated under a pressure of 100 hPa for 90 minutes. The viscosity at a temperature of 25° C. was 250 cP. In addition, a radius of inertia was 1 nm or smaller.

Second Mask Layer Material P: a material obtained by partially condensing zirconium tetrabutoxide monomer. Condensation was performed through agitation at a temperature of 80° C. The material was agitated under a pressure of 800 hPa for 6 hours and was then agitated under a pressure of 100 hPa for 90 minutes. The viscosity at a temperature of 25° C. was 300 cP. In addition, a radius of inertia was 1 nm or smaller.

Second Mask Layer Material Q: a mixture of titanium tetrabutoxide monomer, 3-acrylioxypropyl trimethoxysilane, and I.184 mixed with a mixing ratio of 90 g:10 g:5 g.

Second Mask Layer Material R: a material obtained by partially condensing a mixture of titanium tetrabutoxide monomer and zirconium tetrabutoxide monomer mixed with a mixing ratio of 90 g:10 g, 60 g:40 g, or 30 g:70 g. Condensation was performed through agitation at a temperature of 80° C. The material was agitated under a pressure of 800 hPa for 6 hours, was agitated under a pressure of 200 hPa for 90 minutes, and was then agitated under a pressure of 30 hPa for one hour. The viscosity at a temperature of 25° C. was 330 cP. In addition, a radius of inertia was 1 nm or smaller.

Second Mask Layer Material S: a mixture of titanium tetrabutoxide monomer, zirconium tetrabutoxide monomer, 3-acrylioxypropyl trimethoxysilane, and I.184 mixed with a mixing ratio of 30 g:70 g:50 g:7 g.

The radius of inertial was obtained as follows. The second mask layer material was diluted with a propylene glycol monomethyl ether solvent by 3 weight %, and the radius of inertia was obtained by applying a Gunier plot to the measurement result obtained through a small-angle X-ray scattering measurement using X-rays having a wavelength of 0.154 nm.

Comparative Example 2

Similar to Examples described above, the second layered product 2 was manufactured only by using the binder resins used in the first mask layer materials K to M. That is, investigation was made for a configuration in which the first mask layer does not include a reactive diluent and a polymerization initiator. In addition, the ratio lor/P of the first mask layer was set to 1.

Fabrication of the sapphire substrate using the manufactured second layered product 2 was tested. Thermocompressive bonding was performed for the sapphire substrate, and light irradiation was performed. Then, the mold was released. As result, the third layered product consisting of [the second mask layer/the first mask layer/the object to be processed] was not formed. Instead, a layered product including the resin mold incorporating the second mask layer and the first mask layer and a layered product including the first mask layer and the sapphire substrate were formed. This is because the first mask layer does not contain a reactive diluent and a photopolymerization initiator, so that the solidification strength was weak, and interlayer separation was generated.

Comparative Example 3

Similar to Examples described above, the second layered products 2 were manufactured by excluding the polymerization initiator from the first mask layer materials K to M. That is, investigation was made for a configuration in which the first mask layer does not contain a polymerization initiator. In addition, the ratio lor/P of the first mask layer was set to 1.

Fabrication of the sapphire substrate using the manufactured second layered product 2 was tested. Thermocompressive bonding was performed for the sapphire substrate, and light irradiation was performed. Then, the mold was released. As result, the third layered product consisting of [the second mask layer/the first mask layer/the object to be processed] was not formed. Instead, a layered product including the resin mold incorporating the second mask layer and the first mask layer and a layered product including the first mask layer and the object to be processed were formed. This is because the first mask layer does not contain a photo-polymerization initiator, so that reactivity of the first mask layer is short. In addition, since solidification was not promoted, interlayer separation was generated.

Comparative Example 4

Similar to Examples described above, the second layered products were manufactured by excluding the reactive diluent from the first mask layer materials K to M. That is, investigation was made for a configuration in which the first mask layer does not contain a reactive diluent. In addition, the ratio lor/P of the first mask layer was set to 1.

Fabrication of the sapphire substrate using the manufactured second layered product was tested. Thermocompressive bonding was performed for the sapphire substrate, and light irradiation was performed. Then, the mold was released. As result, the third layered product consisting of [the second mask layer/the first mask layer/the object to be processed] was not formed. Instead, a layered product including the resin mold incorporating the second mask layer and the first mask layer and a layered product including the first mask layer and sapphire substrate were formed. This is because the first mask layer does not contain a reactive diluent, so that the solidification strength was weak, and interlayer separation was generated.

Example 10

(a) Manufacturing of Cylindrical Master
(Manufacturing of Template for Resin Mold)

A concave-convex structure was formed on a quartz glass surface through a semiconductor laser direct lithography method by using quartz glass as a material of the cylindrical master. First, a resist layer was formed on a quartz glass surface through a sputtering method. The sputtering method was performed by using a CuO substrate (containing 8 atm % of Si) having a size of 3 inches ($\phi$) as a target (resist layer) and applying electric power of RF100W to form a resist layer of 20 nm.

Subsequently, exposure was performed using a semiconductor laser having a wavelength of 405 nm while the cylindrical master was rotated. Then, the resist layer after applying the exposure was developed. The development of the resist layer was performed using a glycine water solution of 0.03 wt % for 240 seconds. Then, dry etching was performed for the etching layer (quartz glass) by using the developed resist layer as a mask. The dry etching was performed by using $SF_6$ as an etching gas and applying a processing electric power of 300 W at a processing gas pressure of 1 Pa for a processing time of 5 minutes. Then, only the residue of the resist layer was removed using hydrochloric acid of pH1 from the cylindrical master having the transferred fine structure on a surface. The removal time was set to 6 minutes.

For the surface concave-convex structure of the obtained cylindrical master, Durasurf HD-1101Z (produced by DAIKIN INDUSTRIES, ltd.) was coated and heated at a temperature of 60° C. for one hour. Then, the resulting member was disposed at a room temperature for 24 hours for solidification Then, rinsing was performed three times using Durasurf HD-ZV (produced by DAIKIN INDUSTRIES, ltd.), and a releasing treatment was performed. In addition, the shape or the arrangement of the concave-convex structure provided on a surface of the cylindrical master was controlled based on the output power of the semiconductor laser, an operation pattern, or a processing speed.

The types of the concave-convex structures manufactured on a surface of the cylindrical master are listed in Table 8. The terminologies described in Table 8 have the following meanings.

Type: indicates whether the concave-convex structure has a hole configuration (concave) or a dot configuration (convex). The "concave" means a fine hole configuration, and the "convex" means a fine dot configuration.

P: indicates a pitch of the concave-convex structure in a nanometer scale

Cylindrical Master: indicates a reference number.

TABLE 8

| Cylindrical Master | Type | P[nm] |
|---|---|---|
| 1 | Concave | 200 |
| 2 | Concave | 460 |
| 3 | Concave | 700 |

Subsequently, a resin concave-convex structure was formed on a film through a consecutive UV transfer method from the cylindrical master.

(b) Manufacturing of Reel-Like Resin Mold A

As a transfer material, the following transfer material 9 was used.

Transfer Material 9: a mixture of DACHP, M350, I.184, and I.369 was mixed with a mixing ratio of 17.5 g:100 g:5.5 g:2.0 g.

The transfer material 9 was coated on an easy adhesion surface of a PET film (A-4100, produced by TOYOBO CO., LTD.) having a width of 300 mm and a thickness of 100 μm using a Micro Gravure coating (produced by Yasui Seiki Co., Ltd.) until the coated film thickness reaches 6 μm. Then, the PET film having the coated transfer material 9 was pressedly laminated to the cylindrical master using a nip roll (0.1 MPa). Ultraviolet rays were irradiated using a UV light exposure apparatus (H-bulb, produced by Fusion UV Systems Japan K.K.) such that an integral exposure light amount under a lamp center becomes 1000 mJ/cm$^2$ under an atmospheric pressure at a temperature of 25° C. and a humidity of 60% to continuously perform photosetting, so that a reel-like resin mold A (having a length of 200 m and a width of 300 mm) having the transferred concave-convex structure was obtained.

The manufactured resin molds A are listed in Table 9. The terminologies described in Table 9 have the following meanings. In the resin molds A described in Table 9, dry etching was performed for the fine patterned surface of the resin mold. Through the dry etching, the opening ratios described in Table 9 were achieved. In the resin molds B manufactured as follows, the resin mold A not subjected to the dry etching was used as a template for a transfer process.

Resin Mold A: indicates a reference number.

Type: indicates whether the concave-convex structure has a hole configuration (concave) or a dot configuration (convex). The "concave" means a fine hole configuration, and the "convex" means a fine dot configuration.

P: indicates a pitch of the concave-convex structure in a nanometer scale hst: indicates a height (depth) of the concave-convex structure in a nanometer scale.

Sh/Sc: indicates a proportion of cavities as seen in a plan view of the concave-convex structure as a dimensionless value.

Concave-convex structure Material: indicates a material of the concave-convex structure. Therefore, this means that the concave-convex structure was formed by curing the listed materials.

TABLE 9

| Resin Mold A | Type | P[nm] | hst[nm] | Sh/Sc | Concave-Convex Structure Material |
|---|---|---|---|---|---|
| A1 | Convex | 200 | 200 | 0.94 | (9) |
| A2 | Convex | 460 | 460 | 0.82 | (9) |
| A3 | Convex | 700 | 700 | 0.83 | (9) |
| A4 | Convex | 460 | 230 | 0.77 | (9) |

Then, a resin mold B was manufactured through a UV consecutive transfer method by using the reel-like resin mold A as a template.

(c) Manufacturing of Resin Mold B

In the process of manufacturing the resin mold B, transferring was performed for the transfer material 9 described above or the transfer material 10 described below by using the reel-like resin mold A as a template.

Transfer Material 10: a mixture of M309, M350, silicone diacrylate, I.184, and I.369 mixed with a mixing ratio of 20 g:80 g:1.5 g:5.5 g:2.0 g. As the silicone diacrylate, EBECRYL350 produced by DAICEL-CYTEC Company LTD. was used.

Similar to Example 1, a plurality of reel-like resin molds B (having a length of 200 m and a width of 300 mm) having the same transferred concave-convex structure as that of the cylindrical master on a surface were obtained except that the transfer materials 9 and 10 described above were used, and the integral light intensity was set to 1000 mJ/cm$^2$.

The manufactured resin molds B are listed in Table 10. The terminologies described in Table 10 have the following meanings.

Resin Mold B: indicates a reference number.

Type: indicates whether the concave-convex structure has a hole configuration (concave) or a dot configuration (convex). The "concave" means a fine hole configuration, and the "convex" means a fine dot configuration.

P: indicates a pitch of the concave-convex structure in a nanometer scale.

hst: indicates a height (depth) of the concave-convex structure in a nanometer scale.

Sh/Sc: indicates a proportion of cavities as seen in a plan view of the concave-convex structure as a dimensionless value.

Concave-convex structure Material: indicates a material of the concave-convex structure. Therefore, this means that the concave-convex structure was formed by curing the listed materials.

TABLE 10

| Resin Mold B | Type | P[nm] | hst[nm] | Sh/Sc | Concave-Convex Structure Material |
|---|---|---|---|---|---|
| B1 | Concave | 200 | 200 | 0.73 | (9) |
| B2 | Concave | 460 | 460 | 0.79 | (9) |
| B3 | Concave | 460 | 460 | 0.79 | (10) |

TABLE 10-continued

| Resin Mold B | Type | P[nm] | hst[nm] | Sh/Sc | Concave-Convex Structure Material |
|---|---|---|---|---|---|
| B4 | Concave | 700 | 700 | 0.86 | (9) |
| B5 | Concave | 460 | 230 | 0.23 | (9) |

Then, a first layered product 1 was manufactured by applying a method of manufacturing a fine pattern formation layered product according to the aforementioned embodiment to the resin molds A or B.

(d) Manufacturing of First Layered Product 1

As a material of the second mask layer, the second mask layer material U or V was used as follows.

Second Mask Layer Material U: a mixture of TTB, DEDFS, SH710, 3APTMS, M211B, PO-A, M350, I.184, and I.369 mixed with a mixing ratio of 170 g:50 g:40 g:60 g:40 g:40 g:20 g:11 g:4 g.

Second Mask Layer Material V: 50 parts by weight of DACHP was added with respect to 100 parts by weight of the mask layer material U.

Subsequently, the second mask layer materials U and V were diluted with a PGME solvent, and were used as a coating material of the resin mold. The volumetric concentration C of the dilute solution was controlled within a range satisfying Formula (11) $Sc \cdot hc \cdot C < Vc$ based on a relationship between the coat film thickness hc and a volume Vc of the concave portion of the concave-convex structure.

In the following description, the first layered product 1 is manufactured by coating the diluted second mask layer material on the concave-convex structure surface of the resin mold A or B and removing the solvent. The resin mold A or B are simply referred to as the resin mold, and the types of the second mask layer materials are simply referred to as the second mask layer material because the processes are similarly performed regardless of the types of the resin molds and the second mask layer materials (second mask layer material U or V).

The second mask layer material diluted with a volumetric concentration C was coated on the concave-convex structure surface of the resin mold having a volume Vc of the concave portion using Micro Gravure coating (produced by Yasui Seiki Co., Ltd.) until the coated film thickness reaches hc (nm). (coating process) Then, the resulting member was disposed at a temperature of 25° C. and a humidity of 60% under an atmospheric pressure for 5 minutes. Then, the resulting member was disposed at a temperature of 80° C. and a humidity of 60% for 5 minutes to remove the solvent (solvent removal process) to obtain a reel-like first layered product 1 having a length of 200 m and a width of 300 mm. After removing the solvent, a PE-based protection layer was laminated, and the reel-like first layered product 1 was windingly recovered. In the analysis or deployment of the first layered product 1 described below, the first layered product 1 was reeled out, and the protection layer was separated.

The manufactured first layered products 1 are listed in Table 11. The terminologies described in Table 11 have the following meanings.

No.: indicates a reference number.

Resin Mold: indicates a type of the resin mold used in the manufacturing. From the symbols listed in the column of the resin mold, a history of the resin mold can be tracked by referencing Tables 9 and 10.

Type: indicates whether the concave-convex structure has a hole configuration (concave) or a dot configuration (convex). The "concave" means a fine hole configuration, and the "convex" means a fine dot configuration.

Second Mask Layer Material: indicates a type of the second mask layer material.

$Vc/(Sc \cdot hc \cdot C)$: indicates a modification of the coating condition formula $Sc \cdot hc \cdot C < Vc$. That is, $Vc/(Sc \cdot hc \cdot C) > 1$ is set to the coating range.

Distance lcc/hst: indicates a value obtained by dividing the distance lcc between the interface where the second mask layer material is exposed and the top of the convex portion of the concave-convex structure by the height hst of the concave-convex structure. According to the present invention, a condition 0<Distance lcc<1.0 hst is satisfied. The left formula may be modified to 0<lcc/hst<1.0.

Sh/Sc: indicates a proportion of cavities (opening ratio) as seen in a plan view of the concave-convex structure as a dimensionless value.

Concave-convex structure Material: indicates a material of the concave-convex structure. Therefore, this means that the concave-convex structure was formed by curing the listed materials.

In the coating process, the second mask layer material diluted with a volumetric concentration C was coated on the surface of the fine pattern of the mold to have a coat film thickness hc (nm). However, it was difficult to accurately measure the coat film thickness on the fine patterned surface. In this regard, a flat film made of the same material as that of the fine pattern of the mold was manufactured, and the coating for the flat film was performed in advance to set the condition. In this condition setting, a coating condition for achieving the coat film thickness (wet film thickness) hc was determined. As a condition for the coating on the fine patterned surface of the mold, the condition for forming the coat film thickness hc on the flat film was directly applied.

TABLE 11

1st Layered Products 1

| No. | Resin Mold | Type | 2nd Mask Layer Material | $Vc/(Sc \cdot hc \cdot C)$ | lcc/hst |
|---|---|---|---|---|---|
| 1 | B4 | Concave | (U) | 9.04 | 0.64 |
| 2 | B4 | Concave | (U) | 1.81 | 0.31 |
| 3 | B4 | Concave | (U) | 1.51 | 0.24 |
| 4 | B2 | Concave | (U) | 5.99 | 0.86 |
| 5 | B2 | Concave | (U) | 3.01 | 0.70 |
| 6 | B2 | Concave | (U) | 2.21 | 0.48 |
| 7 | B3 | Concave | (U) | 3.01 | 0.70 |
| 8 | B1 | Concave | (U) | 9.04 | 0.75 |
| 9 | A3 | Convex | (U) | 2.25 | 0.50 |
| 10 | A2 | Convex | (U) | 1.58 | 0.40 |
| 11 | B5 | Concave | (V) | 6.52 | 0.22 |

The obtained first layered product 1 was observed using a scanning electron microscope. A part of the result will be described below.

Figure 74A:
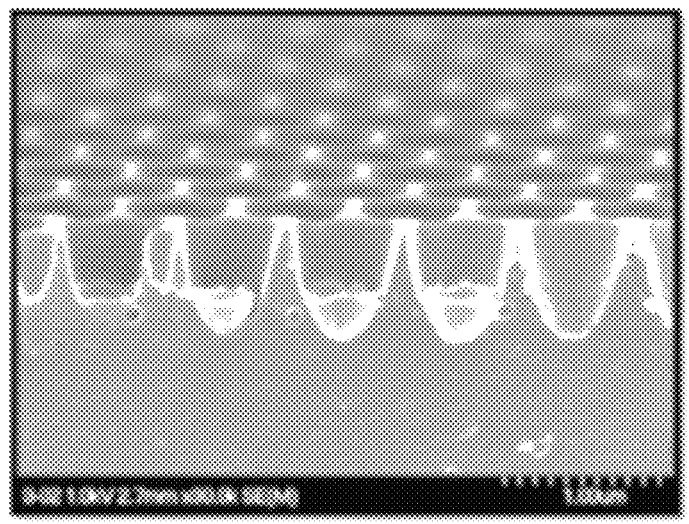
FIGS. 74A to 74C are SEM photographic images according to an example of the invention.
Figure 74B:
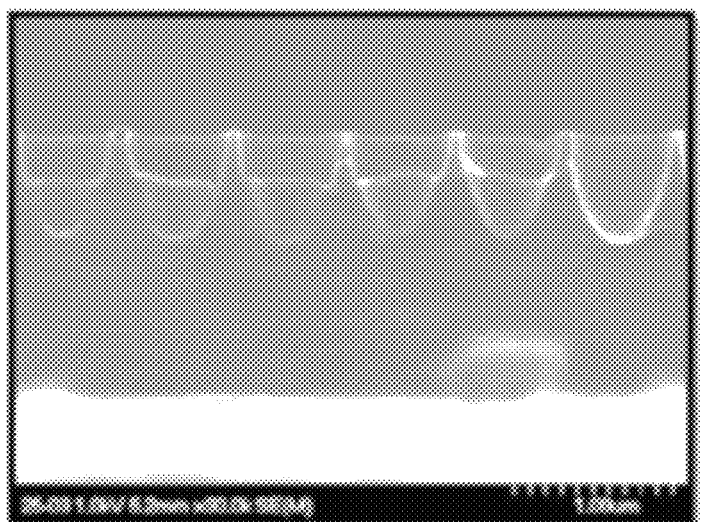
Figure 74C:
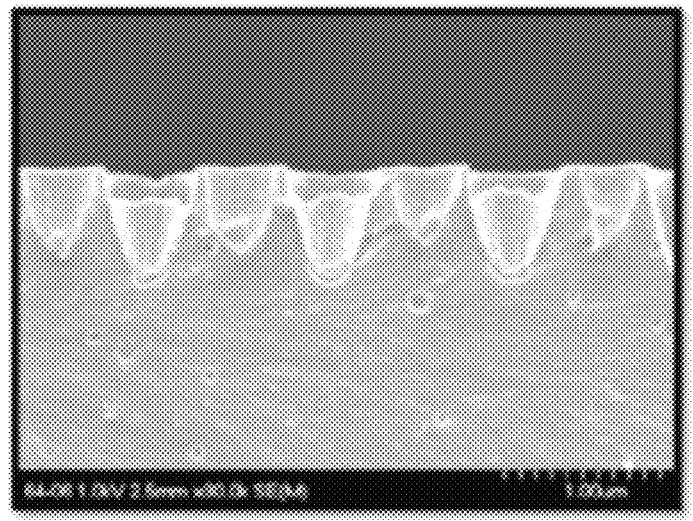

FIGS. 74A to 74C are cross-sectional scanning electron microscope photographic images corresponding to Nos. 1 to 3, respectively, in Table 11 in a case where the pitch of the concave-convex structure having a hole configuration is set to 700 nm.

Figure 75A:
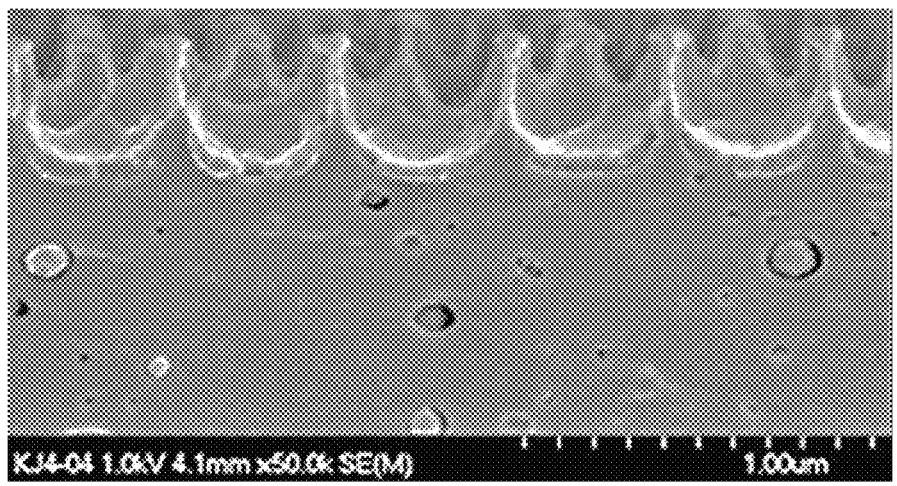
FIGS. 75A to 75C are SEM photographic images according to an example of the invention.
Figure 75B:
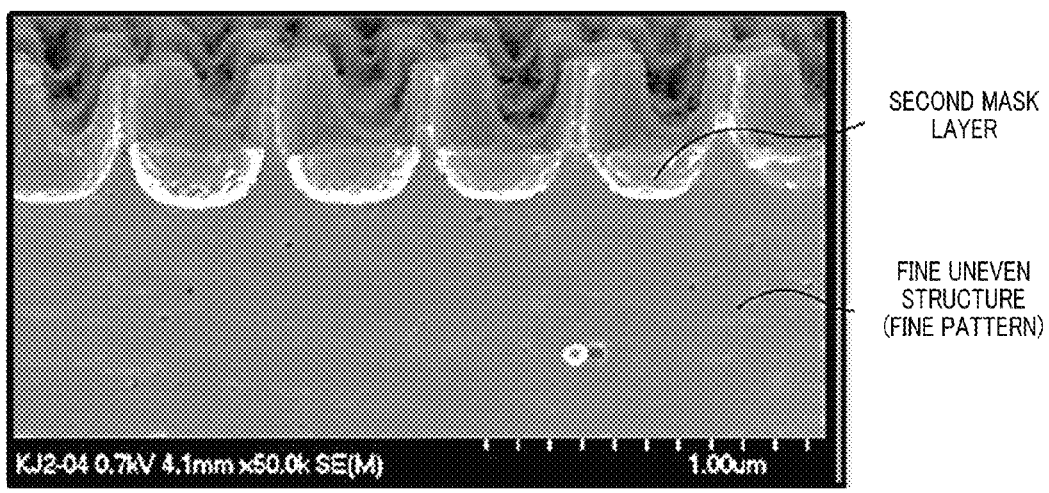
Figure 75C:
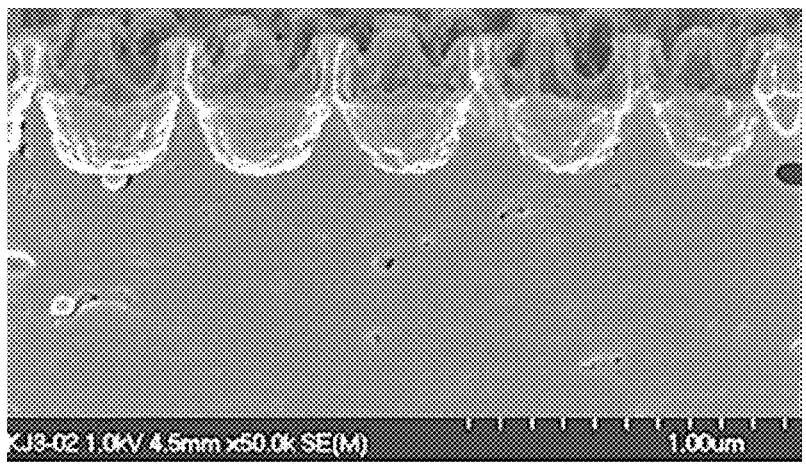

FIGS. 75A to 75C are cross-sectional scanning electron microscope photographic images corresponding to Nos. 4 to 6, respectively, in Table 11 in a case where the pitch of the concave-convex structure having a hole configuration is set to 460 nm.

Figure 76:
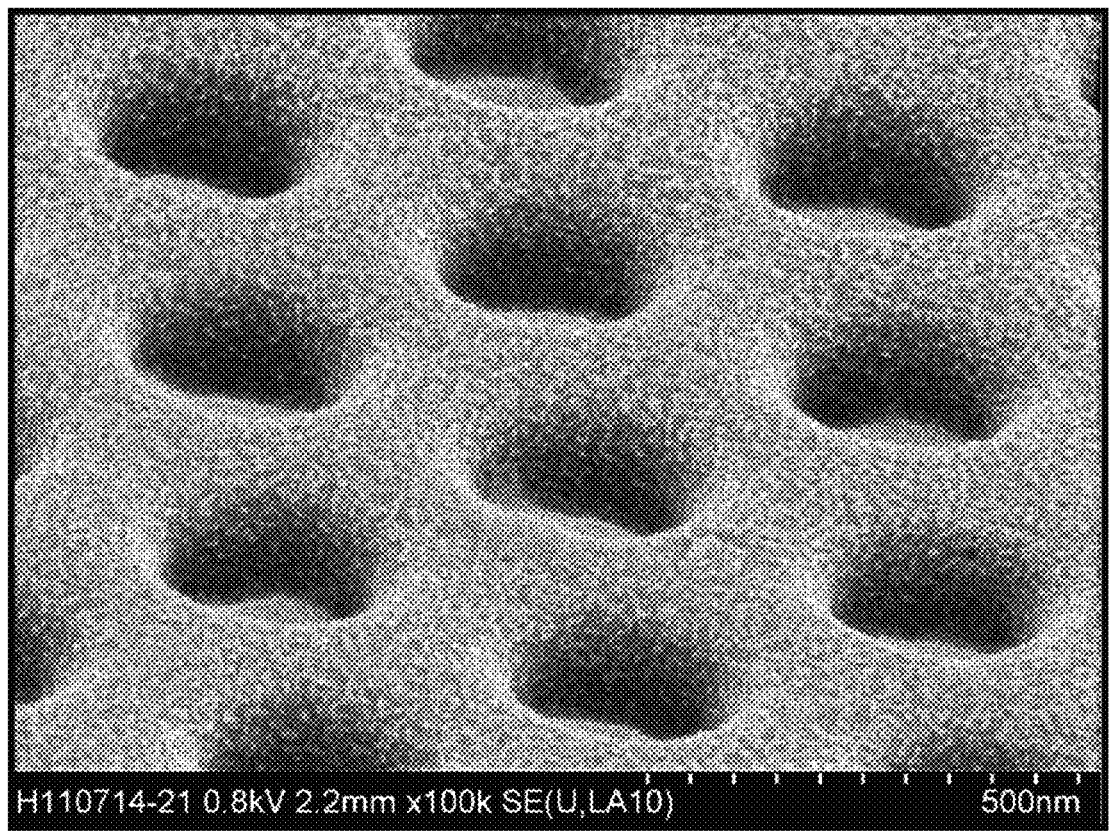
FIG. 76 is a SEM photographic image according to an example of the invention.

FIG. 76 is a perspective scanning electron microscope photographic image corresponding to No. 11 in Table 11 in a case where the pitch of the concave-convex structure having a hole configuration is set to 460 nm.

Figure 77A:
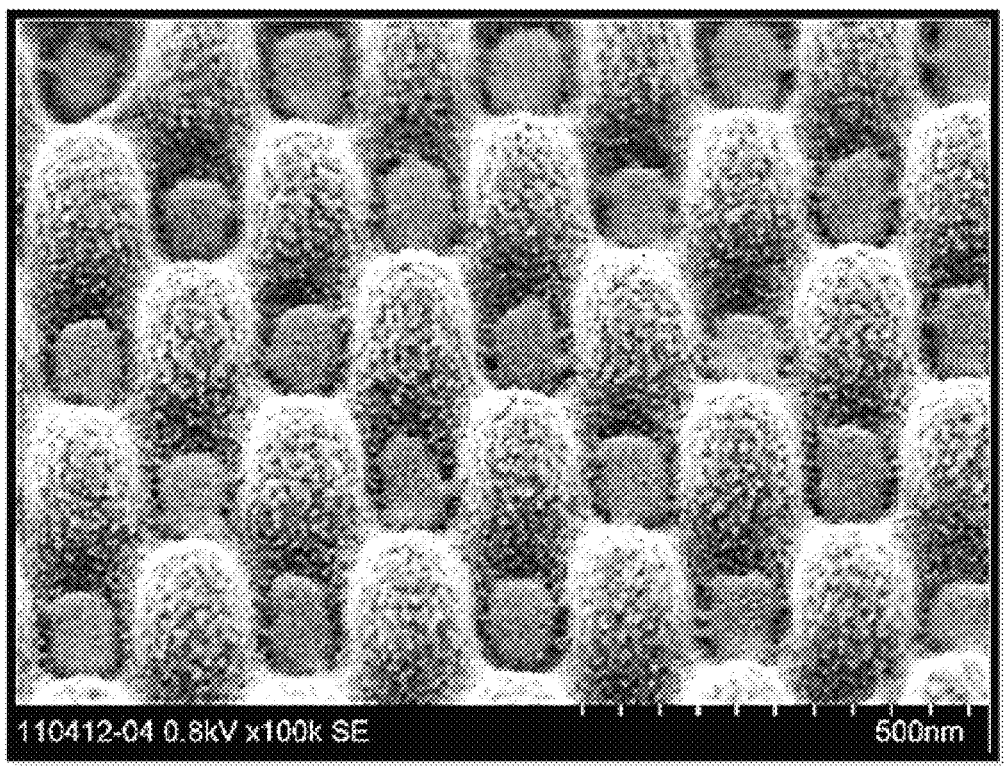
FIGS. 77A and 77B are SEM photographic images according to an example of the invention.
Figure 77B:
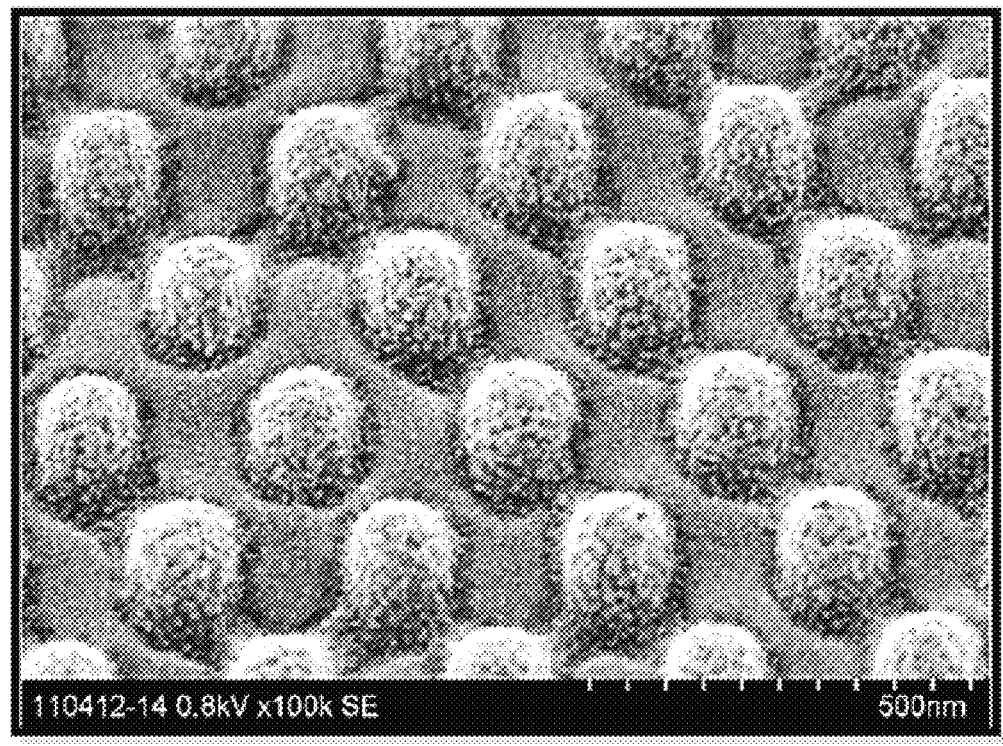

FIGS. 77A and 77B are perspective scanning electron microscope photographic images corresponding to Nos. 9 and 10, respectively, in Table 11 in a case where the pitch of the concave-convex structure having a dot configuration is set to 200 nm.

Even in the first layered products 1 excluded from the analysis drawings described above, it was recognized that the second mask layer was similarly formed in the concave portion of the concave-convex structure.

The obtained first layered product 1 was observed using a scanning electron microscope. By observing the cross section, it was recognized that the second mask material was arranged in the concave portion of the nanostructure of the mold. In addition, by using both a transmission electron microscope and an energy dispersive X-ray spectroscopy method, it was recognized that the second mask did not exist in the convex portion of the nanostructure of the mold. The phrase "do not exist" means that the measurement result was equal to or shorter than the detection limit of the scanning electron microscope and the energy dispersive X-ray spectroscopy method. From the viewpoint of the detection limit, it was determined that the distance lcv is 0 or several nanometers or shorter. The distance lcc measured using a scanning electron microscope was written in Table 11 as a distance ratio lcc/hst. Similar investigation was performed for the cases where Vc/(Sc·hc·C) was 0.6 and 0.3. As a result, the first mask layer was formed to cover the entire concave-convex structure of the mold, and the conditions of distances lcv and lcc were not satisfied.

In addition, titanium (Ti) contained in the second mask layer material was analyzed by combining a transmission electron microscope and an energy dispersive X-ray spectrometry method. As a result, it was recognized that the second mask layer material was not formed on the top of the convex portion in the concave-convex structure (distance lcv→0).

Subsequently, a dilute solution of the first mask layer material was coated on the concave-convex structure of the first layered product 1 manufactured as described above, and a solvent was removed, so that a second layered product 2 was manufactured.

(e) Second Layered Product 2

As a material of the first mask layer, the following first mask layer material W was used. The first mask layer material W was diluted with PGME and MEK and was used as a coating material.

First Mask Layer Material W: a mixture of benzyl-based acrylic polymer, M211B, PO-A, M350, I.184, and I.369 mixed with a mixing ratio of 150 g:40 g:40 g: 20 g: 11 g: 4 g.

The diluted first mask layer material was coated on the concave-convex structure surface of the first layered product 1 using Micro Gravure coating (produced by Yasui Seiki Co., Ltd.) (coating process). Then, the resulting member was disposed at a temperature of 25° C. and a humidity of 60% under an atmospheric pressure for 10 minutes (solvent removal process), so that a reel-like second layered product 2 (having a length of 200 m and a width of 300 mm) was obtained. In addition, after the solvent removal process, a protection layer made of polyethylene that can absorb visible light was laminated to the reel-like second layered product 2, and then, the resulting member was windingly recovered. In the analysis or deployment of the second layered product 2 described below, the second layered product 2 was reeled out, and the protection layer was separated.

The manufactured second layered products 2 are listed in Table 12. The terminologies described in Table 12 have the following meanings.

No.: indicates a reference number.

First Layered Product 1: indicates a type of the used first layered product 1. By comparing with Table 11, details thereof can be identified.

First Mask Layer Material: indicates a type of the first mask layer material.

lor/P: indicates a dimensionless value representing a relationship between the pitch of the concave-convex structure and the thickness of the first mask layer, where lor denotes a distance between the top portion of the convex portion of the concave-convex structure and the exposed surface of the first mask layer, and P denotes a pitch.

TABLE 12

| | 2nd Layered Product 2 | | |
|---|---|---|---|
| No. | 1st Layered Product 1 | 2nd Mask Layer Material | lor/P |
| 12 | 6 | (W) | 0.9 |
| 13 | 6 | (W) | 0.4 |
| 14 | 6 | (W) | 0.1 |

The obtained second layered product 2 was observed using a scanning electron microscope. A part of the result will be described below.

Figure 78:
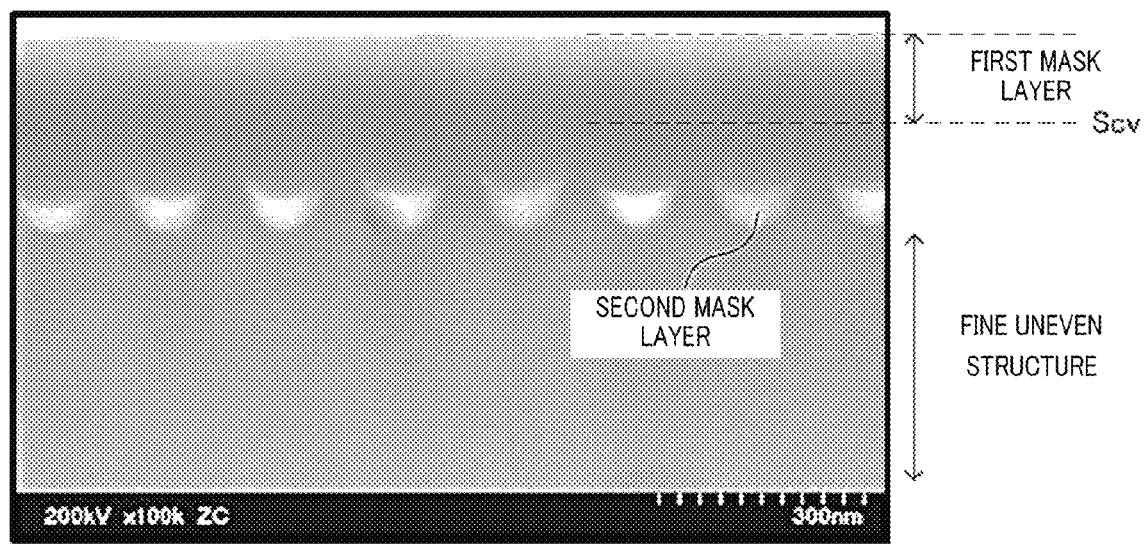
FIG. 78 is a SEM photographic image according to an example of the invention.

FIG. 78 is a cross-sectional scanning electron microscope photographic image of the concave-convex structure of the second layered product 2 corresponding to No. 13 in Table 12. Referring to FIG. 78, it was possible to measure the thickness lor of the first mask layer as 200 nm. The cross section of the obtained second layered product 2 was observed using a scanning electron microscope. As a result, it was recognized that the second mask layer was arranged in the concave portion of the nanostructure of the mold. In addition, the thickness of the first mask layer was measured and written to the column of Lor/P in Table 11.

In addition, titanium (Ti) contained in the second mask layer material was analyzed by combining a transmission electron microscope and an energy dispersive X-ray spectrometry method. As a result, it was recognized that the second mask layer material was not formed on the top of the convex portion in the concave-convex structure (distance lcv→0). In addition, it was also recognized that titanium in the second mask layer was not dispersed into the first mask layer, and the second mask layer did not move by forming the first mask layer.

Even in the second layered products excluded from the analysis drawings described above, it was recognized that the second mask layer was similarly formed in the concave portion of the concave-convex structure. Subsequently, fabrication of the sapphire substrate using the manufactured first layered product 1 described above was tested.

(f) Use of First Layered Product 1

Using the first layered product 1 of No. 1, 5, and 8 in Table 11, a sapphire substrate was fabricated. As the sapphire substrate, c-plane sapphire substrate having a size of 2 inches (φ) was used.

The sapphire substrate and the nanostructured surface of the first layered product 1 were laminated by interposing a photosetting resin (MUR series, produced by MARUZEN PETROCHEMICAL CO., LTD.) as the first mask layer. In a case where the pitch was 460 nm (No. 5 in Table 11), the thickness of the photosetting resin was set to 650 nm. In a case where the pitch was 700 nm (No. 1 in Table 11), the thickness of the photosetting resin was set to 400 nm. In a case where the pitch was 200 nm (No. 8 in Table 11), the thickness of the photosetting resin was set to 400 nm.

Using a laminator, after the sapphire substrate and the first layered product 1 were laminated, they were pressed under a pressure of 0.05 MPa for 5 minutes. Then, UV light was irradiated over the resin mold with an integral light intensity of 1200 mJ/cm$^2$, and the resulting member was disposed under an atmospheric pressure at a temperature of 25° C. and a humidity of 50% for 10 minutes. Subsequently, the resin mold was released, and UV light was irradiated again toward the second mask layer side surface with an integral light intensity of 1000 mJ/cm$^2$. The processes hereinbefore were performed by bonding the reel-like first layered product 1 while a total of 6 sapphire substrates (2×3, horizontally 2 and vertically 3) subjected to formation of the photosetting resin film were arranged side by side.

Figure 79A:
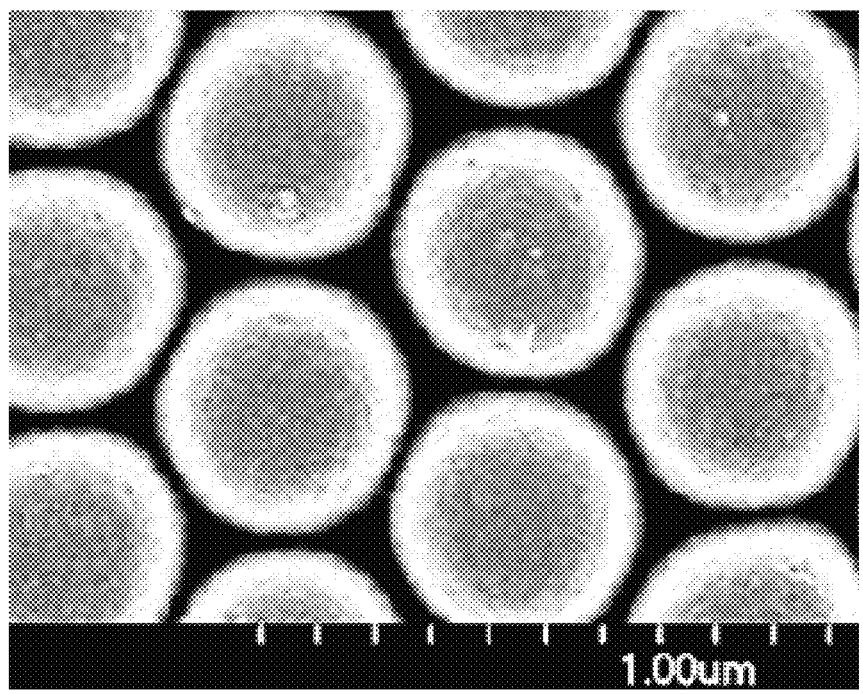
FIGS. 79A and 79B are SEM photographic images according to an example of the invention.
Figure 79B:
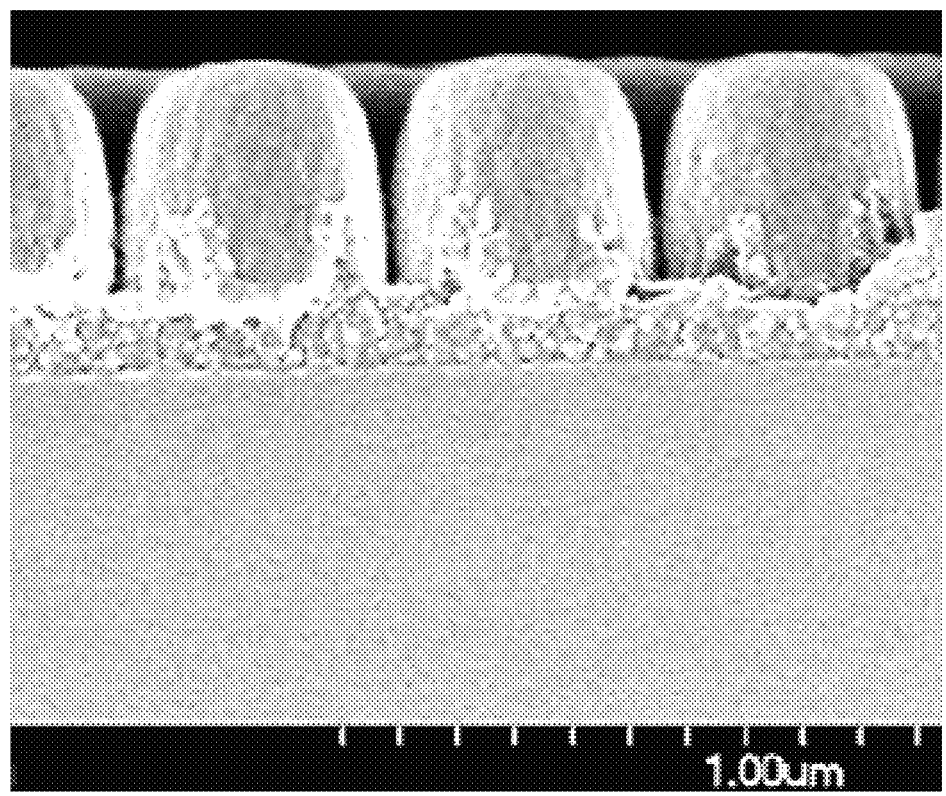

FIGS. 79A and 79B illustrate a scanning electron microscope image of the obtained layered product including the second mask layer, the first mask layer, and sapphire substrate in a case where the pitch of the concave-convex structure is set to 460 nm. FIG. 79A is a surface photographic image, and FIG. 79B is a cross-sectional photographic image.

Figure 80A:
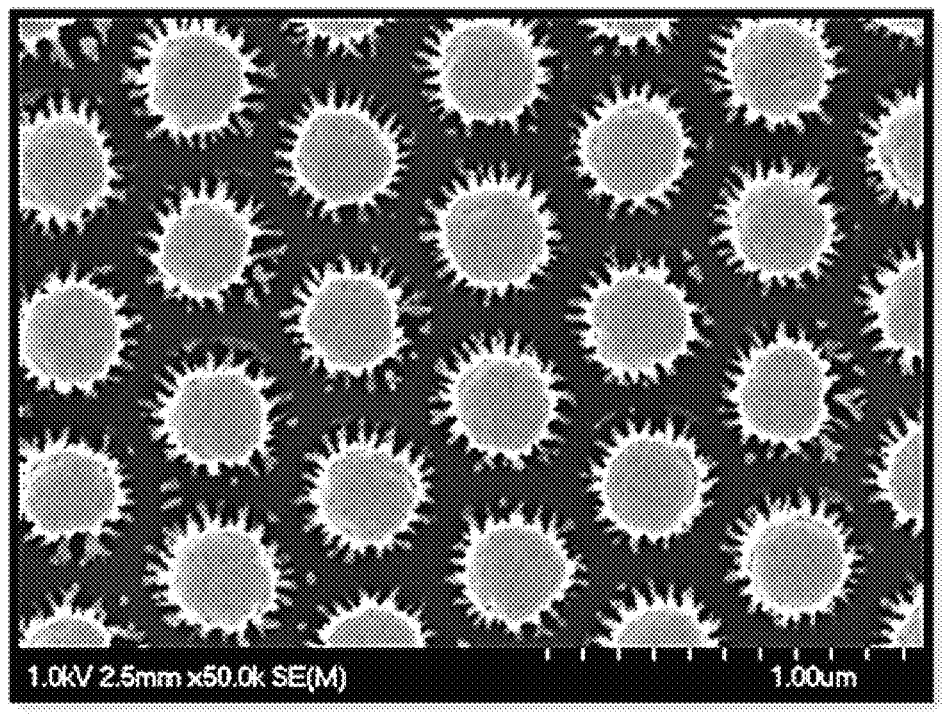
FIGS. 80A and 80B are SEM photographic images according to an example of the invention.
Figure 80B:
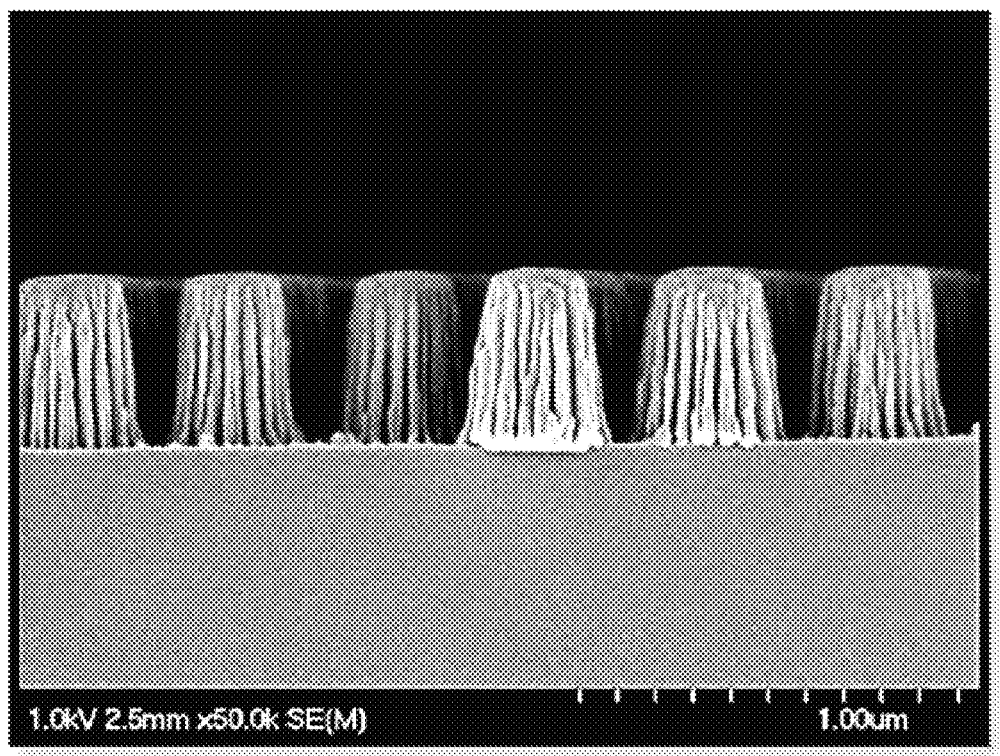

Subsequently, oxygen ashing was performed from the second mask layer side surface. Through the oxygen ashing, the first mask layer was anisotropically etched by using the second mask layer as a mask. The oxygen ashing was performed until the sapphire substrate surface is exposed. A scanning electron microscope photographic image of the fine pattern structure including the fine mask pattern and the object to be processed is illustrated in FIGS. 80A and 80B. FIGS. 80A and 80B illustrate a case where dry etching is performed for the layered product illustrated in FIGS. 79A and 79B. FIG. 80A is a surface photographic image, and FIG. 80B is a cross-sectional photographic image.

Through observation using a scanning electron microscope, it was recognized that oxygen ashing progresses up to the sapphire substrate interface so as to remove the first mask layer. Furthermore, by nanofabricating the first mask layer by using the second mask layer as a mask, large roughness was generated in the edge. It is conceived that this is because of an etching rate difference between an organic domain and an inorganic domain of the second mask layer. Depending on the etching rate difference, the organic domain is removed in advance. It is conceived that, as a result, roughness is generated, and ashing is performed for the first mask layer by using the generated roughness as a mask, so that roughness is generated in the contour of the first mask layer after applying the ashing. Meanwhile, by observing the cross section, it was recognized that the fine pattern including the first and second mask layers on the sapphire substrate was formed to match the pitch of the mold.

For the side face roughness of the first mask layer, after a material of the second mask layer was mixed with a mixing ratio of TTB:3APTMS=100 g:80 g, preliminary condensation was performed until the viscosity becomes 20 times so as to manufacture a prepolymer. The first mask layer on the sapphire substrate was formed by using a mixture of the manufactured prepolymer, Irgacure 184, and Irgacure 369 as the second mask layer material through the method described above. As a result, it was recognized that the side face roughness was significantly reduced.

In addition, the ratio Vo1/Vm1 between the etching rate Vo1 of the first mask layer material and the etching rate Vm1 of the second mask layer was 25.

Subsequently, the sapphire substrate was etched through plasma etching. The plasma etching condition was set such that only a BCl$_3$ gas or a mixed gas between BCl$_3$ and Cl$_2$ or Ar obtained by setting the ratio of gas flow rates to 90 sccm:10 sccm to 85 sccm:15 sccm was used, a processing pressure was set to 0.1 to 6.5 Pa, and the inductively coupled plasma RIE apparatus was used. After the dry etching, the sapphire substrate was rinsed using a piranha solution.

Figure 81A:
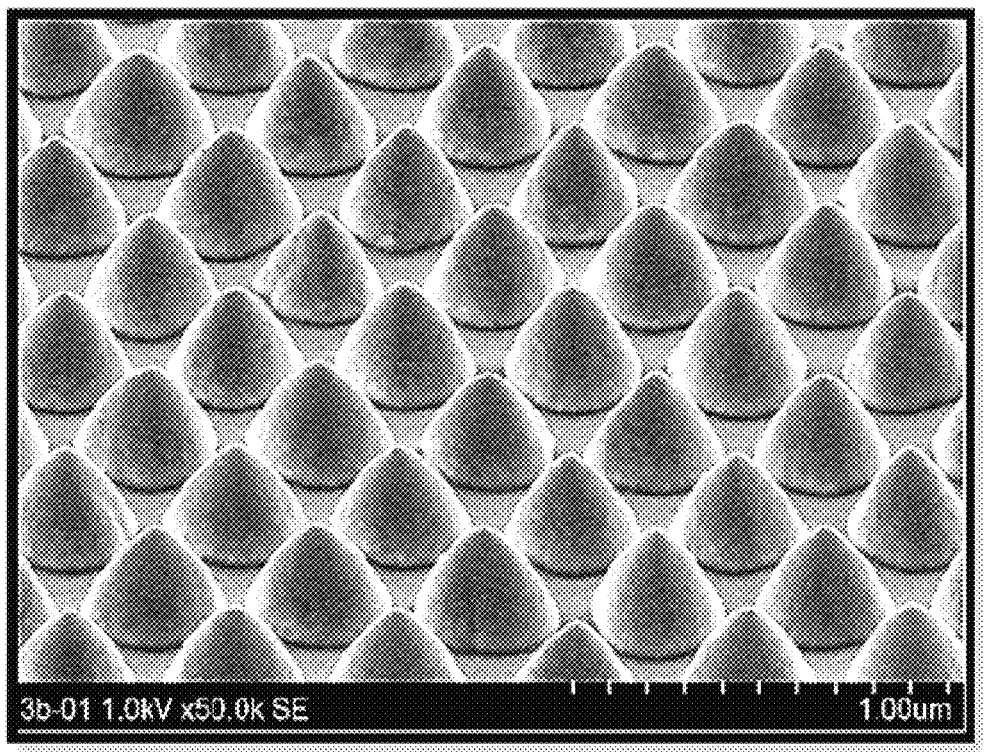
FIGS. 81A and 81B are SEM photographic images according to an example of the invention.
Figure 81B:
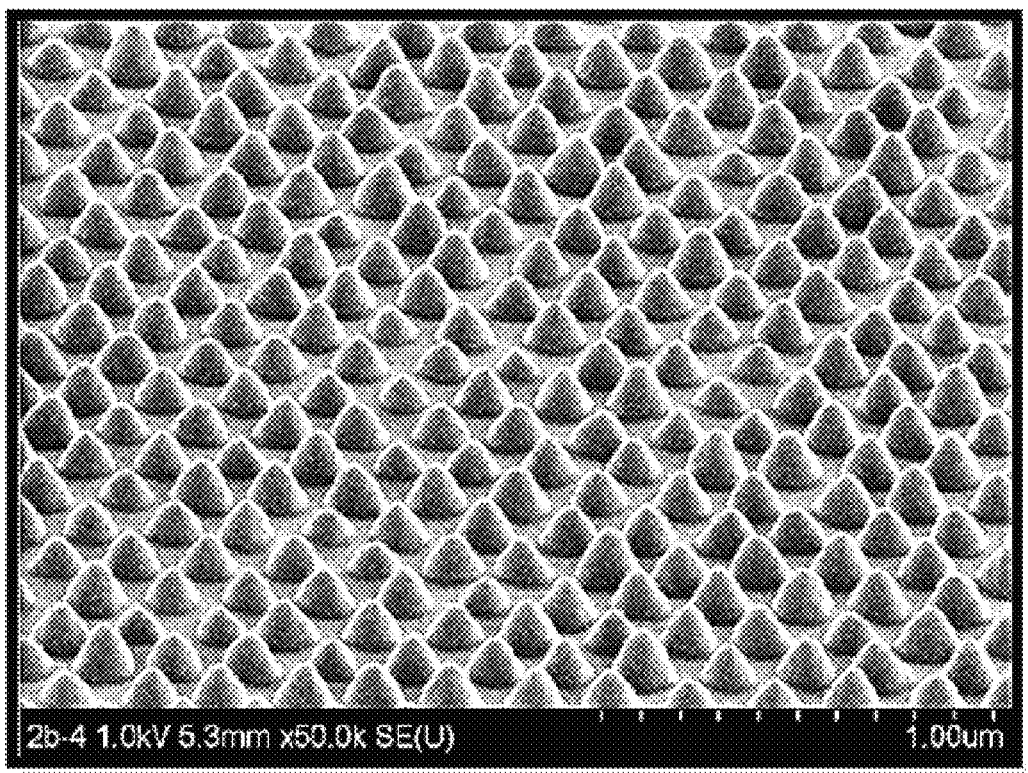
Figure 82A:
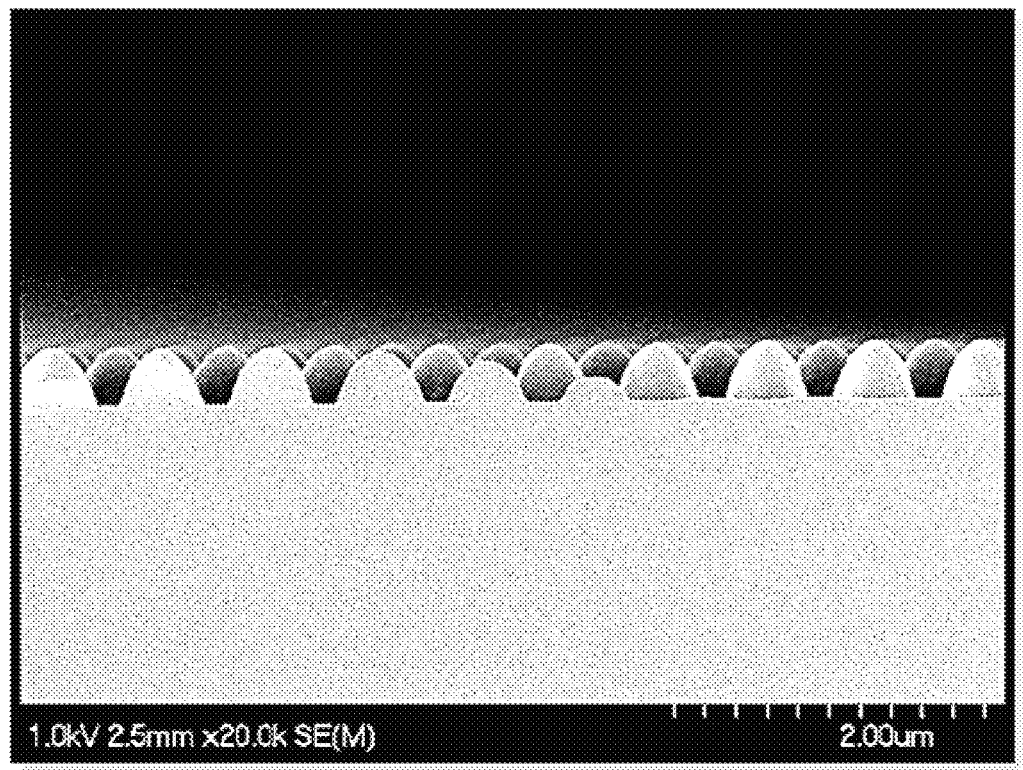
FIGS. 82A and 82B are SEM photographic images according to an example of the invention.
Figure 82B:
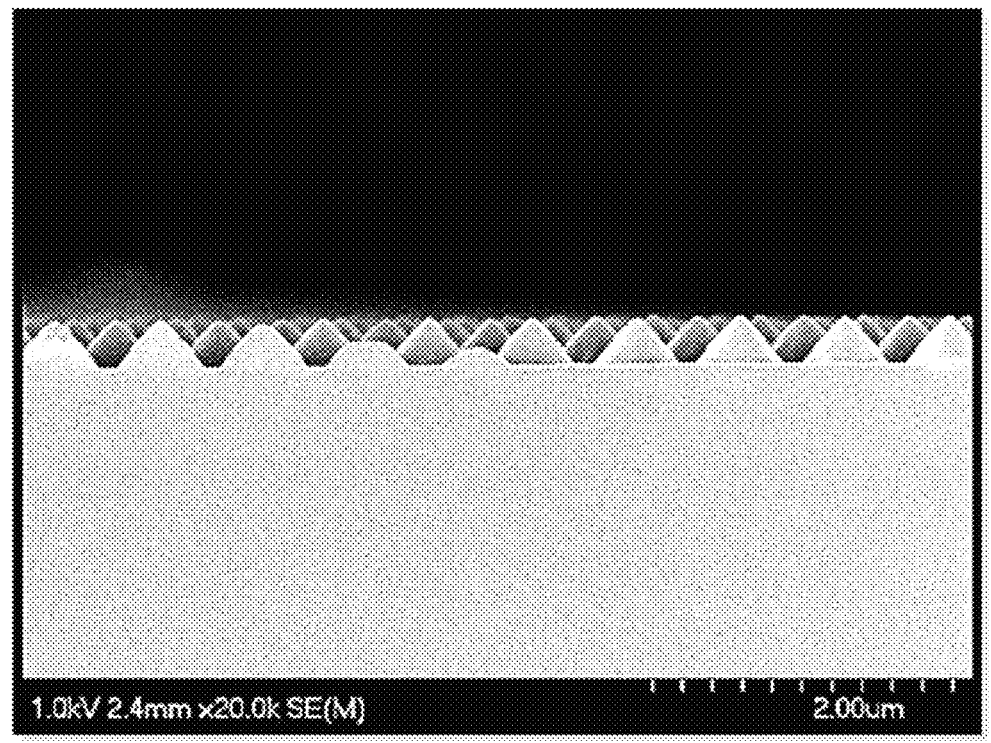
Figure 83C:
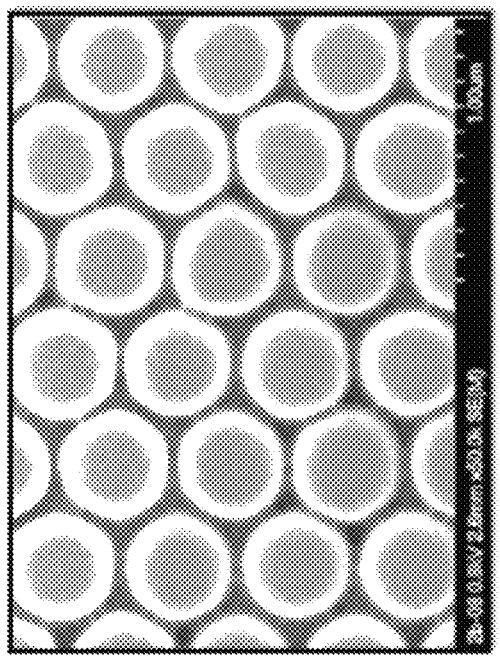
FIGS. 83A to 83D are SEM photographic images according to an example of the invention.
Figure 83D:
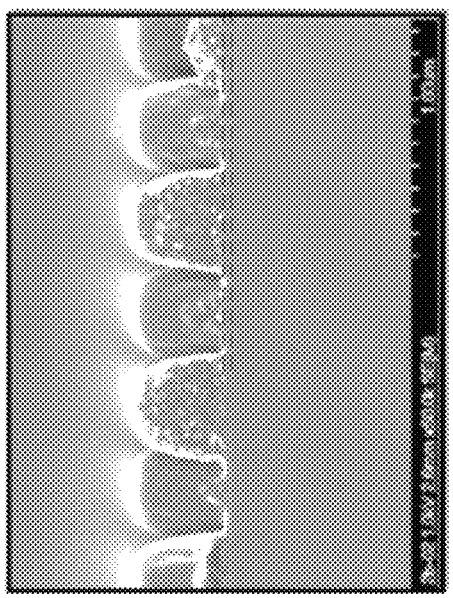
Figure 83A:
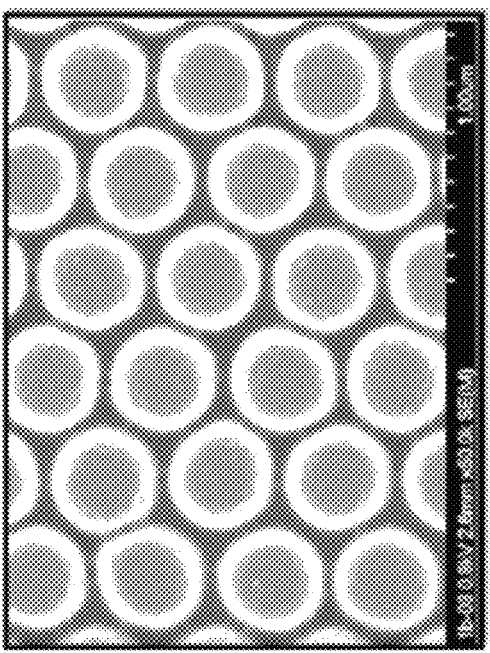
Figure 83B:
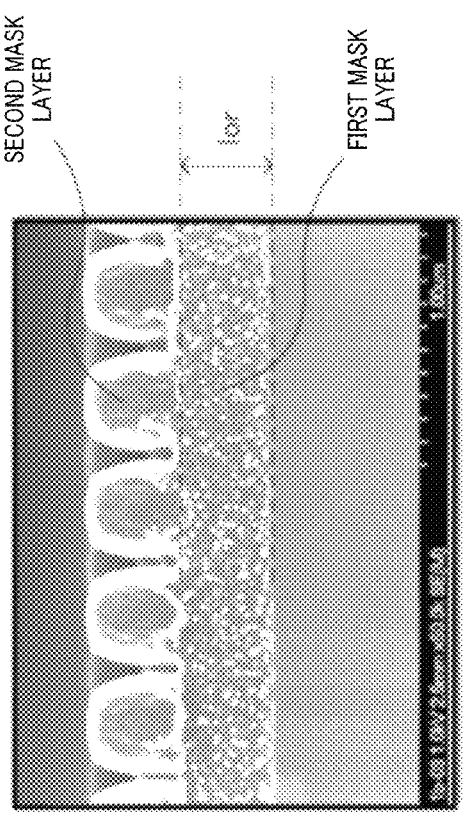
Figure 84A:
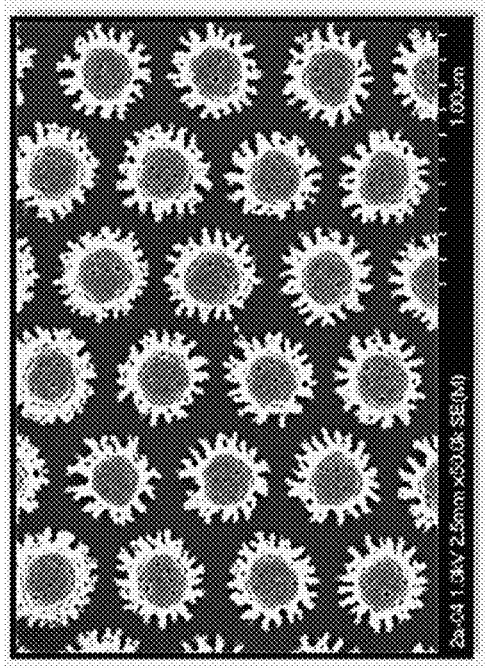
FIGS. 84A to 84D are SEM photographic images according to an example of the invention.
Figure 84C:
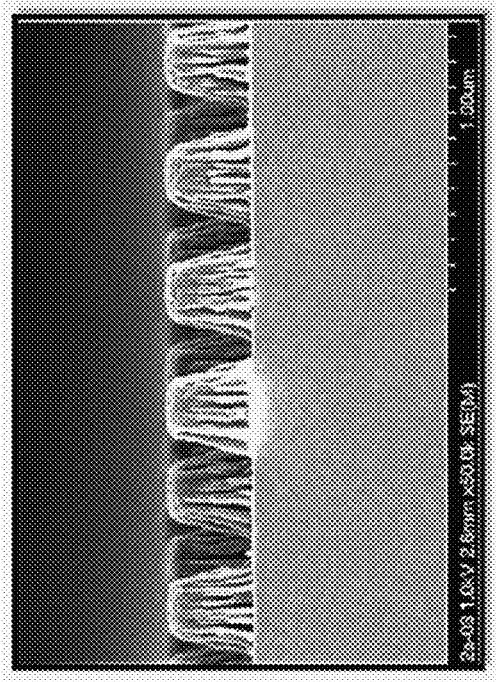
Figure 84B:
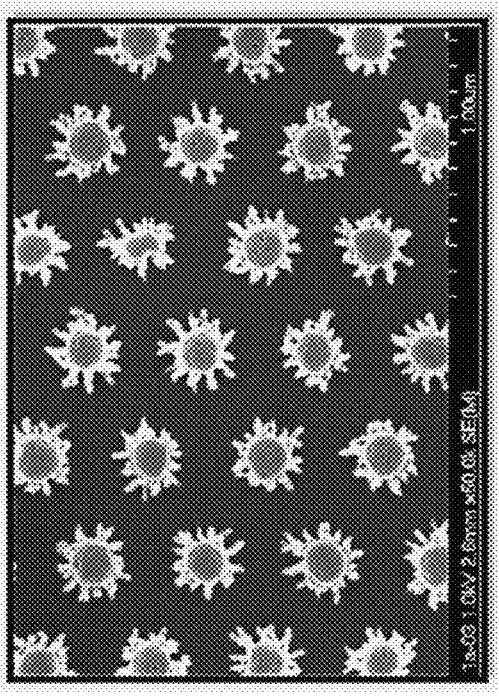
Figure 84D:
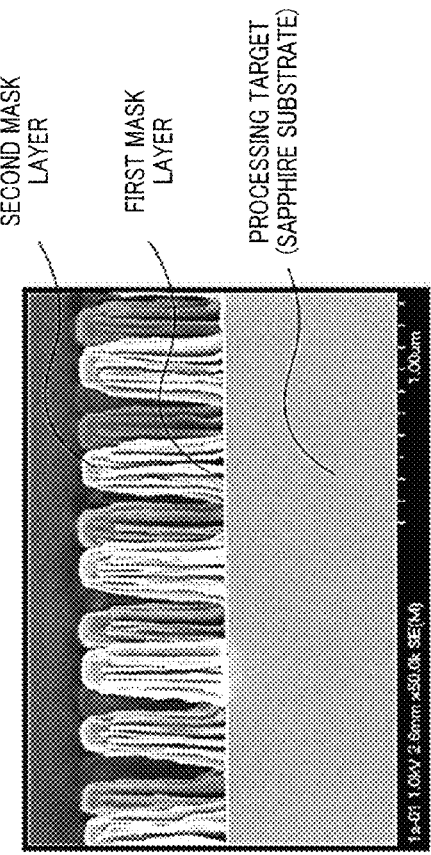

A scanning electron microscope photographic image of the obtained nanofabricated sapphire substrate is shown in FIGS. 81A, 81B, 82A, and 82B. FIG. 81A is a perspective view illustrating a case where the pitch is set to 460 nm, and FIG. 81B is a perspective view illustrating a case where the pitch is set to 200 nm. Meanwhile, in FIGS. 82A and 82B, the pitch is set to 700 nm. In FIGS. 82A and 82B, the structure can be controlled by changing the dry etching condition.

The obtained sapphire substrate was observed using a scanning electron microscope. By changing the dry etching condition, a nanostructure having a different configuration was transferred on the sapphire substrate. For example, convex portions having a conical shape in which oblique sides of the triangular cone are swollen or having a shape similar to a lens were arranged with an interval corresponding to the pitch of the nanostructure of the mold.

In addition, the ratio Vo2/Vi2 between the etching rate Vi2 of the sapphire substrate and the etching rate Vo2 of the first mask layer material was 1.4.

(g) Use of Second Layered Product 2

The sapphire substrate was fabricated using the second layered product of Nos. 12 and 14 in Table 12. As the sapphire substrate, c-plane sapphire substrate having a size of 2 inches (φ) was used.

The first mask layer of the second layered product was directly thermocompressively bonded to the sapphire substrate. The thermocompressive bonding was performed by applying a pressure of 0.01 MPa at a temperature of 80 to 120° C. Then, UV light was irradiated over the resin mold with an integral light intensity of 1200 mJ/cm$^2$, and the resulting member was disposed under an atmospheric pressure at a temperature of 25° C. and a humidity of 50% for 10 minutes. Subsequently, the resin mold was released, and UV light was irradiated again toward the second mask layer side surface of the layered product including the second mask layer, the first mask layer, and the sapphire substrate with an integral light intensity of 1000 mJ/cm$^2$.

Scanning electron microscope photographic images of the obtained layered product including the second mask layer, the first mask layer, and sapphire substrate are shown in FIGS. 83A to 83D. As illustrated in FIGS. 83A to 83D, it was recognized that transferring was satisfactorily performed in both the case where the layered product (lor=405 nm, lor/P=0.9) having the concave-convex structure described in No. 12 of Table 12 was used and the case where layered product (lor=40 nm, lor/P=0.1) of the concave-convex structure described in No. 14 of Table 12 was used.

Out of the obtained third layered product 3 (layered product including the second mask layer, the first mask layer, and the sapphire substrate), a case where the second layered product 2 of No. 12 described in Table 12 (lor=405 nm, lor/P=0.9) was used, and a case where the second layered product 2 of No. 14 described in Table 12 (lor=40 nm, lor/P=0.1) were representatively observed using a scanning electron microscope. By observing the surface, it was recognized that the nanostructure was transferred with an interval corresponding to the pitch of the nanostructure of the mold. Furthermore, by observing the cross section, it was recognized that the height of the nanostructure on the sapphire substrate is equal to the height of the nanostructure of the mold, so that the second mask layer was transferred. Moreover, by observing the cross section, it was recognized that transferring was satisfactorily performed even in a very thin thickness lor, such as 40 nm, and even when the thickness lor is in a submicron scale such as 450 nm.

An in-plane distribution of the distance lor of the second layered product 2 of No. 12 described in Table 12 (lor=405 nm, lor/P=0.9) was ±10% with respect to the film thickness in the center. An in-plane distribution of the distance lor of the second layered product of No. 14 described in Table 12 (lor=40 nm, lor/P=0.1) was ±7% with respect to the center film thickness. Meanwhile, a distribution of the thickness corresponding to the distance lor transferred onto the sapphire substrate was ±12% in the case of No. 12 and ±8% in the case of No. 14. From the aforementioned description, it is recognized that transferring can be performed by reflecting the precisions of the first and second mask layers on the object to be processed by using the second layered product 2.

Subsequently, oxygen ashing was performed from the second mask layer side surface. Through the oxygen ashing, the first mask layer was anisotropically etched by using the second mask layer as a mask. The oxygen ashing was performed until the sapphire substrate surface is exposed. A scanning electron microscope photographic image of the fine pattern structure including the fine mask pattern and the object to be processed is illustrated in FIGS. 84A to 84D. As illustrated in FIGS. 84A to 84D, it is recognized that a fine mask pattern having a high aspect ratio can be formed on the sapphire substrate using a high etching selectivity between the first and second mask layers through the oxygen ashing. In addition, it is inferred that etching can be performed in such a high anisotropic aspect ratio because the metal alkoxide contained in the second mask layer protects the side wall.

Through observation using a scanning electron microscope, it was recognized that oxygen ashing progresses up to the sapphire substrate interface so as to remove the first mask layer. Furthermore, by nanofabricating the first mask layer by using the second mask layer as a mask, large roughness was generated in the edge. It is conceived that this is because of an etching rate difference between an organic domain and an inorganic domain of the second mask layer. Depending on the etching rate difference, the organic domain is removed in advance. It is conceived that, as a result, roughness is generated, and ashing is performed for the first mask layer by using the generated roughness as a mask, so that roughness is generated in the contour of the first mask layer after applying the ashing. Meanwhile, by observing the cross section, it was recognized that the fine pattern including the first and second mask layers on the sapphire substrate was formed to match the pitch of the mold.

For the side face roughness of the first mask layer, after a material of the second mask layer was mixed with a mixing ratio of TTB:3APTMS=100 g:80 g, preliminary condensation was performed until the viscosity becomes 20 times so as to manufacture a prepolymer. The first mask layer on the sapphire substrate was formed by using a mixture of the manufactured prepolymer, Irgacure 184, and Irgacure 369 as the mask through the method described above. As a result, it was recognized that the side face roughness was significantly reduced.

In addition, the ratio Vo1/Vm1 between the etching rate Vo1 of the first mask layer material and the etching rate Vm1 of the second mask layer was 30.

Subsequently, the sapphire substrate was etched through plasma etching. The plasma etching condition was set such that only a $BCl_3$ gas or a mixed gas between $BCl_3$ and $Cl_2$ or Ar obtained by setting the ratio of gas flow rates to 90 ccm:10 sccm to 85 sccm:15 sccm was used, a processing pressure was set to 0.1 to 6.5 Pa, and the inductively coupled plasma RIE apparatus was used. After the dry etching, the sapphire substrate was rinsed using a piranha solution.

Figure 85:
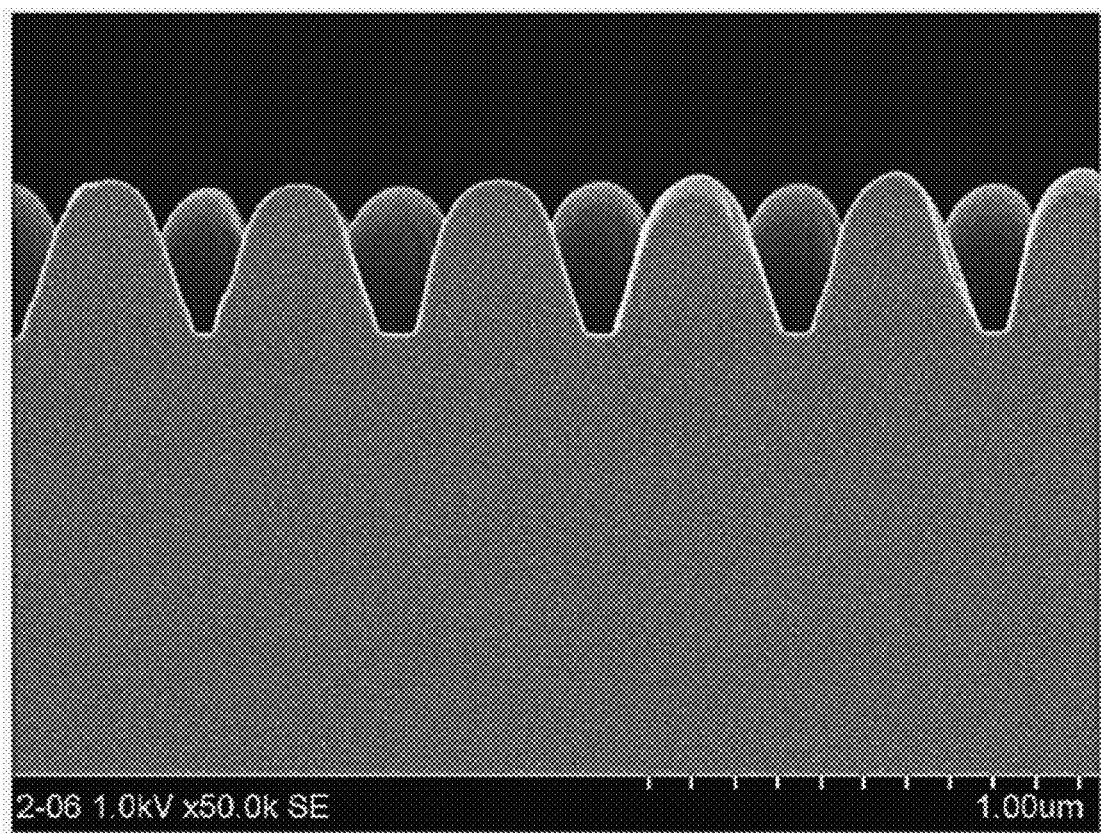
FIG. 85 is a SEM photographic image according to an example of the invention.

A scanning electron microscope photographic image of the obtained nanofabricated sapphire substrate is shown in FIG. 85. FIG. 85 is a cross-sectional scanning electron microscope photographic image of the fabricated sapphire substrate in a case where the second layered product 2 of No. 12 in Table 12 was used. As recognized from FIG. 85, it is possible to easily nanofabricate sapphire substrate which is a difficult processing material.

In addition, the ratio Vo2/Vi2 between the etching rate Vi2 of the sapphire substrate and the etching rate Vo2 of the first mask layer material was 0.7.

Even in the second layered product 2 of No. 14 in Table 14 excluded from the drawings described above, it was possible to similarly form the concave-convex structure on the sapphire substrate.

Comparative Example 5

The first layered product 1 was manufactured using the same methods as those of Examples described above. The coating condition during the manufacturing and the like are described in Table 13.

TABLE 13

| | 1st Layered Product 1 | | | | |
| --- | --- | --- | --- | --- | --- |
| No. | Resin Mold | Type | 2nd Mask Layer Material | Vc/(Sc · hc · C) | lcc/hst |
| 15 | B1 | Concave | (U) | 1.00 | — |
| 16 | B2 | Concave | (U) | 0.99 | — |
| 17 | B4 | Concave | (U) | 0.98 | — |

If the coating condition is set to Vc/(Sc·hc·C)≤1, the distance lcc is shorter than zero (lcc<0) regardless of a pitch or height of the fine pattern. That is, the second mask layer fills overall concave portions of the resin mold. Meanwhile, partially, there was a portion for forming a film consecutively linked to the second mask layer on the convex portion. Fabrication of the sapphire substrate using the first layered product 1 described in Table 13 was tested. A process of removing a remaining film of the second mask layer was added. Due to this process, a macro thickness unevenness was generated in the first mask layer. In the obtained sapphire substrate, partially, there was a portion having no fine pattern or a portion having a significantly different dot diameter of the fine pattern.

Comparative Example 6

The second layered product 2 was manufactured using the same methods as those of Examples described above. The coating condition during the manufacturing and the like are described in Table 14.

TABLE 14

2nd Layered Product 2

| No. | 1st Layered Product 1 | 1st Mask Layer Material | lor/P |
|---|---|---|---|
| 18 | 8 | (W) | 6.0 |
| 19 | 6 | (W) | 6.5 |
| 20 | 2 | (W) | 7.1 |

Fabrication of sapphire substrate was performed using the manufactured second layered product. The resin mold was released, and etching was performed for the first mask layer from the second mask layer side surface through oxygen ashing. It was observed using a scanning electron microscope that, out of pillars formed by the first and second mask layers, the pillars having a large height were collapsed, and a plurality of pillars form a bundle. In this state, fabrication of sapphire substrate was performed. As a result, it was not possible to transfer a fine pattern onto the sapphire substrate by reflecting an accuracy of the resin mold.

Next, the inventors manufactured a third layered product 3 according to the second aspect of the invention described above, transferred a fine pattern onto the object to be processed using the manufactured third layered product 3, and investigated the effect thereof. Hereinafter, details of the investigation performed by the inventors will be described.

Example 11

(a) Manufacturing of Cylindrical Master (Manufacturing of Template for Resin Mold)

By using quartz glass as a base material of the cylindrical master, a fine pattern was formed on the quartz glass surface through direct lithography using a semiconductor laser. Durasurf HD-1101Z (produced by DAIKIN INDUSTRIES, ltd) was coated on a surface of the quartz glass roll having a fine surface unevenness, and the resulting member was heated at a temperature of 60° C. for one hour and was then disposed at a room temperature for 24 hours for solidification. Then, the resulting member was rinsed three times using Durasurf HD-ZV (produced by DAIKIN INDUSTRIES, ltd), and a releasing treatment was performed.

(b) Manufacturing of Resin Mold

A transfer material 11 was prepared by mixing DACHP, M350, I.184, and I.369. 10 to 20 parts by mass of DACHP was added respect to 100 parts by mass of M350. In the process of manufacturing the resin mold B from the resin mold A described below, the resin mold B was manufactured using the same resin as that used in manufacturing of the resin mold A.

The transfer material 11 was coated on an easy adhesion surface of a PET film (A4100, produced by TOYOBO CO., LTD.) having a width of 300 mm and a thickness of 100 µm using a Micro Gravure coating (produced by Yasui Seiki Co., Ltd.) until the coated film thickness reaches 6 µm. Then, the PET film having the coated transfer material 11 was pressedly bonded to the cylindrical master using a nip roll (0.1 MPa). Ultraviolet rays were irradiated using a UV light exposure apparatus (H-bulb, produced by Fusion UV Systems Japan K. K.) such that an integral exposure light amount under a lamp center becomes 600 mJ/cm$^2$ under an atmospheric pressure at a temperature of 25° C. and a humidity of 60% to continuously perform photosetting, so that a reel-like resin mold A (having a length of 200 m and a width of 300 mm) having the transferred fine pattern was obtained. The shape of the fine pattern of the reel-like resin mold A was observed using a scanning electron microscope. As a result, the distance between neighboring convex portions was 460 nm, and a height of the convex portion was 500 nm.

The same transfer material 11 as that of the resin used to manufacture the resin mold A was coated on an easy adhesion surface of a PET film (A4100, produced by TOYOBO CO., LTD.) having a width of 300 mm and a thickness of 100 µm using a Micro Gravure coating (produced by Yasui Seiki Co., Ltd.) until the coated film thickness reaches 6 µm. Then, the PET film having the coated transfer material 11 was pressedly bonded to the fine patterned surface of the resin mold A directly transferred from the cylindrical master using a nip roll (0.1 MPa). Ultraviolet rays were irradiated using a UV light exposure apparatus (H-bulb, produced by Fusion UV Systems Japan K. K.) such that an integral exposure light amount under a lamp center becomes 600 mJ/cm$^2$ under an atmospheric pressure at a temperature of 25° C. and a humidity of 60% to continuously perform photosetting, so that a plurality of reel-like resin molds B (having a length of 200 m and a width of 300 mm) having the transferred fine pattern were obtained. The shape of the fine pattern of the reel-like resin mold B was observed using a scanning electron microscope. As a result, the opening width (φ) of the concave portion was 400 nm, a distance between neighboring concave portions was 460 nm, and a depth of the concave portion was 500 nm.

The ratio Es/Eb between the surface fluorine concentration Es and the average fluorine concentration Eb of the obtained resin mold B was controllable between 40 and 80 using a dose of DACHP. Hereinafter, the resin mold B is referred to as a resin mold. In addition, in the following investigation using the resin mold, resin molds having the ratio Es/Eb set to 74.1, 55.4, and 49.0 were selected, and all of the resin molds were investigated.

In this manner, another resin mold was also manufactured, in which the opening width (φ) of the concave portion was set to 180 nm, the distance between neighboring concave portions was set to 200 nm, and a depth of the concave portion was 300 nm. Then, the following investigation was performed.

(c) Manufacturing of Third Layered Product 3 (1)

A third layered product 3 was manufactured using the resin mold as follows. As a second mask layer material, three types of mask materials including the second mask materials X to Z were prepared, and the same investigation was performed for all of them.

The second mask material X was obtained by sufficiently mixing TTB, DEDFS, TEOS, X21-5841, and SH710 with a mixing ratio of 65.25:21.75:4.35:4.35:4.35 [g]. Subsequently, 2.3 ml of ethanol containing 3.25% of water was agitated and slowly dropped. Then, the resulting member was cured for 4 hours at a temperature of 80° C., and vacuum drawing was performed to obtain the mask material X.

The second mask material Y was obtained by sufficiently mixing TTB, DEDFS, X21-5841, SH710, 3APTMS, M211B, M101A, M350, I.184, and I.369 with a mixing ratio of 33.0:11.0:4.4:4.4:17.6:8.8:8.8:8.8:2.4:0.9 [g].

The second mask material Z was obtained by sufficiently mixing TTB, DEDFS, X21-5841, SH710, and 3 APTMS with a mixing ratio of 46.9:15.6:6.3:6.3:25.0 [g]. Subsequently, 2.3 ml of ethanol containing 3.25% of water was agitated and slowly dropped. Then, the resulting member was cured for 2.5 hours at a temperature of 80° C., and vacuum drawing was performed. To the aforementioned solution, a mixed solution obtained by mixing M211B, M101A, M350, I.184, and I.369 with a mixing ratio of 29.6:29.6:29.6:8.1:3.0 [g] and sufficiently agitating them was added by 42.2 g so as to obtain the mask material Z.

Subsequently, the following investigation was made for each of the second mask materials X, Y, and Z. Hereinafter, the second mask materials X, Y, and Z are collectively referred to as a second mask material without any distinction.

In order to manufacture the third layered product 3, the second mask material was diluted with PGME. The dilution ratio was set such that the amount of the mask material (solid content) contained in the coat film on unit planar area is smaller than a volume of the fine pattern of the resin mold. Specifically, the concentration and the coat film thickness were determined such that a filling rate (height) of the second mask material are 50%, 70%, and 90%, and each of the diluted second mask materials was coated. The dilution was performed by dropping PGME into the second mask material and sufficiently agitating them.

The coating of the second mask material on the fine patterned-surface of the resin mold was performed using the same apparatus as that used in the manufacturing of the resin mold. Using the Micro Gravure coating, each of the diluted second mask materials was coated on the fine pattern formation surface of the resin mold, the resulting member was passed through a dry atmosphere at a temperature of 80° C., and a cover film was bonded and windingly recovered. Hereinafter, the first layered product is referred to as first layered product 1(11) regardless of a difference of the dilution ratio.

The used first layered product 1(11) was obtained by cutting a roll of the first layered product 1(11) wound by 200 m. As the exterior, a width was set to 300 mm, and a length was set to 600 mm. A fine mask pattern formation portion has a width of 250 mm and a length of 600 mm. The third layered product 3 was formed on the object to be processed by bonding the first layered product 1(11) to the object to be processed by interposing the first mask layer, irradiating light, releasing the resin mold, and then performing dry etching. Specifically, the manufacturing was performed as follows.

As the first mask layer, the first mask layer A described below and the first mask layer B described below were separately used. Since both the first mask layers A and B are similarly used, hereinafter, they are simply referred to as a first mask layer. In addition, a c-plane sapphire substrate having a size of 2 inches (φ) was used as the object to be processed.

First Mask Layer A

Solution A=OXT221:CEL2021P:M211B:M309A:M313=20 g:80 g:20 g:40 g:40 g

Solution B=PGME:DTS102:DBA:1.184=300 g:8 g:1 g:5 g

Solution A:Solution B:PGME=100 g:157 g:200 g

First Mask Layer B: MUR-XR02 (produced by MARUZEN PETROCHEMICAL CO., LTD.)

A hydrophilic treatment using ozone was performed for a surface of the object to be processed having a size of 2 inches (φ). Subsequently, the first mask layer was formed on the ozone treatment surface of the object to be processed through a spin coat method to have a thickness of 600 nm or 1000 nm. Subsequently, the resulting member was disposed on a hot plate at a temperature of 80° C. for 2 minutes to remove the solvent.

The second mask layer side surface (fine pattern side surface of the resin mold) of the first layered product 1(11) was bonded to the first mask layer on the object to be processed. In this case, a total of 36 objects to be processed (array of 4×9) having the first mask layers were arranged, and the first layered product 1(11) having a size of 300 mm×600 mm was bonded to the objects to be processed.

After the bonding, a pressure of 0.05 MPa was applied from the resin mold, and UV light was irradiated toward the resin mold. In a case where the first mask layer A was used, the resulting member was disposed at a room temperature for 10 minutes after UV light irradiation, and then, the resin mold was released. Furthermore, after releasing the resin mold, UV light was irradiated again.

From the second mask layer side surface, oxygen etching (1 to 0.5 Pa) was performed to nanostructure the first mask layer, so that the third layered product 3 was obtained.

Figure 86:
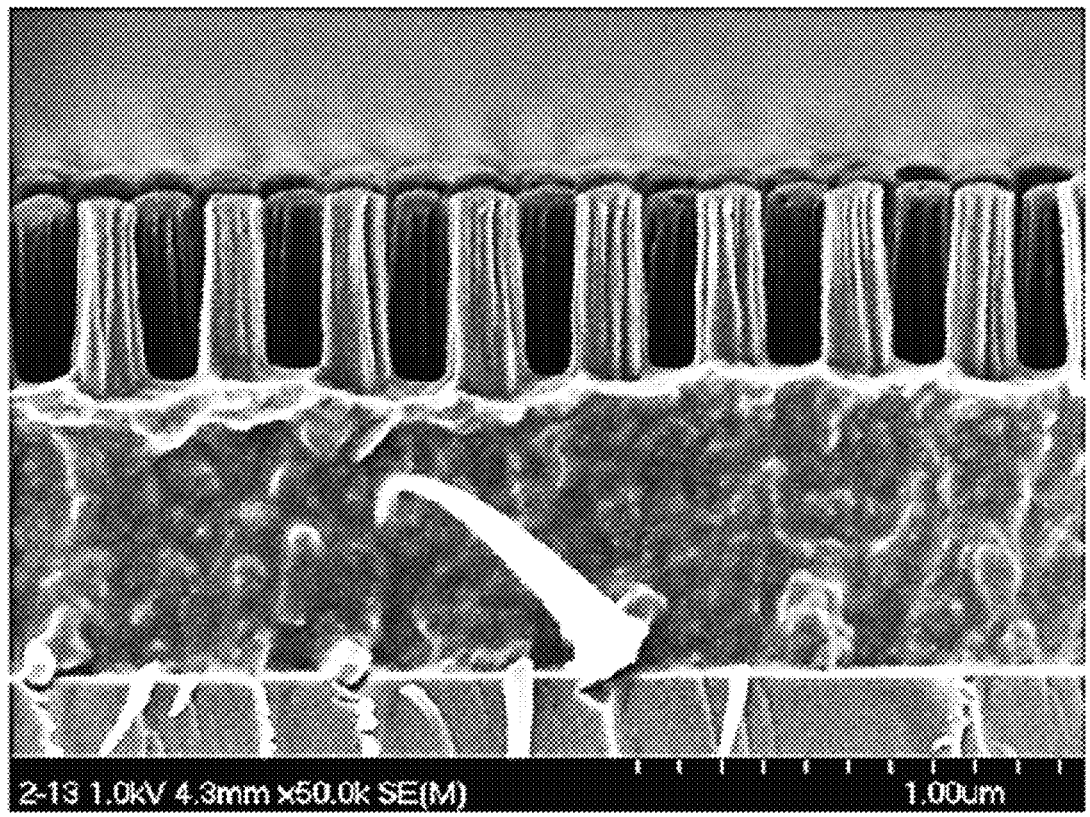
FIG. 86 is a SEM photographic image according to an example of the invention.
Figure 87A:
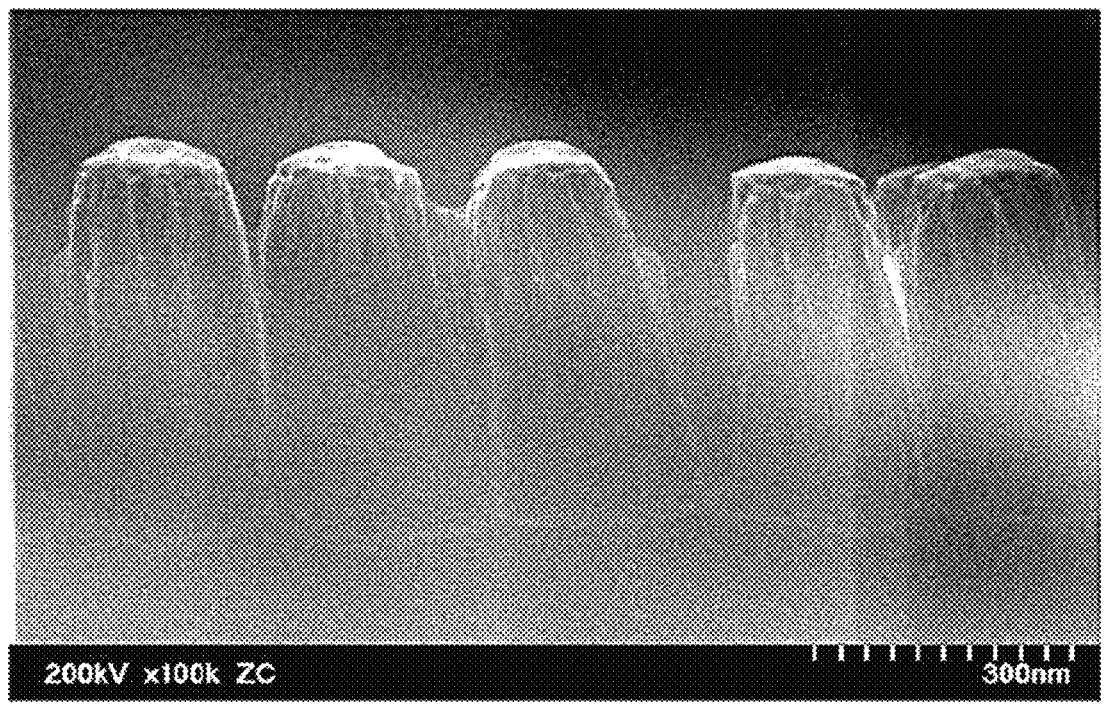
FIGS. 87A and 87B are SEM photographic images according to an example of the invention.
Figure 87B:
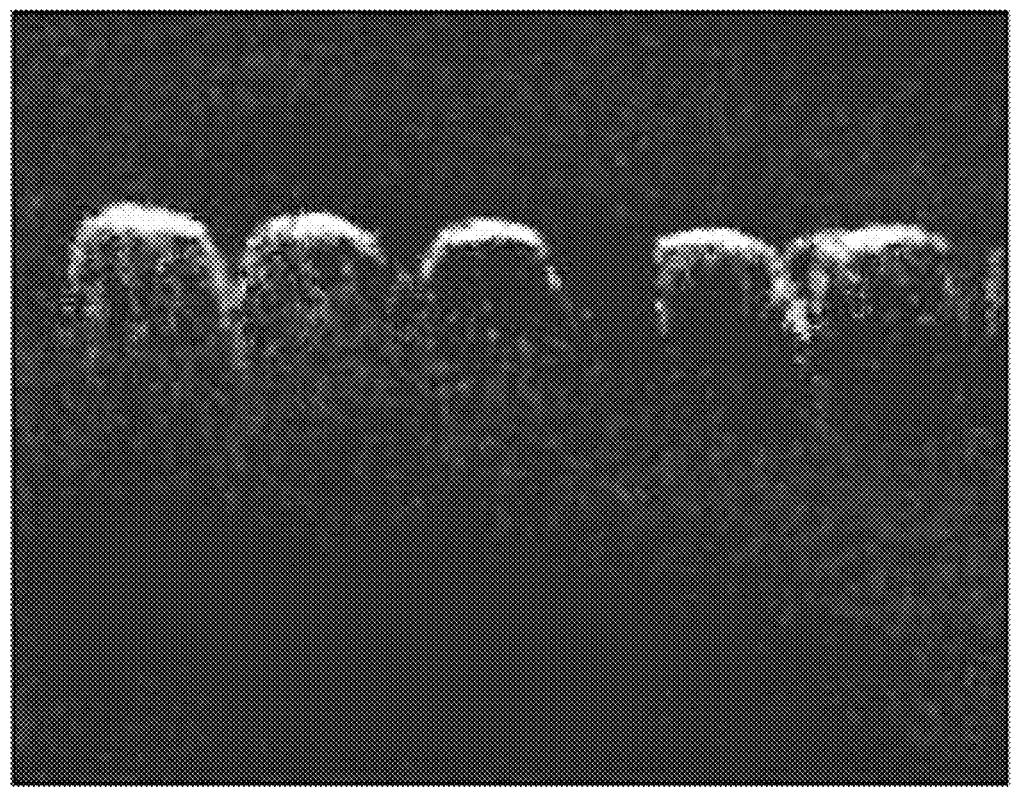

The obtained third layered product 3 (fine pattern structure including the fine mask pattern and the object to be processed) was observed using a scanning electron microscope (SEM), a transmission electron microscope (TEM), and an energy dispersive X-ray spectrometry (EDX) method. An example of the observation result is shown in FIGS. 86, 87A, and 87B. FIG. 86 is an SEM photographic image showing the observation result. FIG. 87A is a TEM photographic image showing the observation result. FIG. 87B is a TEM-EDX photographic image shown in the observation result. Referring to FIG. 86, it is recognized that the first mask layer was nanofabricated. In the TEM photographic image of FIG. 87A, a bright portion corresponds to the second mask layer. This can be determined from a fact that the white portion in the TEM-EDX photographic image of FIG. 87B corresponds to titanium (Ti) contained in the second mask layer. In the TEM photographic image of FIG. 87A, it is recognized that the second mask layer was arranged on the convex portion of the first mask layer with a thickness of approximately 50 nm, and the second mask layer was arranged on the side face of the first mask layer with a thickness of approximately 15 nm. The thickness ratio hmv/h0 was controllable among 0.004, 0.008, 0.01, 0.05, 0.1, 0.5, 1, 2.3, 5, and 9 depending on the filling rate of the second mask layer and the coat thickness of the first mask layer. Meanwhile, the thickness ratio hml/hmv was controllable among 0.06, 0.075, 0.1, 0.3, 0.75, and 0.95.

The obtained third layered product 3 was observed by using a scanning electron microscope, a transmission electron microscope, and an energy dispersive X-ray spectroscopy method. It was observed that, as the dry etching time increases, the removed thickness of the first mask layer increases, and accordingly, the aspect ratio increases. It was recognized that the second mask layer was arranged on the convex portion of the first mask layer with a thickness of approximately 50 nm and was arranged on the side face of the first mask layer with a thickness of approximately 15 nm. The thickness ratio hmv/h0 was controllable among 0.004, 0.008, 0.01, 0.05, 0.1, 0.5, 1, 2.3, 5, and 9 depending on the filling rate of the second mask layer and the coat thickness of the first mask layer. Meanwhile, the thickness ratio hml/hmv was controllable among 0.06, 0.075, 0.1, 0.3, 0.75, and 0.95.

Subsequently, it was tested whether or not the object to be processed can be easily fabricated by using the manufactured third layered product. The test was similarly performed for the overall samples described above.

First, the nanostructured surface of the obtained third layered product was etched using an oxygen gas. Through the oxygen gas etching, the first mask layer was formed up to the interface with the object to be processed. In this process, since the second mask layer is arranged on the surface (a part of the side face and the top portion) of the fine structure of the first mask layer, it was possible to etch the first mask layer with a high anisotropic aspect ratio. The anisotropic aspect ratio was approximately 8 to 15 depending on the dry etching condition.

Figure 88:
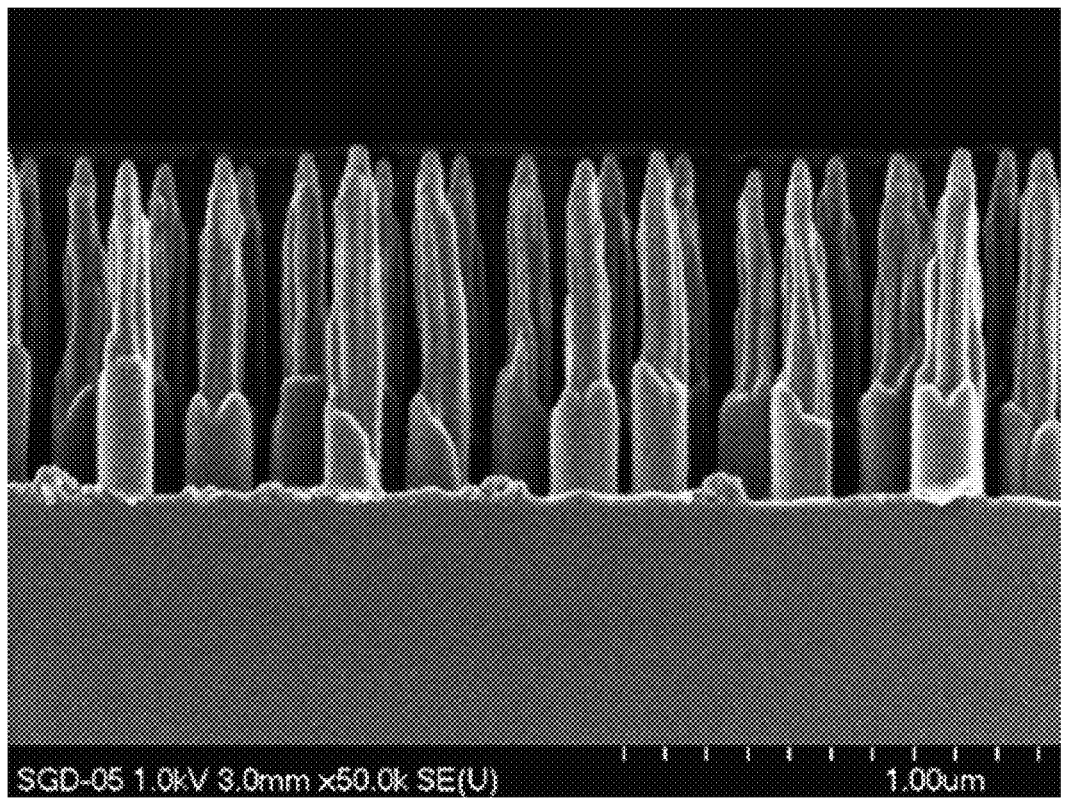
FIG. 88 is a SEM photographic image according to an example of the invention.

Through the aforementioned process, it was possible to form the fine mask pattern having a high aspect ratio including the first and second mask layers on the object to be processed. Although the aspect ratio is changed depending on the dry etching condition, it was controllable between 3 and 8. An example thereof is shown in FIG. 88. FIG. 88 is a cross-sectional SEM photographic image. Referring to FIG. 88, the fine pattern is arranged on the object to be processed, and the aspect ratio was approximately 5.

Subsequently, ICP-RIE etching was performed using a chlorine-based gas over the fine mask pattern having a high aspect ratio to fabricate the object to be processed. In a case where the first mask layer A was used, a mixed gas obtained by mixing an argon gas to a chlorine-based gas was used. The sapphire substrate used as a object to be processed has high dry etching resistance and is a difficult processing material. However, it was possible to fabricate sapphire substrate using the fine pattern having a high aspect ratio (height is large). The pattern arrangement was transferred onto the obtained object to be processed with a pitch matching the distance between concave portions of the used resin mold. The height was controllable within a range of 150 and 400 nm depending on the dry etching condition.

(d) Manufacturing of Third Layered Product 3 (2)

A third layered product 3 was manufactured using a method different from that described in Paragraph (c).

First, the first layered product 1 obtained by coating the second mask material and windingly recovering the resulting member was reeled out. Subsequently, the first mask layer was coated on the second mask layer. After removing the solvent, a cover film was bonded, and the resulting member was windingly recovered to manufacture a second layered product 2.

The used second layered product 2 was obtained by cutting a roll of the second layered product 2 wound by 200 m and separating the cover film. As the exterior, a width was set to 300 mm, and a length was set to 600 mm. A fine mask patterned-portion has a width of 250 mm and a length of 600 mm. The third layered product 3 was formed on the object to be processed by bonding the second layered product 2 to the object to be processed, irradiating light, releasing the resin mold, and then performing dry etching. Specifically, the manufacturing was made as follows.

The first mask layer was made of a resin containing a carboxyl group, a binder polymer as an acrylic copolymer of 50%, a monomer component of approximately 40%, and a multifunctional acrylic compound as a crosslinking agent. A material of the first mask layer was diluted with a solvent (MEK and PGME). The dilution concentration was controlled such that the film thickness after drying the coat reaches 400 nm or 700 nm. In addition, as the object to be processed, a sapphire substrate was used.

A hydrophilic treatment using ozone was performed for a surface of the object to be processed having a size of 2 inches ($\phi$). Subsequently, the object to be processed was heated at a temperature of 80 to 100° C., and the first mask layer side surface of the second layered product 2 was bonded to the object to be processed. In this case, a total of 36 objects to be processed (array of 4×9) were arranged, and the second layered product 2 having a size of 300 mm×600 mm was bonded to the objects to be processed. After the bonding, UV light was irradiated from the resin mold, and the resin mold was released.

It was possible to obtain the third layered product 3 by performing the subsequent process as in the description of Paragraph (c). Since the process was similar to that of description of Paragraph (c), it was possible to form the fine mask pattern having a high aspect ratio and easily fabricate the sapphire substrate by using the fine mask pattern.

Figure 89:
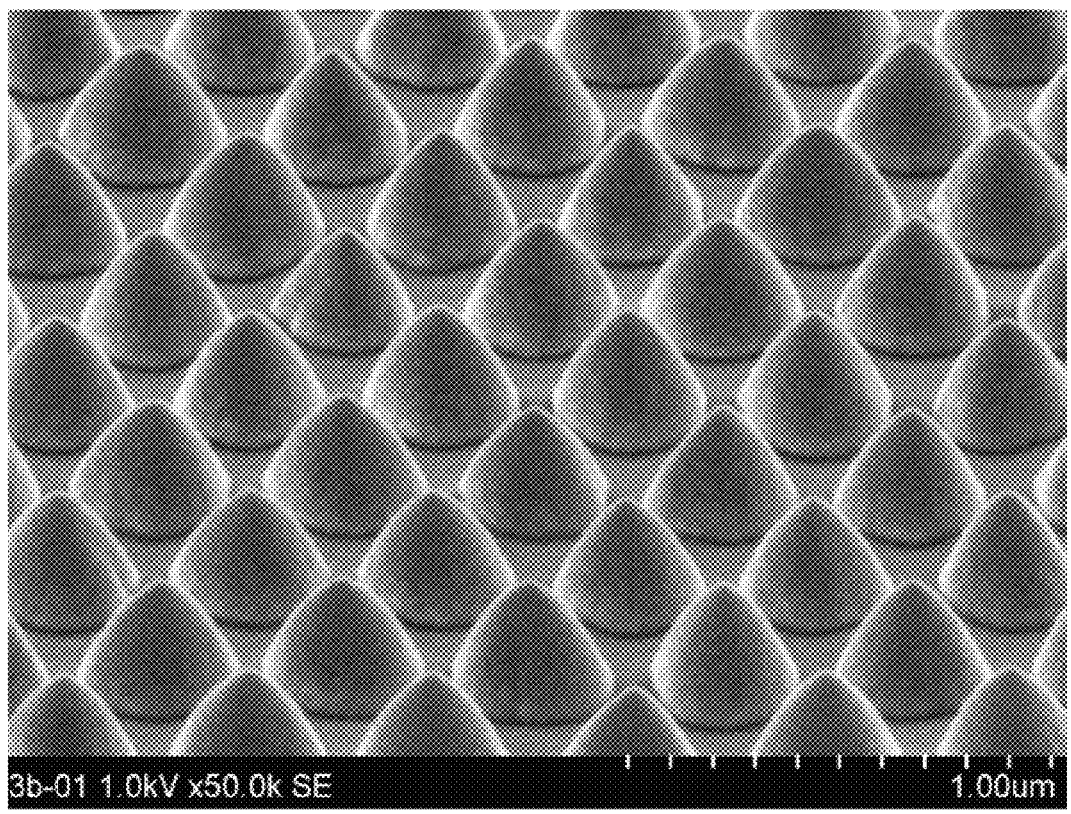
FIG. 89 is a SEM photographic image according to an example of the invention.

The dry etching for fabricating the sapphire substrate was performed as follows. The plasma etching condition for fabricating the sapphire substrate was set such that only a $BCl_3$ gas or a mixed gas between $BCl_3$ and $Cl_2$ or Ar obtained by setting the ratio of gas flow rates to 90 ccm:10 sccm to 85 sccm:15 sccm was used, a processing pressure was set to 0.1 to 6.5 Pa, and the inductively coupled plasma RIE apparatus was used. FIG. 89 is a surface SEM photographic image illustrating an example of the fabricated sapphire substrate. FIG. 89 is a scanning electron microscope photographic image perspectively observed. Referring to FIG. 89, it is recognized that a fine structure having a pitch of 460 nm was clearly arranged on a surface of the sapphire substrate.

(e) Calculation of Etching Rate Ratio

The etching rate ratio was calculated. The etching rate ratio was calculated as $Vo1/Vm1$, where $Vo1$ denotes an etching rate of the first mask layer, and $Vm1$ denotes an etching rate of the second mask layer. The first mask layer diluted with PGME or the second mask layer diluted with PGME was formed on a quartz substrate through a spin coat method and was dried at a temperature of 80° C. for 30 minutes. Subsequently, in a case where a photo-polymerizable group is included, UV-light was irradiated to perform photo-polymerization under a deoxidizing atmosphere. For the obtained sample, etching rates were inferred, and the ratio $Vo1/Vm1$ was calculated based thereon. As a result, it was possible to obtain a etching selectivity $Vo1/Vm1$=10, 16, 20, 51, 55, and 80. Meanwhile, a ratio $Vo2/Vi2$ between the etching rate $Vi2$ of the sapphire substrate and the etching rate $Vo2$ of the first mask layer was also calculated using the chlorine-based gas. As a result, it was possible to obtain a etching selectivity $Vo2/Vi2$ of 2.5, 2.0, 1.7, 1.4, and 0.74.

Example 12

(a) Manufacturing of Cylindrical Master
(Manufacturing of Template for Resin Mold)

Three quartz glass cylindrical masters were manufactured by using quartz glass as a material of the cylindrical master. A concave-convex structure was formed on the quartz glass surface through a semiconductor laser direct lithography method. A pitch of 200 nm was formed on the fine pattern of the first quartz glass. A pitch of 460 nm was formed on the fine pattern of the second quartz glass. A pitch of 700 nm was formed on the fine pattern of the third quartz glass. For overall quartz glass cylindrical masters, the same process was performed as follows. Durasurf HD-1101Z (produced by DAIKIN INDUSTRIES, ltd) was coated on a surface of the quartz glass roll having a fine surface unevenness, and the resulting member was heated at a temperature of 60° C. for one hour and was then disposed at a room temperature for 24 hours for solidification. Then, the resulting member was rinsed three times using Durasurf HD-ZV (produced by DAIKIN INDUSTRIES, ltd), and a releasing treatment was performed.

(b) Manufacturing of Resin Mold

A transfer material 12 was prepared by mixing DACHP, M350, I.184, and I.369. 10 to 20 parts by mass of DACHP was added respect to 100 parts by mass of M350. In the process of manufacturing the resin mold B from the resin mold A described below, the resin mold B was manufactured using the same resin as that used in manufacturing of the resin mold A.

Similar to Example 1, a reel-like resin mold A (having a length of 200 m and a width of 300 mm) having the transferred fine pattern on a surface was obtained. As the shape of the fine pattern of the reel-like resin mold A, the distance between convex portions was set to 200 nm, and the height was set to 250 nm in a case where the first quartz glass was used. In a case where the second quartz glass was used, the distance between convex portions was set to 460 nm, and the height was set to 500 nm. In a case where the third quartz glass was used, the distance between convex portions was set to 700 nm, and the height was 750 nm.

Similar to Example 1, a plurality of reel-like resin molds B (having a length of 200 m and a width of 300 mm) having the same fine pattern as that transferred on a surface of the cylindrical master were obtained. As a shape of the fine pattern of the reel-like resin mold B, the distance between concave portions was 200 nm, and an opening width was 180 nm for the first quartz glass. For the second quartz glass, the distance between concave portions was 460 nm, and the opening width was 430 nm. For the third quartz glass, the distance between concave portions was 700 nm, and the opening width was 650 nm.

A reel-like resin mold B was also manufactured by changing the manufacturing condition of the cylindrical master, in which the distance between concave portions was set to 460 nm, and the opening width was set to 340 nm, 380 nm, and 400 nm.

The ratio Es/Eb between the surface fluorine concentration Es and the average fluorine concentration Eb of the obtained resin mold B was controllable between 40 and 80 based on a dose of DACHP. Hereinafter, the resin mold B is referred to as a resin mold regardless of a difference of the pitch or the opening width.

(c) Manufacturing of Third Layered Product 3 (1)

A third layered product 3 was manufactured using the resin mold as follows.

The second mask material AA was obtained by sufficiently mixing TTB, DEDFS, X21-5841, SH710, 3APTMS, M211B, M101A, M350, I.184, and I.369 with a mixing ratio of 33.0: 11.0:4.4:4.4:17.6:8.8:8.8:8.8:2.4:0.9 [g].

The second mask material AA was diluted with PGME. The dilution ratio was controlled in combination with the coat film thickness such that the solid content is reduced in comparison with a volume of the fine pattern of the resin mold. Specifically, the concentration was determined such that the distance X between the convex portion of the resin mold and an exposed surface of the second mask layer in the concave portion of the resin mold becomes 0.3Y using the depth Y of the concave-convex structure of the resin mold. The dilution was performed by dropping PGME on the second mask material and sufficiently agitating it.

The coating of the second mask material on the fine patterned-surface of the resin mold was performed using the same apparatus as that used in the manufacturing of the resin mold. Using the Micro Gravure coating, the diluted mask material was coated on the fine patterned-surface of the resin mold, the resulting member was passed through a dry atmosphere at a temperature of 80° C., and a cover film was bonded and windingly recovered.

The cross section of the obtained first layered product 1 was observed using a scanning electron microscope and a transmission electron microscope. As a result, it was recognized that the second mask layer was filled in the concave portion in overall cases regardless of the used fine pattern. The distance X was set to 0.2Y to 0.4Y. Meanwhile, a top portion of the convex portion of the resin mold was observed using a transmission electron microscope. As a result, it was impossible to observe the second mask layer. Therefore, it was determined that the second mask layer is not formed on the convex portion, or the thickness is equal to or smaller than several nm even if it is formed.

The used first layered product 1 was obtained by cutting a roll of the first layered product 1 wound by 200 m. As the exterior, a width was set to 300 mm, and a length was set to 600 mm. A fine mask pattern formation portion has a width of 250 mm and a length of 600 mm. The third layered product 3 was manufactured by bonding the first layered product 1 to the object to be processed by interposing the first mask layer, irradiating light, releasing the resin mold, and then performing dry etching. Specifically, the manufacturing was performed as follows.

As the first mask layer, the first mask layer A and the first mask layer B described above were separately used. Since both the first mask layers A and B are similarly used, hereinafter, they are simply referred to as a first mask layer.

First Mask Layer A:
Solution A=OXT221:CEL2021P:M211B:M309: M313=20 g:80 g:20 g:40 g:40 g.
Solution B=PGME:DTS102:DBA:1.184=300 g:8 g:1 g:5 g
Solution A:Solution B:PGME=100 g:157 g:200 g
First Mask Layer B: MUR-XR02 (produced by MARUZEN PETROCHEMICAL CO., LTD.)

In addition, as the object to be processed, a c-plane sapphire substrate and a gallium nitride substrate were used. Since the same process was performed for any substrate, hereinafter, they will be simply referred to as an object to be processed.

A hydrophilic treatment using ozone was performed for a surface of the object to be processed having a size of 2 inches (φ). Subsequently, a thin film was formed on the ozone treatment surface of the object to be processed through a spin coat method of a speed of 2000 rpm for first mask layer A and 5000 rpm for the first mask layer B. Subsequently, the resulting member was disposed on a hot plate at a temperature of 80° C. for 2 minutes to remove the solvent.

The second mask layer side surface (fine pattern side surface of the resin mold) of the first layered product 1 was bonded to the first mask layer on the object to be processed. In this case, a total of 36 objects to be processed (array of 4×9) having the first mask layers were arranged, and the first layered product 1 having a size of 300 mm×600 mm was bonded to the objects to be processed.

After the bonding, a pressure of 0.05 MPa was applied from the resin mold, and UV light was irradiated toward the resin mold. In a case where the first mask layer A was used, the resulting member was disposed at a room temperature for 10 minutes after UV light irradiation. Then, the resin mold was released. Furthermore, UV light was irradiated again.

Figure 90:
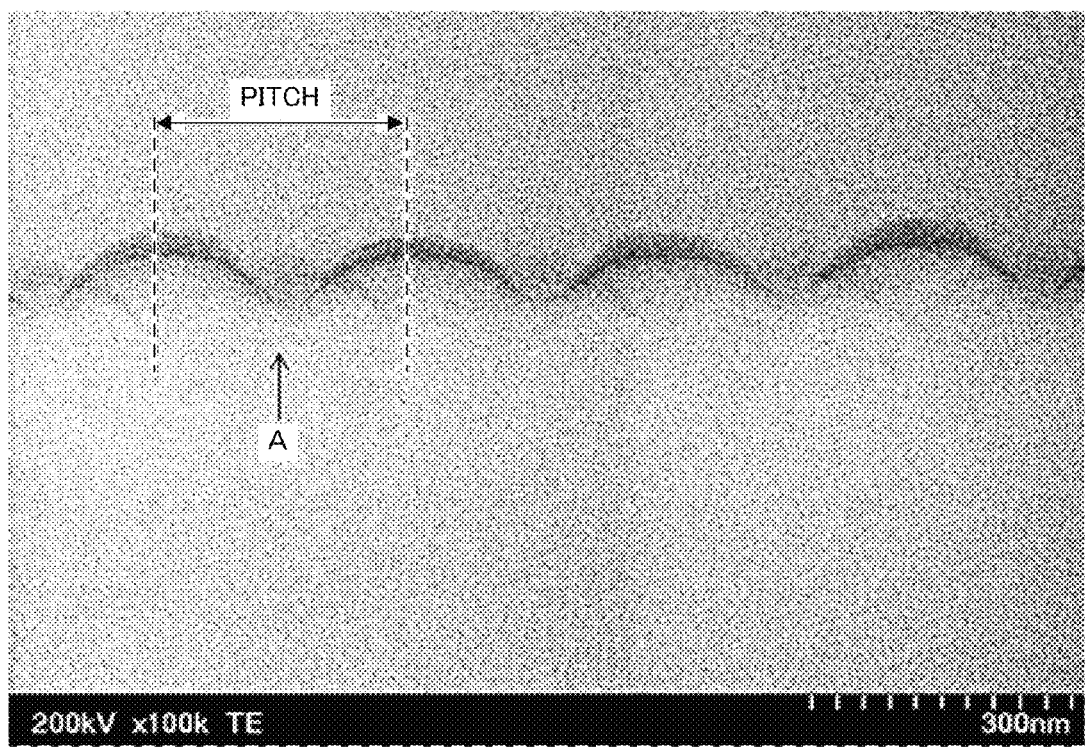
FIG. 90 is a SEM photographic image according to an example of the invention.

The fine pattern side surface of the obtained object to be processed was observed using a scanning electron microscope. As a result, a configuration consisting of [the second mask layer/the first mask layer/the object to be processed]

was observed. In addition, it was recognized that the second mask layer is not arranged in the bottom of the concave portion of the fine pattern made from the first mask layer. An example thereof is illustrated in FIG. 90. FIG. 90 is a transmission electron microscope photographic image. Since it is a transmission electron microscope photographic image, the fine patterns are overlappingly captured. However, as illustrated in FIG. 90, a distance between a certain convex portion and the secondly closest convex portion corresponds to the pitch. That is, the point A in FIG. 90 corresponds to the concave portion. In FIG. 90, the black portion in the bottom corresponds to the inorganic substrate, and the white portion over the inorganic substrate corresponds to the first mask layer. In addition, the black portion over the first mask layer corresponds to the second mask layer. Since there is no contrast in the second mask layer in the position of the point A (concave bottom portion), it is recognized that there is no remaining film (intermediate product).

The first mask layer was nanostructured by performing $O_2$ etching (1 Pa to 0.5 Pa) from the second mask layer side surface of the obtained intermediate product, so that the third layered product 3 (fine pattern structure including the fine mask pattern and the object to be processed) was obtained.

The obtained third layered product 3 was observed using a scanning electron microscope (SEM), a transmission electron microscope (TEM), and an energy dispersive X-ray spectrometry (EDX) method. The thickness ratio hmv/h0 was controllable within a range of 0.003 to 10 based on the filling rate of the second mask layer and the coat thickness of the first mask layer. Meanwhile, the thickness hml/hmv was controllable within a range of 0.05 to 0.9.

Subsequently, it was tested whether or not the object to be processed can be easily fabricated by using the manufactured third layered product. As a sample, the sample obtained by using a sapphire substrate as a object to be processed was used.

First, the nanostructured surface of the obtained third layered product 3 was etched using an oxygen gas. Through the oxygen gas etching, the first mask layer was formed up to the interface with the object to be processed. In this process, since the second mask layer is arranged on the surface (a part of the side face and the top portion) of the fine structure of the first mask layer, it was possible to etch the first mask layer with a high anisotropic aspect ratio. The anisotropic aspect ratio was approximately 8 to 15 depending on the dry etching condition.

Through the aforementioned process, it was possible to form the fine mask pattern having a high aspect ratio including the first and second mask layers on the object to be processed. Although the aspect ratio is changed depending on the dry etching condition, it was controllable between approximately 3 and 8.

Subsequently, etching was performed using a chlorine-based gas over the fine mask pattern having a high aspect ratio to form the object to be processed. In a case where the first mask layer A was used, a mixed gas obtained by mixing an argon gas and an oxygen gas to a chlorine-based gas was used. The sapphire substrate used as a object to be processed has high dry etching resistance and is a difficult processing material. However, it was possible to easily process sapphire substrate using the fine mask pattern having a high aspect ratio (height is large). The pattern arrangement was transferred onto the obtained object to be processed with a pitch matching the distance between concave portions of the used resin mold. The height was controllable within a range of 150 to 400 nm depending on the dry etching condition.

(d) Manufacturing of Third Layered Product 3 (2)

A third layered product 3 was manufactured using a method different from that described in Paragraph (c).

The first layered product 1 obtained by coating the second mask layer material and windingly recovering the resulting member was reeled out. Subsequently, the first mask layer was coated on the second mask layer. After removing the solvent, a cover film was bonded, and the resulting member was windingly recovered to manufacture a second layered product.

The used second layered product 2 was obtained by cutting a roll of the second layered product 2 wound by 200 m and separating the cover film. As the exterior, a width was set to 300 mm, and a length was set to 600 mm. A fine mask formation portion has a width of 65 mm and a length of 400 mm. The third layered product 3 was formed on the object to be processed by bonding the second layered product 2 to the object to be processed, irradiating light, releasing the resin mold, and then performing dry etching. Specifically, the manufacturing was made as follows.

The first mask layer was made of a resin containing a carboxyl group, a binder polymer as an acrylic copolymer of 50%, a monomer component of approximately 40%, and a multifunctional acrylic compound as a crosslinking agent. A material of the first mask layer was diluted with a solvent (MEK and PGME) by 12%.

In addition, as the object to be processed, a sapphire substrate and a gallium nitride substrate were used, respectively. Since the same process was performed for any substrate, hereinafter, they will be simply referred to as a object to be processed.

A hydrophilic treatment using ozone was performed for a surface of the object to be processed having a size of 2 inches ($\phi$). Subsequently, the object to be processed was heated at a temperature of 105° C., and the first mask layer side surface of the second layered product 2 was bonded to the object to be processed. In this case, a total of 4 objects to be processed (array of 4×1) were arranged, and the second layered product 2 having a size of 65 mm×400 mm was bonded to the objects to be processed. After the bonding, UV light was irradiated from the resin mold, and the resin mold was released.

The fine pattern side surface of the obtained object to be processed was observed using a scanning electron microscope. As a result, a configuration consisting of [the second mask layer/the first mask layer/the object to be processed] was observed. In addition, it was recognized that the second mask layer is not arranged in the bottom of the concave portion of the concave-convex structure made from the first mask layer. From the aforementioned description, it is recognized that a second mask layer having a large total area and no remaining film (or very thin) can be easily formed by using the second layered product 2.

Subsequently, oxygen etching was performed from the second mask layer side surface to obtain the third layered product 3 (fine pattern structure including the fine mask pattern and the object to be processed). By observing the cross section using a transmission electron microscope, the thickness ratio hmv/h0 was controllable within a range of 0.005 to 8.5. Meanwhile, the thickness ratio hml/hmv was controllable within a range of 0.05 to 0.9.

Subsequently, etching was performed using a chlorine-based gas over the second mask layer of the third layered product 3 to fabricate the object to be processed. In a case where the first mask layer A was used, a mixed gas obtained by mixing an argon gas to a chlorine-based gas was used. The sapphire substrate used as a object to be processed has high dry etching resistance and is a difficult processing material. However, it was possible to easily process sapphire substrate using the fine pattern having a high aspect ratio (height is large). The pattern arrangement was transferred onto the obtained object to be processed with a pitch matching the distance between concave portions of the used resin mold. The height was controllable within a range of 150 to 400 nm depending on the dry etching condition.

Example 13

(a) Manufacturing of Plate Mold

Three quartz glass plate mold were manufactured by using quartz glass as a material of the plate mold. A concave-convex structure was formed on the quartz glass surface through a semiconductor laser direct lithography method. A pitch of 200 nm was formed on the fine pattern of the first quartz glass. A pitch of 460 nm was formed on the fine pattern of the second quartz glass. A pitch of 700 nm was formed on the fine pattern of the third quartz glass. For overall quartz glass plate molds, the same process was performed as follows. Durasurf HD-1101Z (produced by DAIKIN INDUSTRIES, ltd) was coated on a quartz glass surface having a fine concave-convex, and the resulting member was heated at a temperature of 60° C. for one hour and was then disposed at a room temperature for 24 hours for solidification. Then, the resulting member was rinsed three times using Durasurf HD-ZV (produced by DAIKIN INDUSTRIES, ltd), and a releasing treatment was performed.

(b) Manufacturing of Third Layered Product 3 (1)

A third layered product 3 was manufactured using a plate mold as follows. The second mask material AB was obtained by sufficiently mixing TTB, DEDFS, X21-5841, SH710, 3APTMS, M211B, M101A, M350, I.184, and I.369 with a mixing ratio of 33.0:11.0:4.4:4.4:17.6:8.8:8.8:8.8:2.4:0.9 [g].

The second mask material AB was diluted with PGME. The dilution ratio was controlled in combination with the coat film thickness such that the solid content is reduced in comparison with a volume of the fine pattern. Specifically, the concentration was determined such that the distance X between the convex portion of the plate mold and an exposed surface of the second mask layer in the concave portion of the plate mold becomes 0.3Y using the depth Y of the concave-convex structure of the resin mold. The dilution was performed by dropping PGME on the mask material and sufficiently agitating it.

The coating of the second mask material on the fine patterned-surface of the plate mold was performed using a spin coat method. First, the diluted second mask material was dropped on the fine patterned-surface of the plate mold. The dropping was performed until a liquid film of the dilute solution was formed on the entire surface of the fine pattern. Subsequently, the spin coater was rotated at a speed of 400 rpm. Then, the spin coater was rotated at a speed of 2000 rpm. Finally, the resulting member was stored under a dry atmosphere at a temperature of 80° C. for 10 minutes so as to obtain the first layered product 1.

The fine mask pattern was manufactured by bonding the first layered product 1 to the object to be processed by interposing the first mask layer, irradiating light, releasing the plate mold, and then performing dry etching. Specifically, the manufacturing was performed as follows.

As the first mask layer, the first mask layer A described below and the first mask layer B described below were separately used. Since both the first mask layers A and B are similarly used, hereinafter, they are simply referred to as a first mask layer. In addition, as the object to be processed, a c-plane sapphire substrate was used.

First Mask Layer A

Solution A=OXT221:CEL2021P:M211B:M309:M313=20 g:80 g:20 g:40 g:40 g.

Solution B=PGME:DTS102:DBA:1.184=300 g:8 g:1 g:5 g

Solution A:Solution B:PGME=100 g:157 g:200 g

First Mask Layer B: photosetting resin (MUR-XR02, produced by MARUZEN PETROCHEMICAL CO., LTD.)

A hydrophilic treatment using ozone was performed for a surface of the object to be processed having a size of 2 inches (φ). Subsequently, a thin film was formed on the ozone treatment surface of the object to be processed through a spin coat method of a speed of 2000 rpm for first mask layer A and 5000 rpm for the first mask layer B. Subsequently, the resulting member was disposed on a hot plate at a temperature of 80° C. for 2 minutes to remove the solvent.

The second mask layer side surface (fine pattern side surface of the plate mold) of the first layered product 1 was bonded to the first mask layer on the object to be processed. This bonding was performed under a decompressive atmosphere.

After the bonding, a pressure of 0.05 MPa was applied from the plate mold, and UV light was irradiated from the plate mold. In a case where the first mask layer A was used, the resulting member was disposed at a room temperature for 10 minutes after the UV light irradiation. Then, the plate mold was released, and further, UV light was irradiated.

The fine pattern side surface of the obtained object to be processed was observed using a scanning electron microscope. As a result, a configuration consisting of [the second mask layer/the first mask layer/the object to be processed] was observed. In addition, it was recognized that the second mask layer is not arranged in the bottom of the concave portion of the fine pattern made from the first mask layer.

From the second mask layer side surface, oxygen etching (1 to 0.5 Pa) was performed to nanostructure the first mask layer, so that the third layered product 3 (fine pattern structure including the fine mask pattern and the object to be processed) was obtained.

The obtained third layered product 3 was observed using a scanning electron microscope (SEM), a transmission electron microscope (TEM), and an energy dispersive X-ray spectrometry (EDX) method. As a result, the thickness ratio hmv/h0 was controllable within a range of 0.005 to 8 depending on the coat thickness of the first mask layer. Meanwhile, the thickness ratio hml/hmv was controllable within a range of 0.07 to 0.95.

Subsequently, it was tested whether or not the object to be processed can be easily fabricated using the manufactured third layered product 3. As a sample, the sample obtained by using a sapphire substrate as a object to be processed was used.

First, the nanostructured surface of the obtained third layered product 3 was etched using an oxygen gas. Through the oxygen gas etching, the first mask layer was formed up to the interface with the object to be processed. In this process, since the second mask layer is arranged on the surface (a part of the side face and the top portion) of the fine structure of the first mask layer, it was possible to etch the first mask layer with a high anisotropic aspect ratio. The anisotropic aspect ratio was approximately 8 to 15 depending on the dry etching condition.

Through the aforementioned process, it was possible to form the fine mask pattern having a high aspect ratio including the first and second mask layers on the object to be processed. Although the aspect ratio is changed depending on the dry etching condition, it was controllable between 3 and 8.

Subsequently, etching was performed using a chlorine-based gas over the fine mask pattern having a high aspect ratio to fabricate the object to be processed. In a case where the first mask layer A was used, a mixed gas obtained by mixing an argon gas and an oxygen gas to a chlorine-based gas was used. The sapphire substrate used as an object to be processed has high dry etching resistance and is a difficult processing material. However, it was possible to easily fabricate sapphire substrate using the fine pattern having a high aspect ratio (height is large). The pattern arrangement was transferred onto the obtained object to be processed with a pitch matching the distance between concave portions of the used resin mold. The height was controllable within a range of 150 to 400 nm depending on the dry etching condition.

(d) Manufacturing of Third Layered Product 3 (2)

A third layered product 3 was manufactured using a method different from that described in Paragraph (c). The second layered product 2 was manufactured by coating the first mask layer on the plate mold (first layered product 1) obtained by coating the second mask layer.

The first mask layer was made of a resin containing a carboxyl group, a binder polymer as an acrylic copolymer of 50%, a monomer component of approximately 40%, and a multifunctional acrylic compound as a crosslinking agent. A material of the first mask layer was diluted with a solvent (MEK and PGME) by 12%. The first mask layer was formed through a spin coat method at a speed of 5000 rpm. In addition, as the object to be processed, a sapphire substrate was used.

A hydrophilic treatment using ozone was performed for a surface of the object to be processed having a size of 2 inches ($\phi$). Subsequently, the object to be processed was heated at a temperature of 105° C., and the first mask layer side surface of the second layered product was bonded to the object to be processed. This process was performed under a decompressive atmosphere. After the bonding, UV light was irradiated toward the resin mold, and the plate mold was released.

The fine pattern side surface of the obtained object to be processed was observed using a scanning electron microscope. As a result, a configuration consisting of [the second mask layer/the first mask layer/the object to be processed] was observed. In addition, it was recognized that the second mask layer is not arranged in the bottom of the concave portion of the fine pattern made from the first mask layer.

Subsequently, oxygen etching was performed from the second mask layer side surface to obtain the third layered product 3 (fine pattern structure including the fine mask pattern and the object to be processed). By observing the cross section using a transmission electron microscope, the thickness ratio hmv/h0 was controllable within a range of 0.007 to 9. Meanwhile, the thickness ratio hml/hmv was controllable within a range of 0.06 to 0.8.

Subsequently, etching was performed using a chlorine-based gas over the second mask layer of the third layered product 3 to fabricate the object to be processed. In a case where the first mask layer A was used, a mixed gas obtained by mixing an argon gas to a chlorine-based gas was used. The sapphire substrate used as a object to be processed has high dry etching resistance and is a difficult processing material. However, it was possible to easily fabricate sapphire substrate using the fine pattern having a high aspect ratio (height is large). The pattern arrangement was transferred onto the obtained object to be processed with a pitch matching the distance between concave portions of the used resin mold. The height was controllable within a range of 150 to 400 nm depending on the dry etching condition.

Comparative Example 7

A third layered product 3 having no second mask layer on the uneven side face in the first mask layer of the fine pattern was manufactured by changing the material of the second mask layer described in Paragraph (b) of Example 13 to the following material.

A second mask material AC was obtained by sufficiently mixing M211B, M313A, M309, I.184, and I.369 with a mixing ratio of 140 g:40 g:20 g:5.5 g:2.0 g.

The first layered product 1 was manufactured by using the second mask material AC. Subsequently, the same process as that described in Paragraphs (b) and (d) in Example 13 was performed to manufacture the third layered product.

Etching was performed using an oxygen gas from the surface of the second mask layer. The etching time was controlled such that the etching progresses up to the interface between the first mask layer and the object to be processed. After the etching, it was observed whether or not the fine mask pattern having a high aspect ratio is manufactured using a scanning electron microscope. The aspect ratio was set to 2 at maximum although it may be changed depending on the dry etching condition. It can be inferred that this is because the second mask layer is not arranged on the side face of the fine structure of the first mask layer, so that the anisotropic aspect ratio is not satisfactory when the first mask layer is etched, and the first mask layer is removed through the horizontal etching from the second mask layer side top portion of the convex portion of the first mask layer.

Next, the inventors manufactured a fourth layered product 4 according to the second aspect of the invention described above, transferred a fine pattern onto the object to be processed using the manufactured fourth layered product 4, and investigated the effect thereof. Hereinafter, details of the investigation performed by the inventors will be described.

Example 14

(a) Manufacturing of Cylindrical Master
(Manufacturing of Template for Resin Mold)

By using quartz glass as a base material of the cylindrical master, an concave-convex structure was formed on the quartz glass surface through direct lithography using a semiconductor laser. First, a resist layer was formed on the quartz glass surface through a sputtering method. The sputtering method was performed by using a CuO substrate (containing 8 atm % of Si) having a size of 3 inches ($\phi$) as a target (resist layer) and applying electric power of RF100W to form a resist layer of 20 nm. Subsequently, exposure was performed using a semiconductor laser having a wavelength of 405 nm while the cylindrical master was rotated. Then, the resist layer after applying the exposure was developed. The development of the resist layer was performed using a glycine water solution of 0.03 wt % for 240 seconds. Then, dry etching was performed for the etching layer (quartz glass) by using the developed resist layer as a mask. The dry etching was performed by using SF$_6$ as an etching gas and applying a processing electric power of 300 W at a processing gas pressure of 1 Pa for a processing time of 5 minutes. Then, only the residue of the resist layer was removed using hydrochloric acid of pH1 from the cylindrical master having the transferred fine structure on a surface. The removal time was set to 6 minutes.

For the surface concave-convex structure of the obtained cylindrical master, Durasurf HD-1101Z (produced by DAIKIN INDUSTRIES, ltd.) was coated and heated at a temperature of 60° C. for one hour. Then, the resulting member was disposed at a room temperature for 24 hours for solidification. Then, rinsing was performed three times using Durasurf HD-ZV (produced by DAIKIN INDUSTRIES, ltd.), and a releasing treatment was performed. Subsequently, the resin concave-convex structure was formed on a film using a consecutive UV transfer method from the cylindrical master.

(b) Manufacturing of Reel-Like Mold A

As a transfer material, the following transfer material 13 was used.

Transfer Material 13: a mixture of DACHP, M350, I.184, and I.369 was mixed with a mixing ratio of 17.5 g:100 g:5.5 g:2.0 g.

A reel-like resin mold A (having a length of 200 m and a width of 300 mm) having the transferred concave-convex structure on a surface were obtained in a similar manner as Example 1 except that the transfer material 13 described above was used, and the integral light intensity was set to 1000 mJ/cm$^2$.

(c) Manufacturing of Fourth Layered Product 4

As the object to be processed, a c-plane sapphire substrate and a silicon wafer were used. Since the same process was performed for the object to be processed in any case, they are collectively referred to as a object to be processed.

A UV-O$_3$ treatment was performed for the object to be processed for 10 minutes, so that organic materials on the surface of the object to be processed were removed, and the surface was hydrophilized. Then, a composition obtained by mixing 3-acrylioxypropyl trimethoxysilane and I.184 with a mixing ratio of 100 g:2 g was diluted with propylene glycol monomethyl ether by 20 weight % by adding hydrochloric acid having a concentration of 36% until a concentration of 0.02 weight %. The obtained solution was spin-coated on the treated surface of the object to be processed after applying the UV-O$_3$ treatment. The spin coating was performed at a speed of 5000 rpm. After the spin coating, the resulting member was dried in an oven at temperature of 80° C. for 5 minutes.

On the resulting object to be processed, a solution obtained by diluting the transfer material 13 with propylene glycol monomethyl ether by 10 weight % was spin-coated. The film thickness was controlled based on the spin coat condition.

The resin mold A was bonded to the object to be processed having the film formed of the transfer material 13, and UV-light was irradiated over the resin mold A with an integral light intensity of 1300 mJ/cm$^2$. After the UV-light irradiation, the resulting member was disposed on a hot plate at a temperature of 105° C. for 30 seconds, and then, the resin mold A was released. Through the process described above, a layered product including the first mask layer and the object to be processed having a fine pattern on a surface was obtained (hereinafter, referred to as a layered product A).

The second mask material AD described below or the second mask material AE described below was dissolved in a solvent obtained by mixing MIBK and propylene glycol monomethyl ether with a mixing ratio of 6:4, and the resulting member was coated on a pattern surface of the layered product A. Here, the coating was performed using a bar coater. The bar coater was operated at a speed of 25 mm/sec. After the coating, the resulting member was disposed at a temperature of 25° C. and a humidity of 60% for one minute. Then, the resulting member was disposed in an oven at a temperature of 80° C. for 3 minutes, so that the fourth layered product 4 was manufactured.

Second Mask Material AD: a material obtained by mixing a zirconium tetrabutoxide monomer and a titanium tetrabutoxide monomer with a mixing ratio of 40 g:60 g and performing condensation at a temperature of 80° C. until a viscosity of 250 cP is obtained.

Second Mask Material AE: a material obtained by mixing a zirconium tetrabutoxide monomer, a titanium tetrabutoxide monomer, and phenyl-modified silicone with a mixing ratio of 40 g:60 g:1.5 g and performing condensation at a temperature of 60° C. until a viscosity of 200 cP is obtained.

The obtained fourth layered product 4 was analyzed using a scanning electron microscope, a transmission electron microscope, and an energy dispersive X-ray spectroscopy method. Details of the obtained fine pattern formation layered product 4 are listed in Table 15. The terminologies in Table 15 are defined as follows.

No.: indicates a reference number of the fourth layered product 4.

Thickness: indicates a distance from the interface between the object to be processed and the first mask layer to the top position S of the convex portion of the fine pattern of the first mask layer.

Pitch: indicates a pitch of the fine pattern of the first mask layer.

Opening Ratio: indicates an opening ratio of the fine pattern of the first mask layer.

Es/Eb: indicates a ratio between the surface fluorine concentration Es on the fine patterned surface of the first mask layer and the average fluorine concentration Eb of the first mask layerfine patterned surface.

TABLE 15

| | 1st Mask Layer | | | | 2nd Mask Layer | | |
|---|---|---|---|---|---|---|---|
| | | | Openning | | | | |
| No. | Tickness | Pitch | Ratio | Es/Eb | Material | lcv | lcc/h |
| 1 | 320 | 460 | 79% | 47 | (AD) | →0 nm | 0.48 |
| 2 | 540 | 460 | 79% | 47 | (AD) | →0 nm | 0.34 |
| 3 | 720 | 460 | 79% | 47 | (AD) | →0 nm | 0.7 |
| 4 | 380 | 460 | 62% | 49 | (AE) | →0 nm | 0.31 |
| 5 | 500 | 460 | 62% | 49 | (AE) | →0 nm | 0.23 |
| 6 | 690 | 460 | 62% | 49 | (AE) | →0 nm | 0.84 |

The cross-sectional photographic image was observed using a scanning electron microscope. As a result, it was recognized that the second mask layer was arranged in the concave portion of the fine pattern of the first mask layer. By analyzing the top portion of the fine pattern using a transmission electron microscope and an energy dispersive X-ray spectroscopy method, it was recognized that the second mask layer is not arranged on the top portion of the fine pattern. From the viewpoint of a resolution of this analysis, it can be determined that the second mask layer does not exist in the top portion of the fine pattern or it is several nanometers or smaller even if it exists.

Subsequently, it was tested whether or not the object to be processed can be fabricated using the fourth layered product 4. Here, as the object to be processed, a sapphire substrate was used.

First, an oxygen ashing treatment was performed from the second mask layer side surface. Through the oxygen ashing, the first mask layer was etched firstly from the top portion of the fine pattern of the first mask layer. This is because the second mask layer is arranged in the concave portion of the fine pattern, and the etching selectivity between the second mask layer and the first mask layer is very high (for example, 28 to 35). The oxygen ashing was performed until the object to be processed is exposed. Subsequently, ICP-RIE etching was performed using a mixed gas obtained by adding an argon gas to a chlorine-based gas to fabricate the object to be processed. The fabricated sapphire substrate was observed using a scanning electron microscope. As a result, it was recognized that a plurality of convex portions were arranged on a surface of the sapphire substrate. It was also recognized that the shape of the convex portion was controlled depending on a mold shape and a dry etching condition. For example, the shape of the convex portion may include a conical shape, a conical shape having a warped side face, a lens shape, a parabolic shape, and the like.

As described above, similar to the first layered product 1 to the third layered product 3 described above, it is possible to easily fabricate the object to be processed even by using the fourth layered product 4.

While embodiments of the present invention have been described, the present invention may be variously changed or modified without limiting to the embodiments described above. In the aforementioned embodiments, the sizes or shapes of elements illustrated in the accompanying drawings may be appropriately changed or modified without limitation. The first and second aspects and Embodiments 1 to 4 according to the present invention described above may be embodied in a combination. Other changes, alterations, or modifications can be appropriately made without departing from the scope or spirit of the present invention.

According to the present invention, it is possible to implement a fine pattern formation layered product and a method of manufacturing a fine pattern formation layered product, capable of easily forming a fine pattern having a thin or no remaining film in order to form a fine pattern having a high aspect ratio on a desired object to be processed. Particularly, the invention may be appropriately applied to an optical member for a semiconductor light-emitting device and a method of manufacturing the same. In addition, the obtained fine pattern may be used in a water-repellent film, a hydrophilic film, or an adhesive tape.

This application is based on and claims priority to Japanese Unexamined Patent Application Nos. 2011-139692 (filed on Jun. 23, 2011), 2011-185504 (filed on Aug. 29, 2011), 2011-286453 (filed on Dec. 27, 2011), 2012-022267 (filed on Feb. 3, 2012), 2012-013466 (filed on Jan. 25, 2012), 2012-037957 (filed on Feb. 23, 2012), 2011-285597 (filed on Dec. 27, 2011), 2011-185505 (filed on Aug. 29, 2011), and 2012-038273 (filed on Feb. 24, 2012), the entire content of which is incorporated herein by reference.

The invention claimed is:

1. A layered product for fine pattern formation used to form a fine pattern in a processing object using a first mask layer, comprising:
a mold having a concavo-convex structure on its surface; and
a second mask layer serving as a mask when the first mask layer is fabricated,
wherein a distance (lcc) between a top position (S) of a convex portion of the concavo-convex structure and an interfacial position (Scc) of the second mask layer formed in the concave portion of the concavo-convex structure and a height (h) of the concavo-convex structure satisfy Formula (1) 0<lcc<1.0 h, and a distance (lcv) between the top position (S) of the convex portion and a top position (Scv) of the second mask layer formed on the convex portion and the height (h) satisfy Formula (2) 0≤lcv≤0.05 h.

2. The layered product for fine pattern formation according to claim 1, wherein the first mask layer is provided to cover the concavo-convex structure of the mold, and
a distance (lor) between the top position (Scv) and a surface of the first mask layer and a pitch (P) of the concavo-convex structure satisfy Formula (6) 0.05≤lor/P≤5.

3. The layered product for fine pattern formation according to claim 2, further comprising a protection layer provided on a surface of the first mask layer.

4. The layered product for fine pattern formation according to claim 2, wherein the first mask layer includes a reactive diluent and a polymerization initiator.

5. The layered product for fine pattern formation according to claim 4, wherein the first mask layer includes a binder resin.

6. The layered product for fine pattern formation according to claim 5, wherein the binder resin has a portion represented by the following general formula (1) in a side chain and/or a main chain of the binder resin.

[Chemical Expression 1]

General Formula (1)

7. The layered product for fine pattern formation according to claim 2, wherein the mold includes a support substrate and a material layer that in provided on a principal surface of the support substrate and contains a material different from that of the support substrate.

8. The layered product for fine pattern formation according to claim 7, wherein the material layer is a resin layer comprising a fluorine-containing resin.

9. The layered product for fine pattern formation according to claim 8, wherein, in the mold, a ratio between a surface fluorine concentration (Es) in a region on the top position (S) of the convex portion and an average fluorine concentration (Eb) in the material layer satisfies Formula (10) 1≤Es/Eb≤30000.

10. The layered product for fine pattern formation according to claim 1, wherein the mold comprises polydimethylsiloxane.

11. The layered product for fine pattern formation according to claim 2, wherein the second mask layer includes a metal element.

12. The layered product for fine pattern formation according to claim 11, wherein the second mask layer includes at least one metal element selected from a group consisting of Ti, Zr, Si, Zn, Cr, Al, Ga, In, Cu, Ag, Fe, Sn, Pb, Ge, Ha, Ta, and W.

13. The layered product for fine pattern formation according to claim 7, wherein the concavo-convex structure has a hole configuration with an opening ratio of 45% or higher, an area of a hole opening is larger than an area of a hole bottom, and a distance between neighboring hole opening centers is set to 100 nm or longer and 1000 nm or shorter.

14. A method of manufacturing a layered product for fine pattern formation comprising a process of coating a solution of a second mask layer material on a concavo-convex structure of a mold to form a second mask layer,
wherein a unit area (Sc) in a plane parallel to a principal surface of the mold in a coating area of the coating process, a coat film thickness (hc) of the solution in the coating process, a volumetric concentration (C) of the solution of the second mask layer material, and a volume (Vc) of the concave portion of the concavo-convex structure existing under the unit area (Sc) satisfy Formula (11) Sc·hc·C<Vc.

15. The method according to claim 14, wherein a water contact angle of the mold against the concavo-convex structure is 90° or larger.

16. The method according to claim 14, wherein the concavo-convex structure has a hole configuration including a plurality of holes which comprise concave portions extending in an out-of-plane direction on the principal surface.

17. The method according to claim 16, wherein the unit area (Sc) and an area (Sh) of the opening satisfy Formula (13) Sh/Sc≥0.55.

18. The method according to claim 15, wherein, in the hole configuration, a length (ly) of a shortest line segment connecting an opening edge of a hole (A) and an opening edge of a hole (B) nearest to the hole (A) is equal to or shorter than 500 nm.

19. The method according to claim 14, wherein the second mask layer material includes a metal alkoxide.

20. A method of manufacturing the layered product for fine pattern formation described in claim 2, comprising, at least in this order:
a coating step of coating a solution of the first mask layer material on the surface having the concavo-convex structure incorporating the second mask layer of a first layered product for fine pattern formation manufactured through a method of manufacturing a layered product for fine pattern formation to form the first mask layer, said method comprises a process of coating a solution of a second mask layer material on a concavo-convex structure of a mold to form the second mask layer, said unit area (Sc) in a plane parallel to a principal surface of the mold in a coating area of the coating process, a coat film thickness (hc) of the solution in the coating process, a volumetric concentration (C) of the solution of the second mask layer material, and a volume (Vc) of the concave portion of the concavo-convex structure existing under the unit area (Sc) satisfy Formula (11) Sc·hc·C<Vc; and
a solvent removal step of removing a solvent from the first mask layer.

21. The method according to claim 20, wherein a coat film thickness (ho) of the solution of the first mask layer material and a volumetric concentration (Co) of the solution of the first mask layer material satisfy Formula (14) Sc·ho·Co≥Vc.

22. The method according to claim 21, wherein a distance (lor) between a top position (Scv) of the second mask layer and a surface of the first mask layer and a pitch (P) of the concavo-convex structure satisfy Formula (15) lor/P≤5.

23. The method according to claim 14, wherein the concavo-convex structure include a resing layer including a fluorine-containing resin and a ratio between a surface fluorine concentration (Es) in a region on the top position (S) of the convex portion of the resin layer and an average fluorine concentration (Eb) in the resin layer satisfies Formula (10) 1<Es/Eb≤30000.

24. A layered product for fine pattern formation comprising:
a processing object;
a first mask layer that is provided on a principal surface of the processing object and has a concavo-convex structure on its surface; and
a second mask layer provided on the concavo-convex structure of the first mask layer,
wherein the second mask layer is arranged in at least a part of a convex portion and side portion of the concavo-convex structure,
a ratio (hmv/h0) between a thickness (hmv) of the second mask layer arranged on the convex portion of the concavo-convex structure and a height (h0) of the concavo-convex structure represented by a distance between a bottom of the concave portion of the concavo-convex structure and a top of the convex portion satisfy Formula (16) 0<hmv/h0≤20, and
a ratio (hml/hmv) between a thickness (hml) of the second mask layer arranged on a side face portion of the concavo-convex structure and a thickness (hmv) of the second mask layer arranged on the convex portion of the concavo-convex structure satisfies Formula (17) 0≤hml/hmv<1.

25. The layered product for fine pattern formation according to claim 24, wherein the second mask layer includes a metal element.

26. The layered product for fine pattern formation according to claim 25, wherein a sum of a height (h0) of the concavo-convex structure and a distance between a bottom position of the concave portion of the concavo-convex structure and a principal surface of the processing object is 50 nm or greater and 1500 nm or smaller.

27. The layered product for fine pattern formation according to claim 26, wherein a distance between top centers of the neighboring convex portions of the concavo-convex structure or a distance between bottom centers of the neighboring concave portions is 50 nm or longer and 1000 nm or shorter.

28. The layered product for fine pattern formation according to claim 27, wherein a thickness (hmv) of the second mask layer arranged on the convex portion of the concavo-convex structure satisfies Formula (18) 0<hmv<1000 nm, and a thickness (hml) of the second mask layer arranged on a side face portion of the concavo-convex structure satisfies Formula (19) 0≤hml≤50 nm.

29. The layered product for fine pattern formation according to claim 28, wherein a ratio (Vo1/Vm1) between an etching rate (Vo1) of the first mask layer and an etching rate (Vm1) of the second mask layer through dry etching satisfies Formula (7) 3≤Vo1/Vm1, and the first mask layer has a portion represented by the following general formula (1).

[Chemical Expression 2]

General Formula (1)

30. The method of manufacturing a layered product for fine pattern formation by using the layered product for fine pattern formation described in claim 1, wherein the layered product for fine pattern formation comprising:

a processing object;

the first mask layer that is provided on a principal surface of the processing object and has a concavo-convex structure on its surface; and the second mask layer provided on the concavo-convex structure of the first mask layer, said second mask layer is arranged in at least a part of a convex portion and side portion of the concavo-convex structure, a ratio (hmv/h0) between a thickness (hmv) of the second mask layer arranged on the convex portion of the concavo-convex structure and a height (h0) of the concavo-convex structure represented by a distance between a bottom of the concave portion of the concavo-convex structure and a top of the convex portion satisfy Formula (16) 0<hmv/h0≤20, and a ratio (hml/hmv) between a thickness (hml) of the second mask layer arranged on a side face portion of the concavo-convex structure and a thickness (hmv) of the second mask layer arranged on the convex portion of the concavo-convex structure satisfies Formula (17) 0≤hml/hmv<1, and comprising, at least in this order:

a step of forming a film of material of the first mask layer on a principal surface of the processing object;

a step of laminating a surface of the layered product for fine pattern formation to the formed first mask layer, wherein the surface of the layered product has the concavo-convex structure in which the second mask layer is arranged;

a step of irradiating energy rays onto a material of the first mask layer; and a step of releasing the mold.

31. A method of manufacturing a layered product for fine pattern formation comprising further performing dry etching on a surface on which the first mask layer and the second mask layer are formed of the layered product for fine pattern formation manufactured by the method according to claim 30.

32. The method of manufacturing a layered product for fine pattern formation by using the layered product for fine pattern formation described in claim 1, wherein the layered product for fine pattern formation comprising:

a processing object;

the first mask layer that is provided on a principal surface of the processing object and has a concavo-convex structure on its surface; and the second mask layer provided on the concavo-convex structure of the first mask layer, said second mask layer is arranged in at least a part of a convex portion and side portion of the concavo-convex structure, a ratio (hmv/h0) between a thickness (hmv) of the second mask layer arranged on the convex portion of the concavo-convex structure and a height (h0) of the concavo-convex structure represented by a distance between a bottom of the concave portion of the concavo-convex structure and a top of the convex portion satisfy Formula (16) 0<hmv/h0≤20, and a ratio (hml/hmv) between a thickness (hml) of the second mask layer arranged on a side face portion of the concavo-convex structure and a thickness (hmv) of the second mask layer arranged on the convex portion of the concavo-convex structure satisfies Formula (17) 0≤hml/hmv<1, and comprising, at least in this order:

a step of coating a dilute material of the first mask layer on a surface of the layered product for fine pattern formation, said surface having the concavo-convex structure in which the second mask layer is arranged;

a step of removing a surplus solvent;

a step of laminating a surface of the layered product for fine pattern formation to the processing object by interposing the coated dilute material of the first mask layer, wherein the surface of the layered product has the concavo-convex structure;

a step of irradiating energy rays onto the coated dilute material of the first mask layer; and a step of releasing the mold, wherein a coat film thickness (ho) of the dilute material of the first mask layer and a volumetric concentration (Co) of the dilute material of the first mask layer satisfy Formula (14) Sc·ho·Co≥Vc, and a distance (lor) between a top position (Scv) and a surface of the first mask layer and a pitch (P) of the concavo-convex structure satisfy Formula (15) lor/P≤5.

33. A method of manufacturing a layered product for fine pattern formation comprising further performing dry etching on a surface on which the first mask layer and the second mask layer are formed of the layered product for fine pattern formation manufactured by the method according to claim 32.

34. The method of manufacturing a layered product for fine pattern formation by using the layered product for fine pattern formation described in claim 1, wherein the layered product for fine pattern formation comprising:

a processing object;

the first mask layer that is provided on a principal surface of the processing object and has a concavo-convex structure on its surface; and the second mask layer provided on the concavo-convex structure of the first mask layer, said second mask layer is arranged in at least a part of a convex portion and side portion of the concavo-convex structure, a ratio (hmv/h0) between a thickness (hmv) of the second mask layer arranged on the convex portion of the concavo-convex structure and a height (h0) of the concavo-convex structure represented by a distance between a bottom of the concave portion of the concavo-convex structure and a top of the convex portion satisfy Formula (16) 0<hmv/h0≤20, and a ratio (hml/hmv) between a thickness (hml) of the second mask layer arranged on a side face portion of the concavo-convex structure and a thickness (hmv) of the second mask layer arranged on the convex portion of the concavo-convex structure satisfies Formula (17) 0≤hml/hmv<1, and comprising, in this order:

a step of laminating a surface of the first mask layer of the layered product for fine pattern formation to a surface of the processing object heated at a temperature of 20° C. to 200° C.;

a step of irradiating energy rays onto the first mask layer; and a step of releasing the mold.

35. The method according to claim 34, further comprising:

a step of heating the processing object at a temperature range of 40° C. to 200° C.; and a step of cooling the processing object at a temperature range of 5° C. to 120° C., after irradiating energy rays onto the first mask layer before releasing the mold.

36. A method of manufacturing a layered product for fine pattern formation comprising further performing a dry etching step of etching the first mask layer of the layered product for fine pattern formation manufactured by the method according to claim 34.

37. A layered product for fine pattern formation comprising:
- a processing object;
- a first mask layer that is provided on a principal surface of the processing object and has a concavo-convex structure on its surface; and
- a second mask layer provided on the concavo-convex structure of the first mask layer,
- wherein a distance (lcc) between a top position (S) of a convex portion of the concavo-convex structure and an interfacial position (Scc) of the second mask layer formed in the concave portion of the concavo-convex structure and a height (h) of the concavo-convex structure satisfy Formula (1) $0<lcc<1.0\,h$,
- a distance (lcv) between the top position (S) of the convex portion and a top position (Scv) of the second mask layer formed on the convex portion of the concavo-convex structure satisfies Formula (20) $0 \leq lcv < h-lcc$, and
- a thickness of the first mask layer represented by a distance between an interface between the first mask layer and the processing object and a top position (S) of the convex portion is 50 nm or larger and 1500 nm or smaller.

38. The layered product for fine pattern formation according to claim 37, wherein Formula (3) $0.02\,h \leq lcc \leq 0.9\,h$ and Formula (21) $0 \leq lcv < (h-lcc)/2$ are satisfied, the distance (lcv) satisfies Formula (5) $lcv=0$, and the second mask layer include a metal element.

39. The layered product for fine pattern formation according to claim 37, wherein a distance between top centers of the neighboring convex portions of the concavo-convex structure or a distance between bottom centers of the neighboring concave portions is 50 nm or longer and 1000 nm or shorter.

40. A method of manufacturing a fine pattern structure, comprising in this order:
- a mold formation step of consecutively transferring a concavo-convex structure provided on a surface of a cylindrical master using an optical transfer method to form a concavo-convex structure on a principal surface of a film-like substrate to obtain a first film-like mold;
- a second mask layer filling step of coating a solution of a second mask layer material on a surface having the concavo-convex structure of the first film-like mold to form a second mask layer in the concave portion of the concavo-convex structure;
- a first mask layer forming step of coating a solution of the first mask layer material on the surface having the concavo-convex structure, which filled by the second mask layer, of the first film-like mold, to form a first mask layer so as to cover the concavo-convex structure and the second mask layer;
- a thermal laminating step of thermally laminating the first mask layer to a principal surface of the processing object;
- a step of irradiating energy rays onto the first mask layer;
- a step of releasing the first film-like mold to obtain a layered product including the second mask layer, the first mask layer, and the processing object;
- a first dry etching step of performing a first dry etching to etch the first mask layer of the layered product by using the second mask layer as a mask to expose a part of the processing object; and
- a second dry etching step of performing a second dry etching to etch the processing object under a condition different from that of the first dry etching.

41. The method according to claim 40, further comprising, between the first mask layer formation process and the thermal laminating process:
- a protection layer laminating step of laminating a protection layer on a surface of the first mask layer; and
- a protection layer removal step of removing the protection layer.

42. The method according to claim 40, wherein the first film-like mold obtained after the first mask layer formation process is the layered product for fine pattern formation used to form a fine pattern in a processing object using the first mask layer, comprising:
- a mold having a concavo-convex structure on its surface; and
- the second mask layer serving as a mask when the first mask layer is fabricated,
- wherein a distance (lcc) between a top position (S) of a convex portion of the concavo-convex structure and an interfacial position (Scc) of the second mask layer formed in the concave portion of the concavo-convex structure and a height (h) of the concavo-convex structure satisfy Formula (1) $0<lcc<1.0\,h$, and a distance (lcv) between the top position (S) of the convex portion and a top position (Scv) of the second mask layer formed on the convex portion and the height (h) satisfy Formula (2) $0 \leq lcv \leq 0.05\,h$,
- wherein the first mask layer is provided to cover the concavo-convex structure of the mold, and
- a distance (lor) between the top position (Scv) and a surface of the first mask layer and a pitch (P) of the concavo-convex structure satisfy Formula (6) $0.05 \leq lor/P \leq 5$, and
- the layered product including the second mask layer, the first mask layer, and the processing or the layered product including the second mask layer, the first mask layer, and the processing object during the first dry etching step is the layered product for fine pattern formation comprising:
- the processing object;
- the first mask layer that is provided on a principal surface of the processing object and has a concavo-convex structure on its surface; and
- the second mask layer provided on the concavo-convex structure of the first mask layer,
- wherein the second mask layer is arranged in at least a part of a convex portion and side portion of the concavo-convex structure,
- a ratio (hmv/h0) between a thickness (hmv) of the second mask layer arranged on the convex portion of the concavo-convex structure and a height (h0) of the concavo-convex structure represented by a distance between a bottom of the concave portion of the concavo-convex structure and a top of the convex portion satisfy Formula (16) $0<hmv/h0 \leq 20$, and
- a ratio (hml/hmv) between a thickness (hml) of the second mask layer arranged on a side face portion of the concavo-convex structure and a thickness (hmv) of the second mask layer arranged on the convex portion of the concavo-convex structure satisfies Formula (17) $0 \leq hml/hmv<1$.

43. A method of manufacturing a fine pattern structure, sequentially comprising in this order:
- a first mold formation step of consecutively transferring a concavo-convex structure provided on a surface of a cylindrical master using an optical transfer method to form a concavo-convex structure on a principal surface of a film-like substrate to obtain a first film-like mold;

a second mold formation step of consecutively transferring a concavo-convex structure of the first film-like mold using an optical transfer method to form a concavo-convex structure on a principal surface of a film-like substrate to obtain a second film-like mold;

a second mask layer filling step of coating a solution of a second mask layer material on a surface having the concavo-convex structure of the second film-like mold to form a second mask layer in the concave portion of the concavo-convex structure;

a first mask layer formation step of coating a solution of the first mask layer material on the surface having the concavo-convex structure, which is filled by the second mask layer, of the second film-like mold to form a first mask layer so as to cover the concavo-convex structure and the second mask layer;

a thermal laminating step of thermally laminating the first mask layer to a principal surface of the processing object;

a step of irradiating energy rays onto the first mask layer;

a step of releasing the second film-like mold to obtain a layered product including the second mask layer, a first mask layer, and a processing object;

a first dry etching step performing a first dry etching to etch the first mask layer of the layered product by using the second mask layer as a mask to expose a part of the processing object; and a second dry etching step of performing a second dry etching to etch the processing object under a condition different from that of the first dry etching.

44. The method according to claim 43, further comprising, between the first mask layer formation process and the thermal laminating process:

a protection layer laminating step of laminating a protection layer on a surface of the first mask layer; and a protection layer removal step of removing the protection layer.

45. The method according to claim 43, wherein the second film-like mold obtained after the first mask layer formation step is the layered product for fine pattern formation used to form the fine pattern in a processing object using a first mask layer, comprising:

a mold having a concavo-convex structure on its surface; and the second mask layer serving as a mask when the first mask layer is fabricated, wherein a distance (lcc) between a top position (S) of a convex portion of the concavo-convex structure and an interfacial position (Scc) of the second mask layer formed in the concave portion of the concavo-convex structure and a height (h) of the concavo-convex structure satisfy Formula (1) 0<lcc<1.0 h, and a distance (lcv) between the top position (S) of the convex portion and a top position (Scv) of the second mask layer formed on the convex portion and the height (h) satisfy Formula (2) 0≤lcv≤0.05 h, wherein the first mask layer is provided to cover the concavo-convex structure of the mold, and a distance (lor) between the top position (Scv) and a surface of the first mask layer and a pitch (P) of the concavo-convex structure satisfy Formula (6) 0.05≤lor/P≤5, and the layered product including the second mask layer, the first mask layer, and the processing or the layered product including the second mask layer, the first mask layer, and the processing object during the first dry etching step is the layered product for fine pattern formation comprising:

the processing object;

the first mask layer that is provided on a principal surface of the processing object and has a concavo-convex structure on its surface; and the second mask layer provided on the concavo-convex structure of the first mask layer, wherein the second mask layer is arranged in at least a part of a convex portion and side portion of the concavo-convex structure, a ratio (hmv/h0) between a thickness (hmv) of the second mask layer arranged on the convex portion of the concavo-convex structure and a height (h0) of the concavo-convex structure represented by a distance between a bottom of the concave portion of the concavo-convex structure and a top of the convex portion satisfy Formula (16) 0<hmv/h0≤20, and a ratio (hml/hmv) between a thickness (hml) of the second mask layer arranged on a side face portion of the concavo-convex structure and a thickness (hmv) of the second mask layer arranged on the convex portion of the concavo-convex structure satisfies Formula (17) 0≤hml/hmv<1.

46. A semiconductor light-emitting device comprising:

the processing object having the concavo-convex structure manufactured through the method according to claim 40 on a surface; and a nitride semiconductor layer provided on the surface having the concavo-convex structure of the processing object.

47. A semiconductor light-emitting device comprising:

the processing object having the concavo-convex structure manufactured through the method according to claim 43 on a surface; and a nitride semiconductor layer provided on the surface having the concavo-convex structure of the processing object.

48. The layered product for fine pattern formation according to claim 1, wherein the first mask layer and the second mask layer includes a metal alkoxide made of a metal species M1 (where M1 denotes at least a metal element selected from a group consisting of Ti, Zr, Zn, Sn, B, In, and Al) and/or a metal alkoxide made of a metal species Si.

49. The layered product for fine pattern formation according to claim 48, wherein a ratio between a surface fluorine concentration (Es) in an area of a surface which contact the second mask layer surface of the concavo-convex structure or the first mask layer and an average fluorine concentration (Eb) of the concavo-convex structure or the first mask layer satisfies Formula (22) 30≤Es/Eb≤160.

50. The layered product for fine pattern formation according to claim 49, wherein the fine pattern is used to nanofabricate a processing object.

51. The layered product for fine pattern formation according to claim 24, wherein the first mask layer and the second mask layer includes a metal alkoxide made of a metal species M1 (where M1 denotes at least a metal element selected from a group consisting of Ti, Zr, Zn, Sn, B, In, and Al) and/or a metal alkoxide made of a metal species Si.

52. The layered product for fine pattern formation according to claim 51, wherein a ratio between a surface fluorine concentration (Es) in an area of a surface which contact the second mask layer surface of the concavo-convex structure or the first mask layer and an average fluorine concentration (Eb) of the concavo-convex structure or the first mask layer satisfies Formula (22) $30 \leq Es/Eb \leq 160$.

53. The layered product for fine pattern formation according to claim 52, wherein the fine pattern is used to nanofabricate a processing object.

\* \* \* \* \*